(12) United States Patent
Matsuda et al.

(10) Patent No.: US 9,316,911 B2
(45) Date of Patent: Apr. 19, 2016

(54) ACTINIC-RAY- OR RADIATION-SENSITIVE RESIN COMPOSITION, ACTINIC-RAY- OR RADIATION-SENSITIVE FILM THEREFROM AND METHOD OF FORMING PATTERN USING THE COMPOSITION

(75) Inventors: Tomoki Matsuda, Shizuoka (JP); Yoko Tokugawa, Shizuoka (JP); Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 155 days.

(21) Appl. No.: 13/538,246

(22) Filed: Jun. 29, 2012

(65) Prior Publication Data

US 2013/0004741 A1  Jan. 3, 2013

(30) Foreign Application Priority Data

Jun. 30, 2011  (JP) ................. 2011-146476

(51) Int. Cl.
*G03F 7/039* (2006.01)
*G03F 7/004* (2006.01)
*G03F 7/20* (2006.01)

(52) U.S. Cl.
CPC ............ *G03F 7/0397* (2013.01); *G03F 7/0045* (2013.01); *G03F 7/0046* (2013.01); *G03F 7/2041* (2013.01); *Y10T 428/24802* (2015.01)

(58) Field of Classification Search
None
See application file for complete search history.

(56) References Cited

U.S. PATENT DOCUMENTS

| 2005/0186505 A1* | 8/2005 | Kodama et al. ............ 430/270.1 |
| 2009/0104563 A1 | 4/2009 | Ishiduka et al. |
| 2010/0015554 A1* | 1/2010 | Saegusa et al. ............ 430/286.1 |
| 2010/0255418 A1 | 10/2010 | Yamaguchi et al. |
| 2012/0142806 A1* | 6/2012 | Motofuji et al. ................. 522/53 |
| 2012/0164574 A1* | 6/2012 | Tokugawa et al. ......... 430/281.1 |
| 2013/0015562 A1 | 1/2013 | Yamamoto et al. |

FOREIGN PATENT DOCUMENTS

| JP | 2003-307839 A | 10/2003 |
| JP | 2006290798 A * | 10/2006 |
| JP | 3841406 B2 | 11/2006 |
| JP | 2007-230913 A | 9/2007 |
| JP | 2007230913 A * | 9/2007 |
| JP | 2009-122623 A | 6/2009 |
| JP | 2011048289 A * | 3/2011 |
| JP | 2011-76057 A | 4/2011 |
| JP | 2012-137557 A | 7/2012 |
| WO | WO 2010143560 A1 * | 12/2010 |
| WO | 2012/086849 A1 | 6/2012 |
| WO | 2012/086850 A1 | 6/2012 |
| WO | WO2012086849 A1 * | 6/2012 |
| WO | WO2012086850 A1 * | 6/2012 |

OTHER PUBLICATIONS

English Translation of JP2007230913.*
English Translation of JP2006290798.*
English Translation of JP2011048289.*
Japanese Office Action issued in application No. 2011-146476 dated Apr. 16, 2013.

\* cited by examiner

*Primary Examiner* — Cynthia H Kelly
*Assistant Examiner* — Anna Malloy
(74) *Attorney, Agent, or Firm* — Sughrue Mion, PLLC

(57) ABSTRACT

An actinic-ray- or radiation-sensitive resin composition according to the present invention includes (A) a resin to be decomposed to increase its solubility in an alkali developer when acted on by an acid, and (B) a compound represented by the general formula (1-1) below.

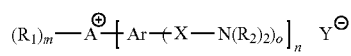

(1-1)

16 Claims, No Drawings

ACTINIC-RAY- OR RADIATION-SENSITIVE RESIN COMPOSITION, ACTINIC-RAY- OR RADIATION-SENSITIVE FILM THEREFROM AND METHOD OF FORMING PATTERN USING THE COMPOSITION

CROSS-REFERENCE TO RELATED APPLICATIONS

This application is based upon and claims the benefit of priority from prior Japanese Patent Application No. 2011-146476, filed Jun. 30, 2011, the entire contents of which are incorporated herein by reference.

BACKGROUND OF THE INVENTION

1. Field of the Invention

The present invention relates to an actinic-ray- or radiation-sensitive resin composition, an actinic-ray- or radiation-sensitive film formed from the composition and a method of forming a pattern using the composition. More particularly, the present invention relates to a composition that finds application in, for example, a semiconductor production process for an IC or the like, a circuit board production process for a liquid crystal, a thermal head or the like and other photofabrication lithography processes, and relates to a film formed from the composition and a method of forming a pattern using the composition. In particular, the present invention is concerned with a composition that is suitable for exposure using a liquid-immersion projection exposure apparatus in which a far ultraviolet light of wavelength 300 nm or shorter is employed as a light source, and is concerned with a film formed from the composition and a method of forming a pattern using the composition.

2. Description of the Related Art

Heretofore, in a semiconductor production process, etc. it is common practice to use resist compositions. An example of such compositions is a chemically amplified resist composition.

The chemically amplified resist composition typically comprises a resin that when acted on by an acid, is decomposed to increase its solubility in an alkali developer, and a compound that when exposed to actinic rays or radiation, is decomposed to generate an acid. With respect to this resin and compound, various developments have been realized in order to cope with, for example, the miniaturization of semiconductors (see, for example, JP-A-2007-230913, JP-A-2009-122623, JP-A-2003-307839, and Japanese Patent No. 3841406).

This composition is often stored for a prolonged period of time from the production to the actual use thereof. In this connection, it is preferred to ensure a minute change of line width between the pattern formed from the composition immediately after the production and the pattern formed from the composition having been stored for a prolonged period of time after the production. Namely, with respect to this composition, it is required to enhance the temporal stability of pattern width.

BRIEF SUMMARY OF THE INVENTION

It is an object of the present invention to provide an actinic-ray- or radiation-sensitive resin composition that excels in the temporal stability of pattern width. It is further objects of the present invention to provide an actinic-ray- or radiation-sensitive film formed from the composition and a method of forming a pattern using the composition.

Aspects of the present invention are as follows.

[1] An actinic-ray- or radiation-sensitive resin composition comprising:

(A) a resin to be decomposed to increase its solubility in an alkali developer when acted on by an acid, and (B) a compound represented by the general formula (1-1) below,

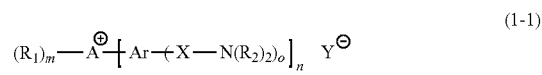

(1-1)

where

A represents a sulfur atom or an iodine atom, $R_1$ each independently represents an alkyl group, an alkenyl group, a cycloaliphatic group, an aromatic hydrocarbon group or a heterocyclic hydrocarbon group; where m is 2, two $R_1$s may be bonded to each other to form a ring, Ar each independently represents an aromatic ring group, X each independently represents a bivalent connecting group, $R_2$ each independently represents a hydrogen atom, an alkyl group, an alkenyl group, a cycloaliphatic group, an aromatic hydrocarbon group or a heterocyclic hydrocarbon group, at least two groups selected from X and two $R_2$s may be bonded to each other to form a ring, and provided that to the nitrogen atom (N) in the general formula (1-1), at least one group is directly bonded, the group being selected from a cycloaliphatic group, an aromatic hydrocarbon group, a heterocyclic hydrocarbon group and a linear aliphatic group whose moiety adjacent to the nitrogen atom is a tertiary or quaternary carbon atom, when A is a sulfur atom, n is an integer of 1 to 3, and m is an integer satisfying the relationship m+n=3, when A is an iodine atom, n is an integer of 1 or 2, and m is an integer satisfying the relationship m+n=2, o is an integer of 1 to 10, and $Y^-$ represents a non-nucleophilic anion.

[2] The composition according to [1], further comprising (C) a compound to be decomposed to generate an acid when exposed to actinic rays or radiation, the compound being other than the compounds (B).

[3] The composition according to [2], wherein the compound (C) is represented by the general formulae (ZI-3), (ZI-4) or (ZI-5) below,

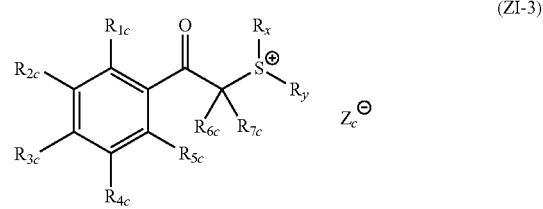

(ZI-3)

in the general formula (ZI-3), $R_{1c}$ to $R_{5c}$ each independently represents a hydrogen atom, an alkyl group, a cycloalkyl group, an alkoxy group, an alkoxycarbonyl group, a halogen atom, a cyano group, a nitro group or a phenylthio group, $R_{6c}$ and $R_{7c}$ each independently represents a hydrogen atom, an alkyl group, a cycloalkyl group, a halogen atom, a cyano group or an aryl group, $R_x$ and R each independently represents an alkyl group, a cycloalkyl group, a 2-oxoalkyl group, a 2-oxocycloalkyl group, an alkoxycarbonylalkyl group, an allyl group or a vinyl group, provided that any two or more of $R_{1c}$ to $R_{5c}$, and $R_{6c}$ and $R_{7c}$, and $R_x$ and $R_y$ may be bonded to each other to form a ring structure, and that the ring structure may contain an oxygen atom, a sulfur atom, an ester bond or an amido bond, and $Zc^-$ represents a non-nucleophilic anion,

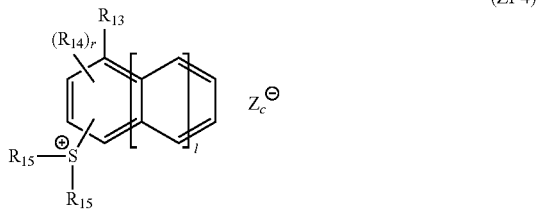

in the general formula (ZI-4), $R_{13}$ represents a hydrogen atom, a fluorine atom, a hydroxyl group, an alkyl group, a cycloalkyl group, an alkoxy group, an alkoxycarbonyl group or a group with a mono- or polycycloalkyl skeleton, $R_{14}$, when r≥2, each independently represents an alkyl group, a cycloalkyl group, an alkoxy group, an alkoxycarbonyl group, an alkylcarbonyl group, an alkylsulfonyl group, a cycloalkylsulfonyl group or a group with a mono- or polycycloalkyl skeleton, $R_{15}$ each independently represents an alkyl group, a cycloalkyl group or a naphthyl group, provided that two $R_{15}$s may be bonded to each other to form a ring, l represents an integer of 0 to 2, r represents an integer of 0 to 8, and $Zc^-$ represents a non-nucleophilic anion, and

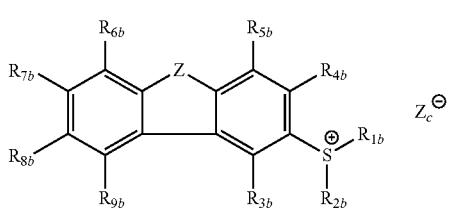

in the general formula (ZI-5),

Z represents an oxygen atom, a sulfur atom or —N($R_x$)— where $R_x$ represents a hydrogen atom, an alkyl group, a cycloalkyl group, an acyl group, an alkenyl groUp, an alkoxycarbonyl group, an aryl group, an arylcarbonyl group or an aryloxycarbonyl group, $R_{1b}$ and $R_{2b}$ each independently represents an alkyl group, a cycloalkyl group or an aryl group, $R_{3b}$ to $R_{9b}$ each independently represents a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group or an arylcarbonyloxy group, provided that $R_{1b}$ and $R_{2b}$ may be bonded to each other to form a ring, and that any two or more of $R_{6b}$ to $R_{9b}$, $R_{3b}$ and $R_{9b}$, $R_{4b}$ and $R_{5b}$, $R_{5b}$ and $R_x$, and $R_{6b}$ and $R_x$ may be bonded to each other to form a ring, and $Zc^-$ represents a non-nucleophilic anion.

[4] The composition according to [1], wherein either at least one group selected from X and two $R_2$s or the ring formed by bonding at least two groups selected from X and two $R_2$s comprises an electron withdrawing group as a substituent group.

[5] The composition according to [1], wherein Ar, X and $R_2$ in the general formula (1-1) are configured such that a conjugate acid of a compound represented by the general formula (1-1P) below exhibits a pKa value of 0 or higher.

$$H-Ar-X-N(R_2)_2 \quad (1\text{-}1P)$$

[6] The composition according to [1], wherein A represents a sulfur atom.

[7] The composition according to [1], wherein $R_1$ each independently represents an aromatic hydrocarbon group.

[8] The composition according to [1], wherein $Y^-$ represents an organic acid anion.

[9] The composition according to [1], wherein $Y^-$ represents a sulfonate anion, an imidate anion or a methide anion.

[10] An actinic-ray- or radiation-sensitive film formed from the composition according to [1].

[11] A method of forming a pattern, comprising: forming the composition according to [1] into a film; exposing the film to light; and developing the exposed film.

[12] The method according to [11], wherein the exposure is performed through an immersion liquid.

[13] A process for manufacturing an electronic device, comprising the method of [11].

[14] An electronic device manufactured by the process of [13].

The present invention has made it feasible to provide an actinic-ray- or radiation-sensitive resin composition that excels in the temporal stability of pattern width and also to provide an actinic-ray- or radiation-sensitive film formed from the composition and a method of forming a pattern using the composition.

DETAILED DESCRIPTION OF THE INVENTION

Embodiments of the present invention will be described below.

Note that, a group or an atomic group herein without explicitly referring to whether it is substituted or unsubstituted encompasses both groups with no substituent groups and groups having one or more substituent groups. For example, the "alkyl group" encompasses not only alkyl groups having no substituent groups (viz. unsubstituted alkyl groups) but also alkyl groups having one or more substituent groups (viz. substituted alkyl groups).

Here, the terms "actinic rays" and "radiation" mean, for example, a mercury lamp bright line spectrum, far ultraviolet rays represented by an excimer laser, extreme ultraviolet (EUV) rays, X-rays, electron beams (EB). The term "light" means actinic rays or radiation. The expression "exposure" means not only light irradiation using a mercury lamp, far ultraviolet, X-rays, EUV light, etc. but also lithography using particle beams, such as an electron beam and an ion beam.

The composition according to the present invention comprises: (A) a resin to be decomposed to increase its solubility in an alkali developer when acted on by an acid (also referred to as an acid-decomposable resin or a resin (A) hereinafter); and (B) a compound represented by the general formula (1-1) (also referred to as a compound (B) hereinafter). Such a composition comprising these components makes it possible to improve the temporal stability of pattern width as described later.

These components will be described below in the order listed.

(A) Acid-Decomposable Resin

The resin (A) has a group (which is also referred to as an acid-decomposable group) that is decomposed when acted on by an acid to produce an alkali-soluble group either in the main chain or in the side chain or both of the main and the side chains of the resin. The resin (A) is preferably insoluble or slightly soluble in an alkali developer.

The acid-decomposable group is preferred to have a structure in which the alkali-soluble group is protected by a group that is decomposed when acted on by an acid to be eliminated.

Alkali-soluble groups include a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

Preferable alkali-soluble groups include a carboxyl group, a fluoroalcohol group (preferably a hexafluoroisopropanol group) and a sulfonate group.

The acid-decomposable group is preferably a group as obtained by substituting the hydrogen atom of any of these alkali-soluble groups with a group that is eliminated by the action of an acid.

As a group that is eliminated by the action of an acid includes, for example, a group represented by $—C(R_{36})(R_{37})(R_{38})$, $—C(R_{35})(R_{37})(OR_{39})$ or $—C(R_{01})(R_{02})(OR_{39})$.

In the formulae, $R_{36}$ to $R_{39}$ each independently represents an alkyl group, a cycloalkyl group, an aryl group, an aralkyl group or an alkenyl group. $R_{36}$ and $R_{37}$ may be bonded to each other to form a ring.

$R_{01}$ and $R_{02}$ each independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group, or the like. Further preferred is a tertiary alkyl ester group.

The repeating unit having an acid-decomposable group, which may be contained in the resin (A), is preferably the repeating unit represented by the following general formula (AI).

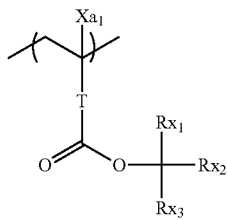

(AI)

In the formula (AI), $Xa_1$ represents a hydrogen atom, a methyl group which may have a substituent group, or a group represented by $—CH_2—R_9$. $R_9$ represents a hydroxyl group or a monovalent organic group, which includes, for example, an alkyl group or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

T represents a single bond or a bivalent connecting group. $R_{x1}$ to $R_{x3}$ each independently represents a (linear of branched) alkyl group or a (monocyclic or polycyclic) cycloalkyl group.

At least two of $R_{x1}$ to $R_{x3}$ may be bonded to each other to thereby form a (monocyclic or polycyclic) cycloalkyl group.

The bivalent connecting group of T includes such as an alkylene group, a —COO-Rt- group or a —O-Rt- group. In the formulae, Rt represents an alkylene group or a cycloalkylene group.

T is preferably a single bond or a —COO-Rt- group. Rt is preferably an alkylene group having 1 to 5 carbon atoms, more preferably a —$CH_2$— group or —$(CH_2)_3$— group.

The alkyl group for $R_{x1}$ to $R_{x3}$ is preferably one having 1 to 4 carbon atoms, such as a methyl group, an ethyl group, an n-propyl group, an isopropyl group, an n-butyl group, an isobutyl group or a t-butyl group.

The cycloalkyl group for $R_{x1}$ to $R_{x3}$ is preferably a monocycloalkyl cycloalkyl group, such as a cyclopentyl group or a cyclohexyl group, or a polycycloalkyl group, such as a norbornyl group, a tetracyclodecanyl group, a tetracyclododecanyl group or an adamantyl group.

The cycloalkyl group formed by bonding at least two of $R_{x1}$ to $R_{x3}$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group. In particular, monocyclic cycloalkyl groups having 5 or 6 carbon atoms are preferred.

Embodiments are preferred in which $R_{x1}$ is a methyl group or an ethyl group, and $R_{x2}$ and $R_{x3}$ are bonded to each other to thereby form the above-mentioned cycloalkyl groups.

Above-mentioned groups may have a substituent group, in which the substituent group includes, for example, an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms), and preferably having 8 or less carbon atoms.

The total percentage of the repeating units having an acid-decomposable group is preferably 20 to 70 mol %, more preferably 30 to 50 mol % based on all the repeating units in the resin.

Specific examples of preferred repeating units having an acid-decomposable group are listed below, which however in no way limit the scope of the present invention.

In the specific examples, $R_x$ and $Xa_1$ each represents a hydrogen atom, $CH_3$, $CF_3$ or $CH_2OH$. $R_{xa}$ and $R_{xb}$ each represents an alkyl group having 1 to 4 carbon atoms. Z represents a substituent group comprising a polar group. In the case where a plurality of Z groups is present, they are independent to each other. The index p represents 0 or a positive integer.

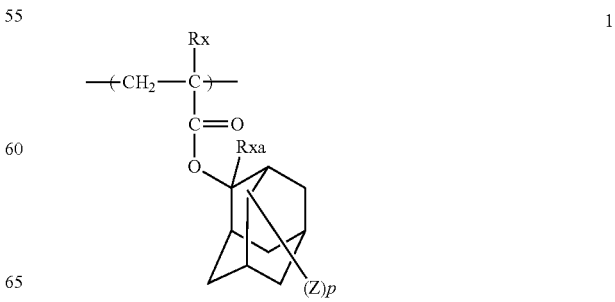

1

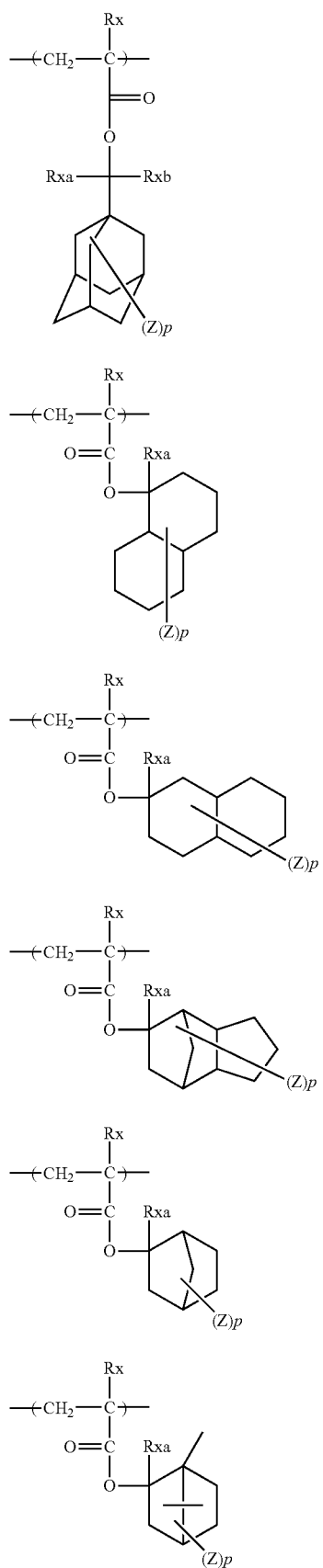
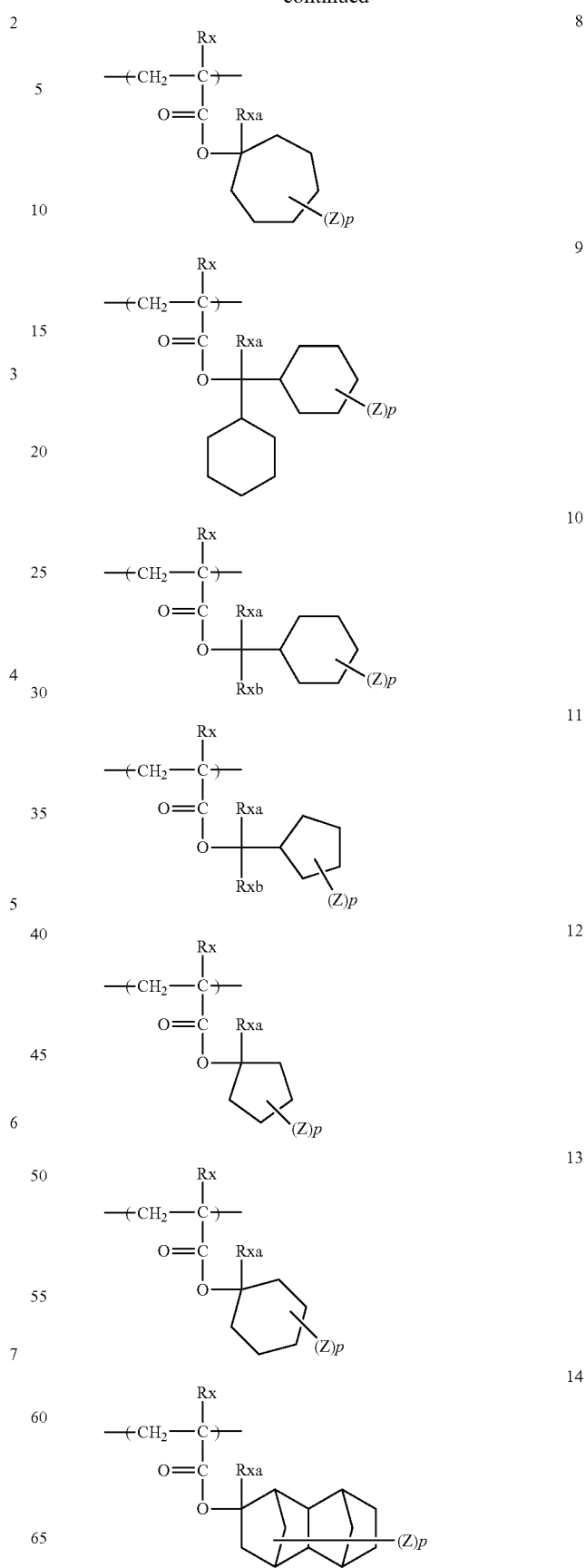

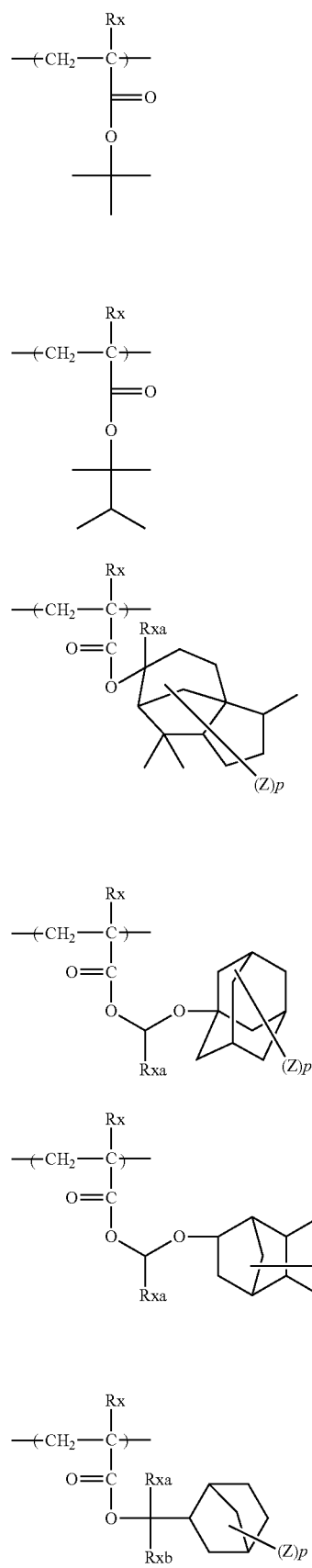
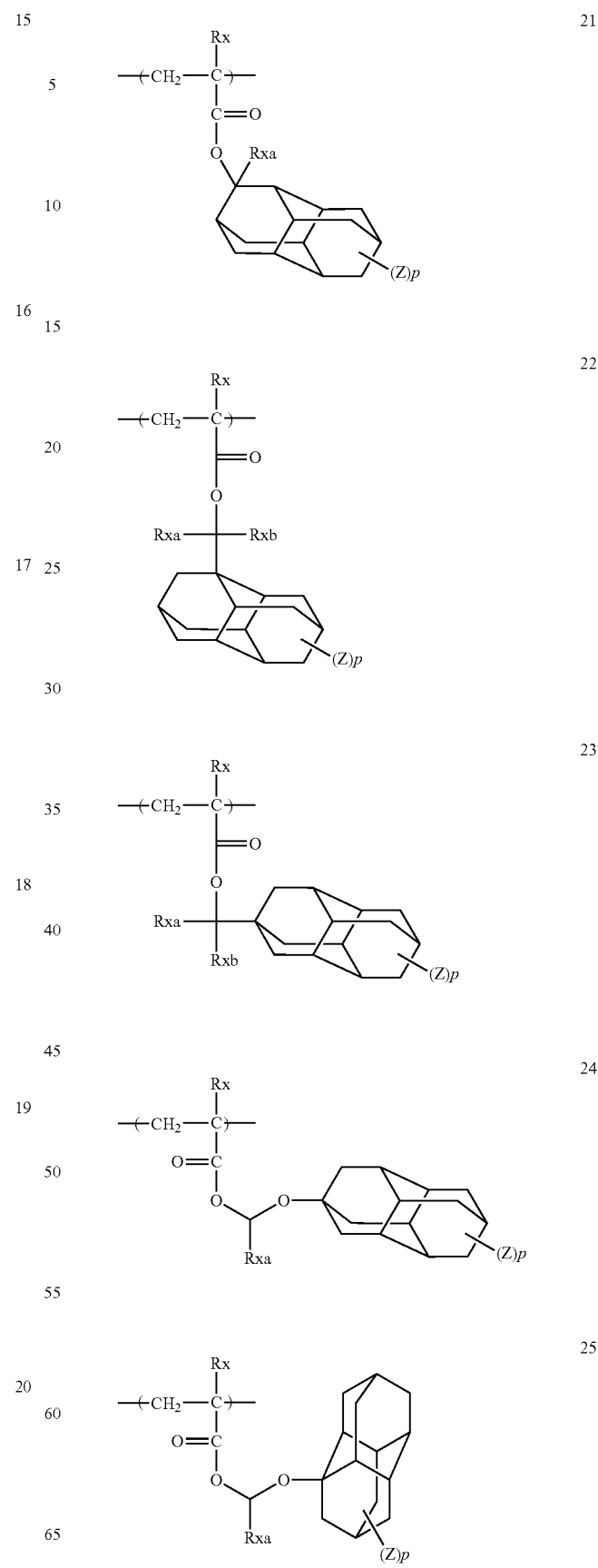

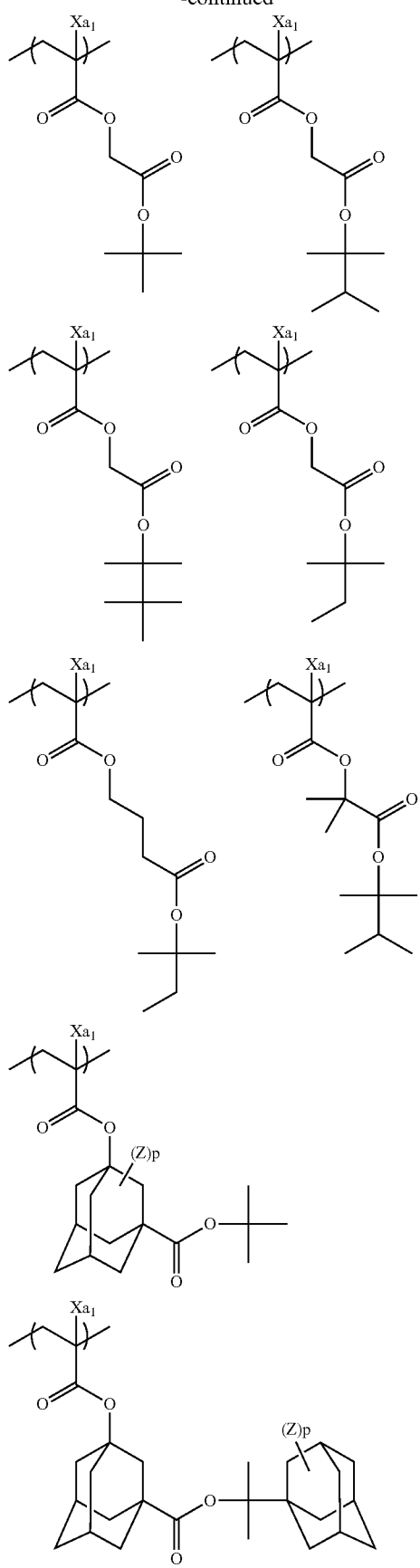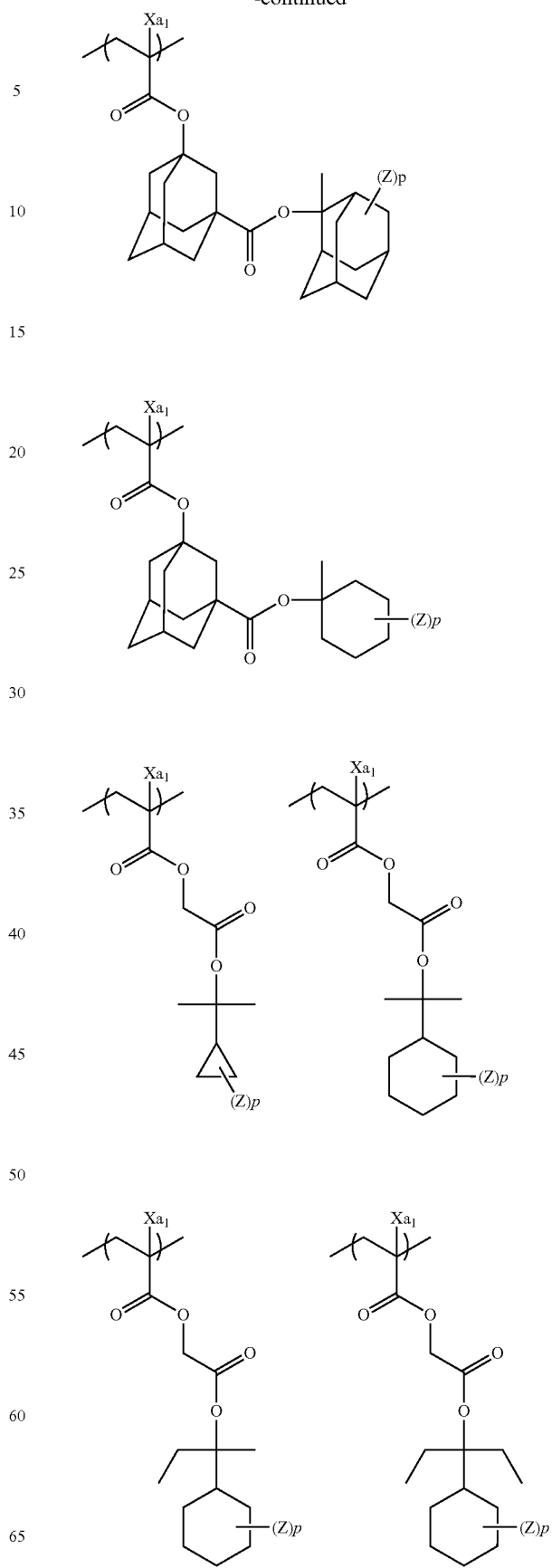

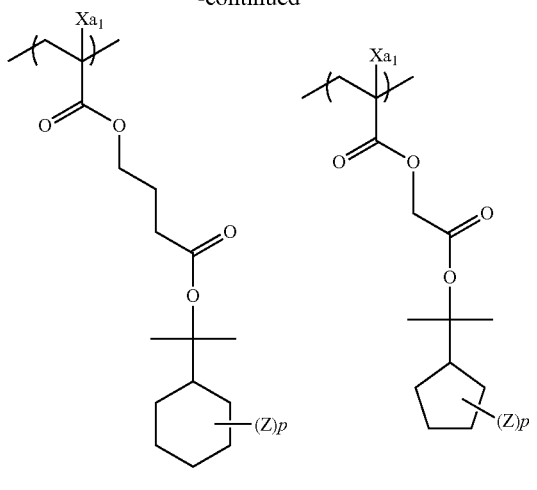
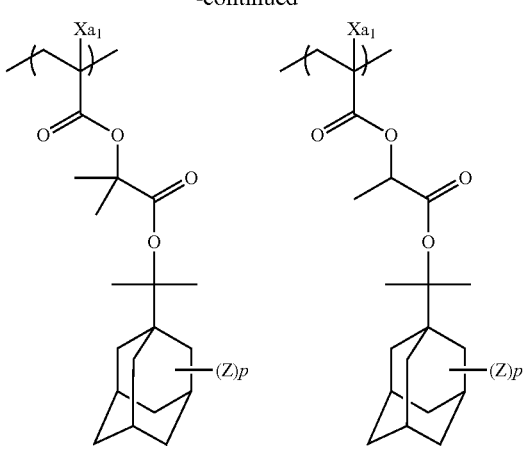
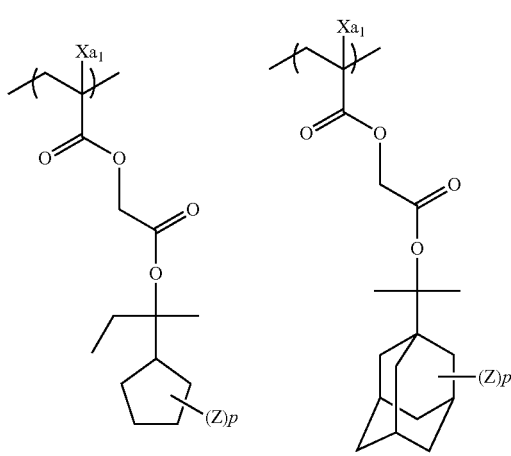
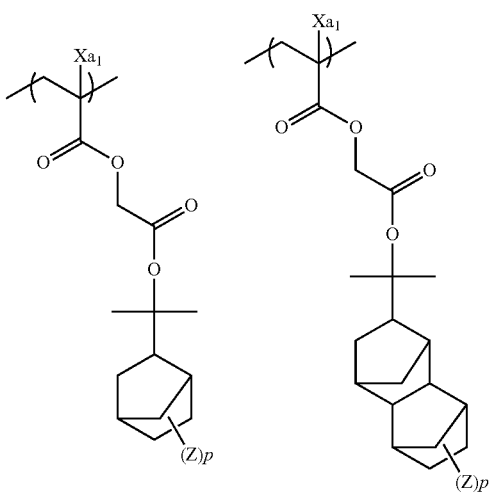
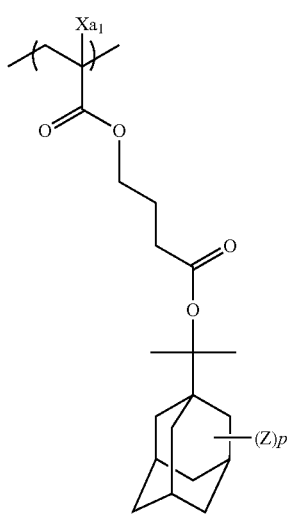
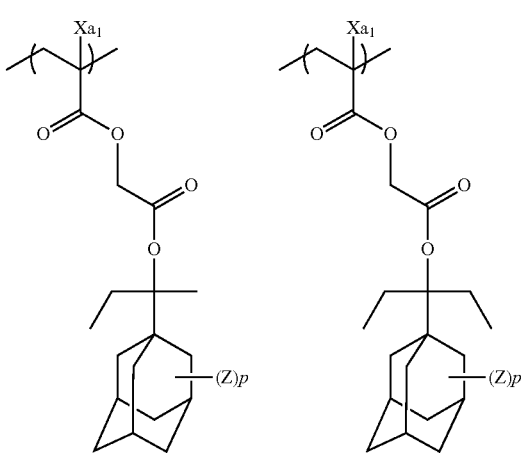

-continued
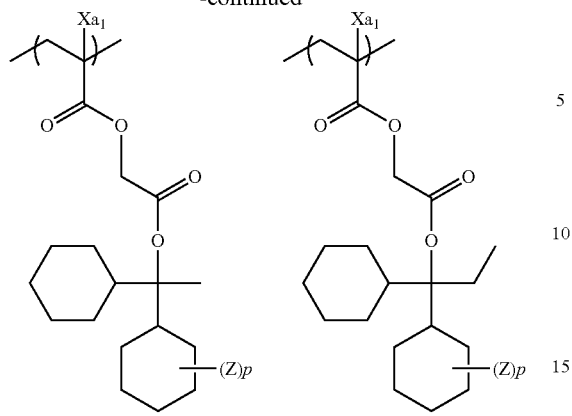
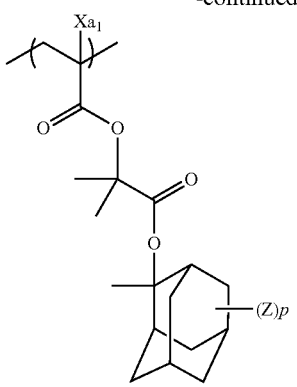
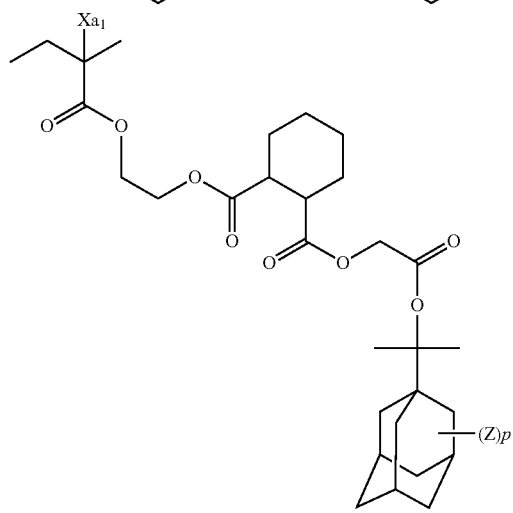
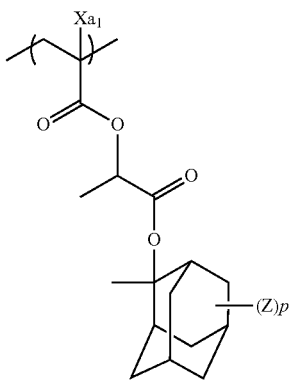
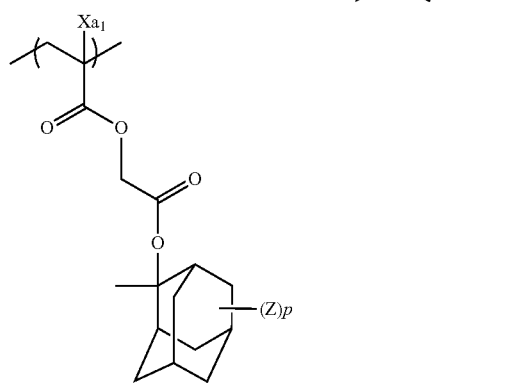
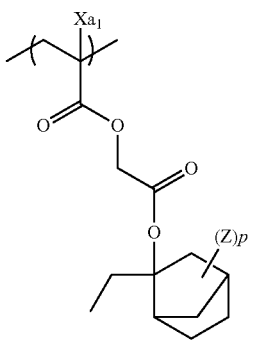
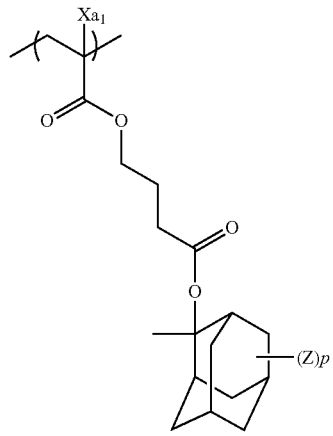
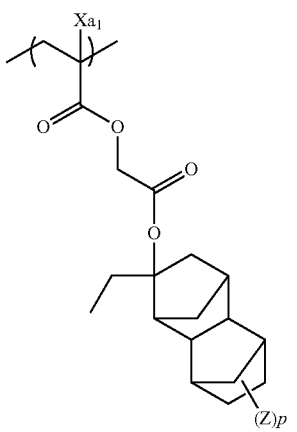

-continued

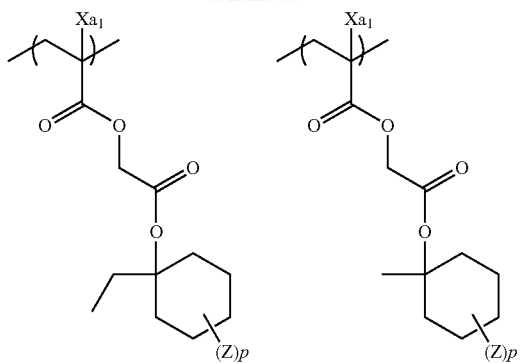
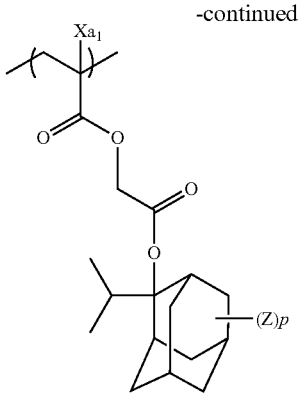

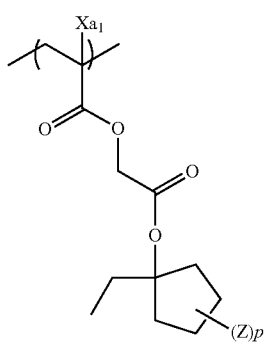

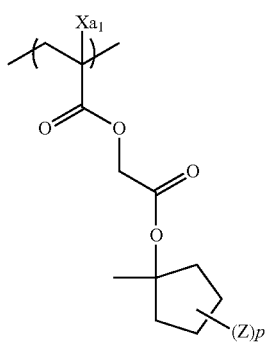

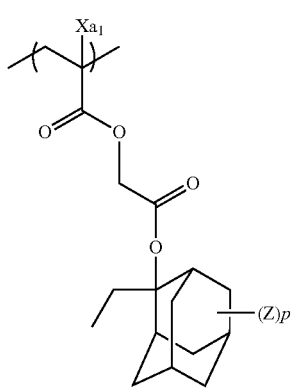

It is more preferred for the resin (A) to contain, as the repeating units of general formula (AI), at least any of the repeating units of general formula (I) and the repeating units of general formula (II) below.

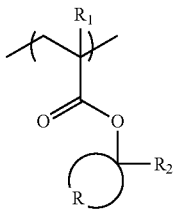

In the general formulae (I) and (II), $R_1$ and $R_3$ each independently represents a hydrogen atom, a methyl group which may have a substituent group or a group represented by the formula —$CH_2$—$R_9$. $R_9$ represents a monovalent organic group.

$R_2$, $R_4$, $R_5$ and $R_6$ each independently represents an alkyl group or a cycloalkyl group.

R represents an atomic group required for forming an alicyclic structure together with a carbon atom.

$R_1$ preferably represents a hydrogen atom, a methyl group, a trifluoromethyl group or a hydroxymethyl group.

The alkyl group for $R_2$ may be linear or branched, and may have a substituent group.

The cycloalkyl group for $R_2$ may be monocyclic or polycyclic, and may have a substituent group.

$R_2$ preferably is an alkyl group, more preferably an alkyl group having 1 to 10 carbon atoms, further more preferably 1 to 5 carbon atoms, and includes a methyl group and an ethyl group, for example.

R represents an atomic group required for forming an alicyclic structure together with a carbon atom. The alicyclic structure formed by R is preferably an alicyclic structure of a single ring, and preferably has 3 to 7 carbon atoms, more preferably 5 or 6 carbon atoms.

$R_3$ preferably is a hydrogen atom or a methyl group, more preferably a methyl group.

The alkyl groups for $R_4$, $R_5$ and $R_6$ may be linear or branched, and may have a substituent group. The alkyl groups are preferably those having 1 to 4 carbon atoms, such as a methyl group, an ethyl group, an n-propyl group, an isopropyl group, an n-butyl group, an isobutyl group and a t-butyl group.

The cycloalkyl groups for $R_4$, $R_5$ and $R_6$ may be monocyclic or polycyclic, and may have a substituent group. The cycloalkyl groups are preferably a monocycloalkyl group, such as a cyclopentyl group or a cyclohexyl group, and a polycycloalkyl group, such as a norbornyl group, a tetracyclodecanyl group, a tetracyclododecanyl group or an adamantyl group.

The repeating units represented by the general formula (I) include, for example, those represented by the general formula (I-a) below.

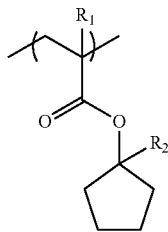

(1-a)

In the formula, $R_1$ and $R_2$ have the same meaning as those in the general formula (I).

The repeating units of general formula (II) are preferably those of general formula (II-1) below.

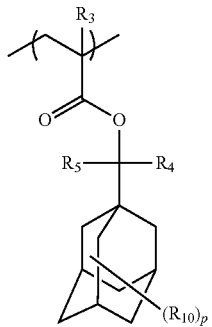

(II-1)

In general formula (II-1), $R_3$ to $R_5$ have the same meanings as those in general formula (II).

$R_{10}$ represents a substituent group comprising a polar group. In a case where a plurality of $R_{10}$ groups is present, they may be identical to or different from each other. The substituent group comprising a polar group includes, for example, a linear or branched alkyl group or cycloalkyl group having a hydroxyl group, a cyano group, an amino group, an alkylamido group or a sulfonamido group, and is preferably an alkyl group having a hydroxyl group. The branched alkyl group is particularly preferable an isopropyl group.

The index 2 represents an integer of 0 to 15. The index p is preferably 0 to 2, more preferably 1 or 1.

The acid-decomposable resin is more preferable to contain, as the repeating units of general formula (AI), at least one of the repeating units of general formula (I) and the repeating units of general formula (II). Also, in the another embodiment, the acid-decomposable resin is more preferable to contain, as the repeating units of general formula (AI), two types of the repeating units of general formula (I).

When the resin (A) contains a plurality of acid-decomposable repeating units, the following combinations are preferred. In the following formulae, R each independently represents a hydrogen atom or a methyl group.

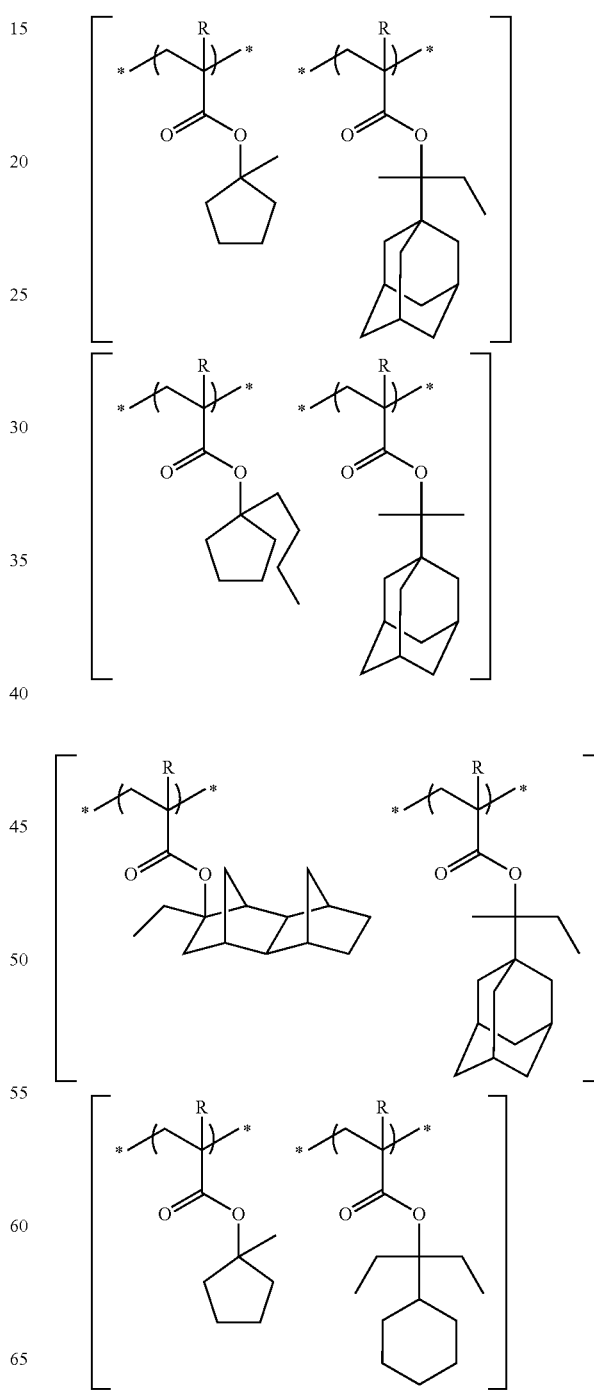

-continued
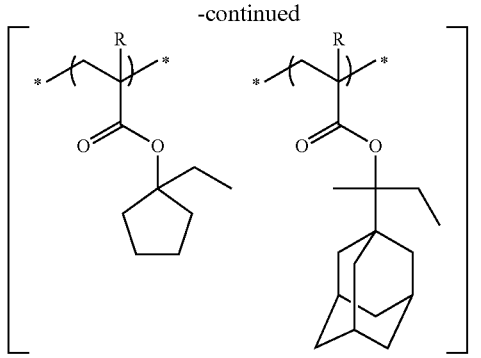
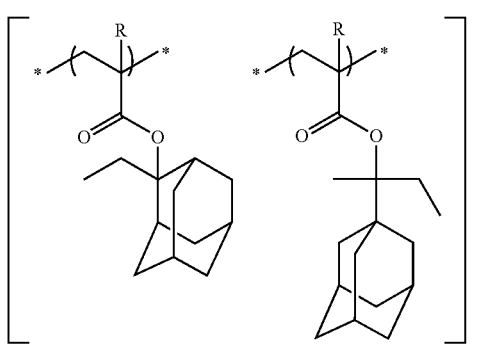
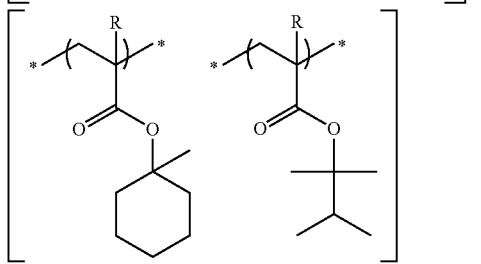
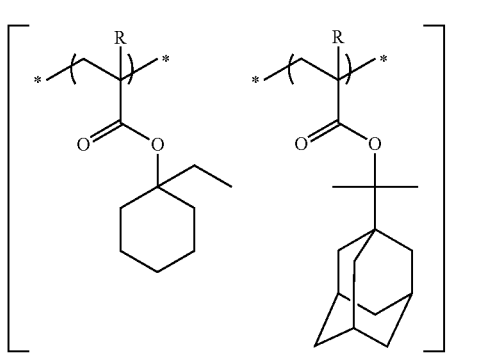
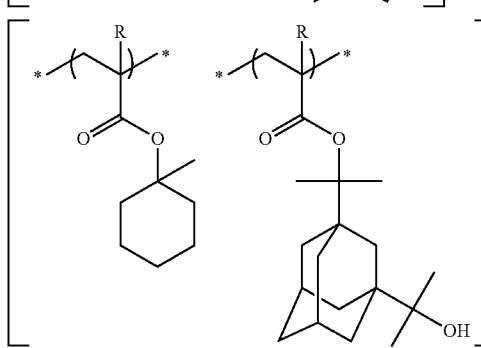
-continued
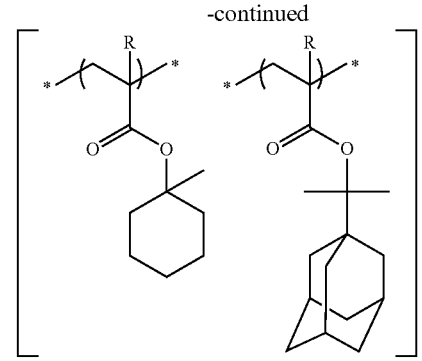
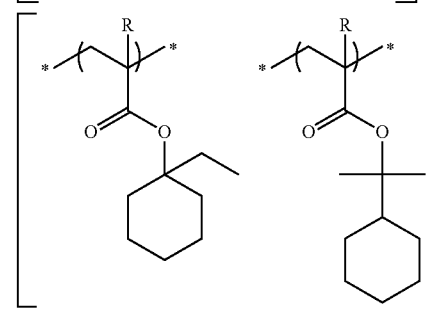
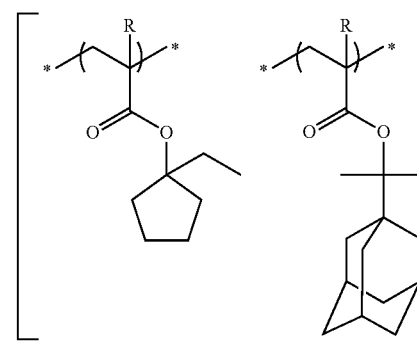
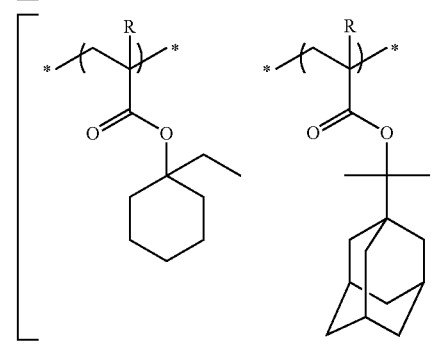
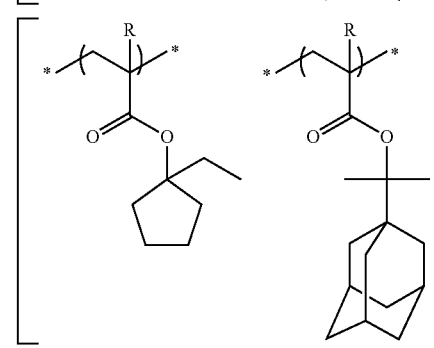

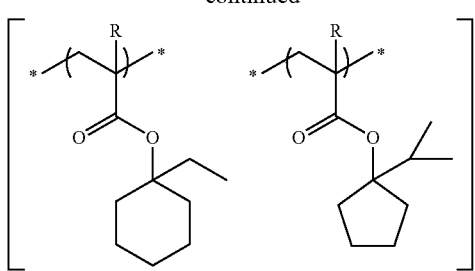
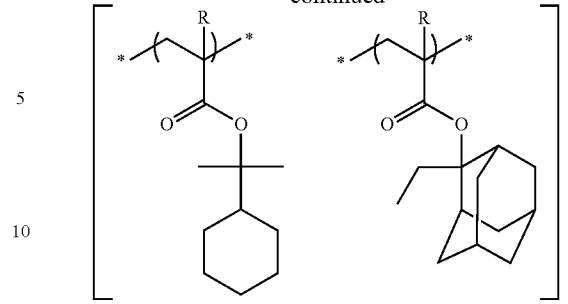
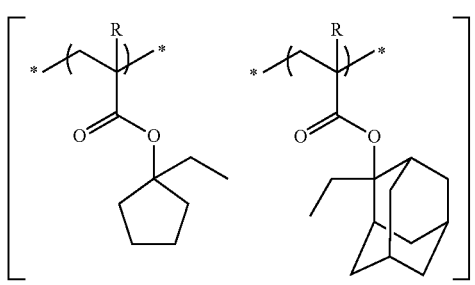
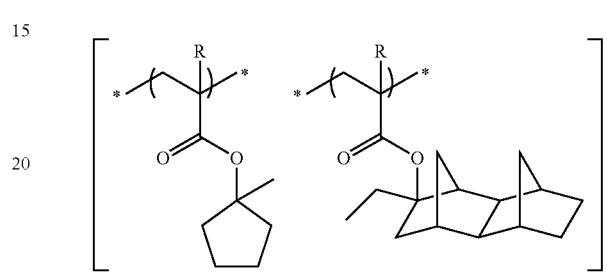
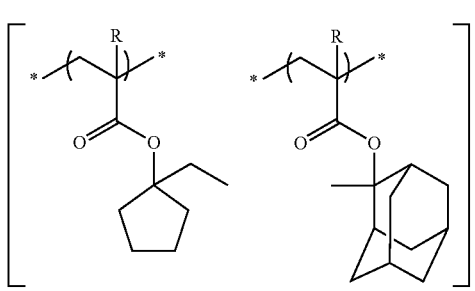
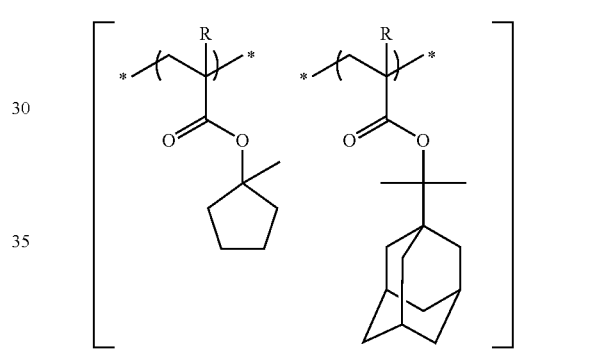
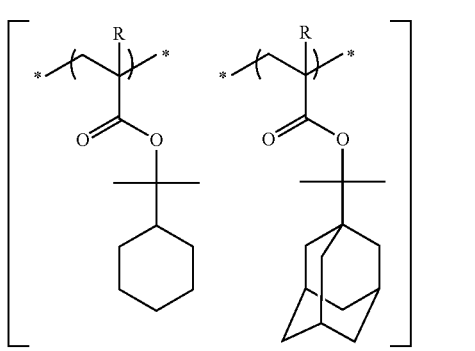

The resin (A) preferably comprises a repeating unit having a lactone structure or a sultone (cyclic sulfonate) structure.

Although any group having lactone structure can be used as the lactone group, a lactone structure of a 5 to 7-membered ring is preferable. A lactone structure in which another cyclic structure is condensed with the lactone structure of a 5 to 7-membered ring in a fashion to form a bicyclo structure or spiro structure is more preferable.

It is more preferable that the resin has a lactone structure represented by any of the general formulae (LC1-1) to (LC1-17) below. The lactone structure may be directly bonded to the main chain.

More preferable lactone structures are those of formulae (LC1-1), (LC1-4), (LC1-5), (LC1-6), (LC1-13), (LC1-14), and (LC1-17). The use of particular lactone structures would realize improvement in the line width roughness (LWR) and development defect.

LC1-1

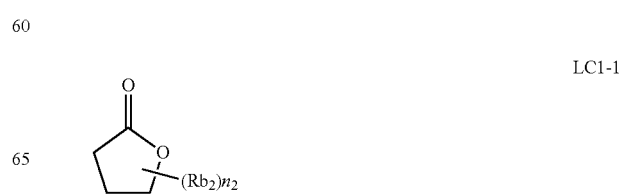

LC1-2 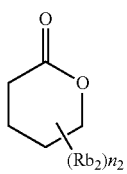
LC1-3 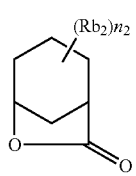
LC1-4 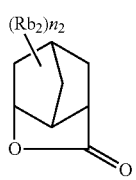
LC1-5 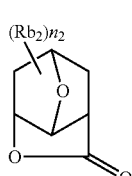
LC1-6 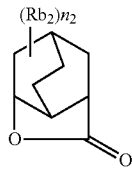
LC1-7 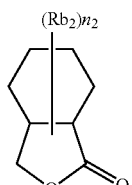
LC1-8 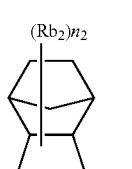
LC1-9 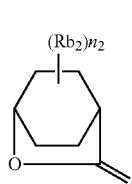
LC1-10 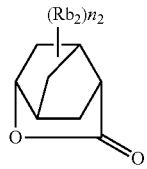
LC1-11 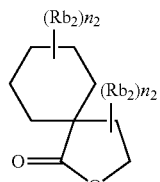
LC1-12 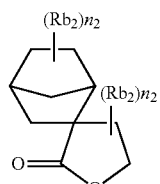
LC1-13 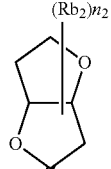
LC1-14 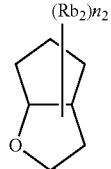
LC1-15 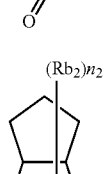
LC1-16 
LC1-17 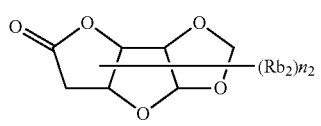

SL1-1

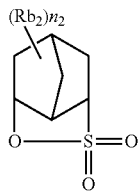

SL1-2

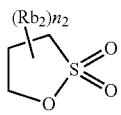

The lactone structure moiety may have or not have the substituent group (Rb$_2$). Preferred Rb$_2$ groups include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. An alkyl group having 1 to 4 carbon atoms, a cyano group or an acid-decomposable group is more preferable. The index n$_2$ represents an integer of 0 to 4. In a case where the index n$_2$ is 2 or more, the plurality of substituent groups (Rb$_2$) may be identical to or different from each other. Also, the plurality of substituent groups (Rb$_2$) may be bonded to each other to thereby form a ring.

The resin (A) is preferred to comprise a repeating unit having a lactone structure represented by the following general formula (III).

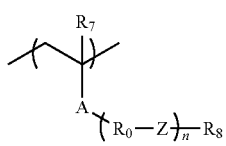

(III)

In the formula (III),

A represents an ester bond (i.e., a group represented by —COO—) or an amido bond (i.e., a group represented by —CONH—).

Ro, when there is a plurality of Ro groups, each independently represents an alkylene group, a cycloalkylene group or a combination thereof.

Z, when there is a plurality of Z groups, each independently represents an ether bond, an ester bond, an amido bond, a urethane bond (a group represented by

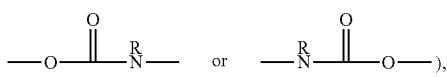

or a urea bond (a group represented by

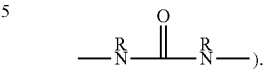

where R represents a hydrogen atom, an alkyl group, cycloalkyl group or an aryl group.

R$_8$ represents a monovalent organic group with a lactone structure.

n represents the number of repetitions of the structure represented by —R$_0$—Z—, and is an integer of 0 to 2.

R$_7$ represents a hydrogen atom, a halogen atom or an alkyl group.

The alkylene group and cycloalkylene group for R$_0$ may have a substituent group.

Z preferably is an ether bond or an ester bond, most preferably an ester bond.

The alkyl group for R$_7$ is preferably an alkyl group having 1 to 4 carbon atoms, more preferably a methyl group or an ethyl group and most preferably a methyl group. The alkyl group for R$_7$ may be substituted. The substituent groups include, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acetoxy group such as an acetyl group or a propionyl group. R$_7$ is preferably a hydrogen atom, a methyl group, a trifluoromethyl group or a hydroxymethyl group.

The linear alkylene group for R$_0$ is preferably a linear alkylene group having 1 to 10 carbon atoms, more preferably 1 to 5 carbon atoms, and includes, for example, a methylene group, an ethylene group, or a propylene group. The cycloalkylene group is preferably a cycloalkylene group having 3 to 20 carbon atoms, and includes, for example, cyclohexylene, cyclopentylene, norbornylene, or adamantylene. The linear alkylene groups are preferred from the viewpoint of the exertion of the effect of the present invention, and a methylene group is most preferred.

The substituent group with a lactone structure represented by R$_8$ is not limited as long as the lactone structure is contained. Specific examples include the lactone structures of above-mentioned general formulae (LC1-1) to (LC1-17). Of these, the structure of general formula (LC1-4) is most preferred. In general formulae (LC1-1) to (LC1-17), n$_2$ is more preferably 2 or less.

R$_8$ is preferably a monovalent organic group with an unsubstituted lactone structure or a monovalent organic group with a lactone structure substituted with a methyl group, a cyano group or an alkoxycarbonyl group. More preferably, R$_8$ is a monovalent organic group with a lactone structure substituted with a cyano group (cyanolactone).

Specific examples of the repeating units having a group with a lactone structure represented by the general formula (III) will be shown below, which however in no way limit the scope of the present invention.

In the specific examples, R represents a hydrogen atom, an alkyl group which may have a substituent group, or a halogen atom. R is preferably a hydrogen atom, a methyl group, a hydroxymethyl group or an acetoxymethyl group.

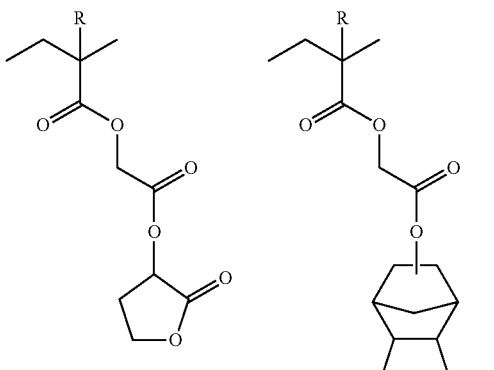
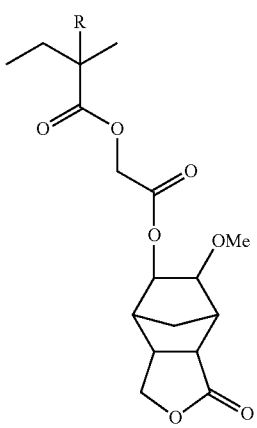
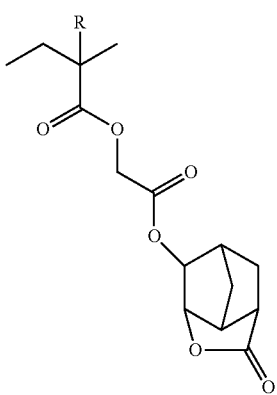
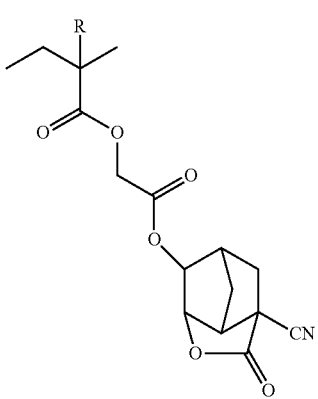

The repeating unit having a lactone structure is preferably that of the general formula (III-1) below.

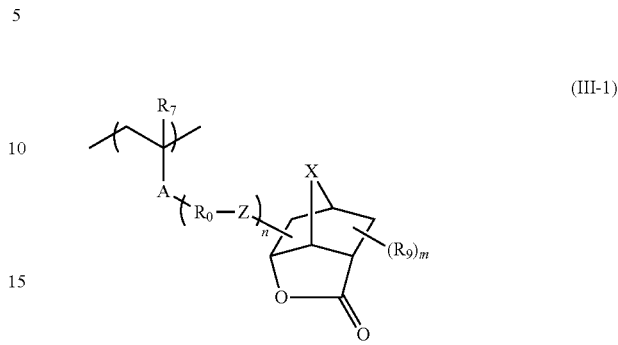

(III-1)

In general formula (III-1), $R_7$, A, $R_0$, Z and n are as defined in general formula (III) above.

$R_9$, when there is a plurality of $R_9$ groups, each independently represents an alkyl group, a cycloalkyl group, an alkoxycarbonyl group, a cyano group, a hydroxyl group or an alkoxy group. When there is a plurality of $R_9$ groups, two or more $R_9$ groups may be bonded to each other to thereby form a ring.

X represents an alkylene group, an oxygen atom or a sulfur atom.

The index m represents the number of substituent groups, being an integer of 0 to 5; and preferably 0 or 1.

The alkyl group for $R_9$ is preferably an alkyl group having 1 to 4 carbon atoms, more preferably a methyl group or an ethyl group, and most preferably a methyl group. The cycloalkyl group includes, for example, a cyclopropyl group, a cyclobutyl group, a cyclopentyl group or a cyclohexyl group. The alkoxycarbonyl group includes, for example, a methoxycarbonyl group, an ethoxycarbonyl group, an n-butoxycarbonyl group or a t-butoxycarbonyl group. The alkoxy group includes, for example, a methoxy group, an ethoxy group, a propoxy group, isopropoxy group or a butoxy group. These groups may have a substituent group. The substituent group includes, for example, a hydroxyl group; an alkoxy group such as a methoxy group or an ethoxy group; a cyano group; and a halogen atom such as a fluorine atom. More preferably, $R_9$ is a methyl group, a cyano group or an alkoxycarbonyl group, further more preferably a cyano group.

The alkylene group for X includes, for example, a methylene group or an ethylene group. X is preferably an oxygen atom or a methylene group, more preferably a methylene group.

When m is 1 or more, it is preferable that at least one $R_9$ is substituted at the α- or β-position of the carbonyl group of the lactone. The $R_9$ group is most preferably substituted at the α-position of the carbonyl group of the lactone.

Specific examples of the repeating units having a group with a lactone structure or a sultone group represented by the formula (III-1) will be shown below, which however in no way limit the scope of the present invention. In the specific examples, R represents a hydrogen atom, an o alkyl group which may have a substituent group, or a halogen atom. R preferably represents a hydrogen atom, a methyl group, a hydroxymethyl group or an acetoxymethyl group.

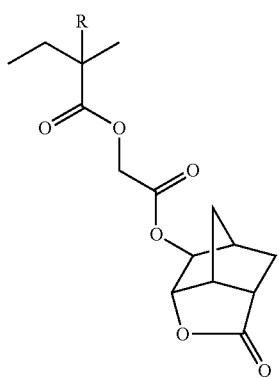
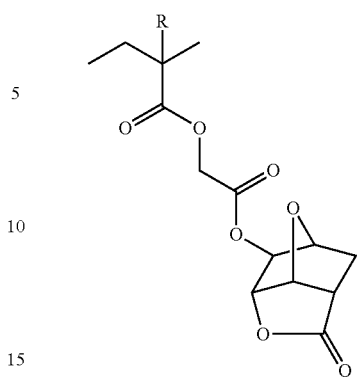
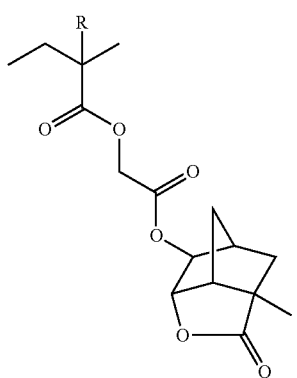
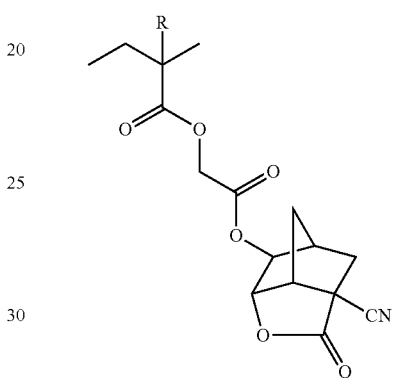
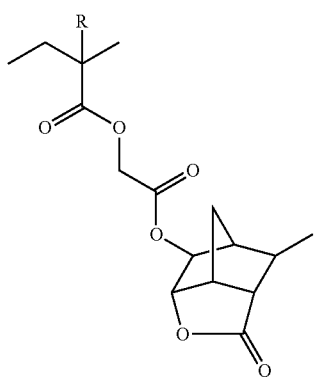
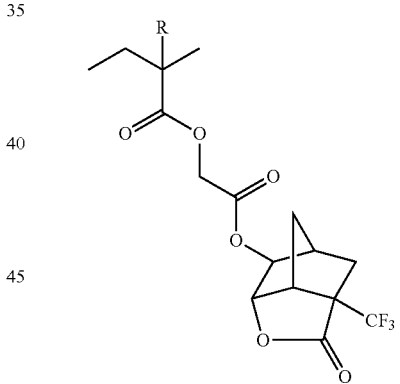
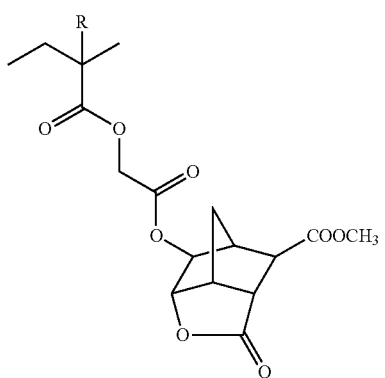
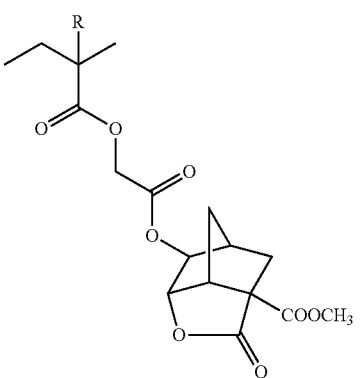

33
-continued
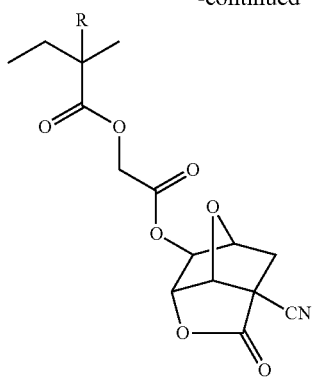
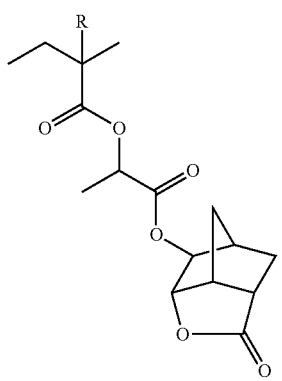
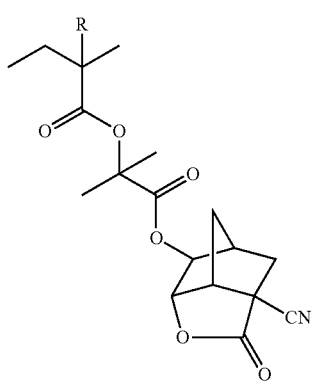
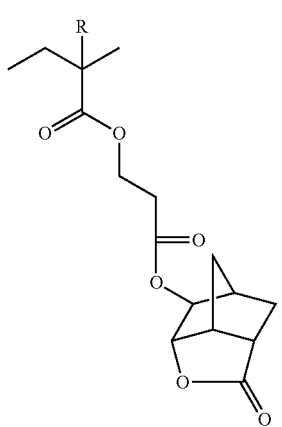
34
-continued
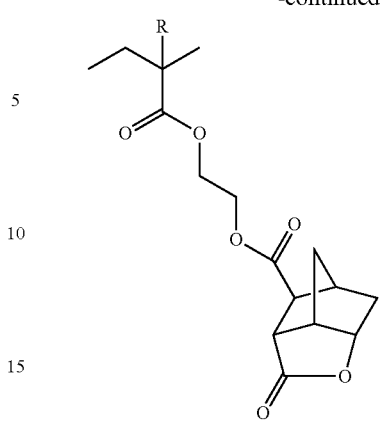
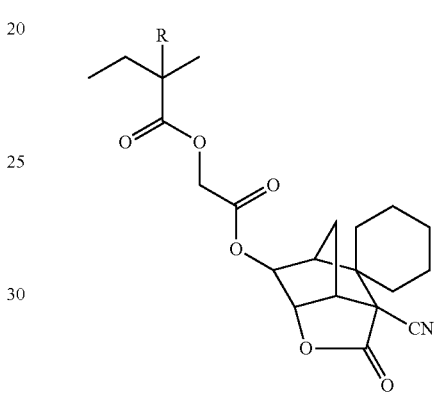
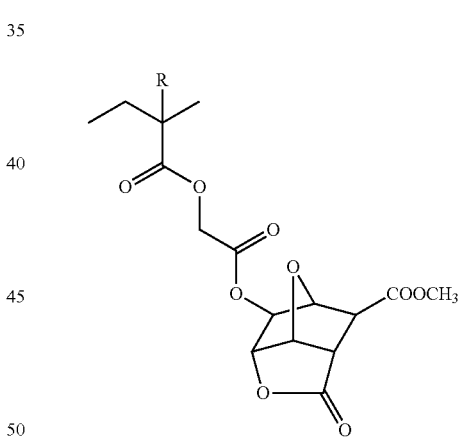
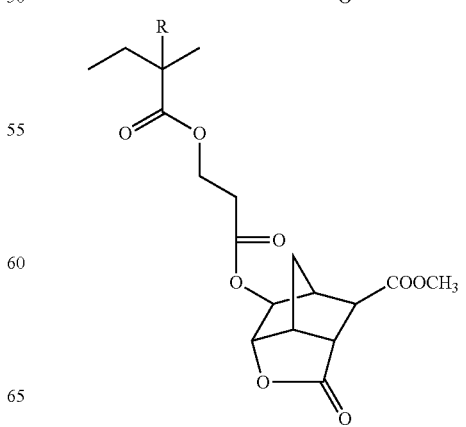

35
-continued
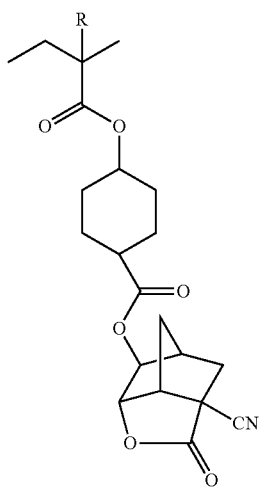
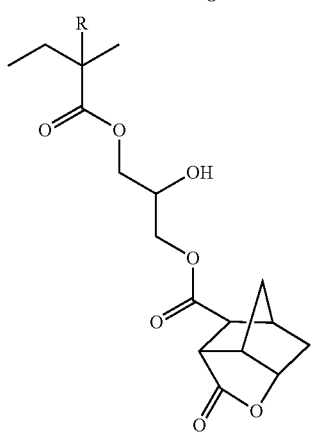
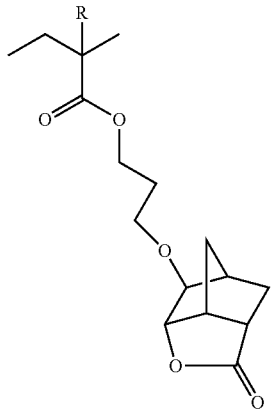
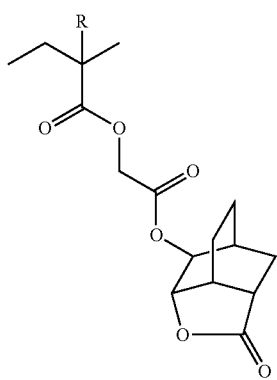
36
-continued
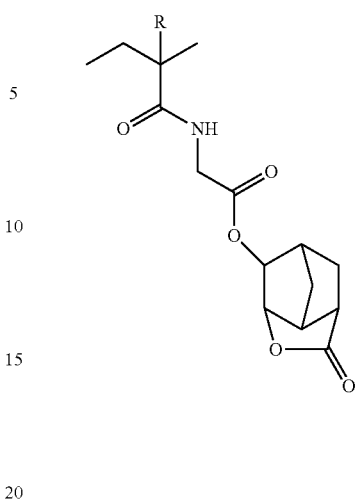
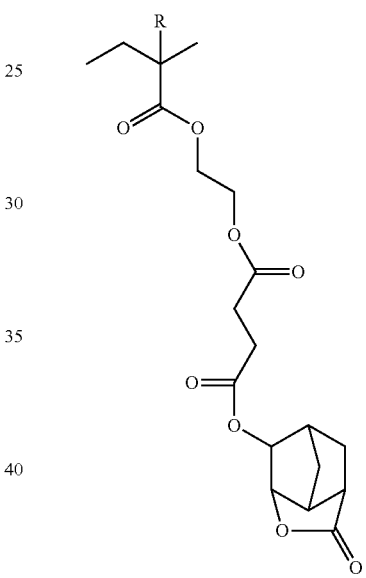
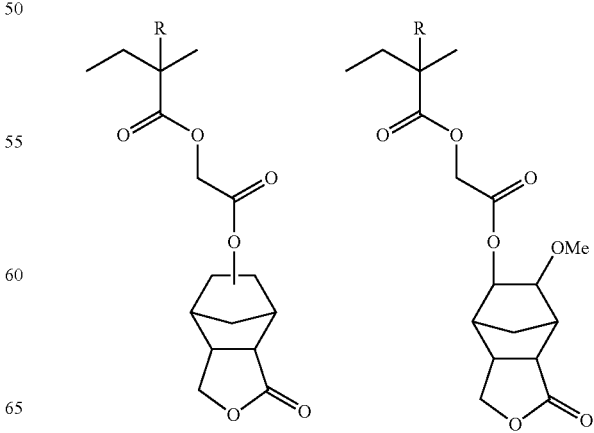

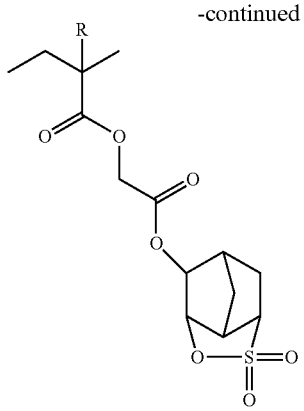

The percentage of the repeating units represented by the general formula (III), or the total percentage when two or more types of the repeating units are contained, is preferably in the range of 15 to 60 mol %, more preferably 20 to 60 mol % and further more preferably 30 to 50 mol %, based on all the repeating units of the resin.

In an embodiment, the repeating unit represented by the general formula (III) may be a repeating unit represented by the general formula (AII') below.

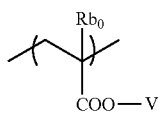

(AII')

In the general formula (AII'), $Rb_0$ represents a hydrogen atom, a halogen atom or an alkyl group having 1 to 4 carbon atoms. The substituent group, that the alkyl group for $Rb_0$ may have, includes a hydroxyl group and a halogen atom. The halogen atom for $Rb_0$ includes a fluorine atom, a chlorine atom, a bromine atom or an iodine atom. $Rb_0$ is preferably a hydrogen atom, a methyl group, a hydroxymethyl group, or a trifluoromethyl group, and more preferably a hydrogen atom or a methyl group.

V represents a group having any of the structure represented by the general formulae (LC1-1) to (LC1-17).

The resin (A) may contain a repeating unit having the above lactone structure besides the unit represented by the general formula (III).

Specific examples of repeating unit containing a lactone structure or sultone structure will be shown below besides above-mentioned specific examples, which in no way limit the scope of the present invention.

In the formulae, $R_x$ represents H, $CH_3$, $CH_2OH$, or $CF_3$.

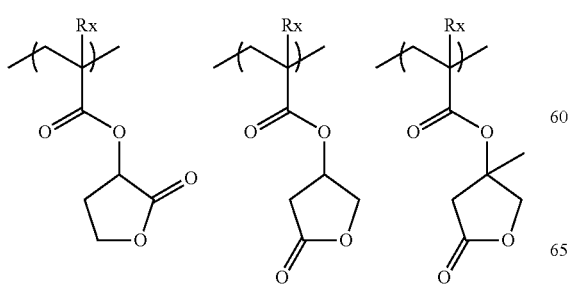

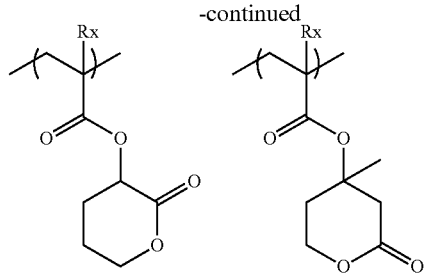

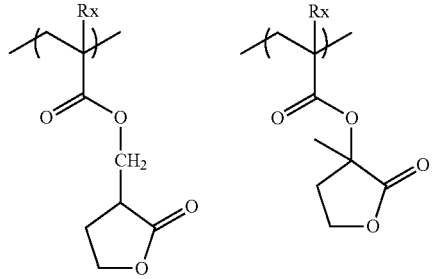

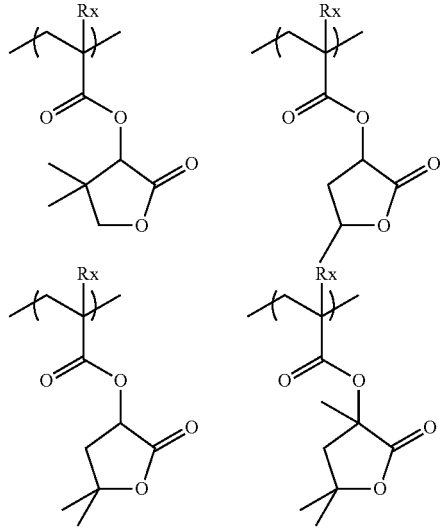

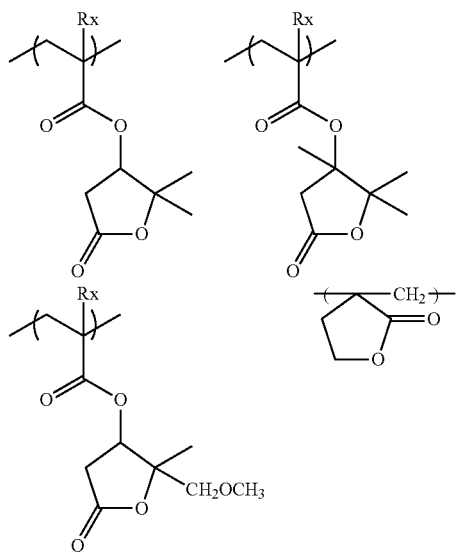

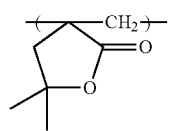
In the formulae, $R_x$ represents H, $CH_3$, $CH_2OH$, or $CF_3$.
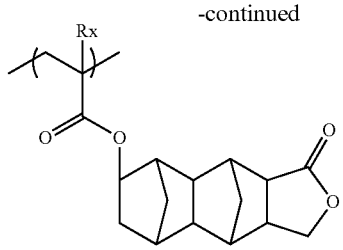
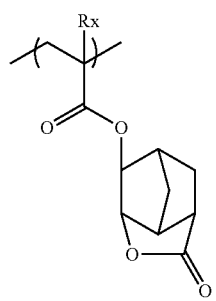 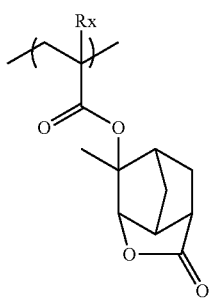
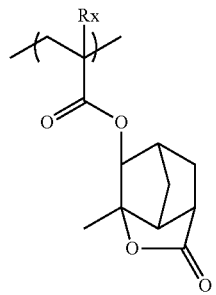 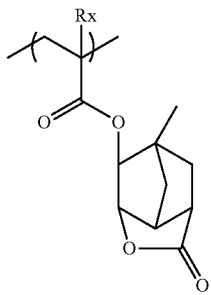
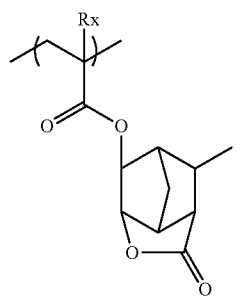 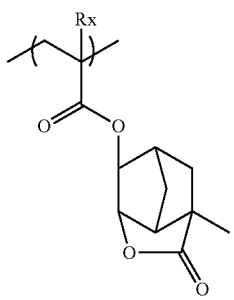
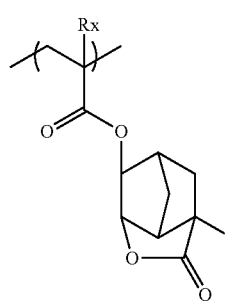 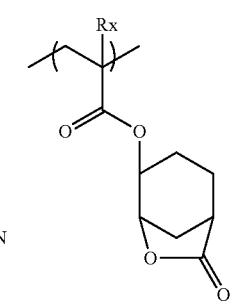
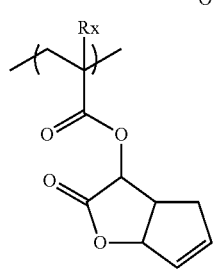 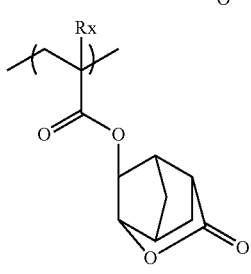

-continued
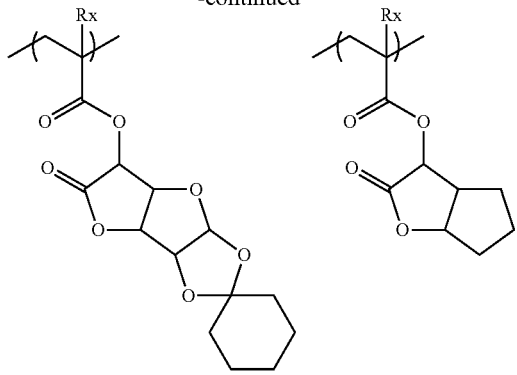
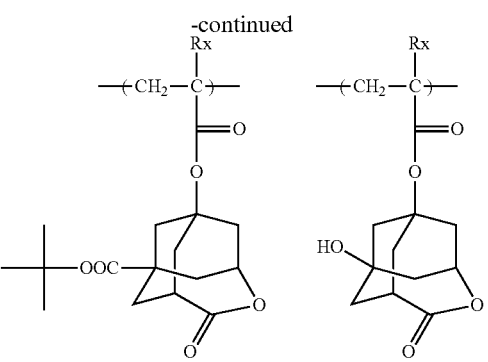
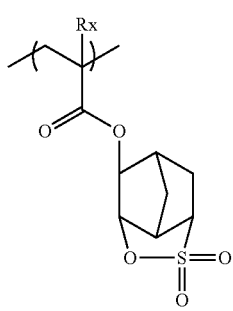
In the formulae, $R_x$ represents H, $CH_3$, $CH_2OH$, or $CF_3$.
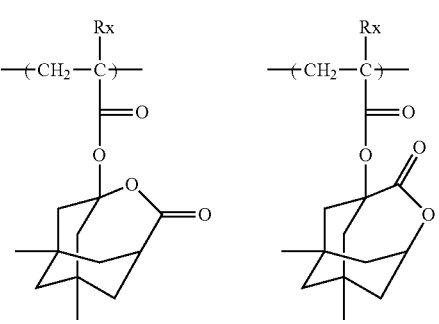
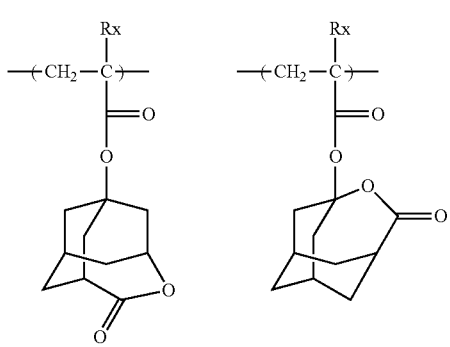
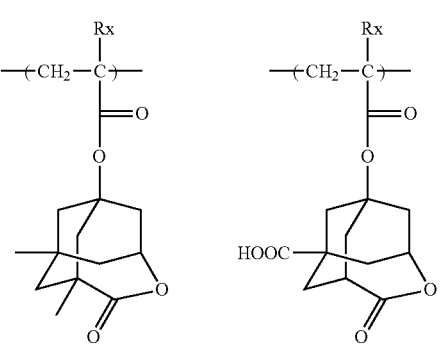
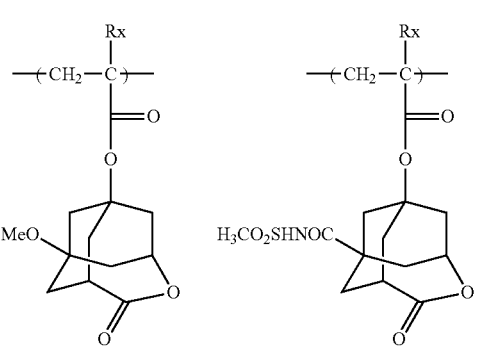
Particularly preferable repeating units of the above specific examples include the following repeating units. Favorable pattern profile and iso/dense bias can be realized by selecting appropriate lactone groups.
In the formulae, $R_x$ represents H, $CH_3$, $CH_2OH$, or $CF_3$.

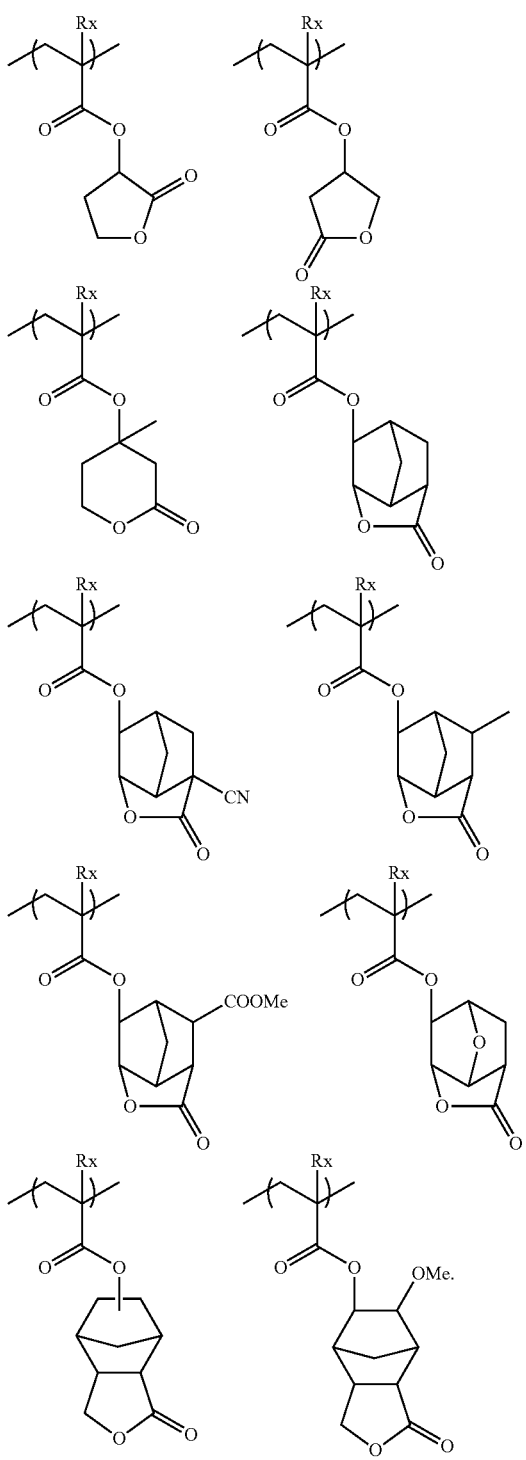

of the repeating units are contained, is preferably in the range of 15 to 60 mol %, more preferably 20 to 50 mol % and further more preferably 30 to 50 mol %, based on all the repeating units of the resin.

Two or more types of lactone repeating units selected from the general formula (III) can be used together in order to enhance the effect of the present invention. In the case of using two or more types together, it is preferable to select two or more types of lactone repeating units from the general formula (III) with the index n of 1.

It is preferable that the resin (A) has a repeating unit having a hydroxyl group or a cyano group other than repeating units represented by general formulae (AI) and (III). Such a repeating unit would enhance adhesion to substrate and developer affinity. The repeating unit having a hydroxyl group or a cyano group is preferably a repeating unit having an alicyclic hydrocarbon structure substituted with a hydroxyl group or a cyano group and is preferably free from the acid-decomposable group. In the alicyclic hydrocarbon structure substituted with a hydroxyl group or a cyano group, the alicyclic hydrocarbon structure is preferably an adamantyl group, a diamantyl group or a norbornane group. Alicyclic hydrocarbon structures substituted with a hydroxyl group or a cyano group preferably has the partial structures represented by the following general formulae (VIIa) to (VIId) below.

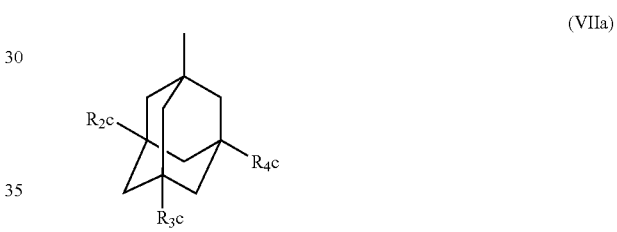

(VIIa)

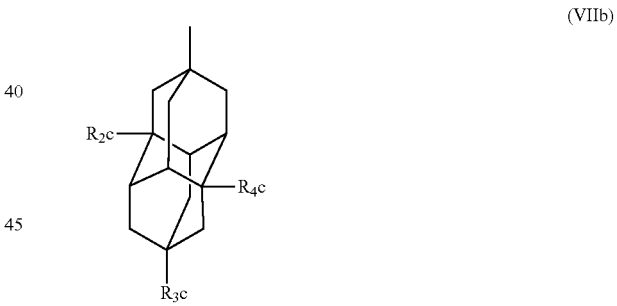

(VIIb)

(VIIc)

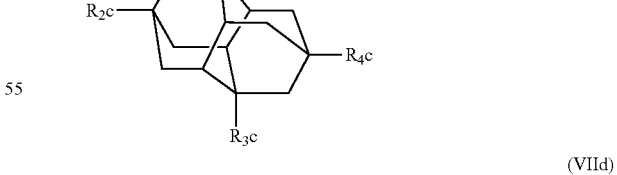

(VIId)

The repeating unit having a lactone group is generally present in the form of optical isomers. Any of the optical isomers may be used. A single type of optical isomer may be used alone, or a plurality of optical isomers may be used in the form of a mixture. When a single type of optical isomer is mainly used, the optical purity thereof is preferably 90% ee or higher, more preferably 95% ee or higher.

The percentage of the repeating unit containing a lactone group other than the repeating unit represented by the general formula (III), or the total percentage when two or more types In the general formulae (VIIa) to (VIIc), $R_2c$ to $R_4c$ each independently represents a hydrogen atom, a hydroxyl group or a cyano group, with the proviso that at least one of the $R_2c$ to $R_4c$ represents a hydroxyl group or a cyano group. Preferably, one or two of the $R_2c$ to $R_4c$ are hydroxyl groups and the remainder is a hydrogen atom. In the general formula (VIIa), more preferably, two of the $R_2c$ to $R_4c$ are hydroxyl groups and the remainder is a hydrogen atom.

The repeating units having any of the partial structures represented by the general formulae (VIIa) to (VIId) include those represented by the following general formulae (AIIa) to (AIId).

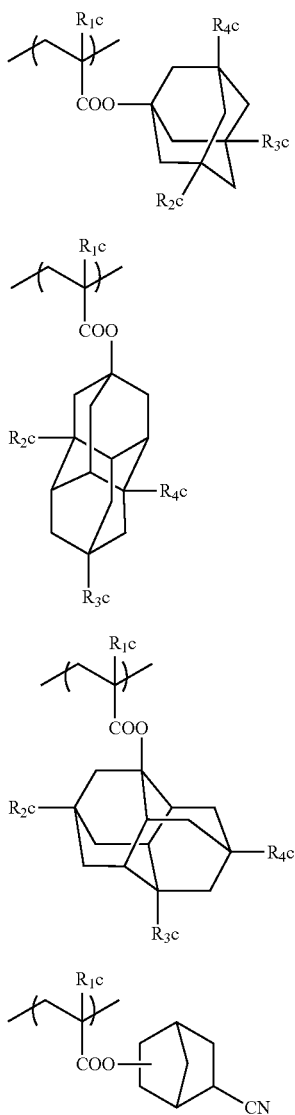

In general formulae (AIIa) to (AIId), $R_1c$ represents a hydrogen atom, a methyl group, a trifluoromethyl group or a hydroxymethyl group.

$R_{2c}$ to $R_{4c}$ have the same meanings as those of the general formulae (VIIa) to (VIIc).

The percentage of the repeating unit having a hydroxyl group or a cyano group based on all the repeating units of the resin (A) is preferably in the range of 5 to 40 mol %, more preferably 5 to 30 mol % and further more preferably 10 to 25 mol %.

Specific examples of the repeating units having a hydroxyl group or a cyano group will be shown below, which however in no way limit the scope of the present invention.

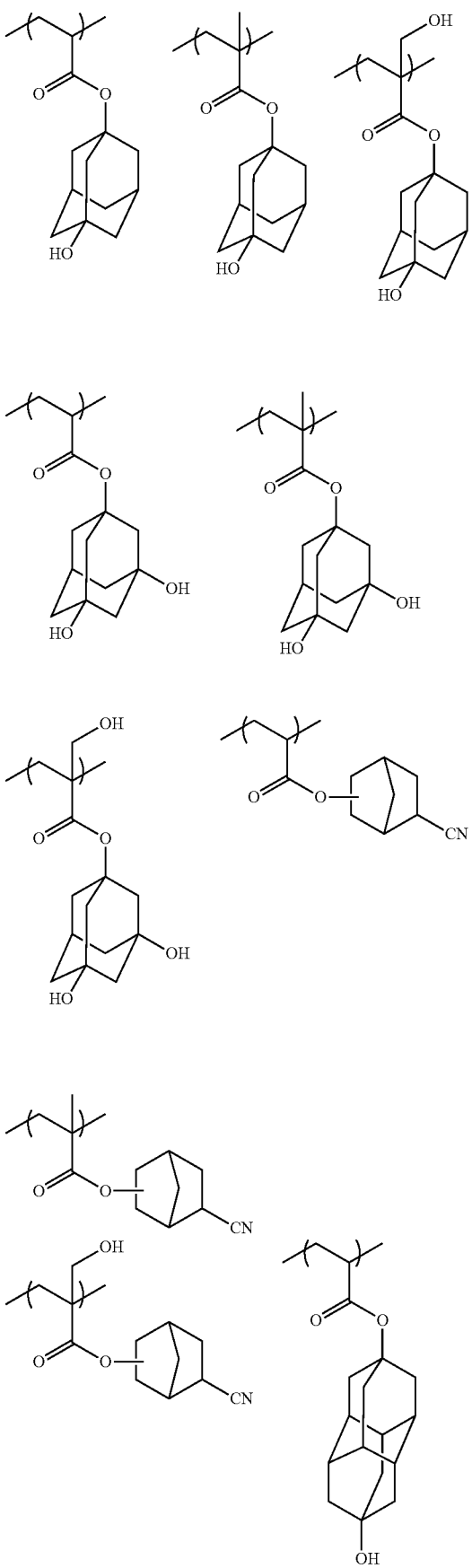

-continued

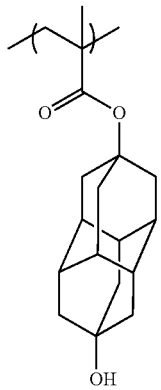
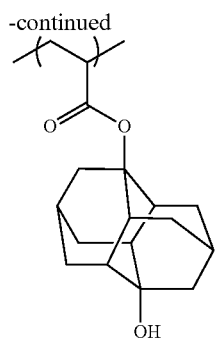
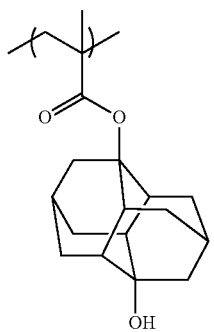

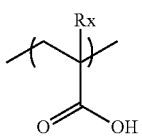
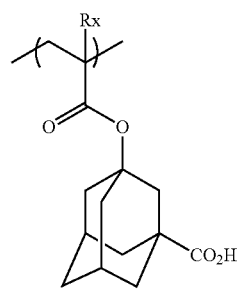
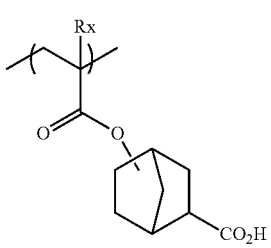
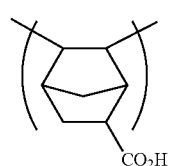
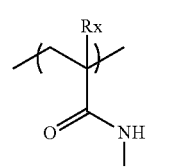
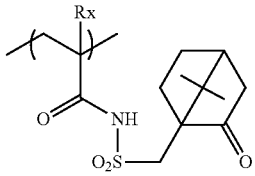
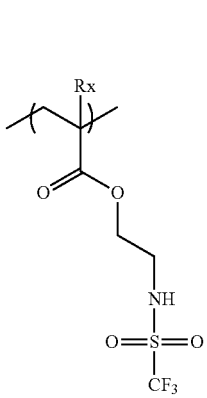
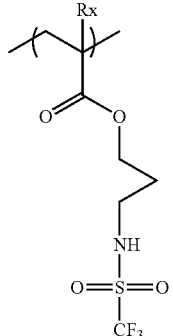
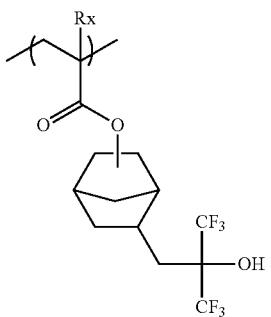

The resin used for the actinic-ray- or radiation-sensitive resin composition of the present invention may have a repeating unit containing an alkali-soluble group. The alkali-soluble group includes a carboxyl group, a sulfonamido group, a sulfonylimido group, a bisulfonylimido group or an aliphatic alcohol substituted with an electron withdrawing group at the α-position (for example, a hexafluoroisopropanol group). It is more preferred to contain a repeating unit having a carboxyl group or a sulfonamido group. The repeating unit having an alkali-soluble group improves resolution in contact hole usage. The repeating unit having an alkali-soluble group is preferably any of a repeating unit wherein the alkali-soluble group is directly bonded to the main chain of a resin such as a repeating unit of acrylic acid or methacrylic acid, a repeating unit wherein the alkali-soluble group is bonded via a connecting group to the main chain of a resin, and a repeating unit wherein the alkali-soluble group is introduced in a terminal of a polymer chain by use of a polymerization initiator or chain transfer agent having the alkali-soluble group in the stage of polymerization. The connecting group may have a mono- or polycyclohydrocarbon structure. The repeating unit of acrylic acid or methacrylic acid is especially preferred.

The percentage of the repeating unit having an alkali-soluble group based on all the repeating units of the resin is preferably in the range of 0 to 20 mol %, more preferably 3 to 15 mol % and further more preferably 5 to 10 mol %.

Specific examples of the repeating units having an alkali-soluble group will be shown below, which however in no way limit the scope of the present invention.

In the specific examples, $R_x$ represents H, $CH_3$, $CH_2OH$, or $CF_3$.

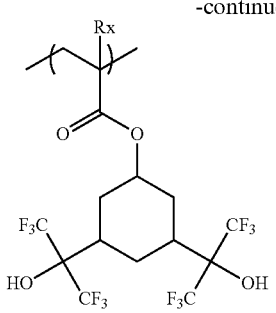

The resin (A) may further contain a repeating unit having an alicyclic hydrocarbon structure containing no polar group and exhibiting no acid decomposability. Such a repeating unit includes, for example, those represented by the general formula (IV) below.

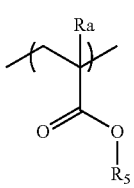

(IV)

In general formula (IV), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$, where $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. The monocyclic hydrocarbon group includes a cycloalkyl group having 3 to 12 carbon atoms such as a cyclopentyl group, a cyclohexyl group, a cyclohepyl group and a cyclooctyl group, and a cycloalkenyl group having 3 to 12 carbon atoms such as a cyclohexenyl group. The monocyclic hydrocarbon group is preferably a monocyclic hydrocarbon group having 3 to 7 carbon atoms, and more preferably includes a cyclopentyl group and a cyclohexyl group.

The polycyclic hydrocarbon groups include ring-assembly hydrocarbon groups and crosslinked-ring hydrocarbon groups. The ring-assembly hydrocarbon groups include, for example, a bicyclohexyl group and a perhydronaphthalenyl group. The crosslinked-ring hydrocarbon rings include, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$]undecane rings; and tetracyclic hydrocarbon rings, such as tetracyclo[4.4.0.1$^{2,5}$.1$^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, per- hydrophenanthrene, perhydroacenaphthene, perhydrofluorene, perhydroindene and perhydrophenalene rings.

Preferable crosslinked-ring hydrocarbon rings include a norbornyl group, an adamantyl group, a bicyclooctanyl group, and a tricyclo[5.2.1.0$^{2,6}$]decanyl group. More preferable crosslinked-ring hydrocarbon rings include a norbornyl group and an adamantyl group.

These alicyclic hydrocarbon groups may have a substituent group. Preferable substituent group includes a halogen atom, an alkyl group, a hydroxyl group protected by a protective group, and an amino group protected by a protective group. The halogen atom is preferably a bromine, chlorine or fluorine atom. The alkyl group is preferably a methyl, ethyl, butyl or t-butyl group. The alkyl group may further have a substituent group. Further substituent group includes a halogen atom, an alkyl group, a hydroxyl group protected by a protective group, and an amino group protected by a protective group.

The protective group includes, for example, an alkyl group, a cycloalkyl group, an aralkyl group, a substituted methyl group, a substituted ethyl group, an alkoxycarbonyl group and an aralkyloxycarbonyl group. Preferable alkyl groups include alkyl groups having 1 to 4 carbon atoms. Preferable substituted methyl groups include methoxymethyl, methoxythiomethyl, benzyloxymethyl, t-butoxymethyl and 2-methoxyethoxymethyl groups. Preferable substituted ethyl groups include 1-ethoxyethyl and 1-methyl-1-methoxyethyl groups. Preferable acyl groups include aliphatic acyl groups having 1 to 6 carbon atoms, such as formyl, acetyl, propionyl, butyryl, isobutyryl, valeryl and pivaloyl groups. Preferable alkoxycarbonyl groups include alkoxycarbonyl groups having 1 to 4 carbon atoms and the like.

The percentage of the repeating unit having an alicyclic hydrocarbon structure containing no polar group and exhibiting no acid decomposability based on all the repeating units of the resin (A) is preferably in the range of 0 to 40 mol %, more preferably 0 to 20 mol %.

Specific examples of the repeating unit having an alicyclic hydrocarbon structure containing no polar group and exhibiting no acid decomposability will be shown below, which however in no way limit the scope of the present invention. In the formulae, Ra represents H, $CH_3$, $CH_2OH$ or $CF_3$.

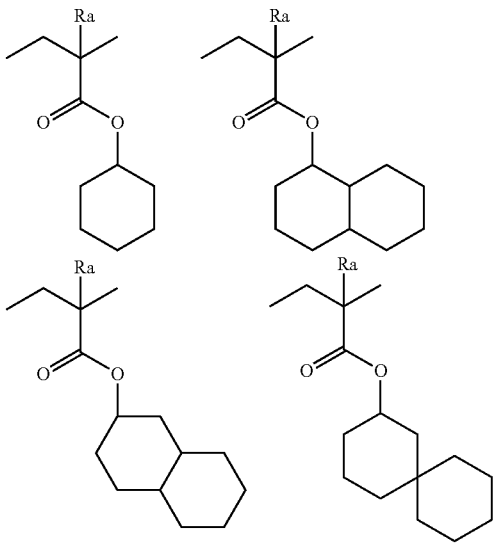

-continued

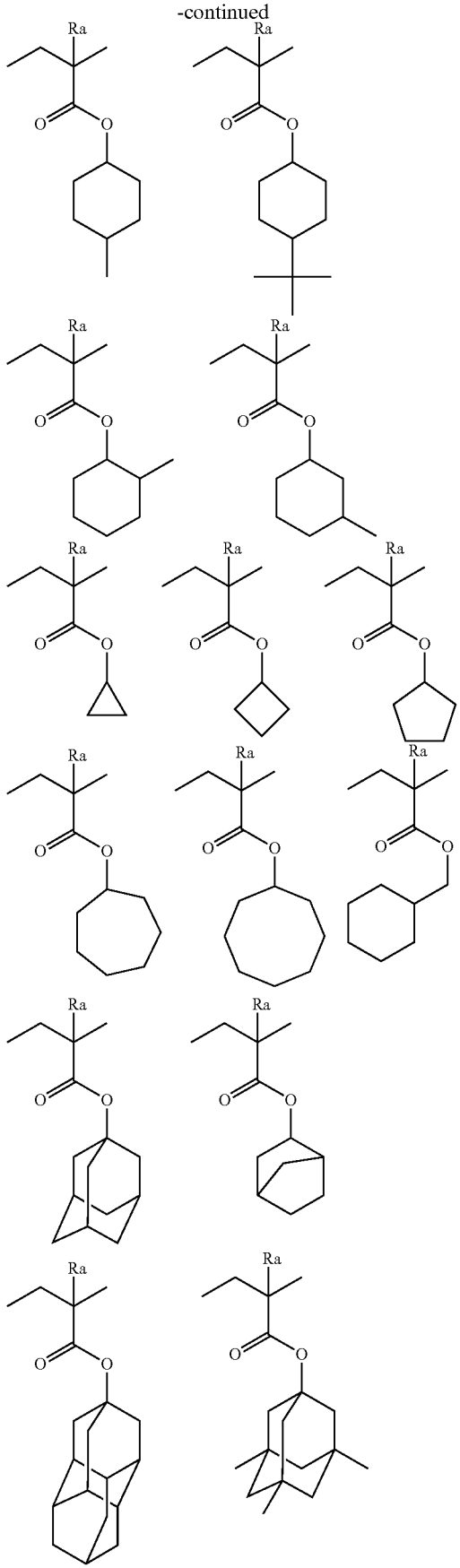

-continued

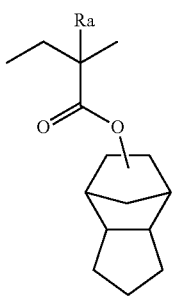

The resin (A) used for the composition of the present invention may have various repeating structural units other than those mentioned hereinbefore in order to regulate the dry etching resistance, standard developer adaptability, adherence to substrates, pattern profile, and properties generally required for the resist such as resolving power, heat resistance, and sensitivity.

Such repeating structural units include those corresponding to the following monomers, which however in no way limit the scope of the present invention.

Such repeating structural units would permit to finely regulate the properties required for the resin used in the composition of the present invention, especially, (1) solubility in a coating solvent, (2) film forming easiness (glass transition temperature), (3) alkali developability, (4) film thinning (selection of hydrophilicity/hydrophobicity and alkali soluble group), (5) adhesion of unexposed areas to substrate, and (6) dry etching resistance.

Such monomers include compounds having an unsaturated bond capable of addition polymerization selected from acrylic esters, methacrylic esters, acrylamides, methacrylamides, allyl compounds, vinyl ethers, vinyl esters.

Otherwise unsaturated compounds capable of addition polymerization that are copolymerizable with the monomers corresponding to the above various repeating structural units can be copolymerized.

The molar ratios of individual repeating structural units contained in the resin (A) are appropriately determined from the viewpoint of regulation of not only the resist dry etching resistance but also the standard developer adaptability, substrate adhesion, pattern profile, and properties generally required for the resist such as resolving power, heat resistance, and sensitivity.

When the composition of the present invention is used in ArF exposure, it is preferred for the resin (A) to contain no aromatic group from the viewpoint of transparency to ArF light. More specifically, percentage of the repeating units having an aromatic group is preferably 5 mol % or less, more preferably 3 mol % or less, further more preferably zero, based on all the repeating units in the resin (A). It is preferred for the resin (A) to contain a monocyclic or polycyclic alicyclic hydrocarbon structure.

Note that it is preferred for the resin (A) to contain neither a fluorine atom nor a silicon atom from the viewpoint of compatibility with a hydrophobic resin to be described hereinafter.

Preferred resin (A) is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. Further, a copolymer containing 20 to 50 mol % of (meth)acrylate repeating unit having an acid-decomposable group; 20 to 50 mol % of (meth)acrylate repeating unit having a lactone structure; 5 to 30 mol % of (meth)acrylate repeating unit containing an alicyclic hyadrocarbon structure substituted with a hydroxyl group or a cyano group; and 0 to 20 mol % of other (meth)acrylate repeating units is more preferred.

In the event of exposing the composition of the present invention to KrF excimer laser beams, electron beams, X-rays or high-energy light rays with wavelength of 50 nm or less (EUV, etc.), it is preferred for the resin (A) to further have hydroxystyrene-based repeating units. It is more preferred for the resin (A) to have hydroxystyrene-based repeating units, hydroxystyrene-based repeating units protected by an acid-decomposable group and acid-decomposable repeating units of a (meth)acrylic acid tertiary alkyl ester, etc.

Preferred hydroxystyrene-based repeating units having an acid-decomposable group include, for example, repeating units derived from t-butoxycarbonyloxystyrene, 1-alkoxyethoxystyrene and (meth)acrylic acid tertiary alkyl ester. Repeating units derived from 2-alkyl-2-adamantyl(meth)acrylate and dialkyl(1-adamantyl)methyl(meth)acrylate are more preferred.

The resin (A) of the present invention can be synthesized by conventional techniques (for example, radical polymerization). The general synthetic methods include, for example, a batch polymerization method in which a monomer species and an initiator are dissolved in a solvent and heated so as to accomplish polymerization, and a dropping polymerization method in which a solution of monomer species and initiator is added by dropping to a heated solvent over a period of 1 to 10 hours. The dropping polymerization method is preferred. A reaction solvent includes, for example, ethers, such as tetrahydrofuran, 1,4-dioxane or diisopropyl ether; ketones, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. Preferred initiators include azobisisobutyronitrile, azobisdimethylvaleronitrile, dimethyl-2,2'-azobis(2-methylpropionate). If desired, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10 to 150° C., preferably 30 to 120° C. and more preferably 60 to 100° C.

The weight average molecular weight of the resin (A) in terms of polystyrene molecular weight as measured by GPC is preferably in the range of 1000 to 200,000, more preferably 2000 to 20,000, still more preferably 3000 to 15,000 and further preferably 5000 to 13,000. The weight average molecular weight of 1000 to 200,000 would prevent deterioration of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the ratio of the resin (A) based on the total solid components of the whole composition is preferably in the range of 30 to 99 mass %, and more preferably 60 to 95 mass %.

The resin (A) of the present invention may either be used alone or in combination.

A resin other than the resin (A) of the present invention may be used in combination with the same in a range not detrimental to the effects of the present invention. The resin other than the resin (A) of the present invention includes an acid-decomposable resin which may contain above-mentioned repeating units that the resin (A) can contain, or other known acid-decomposable resin.

(B) Compound Represented by the General Formula (1-1)

As mentioned above, the composition of the present invention comprises any of compounds (B) of general formula (1-1) below. The compounds (B) are configured so as to, when exposed to actinic rays or radiation, be decomposed to generate an acid. Namely, the compounds (B) function as acid generators.

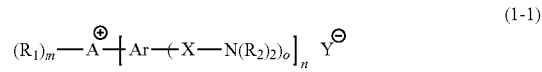

(1-1)

In the formula,

A represents a sulfur atom or an iodine atom.

$R_1$ each independently represents an alkyl group, an alkenyl group, a cycloaliphatic group, an aromatic hydrocarbon group or a heterocyclic hydrocarbon group, provided that when m=2, two $R_1$s may be bonded to each other to form a ring.

Ar each independently represents an aromatic ring group.

X each independently represents a bivalent connecting group.

$R_2$s each independently represents a hydrogen atom, an alkyl group, an alkenyl group, a cycloaliphatic group, an aromatic hydrocarbon group or a heterocyclic hydrocarbon group.

At least two groups selected from X and two $R_2$s may be bonded to each other to form a ring.

Provided that, to the nitrogen atom (N) of the general formula (1-1), at least one cycloaliphatic group, aromatic hydrocarbon group, heterocyclic hydrocarbon group or chain aliphatic group whose moiety adjacent to the nitrogen atom is a tertiary or quaternary carbon atom is directly bonded.

When A is a sulfur atom, n is an integer of 1 to 3, and m is an integer satisfying the relationship m+n=3.

When A is an iodine atom, n is an integer of 1 or 2, and m is an integer satisfying the relationship m+n=2, o is an integer of 1 to 10, and $Y^-$ represents a non-nucleophilic anion.

The inventors have found that in the patterning using conventional compounds, there is room for improvement with respect to the temporal stability of pattern width. In addition, the inventors have found that the change of pattern width over time is attributed to chemical reactions between individual components in the composition. Furthermore, the inventors have found that a nucleophilic reaction by a nitrogen atom contained in a component plays an important role as one of the chemical reactions causing the change of pattern width over time.

On the basis of these findings, in the above compound (B), steric hindrance is introduced around a nitrogen atom providing a basic moiety. Accordingly, the nitrogen atom of the compound (B) exhibits a relatively low nucleophilicity. Namely, any nucleophilic reaction between the compound (B) and other components of the composition can be suppressed. Therefore, the temporal stability of pattern width can be improved by using the compound (B).

$R_1$, when m=2, each independently represents an alkyl group, an alkenyl group, a cycloaliphatic group, an aromatic hydrocarbon group or a heterocyclic hydrocarbon group. When m=2, two R's may be bonded to each other to form a ring. Substituent groups may further be introduced in these groups and ring.

The alkyl group represented by $R_1$ may be in the form of a linear or branched chain. This alkyl group preferably has 1 to 50 carbon atoms, more preferably 1 to 30 carbon atoms and further more preferably 1 to 20 carbon atoms. As such an alkyl group, there can be mentioned, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group or a 2-ethylhexyl group.

The alkenyl group represented by $R_1$ may be in the form of a linear or branched chain. This alkenyl group preferably has 2 to 50 carbon atoms, more preferably 2 to 30 carbon atoms and further more preferably 3 to 20 carbon atoms. As such an alkenyl group, there can be mentioned, for example, a vinyl group, an allyl group or a styryl group.

The cycloaliphatic group represented by $R_1$ is, for example, a cycloalkyl group. The cycloalkyl group may be monocyclic or polycyclic. This cycloaliphatic group is preferably a monocycloalkyl group having 3 to 8 carbon atoms, such as a cyclopropyl group, a cyclopentyl group or a cyclohexyl group.

The aromatic hydrocarbon group represented by $R_1$ is preferably one having 6 to 14 carbon atoms. As such a group, there can be mentioned, for example, an aryl group, such as a phenyl group or a naphthyl group. It is preferred for the aromatic hydrocarbon group represented by $R_1$ to be a phenyl group.

The heterocyclic hydrocarbon group represented by $R_1$ may have or may not have aromaticity. It is preferred for the heterocyclic hydrocarbon group to have aromaticity.

The heterocycle contained in the above heterocyclic hydrocarbon group may be monocyclic or polycyclic. As the heterocycle, there can be mentioned, for example, an imidazole ring, a pyridine ring, a pyrazine ring, a pyrimidine ring, a pyridazine ring, a 2H-pyrrole ring, a 3H-indole ring, a 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isooxazole ring or a benzothiazole ring.

The ring formed by two $R_1$s is preferably a 4- to 7-membered ring, more preferably a 5- or 6-membered ring and most preferably a 5-membered ring.

Preferably, $R_1$ is an aromatic hydrocarbon group, or $R_1$s are bonded to each other to form a ring.

When substituent groups are further introduced in the groups represented by $R_1$ and the rings formed by the mutual bonding of two $R_1$s, the substituent groups are, for example, as follows. Namely, as the substituent groups, there can be mentioned, for example, a halogen atom (—F, —Br, —Cl or —I), a hydroxyl group, an alkoxy group, an aryloxy group, a mercapto group, an alkylthio group, an arylthio group, an amino group, an acyloxy group, a carbamoyloxy group, an alkylsulfoxy group, an arylsulfoxy group, an acylthio group, an acylamino group, a ureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, a carbamoyl group, an alkylsulfinyl group, an arylsulfinyl group, an alkylsulfonyl group, an arylsulfonyl group, a sulfo group (—$SO_3H$) or its conjugated base group (referred to as a sulfonato group), an alkoxysulfonyl group, an aryloxysulfonyl group, a sulfinamoyl group, a phosphono group (—$PO_1H_2$) or its conjugated base group (referred to as a phosphonato group), a phosphonooxy group (—$OPO_3H_2$) or its conjugated base group (referred to as a phosphonatooxy group), a cyano group, a nitro group, an aryl group, an alkenyl group, an alkynyl group, a heterocyclic group, a silyl group and an alkyl group.

Among these substituent groups, a halogen atom, an alkyl group and an alkoxy group are especially preferred. The alkyl group is, for example, the same as mentioned above in connection with $R_1$.

Ar, when n≥2, each independently represents an aromatic ring group. This aromatic ring group may contain a heterocycle as the aromatic ring. This aromatic ring may be monocyclic or polycyclic.

This aromatic ring group preferably has 6 to 14 carbon atoms. As such a group, there can be mentioned, for example, an aryl group, such as a phenyl group, a naphthyl group or an anthryl group. When the aromatic ring group contains a heterocycle, as the heterocycle, there can be mentioned, for example, a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, a carbazole ring or a thiazole ring.

The aromatic ring group represented by Ar is preferably a phenyl group or a naphthyl group, most preferably a phenyl group.

A substituent group other than the groups of formula: —(X—N($R_2$)$_2$) to be described below may further be introduced in the aromatic ring group represented by Ar. As the substituent group, use can be made of, for example, any of those set forth above in connection with $R_1$.

The aromatic ring group represented by Ar is substituted with any of the groups of formula: —(X—N($R_2$)$_2$).

X, when o≥2 and/or n≥2, each independently represents a bivalent connecting group The connecting group represented by X comprises, for example, an alkylene group, a cycloalkylene group, an arylene group, —COO—, —CO— or a combination of these. This connecting group may comprise a combination of any of these groups with at least one member selected from the group consisting of —O—, —S—, —OCO—, —S(=O)—, —S(=O)$_2$—, —OS(=O)$_2$— and —NR—. In the —NR—, R represents, for example, a hydrogen atom, an alkyl group, a cycloalkyl group or an aryl group.

The alkylene group optionally contained in the connecting group represented by X may be in the form of a linear or branched chain. The alkylene group preferably has 1 to 20 carbon atoms, more preferably 1 to 10 carbon atoms. As such an alkylene group, there can be mentioned, for example, a methylene group, an ethylene group, a propylene group or a butylene group.

The cycloalkylene group optionally contained in the connecting group represented by X may be monocyclic or polycyclic. The cycloalkylene group preferably has 3 to 20 carbon atoms, more preferably 3 to 10 carbon atoms. As such a cycloalkylene group, there can be mentioned, for example, a 1,4-cyclohexylene group.

The arylene group optionally contained in the connecting group represented by X preferably has 6 to 20 carbon atoms, more preferably 6 to 10 carbon atoms. As such an arylene group, there can be mentioned, for example, a phenylene group or a naphthylene group.

$R_2$, when o≥2 and/or n≥2, each independently represents a hydrogen atom, an alkyl group, an alkenyl group, a cycloaliphatic group, an aromatic hydrocarbon group or a heterocyclic hydrocarbon group.

The alkyl group represented by $R_2$ may be in the form of a linear or branched chain. This alkyl group preferably has 1 to 50 carbon atoms, more preferably 1 to 30 carbon atoms and further more preferably 1 to 20 carbon atoms. As such an alkyl group, there can be mentioned, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group or a 2-ethylhexyl group.

The alkenyl group represented by $R_2$ may be in the form of a linear or branched chain. This alkenyl group preferably has 2 to 50 carbon atoms, more preferably 2 to 30 carbon atoms and further more preferably 3 to 20 carbon atoms. As such an alkenyl group, there can be mentioned, for example, a vinyl group, an allyl group or a styryl group.

The cycloaliphatic group represented by $R_2$ is, for example, a cycloalkyl group. The cycloalkyl group may be monocyclic or polycyclic. This cycloaliphatic group is preferably a monocycloalkyl group having 3 to 8 carbon atoms, such as a cyclopropyl group, a cyclopentyl group or a cyclohexyl group.

The cycloaliphatic group represented by $R_2$ may be a lactone group (group with a lactone structure). As such a group, there can be mentioned, for example, any of the above-mentioned lactone groups of general formulae (LC1-1) to (LC1-17).

The aromatic hydrocarbon group represented by $R_2$ is preferably one having 6 to 14 carbon atoms. As such a group, there can be mentioned, for example, an aryl group, such as a phenyl group or a naphthyl group. It is preferred for the aromatic hydrocarbon group represented by $R_2$ to be a phenyl group.

The heterocyclic hydrocarbon group represented by $R_2$ may have or may not have aromaticity. It is preferred for the heterocyclic hydrocarbon group to have aromaticity.

The heterocycle contained in the heterocyclic hydrocarbon group may be monocyclic or polycyclic. As the heterocycle, there can be mentioned, for example, an imidazole ring, a pyridine ring, a pyrazine ring, a pyrimidine ring, a pyridazine ring, a 2H-pyrrole ring, a 3H-indole ring, a 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isooxazole ring or a benzothiazole ring.

As mentioned above, in the compound (B), at least two groups selected from X and two $R_2$s are bonded to each other to form a ring. Alternatively, to at least one nitrogen atom in the general formula (1-1), at least one cycloaliphatic group, aromatic hydrocarbon group, heterocyclic hydrocarbon group or chain aliphatic group whose moiety adjacent to the nitrogen atom is a tertiary or quaternary carbon atom is directly bonded. If so, a steric hindrance is introduced around the nitrogen atom, so that the nucleophilicity thereof can be effectively suppressed.

Substituent groups may further be introduced in the rings formed by the mutual bonding of at least two groups selected from X and two $R_2$s groups and the groups directly bonded to the nitrogen atom. The substituent groups are, for example, as follows.

Namely, as the substituent groups, there can be mentioned, for example, a halogen atom (—F, —Br, —Cl or —I), a hydroxyl group, an alkoxy group, an aryloxy group, an alkoxycarbonyl group, an alkylcarbonyloxy group, a mercapto group, an alkylthio group, an arylthio group, an amino group, an acyloxy group, a carbamoyloxy group, an alkylsulfoxy group, an arylsulfoxy group, an acylthio group, an acylamino group, a ureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, a carbamoyl group, an alkylsulfinyl group, an arylsulfinyl group, an alkylsulfonyl group, an arylsulfonyl group, a sulfo group (—SO$_3$H) or its conjugated base group (referred to as a sulfonato group), an alkoxysulfonyl group, an aryloxysulfonyl group, a sulfinamoyl group, a phosphono group (—PO$_3$H$_2$) or its conjugated base group (referred to as a phosphonato group), a phosphonooxy group (—OPO$_3$H$_2$) or its conjugated base group (referred to as a phosphonatooxy group), a cyano group, a nitro group, an aryl group, an alkenyl group, an alkynyl group, a heterocyclic group, a silyl group and an alkyl group.

Among the substituent groups, an electron withdrawing group is preferred. For example, the basicity of the compound (B) can be appropriately lowered by introducing an electron withdrawing group as a substituent group. As such an electron withdrawing group, there can be mentioned, for example, an alkoxy group, a carboxyl group, an alkoxycarbonyl group, an alkylcarbonyloxy group or a cyano group.

In these structures, it is preferred for all the atoms adjacent to a nitrogen atom contained in each of the structures to be carbon atoms or hydrogen atoms from the viewpoint of improvement of basicity. Further, from the viewpoint of improvement of basicity, it is preferred for any electron withdrawing group, such as a carbonyl group, a sulfonyl group, a cyano group or a halogen atom, not to be directly bonded to the nitrogen atom.

When the nitrogen atom is a part of a nitrogen-containing heterocyclic group, the nitrogen-containing heterocyclic group may have or may not have aromaticity. Further, the nitrogen-containing heterocyclic group may be monocyclic or polycyclic. The nitrogen-containing heterocyclic group is preferably a group containing any of a piperidine ring, a morpholine ring, a pyrrolidine ring, a pyridine ring, an imidazole ring, a pyrazine ring, a pyrrole ring and a pyrimidine ring.

It is preferred for Ar, X and $R_2$ in the general formula (1-1) to satisfy the following requirement. Namely, these groups are preferably configured so that a conjugate acid of a compound expressed by general formula (1-1P) below exhibits a pKa value of 0 or higher, more preferably in the range of 0 to 11, further more preferably 2 to 9, and most preferably 3 to 7.

$$H\text{—}Ar\text{—}X\text{—}N(R_2)_2 \quad (1\text{-}1P)$$

If the above requirement is satisfied, the temporal stability of pattern width can be enhanced. This pKa value refers to a value calculated by ACD/ChemSketch (ACD/Labs 8.00 Release Product Version: 8.08).

In the general formula (1-1), o is an integer of 1 to 10, preferably 1 to 4, more preferably 1 or 2 and further more preferably 1.

It is preferred for $Y^-$ to be a non-nucleophilic anion. Herein, the non-nucleophilic anion refers to an anion whose capability of inducing a nucleophilic reaction is markedly low, which anion is capable of suppressing any decomposition over time by an intramolecular nucleophilic reaction. The non-nucleophilic anion enhances the temporal stability of the composition of the present invention.

As the non-nucleophilic anion represented by $Y^-$, there can be mentioned, for example, a sulfonate anion, a carboxylate anion, a sulfonylimido anion, a bis(alkylsulfonyl)imido anion, a tris(alkylsulfonyl)methyl anion or the like.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety in the aliphatic sulfonate anion may be an alkyl group or a cycloalkyl group, being preferably an alkyl group having 1 to 30 carbon atoms or a cycloalkyl group having 3 to 30 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a bornyl group or the like.

As a preferred aromatic group in the aromatic sulfonate anion, there can be mentioned an aryl group having 6 to 14 carbon atoms, for example, a phenyl group, a tolyl group, a naphthyl group or the like.

Substituent groups may be introduced in the alkyl group, cycloalkyl group and aryl group of the aliphatic sulfonate anion and aromatic sulfonate anion. As the substituent groups introduced in the alkyl group, cycloalkyl group and aryl group of the aliphatic sulfonate anion and aromatic sulfonate anion, there can be mentioned, for example, a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) and the like. With respect to the aryl group or ring structure of each of these groups, as its substituent group, there can further be mentioned an alkyl group (preferably having 1 to 15 carbon atoms).

As the aliphatic moiety of the aliphatic carboxylate anion, there can be mentioned any of the same alkyl groups and cycloalkyl groups as mentioned above with respect to the aliphatic sulfonate anion.

As the aromatic group of the aromatic carboxylate anion, there can be mentioned any of the same aryl groups as mentioned above with respect to the aromatic sulfonate anion.

As a preferred aralkyl group in the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

Substituent groups may be introduced in the alkyl group, cycloalkyl group, aryl group and aralkyl group of the aliphatic carboxylate anion, aromatic carboxylate anion and aralkyl carboxylate anion. As the substituent groups introduced in the alkyl group, cycloalkyl group, aryl group and aralkyl group of the aliphatic carboxylate anion, aromatic carboxylate anion and aralkyl carboxylate anion, there can be mentioned, for example, the same halogen atoms, alkyl groups, cycloalkyl groups, alkoxy groups, alkylthio groups, etc., as mentioned above with respect to the aromatic sulfonate anion.

As the sulfonylimido anion, there can be mentioned, for example, a saccharin anion.

The alkyl group in the bis(alkylsulfonyl)imido anion and tris(alkylsulfonyl)methyl anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like. As substituent groups introduced in these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group and the like. An alkyl group substituted with a fluorine atom is preferred. In a preferred form, two alkyl groups in the bis(alkylsulfonyl)imido anion may be bonded to each other to form a ring structure. In that instance, the formed ring structure is preferably a 5- to 7-membered ring.

As the other non-nucleophilic anions, there can be mentioned, for example, phosphorus fluoride, boron fluoride, antimony fluoride and the like.

The non-nucleophilic anion represented by $Y^-$ is preferably selected from an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the non-nucleophilic anion is a perfluorinated aliphatic sulfonate anion having 4 to 8 carbon atoms or a benzenesulfonate anion having a fluorine atom. Further more preferably, the non-nucleophilic anion is a nonafluorobutanesulfonate anion, a perfluorooctanesulfonate anion, a pentafluorobenzenesulfonate anion or a 3,5-bis(trifluoromethyl)benzenesulfonate anion.

The non-nucleophilic anion represented by $Y^-$ is preferably expressed by, for example, the general formula (LD1) below:

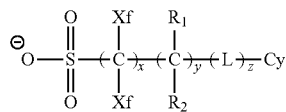

(LD1)

In the formula,

Xf each independently represents a fluorine atom or an alkyl group substituted with at least one fluorine atom.

$R_1$ and $R_2$ each independently represents a group selected from the group consisting of a hydrogen atom, a fluorine atom, an alkyl group and an alkyl group substituted with at least one fluorine atom.

L each independently represents a single bond or a bivalent connecting group.

Cy represents a group with a cyclic structure.

In the formula, x is an integer of 1 to 20, y is an integer of 0 to 10, and z is an integer of 0 to 10.

Xf represents a fluorine atom or an alkyl group substituted with at least one fluorine atom. This alkyl group preferably has 1 to 10 carbon atoms, more preferably 1 to 4 carbon atoms. The alkyl group substituted with at least one fluorine atom is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$.

$R_1$ and $R_2$ each independently represents a group selected from the group consisting of a hydrogen atom, a fluorine atom, an alkyl group and an alkyl group substituted with at least one fluorine atom. Each of the alkyl group and the alkyl group of the alkyl group substituted with at least one fluorine atom preferably has 1 to 4 carbon atoms. More preferably, each of $R_1$ and $R_2$ is a perfluoroalkyl group having 1 to 4 carbon atoms. In particular, there can be mentioned, for example, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, $CF_3$ is preferred.

L represents a single bond or a bivalent connecting group. As the bivalent connecting group, there can be mentioned, for example, —COO—, —OCO—, —CONH—, —CO—, —O—, —S—, —SO—, —SO_2—, an alkylene group, a cycloalkylene group or an alkenylene group. Of these, —CONH—, —CO— and —SO_2— are preferred. —CONH— and —SO_2— are more preferred.

Cy represents a group with a cyclic structure. As the group with a cyclic structure, there can be mentioned, for example, an alicyclic group, an aryl group, a heterocyclic group, an alkyl group substituted with any of these groups, or the like.

The alicyclic group may be monocyclic or polycyclic. As the alicyclic group that is monocyclic, there can be mentioned, for example, a monocycloalkyl group, such as a cyclopentyl group, a cyclohexyl group or a cyclooctyl group. As the alicyclic group that is polycyclic, there can be mentioned, for example, a polycycloalkyl group, such as a norbornyl group, a tricyclodecanyl group, a tetracyclodecanyl group, a tetracyclododecanyl group or an adamantyl group. Of the mentioned groups, alicyclic groups with a bulky structure having at least 7 carbon atoms, such as a norbornyl group, a tricyclodecanyl group, a tetracyclodecanyl group, a tetracyclododecanyl group and an adamantyl group, are preferred from the viewpoint of inhibition of any in-film diffusion in the PEB (post-exposure bake) operation and enhancement of MEEF (Mask Error Enhancement Factor).

The aryl group may be monocyclic or polycyclic. As the aryl group, there can be mentioned, for example, a phenyl group, a naphthyl group, a phenanthryl group or an anthryl group. Of these, a naphthyl group exhibiting a relatively low light absorbance at 193 nm is preferred.

The group with a heterocyclic structure may be monocyclic or polycyclic. The polycyclic structure is superior in the inhibition of any acid diffusion. It is optional for the group with a heterocyclic structure to have aromaticity. As the heterocycle having aromaticity, there can be mentioned, for example, a furan ring, a thiophene ring, a benzofuran ring, a benzothiophene ring, a dibenzofuran ring, a dibenzothiophene ring or a pyridine ring. As the heterocycle having no aromaticity, there can be mentioned, for example, a tetrahydropyran ring, a lactone ring or a decahydroisoquinoline ring. It is especially preferred for the heterocycle in the group with a heterocyclic structure to be a furan ring, a thiophene ring, a pyridine ring or a decahydroisoquinoline ring. As examples of the lactone rings, there can be mentioned the lactone structures set forth above by way of example in connection with the resin (A).

A substituent group may be introduced in the above group with a cyclic structure. As the substituent group, there can be mentioned, for example, an alkyl group, a cycloalkyl group, an aryl group, a hydroxyl group, an alkoxy group, an ester group, an amido group, a urethane group, a ureido group, a thioether group, a sulfonamido group or a sulfonic ester group. The alkyl group may be in the form of a linear or branched chain. It is preferred for the alkyl group to have 1 to 12 carbon atoms. The cycloalkyl group may be monocyclic or polycyclic. It is preferred for the cycloalkyl group to have 3 to 12 carbon atoms. The aryl group preferably has 6 to 14 carbon atoms.

In the formula, x is preferably 1 to 8, more preferably 1 to 4 and most preferably 1; y is preferably 0 to 4, more preferably 0; and z is preferably 0 to 8, more preferably 0 to 4.

Also, the non-nucleophilic anion represented by $Y^-$ is preferably expressed by, for example, general formula (LD2) below.

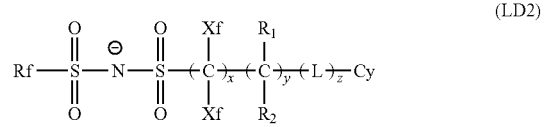

(LD2)

In the general formula (LD2), Xf, $R_1$, $R_2$, L, Cy, x, y and z are as defined above in connection with general formula (LD1). Rf is a group containing a fluorine atom.

As the group containing a fluorine atom represented by Rf, there can be mentioned, for example, an alkyl group containing at least one fluorine atom, a cycloalkyl group containing at least one fluorine atom or an aryl group containing at least one fluorine atom.

These alkyl group, cycloalkyl group and aryl group may be those substituted with a fluorine atom, or those substituted with another substituent group containing a fluorine atom. When Rf is a cycloalkyl group containing at least one fluorine atom or an aryl group containing at least one fluorine atom, the other substituent group containing a fluorine atom can be, for example, an alkyl group substituted with at least one fluorine atom.

Further, these alkyl group, cycloalkyl group and aryl group may further be substituted with a substituent group containing no fluorine atom. As this substituent group, there can be mentioned, for example, any of those mentioned above with respect to Cy wherein no fluorine atom is contained.

As the alkyl group containing at least one fluorine atom represented by Rf, there can be mentioned, for example, any of those mentioned hereinbefore as the alkyl group substituted with at least one fluorine atom, represented by Xf. As the cycloalkyl group containing at least one fluorine atom represented by Rf, there can be mentioned, for example, a perfluorocyclopentyl group or a perfluorocyclohexyl group. As the aryl group containing at least one fluorine atom represented by Rf, there can be mentioned, for example, a perfluorophenyl group.

Specific examples of the cation moieties of the compounds (B) are shown below.

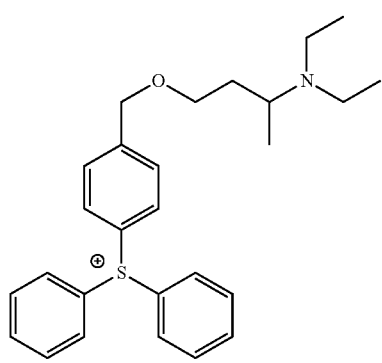
(Bb1)

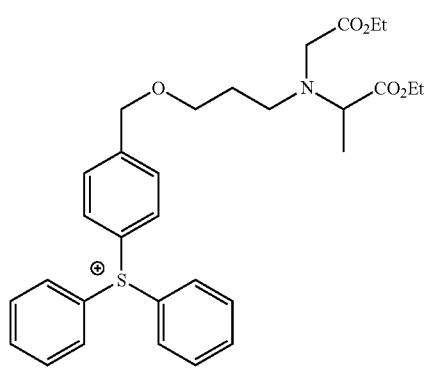
(Bb2)

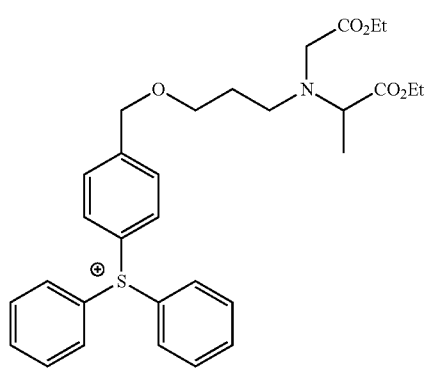
(Bb3)

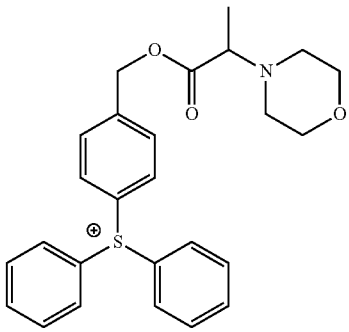
(Bb4)

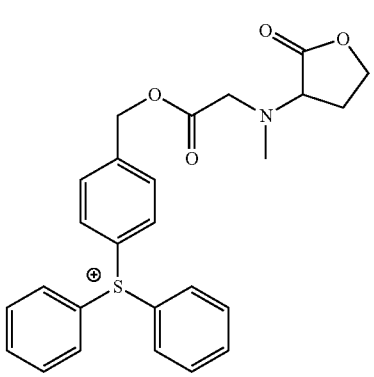
(Bb5)

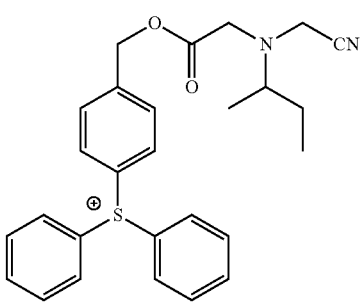
(Bb6)

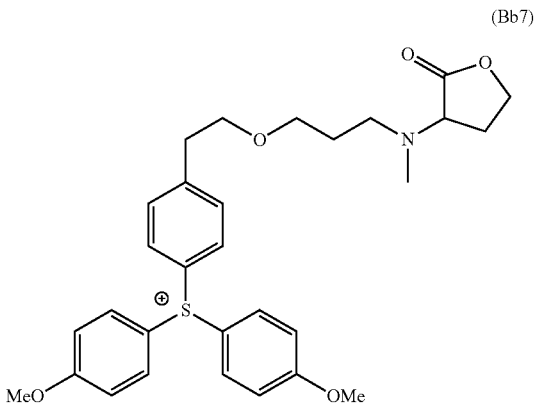
(Bb7)

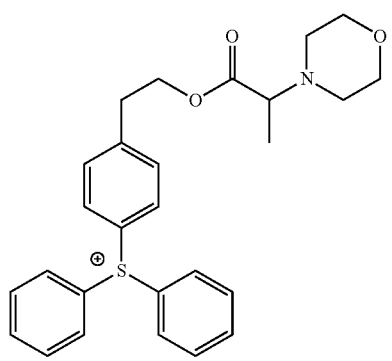
(Bb8)
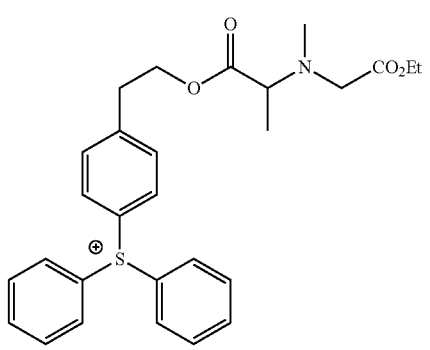
(Bb12)
(Bb9)
(Bb13)
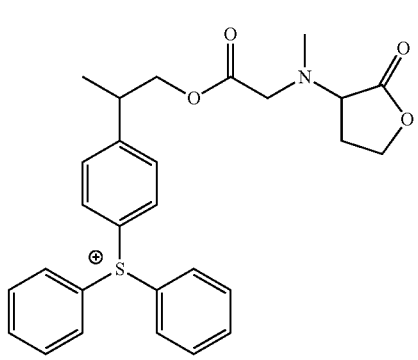
(Bb10)
(Bb14)
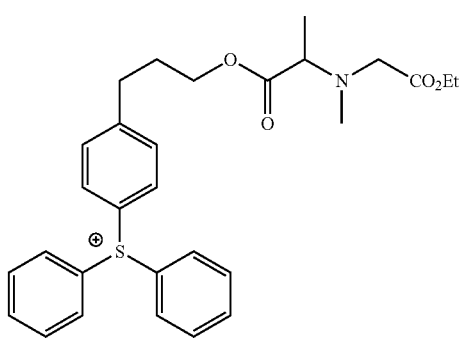
(Bb11)
(Bb15)
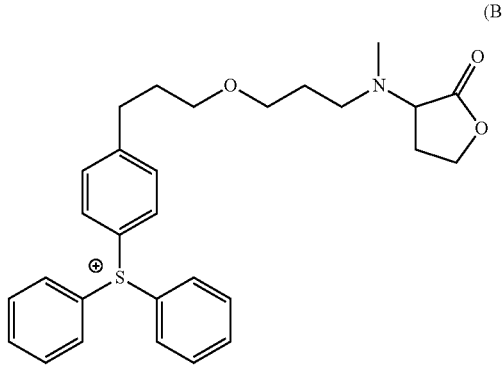

(Bb16) 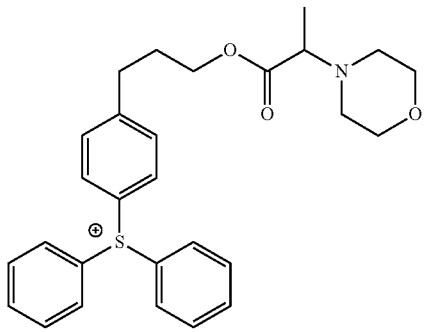
(Bb17) 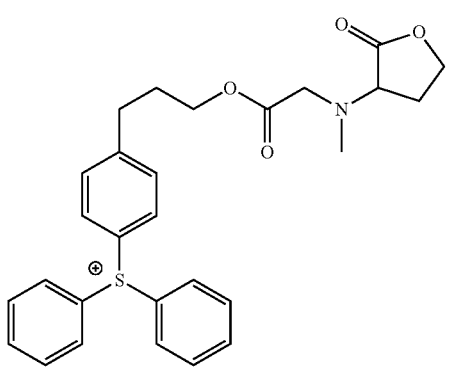
(Bb18) 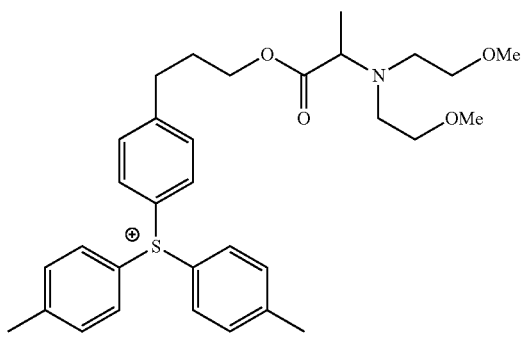
(Bb19) 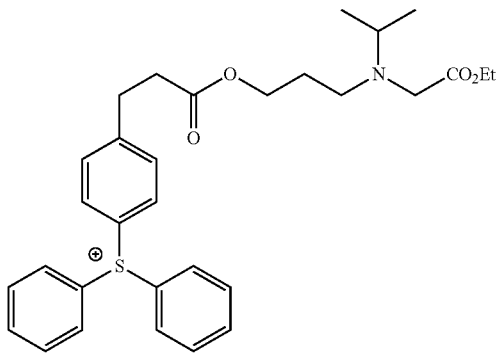
(Bb20) 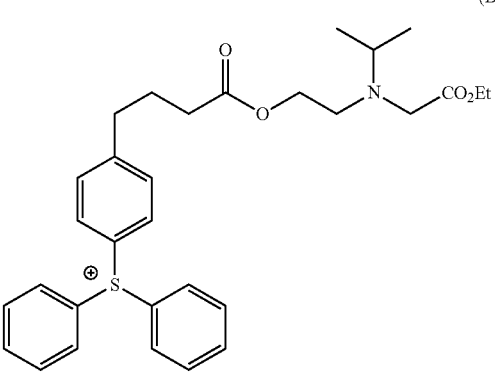
(Bb21) 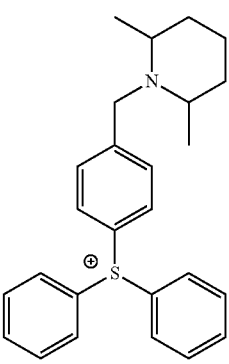
(Bb22) 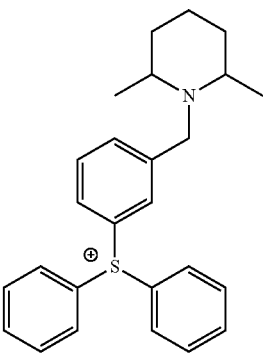
(Bb23) 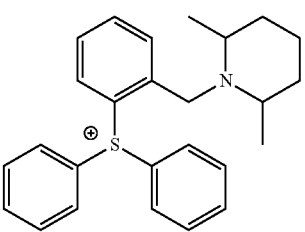

(Bb24) 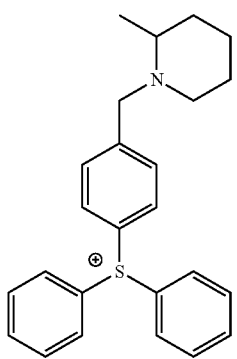
(Bb28) 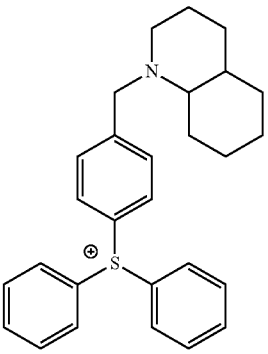
(Bb25) 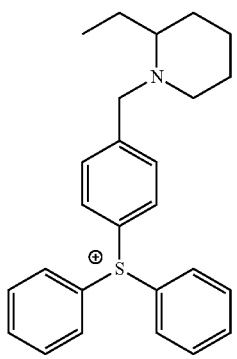
(Bb29) 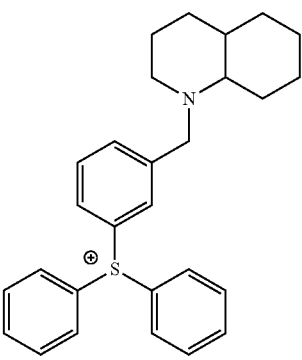
(Bb26) 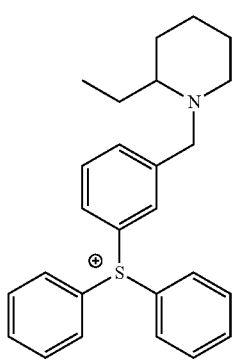
(Bb30) 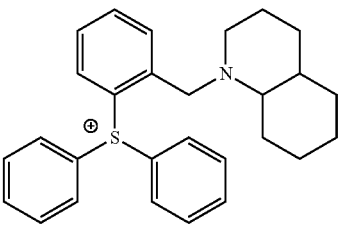
(Bb27)
(Bb31) 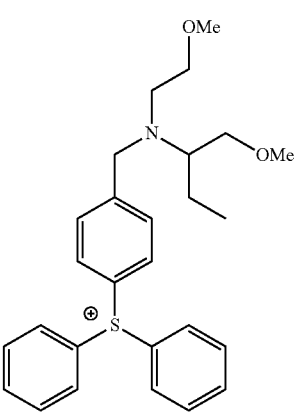

71
-continued
(Bb32)
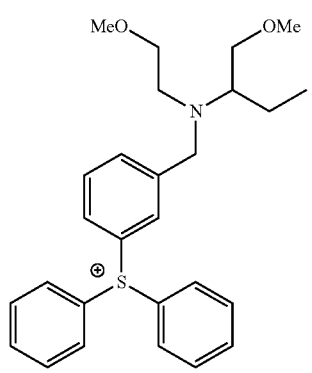
(Bb33)
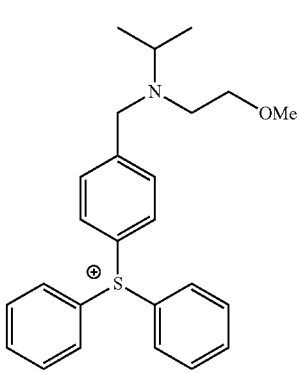
(Bb34)
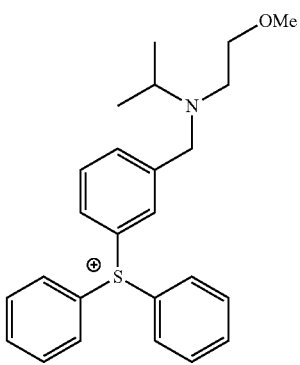
(Bb35)
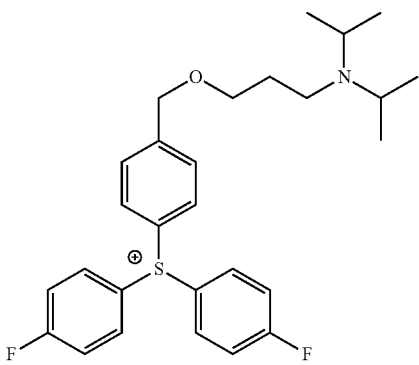
72
-continued
(Bb36)
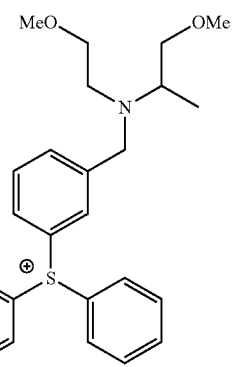
(Bb37)
(Bb38)
(Bb39)

(Bb40)
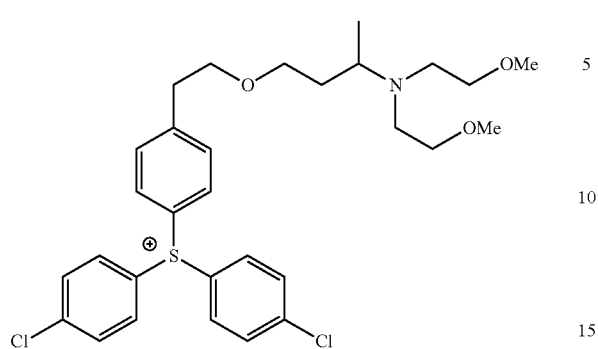
(Bb41)
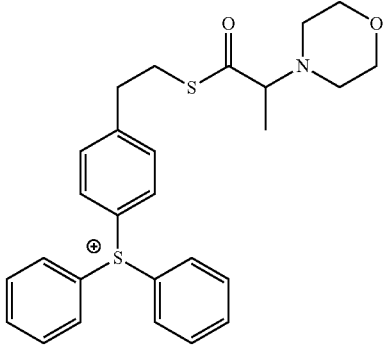
(Bb41)
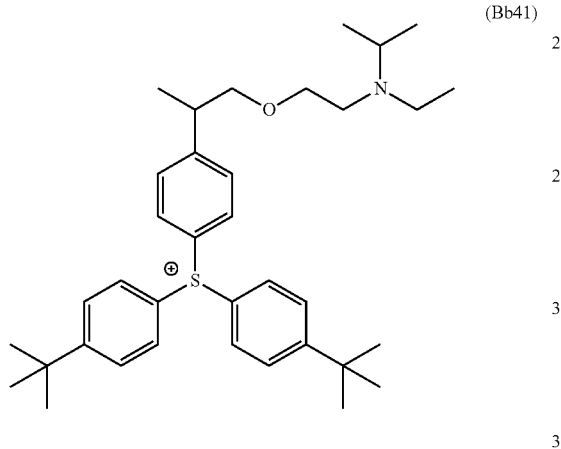
(Bb42)
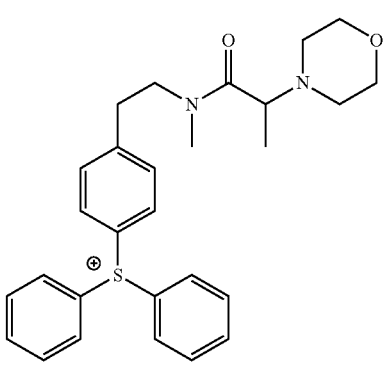
(Bb42)
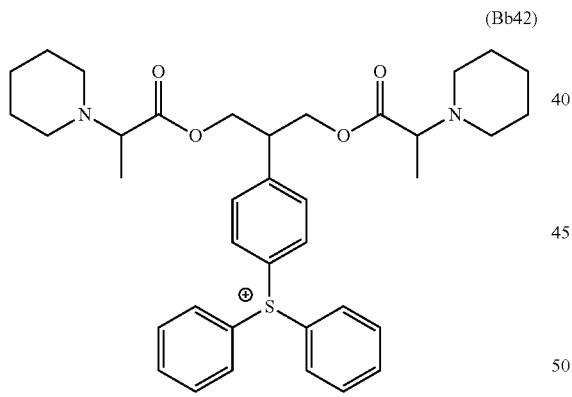
(Bb43)
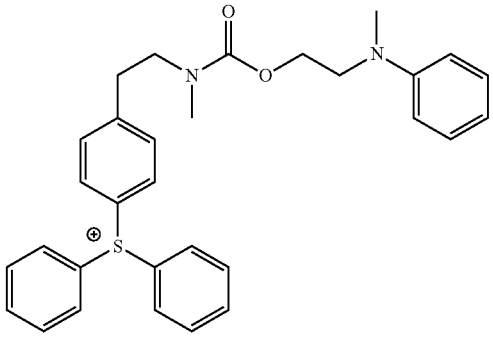
(Bb43)
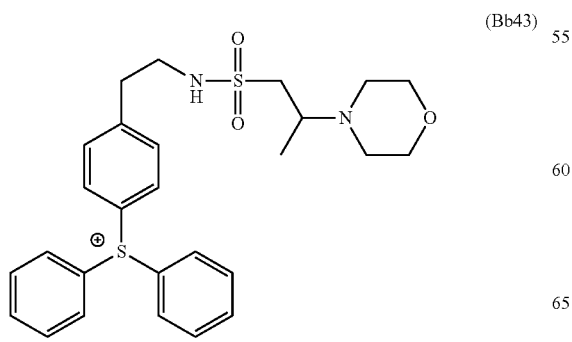
(Bb44)
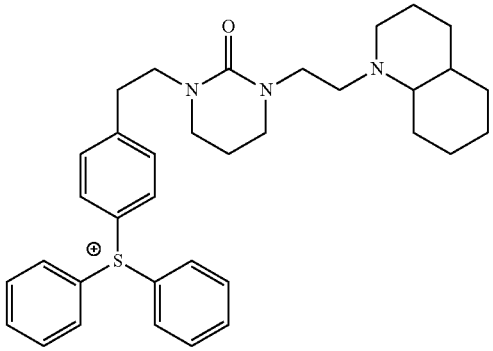

(Bb45) 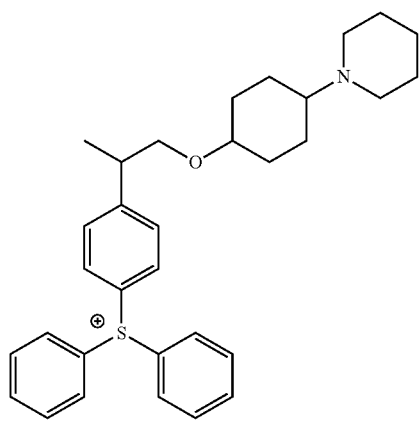
(Bb49) 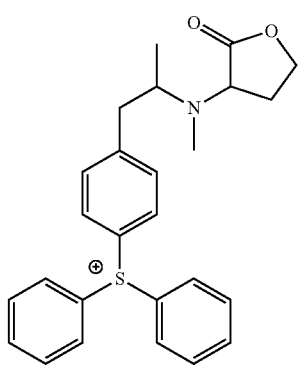
(Bb46) 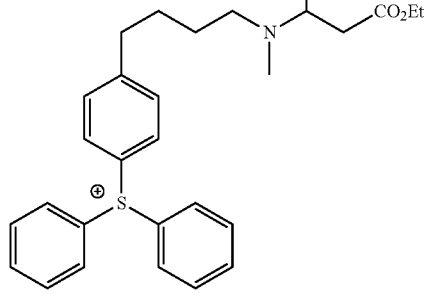
(Bb50) 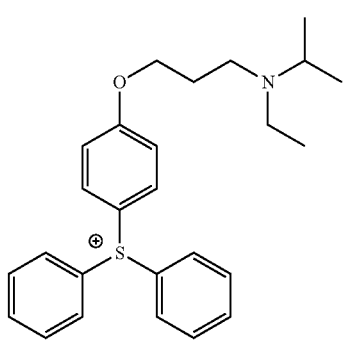
(Bb47) 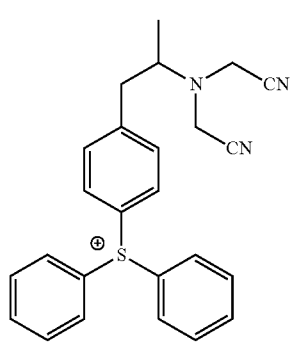
(Bb51) 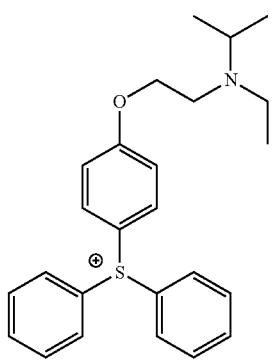
(Bb48) 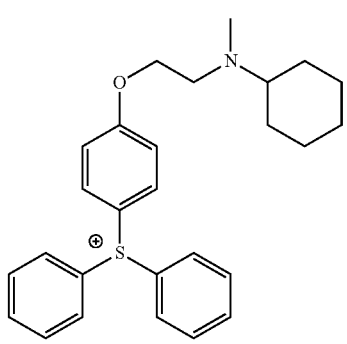
(Bb52) 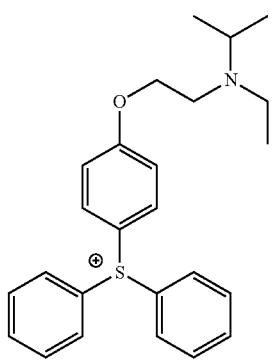

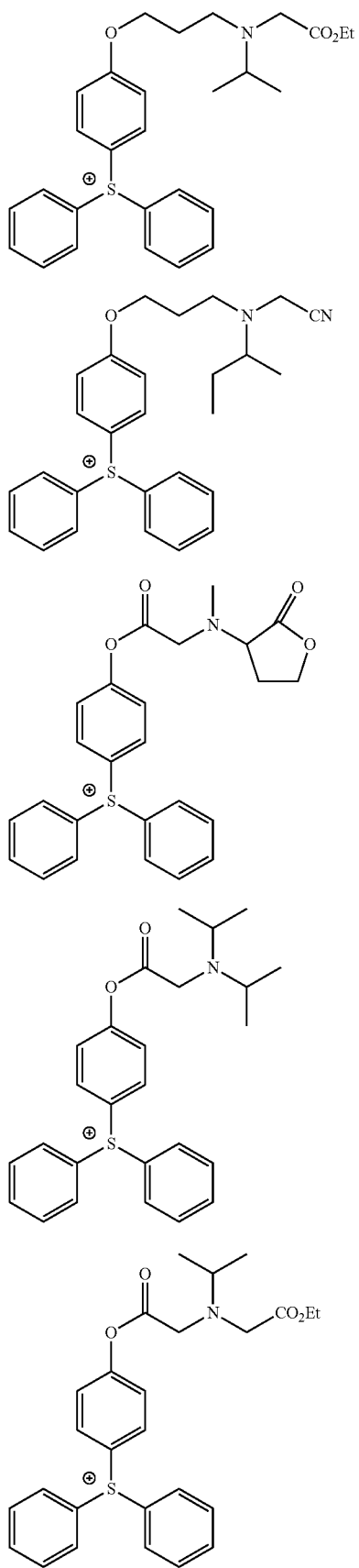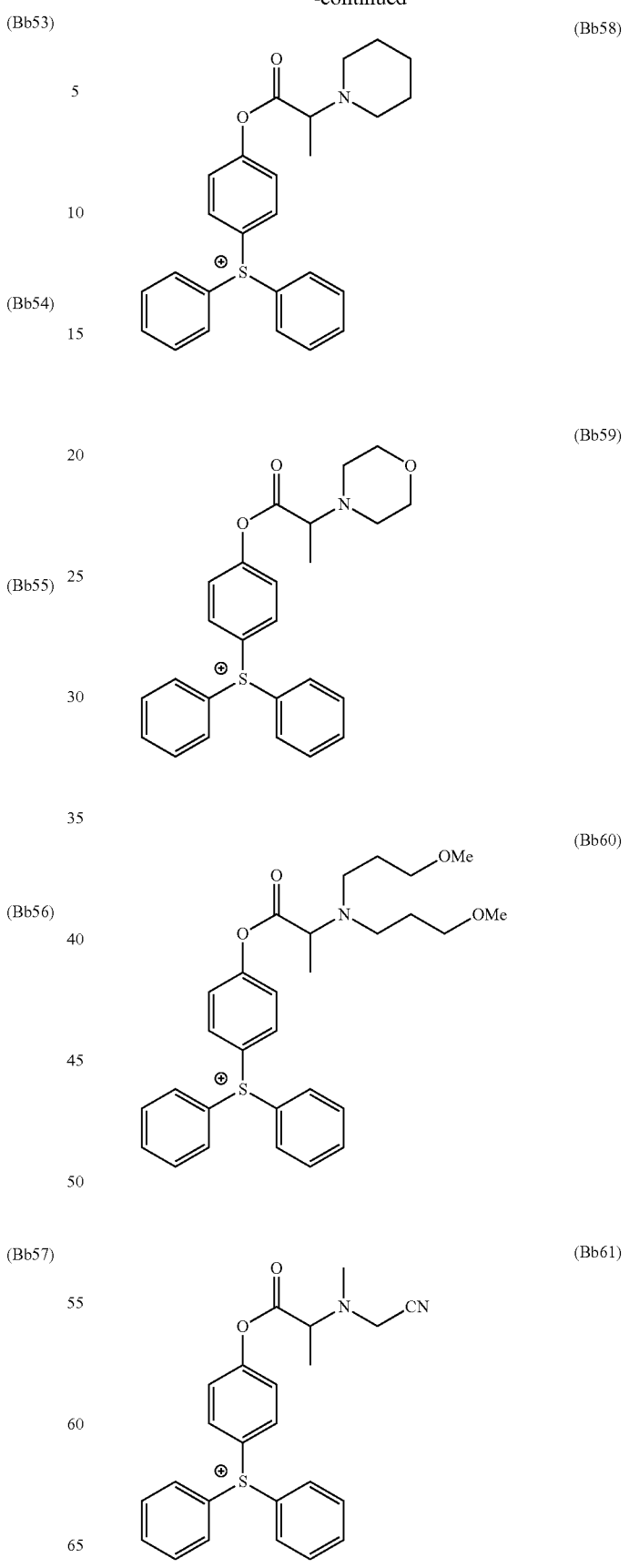

-continued
(Bb62) 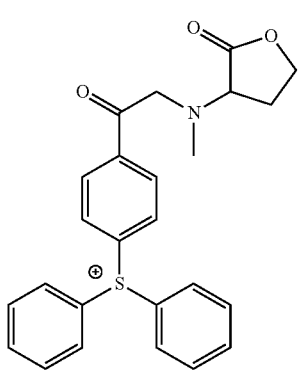
(Bb63) 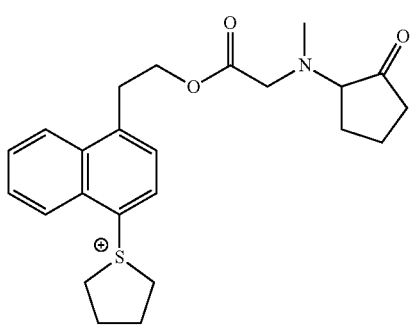
(Bb64) 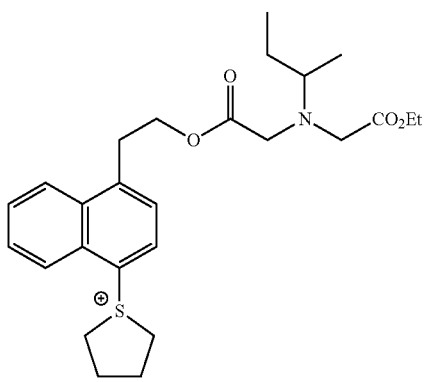
(Bb65) 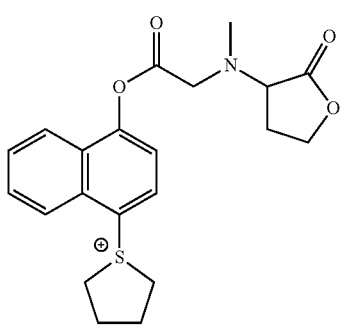
-continued
(Bb66) 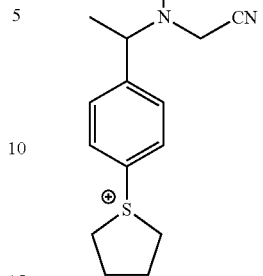
(Bb67) 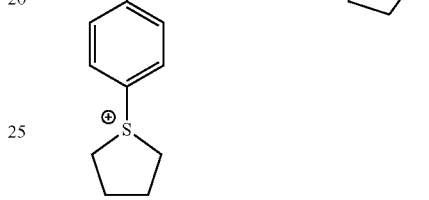
(Bb68) 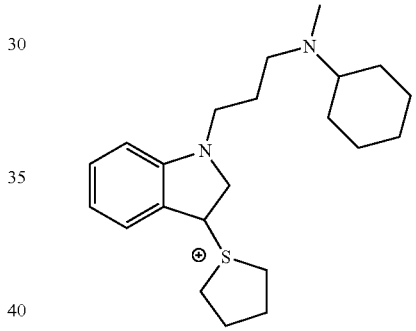
(Bb69) 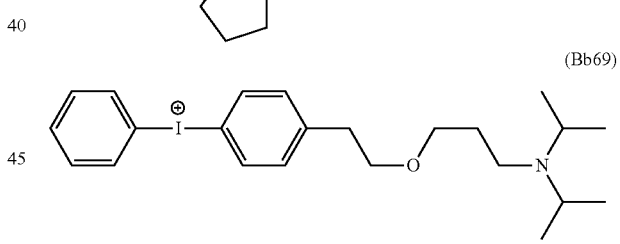
(Bb70) 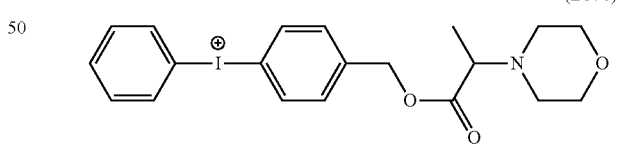
(Bb71) 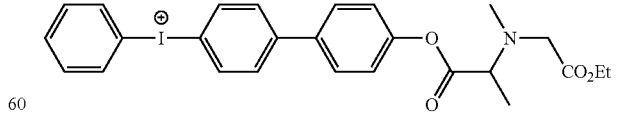
The process for producing the compounds represented by the general formula (1-1) is not particularly limited. For example, the compounds are synthesized by reacting the compounds of general formula (2) below with the compounds of general formula (3) below.

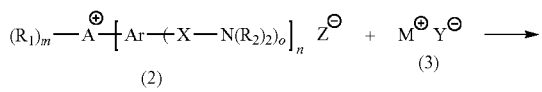

(2)       (3)

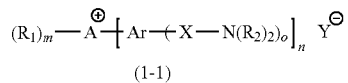

(1-1)

In the formulae, $Z^-$ is, for example, a bromide ion, a chloride ion, an iodide ion, a sulfonate ion, a carboxylate ion, $BF_4^-$, $AsF_6^-$, $SbF_6^-$, $PF_6^-$ or $ClO_4^-$, preferably a bromide ion, a chloride ion, a sulfonate ion or a carboxylate ion.

As the sulfonate ion represented by $Z^-$, there can be mentioned, for example, a p-toluenesulfonate ion, a methanesulfonate ion or a trifluoromethanesulfonate ion.

As the carboxylate ion represented by $Z^-$, there can be mentioned, for example, a trifluoroacetate ion or an acetate ion.

$M^+$ is, for example, an alkali metal ion. As the alkali metal ion, there can be mentioned, for example, a sodium ion, a lithium ion or a potassium ion.

The compounds (2) and (3) may be commercially available products, or may be synthesized.

The process for producing the compounds (2) is not particularly limited. For example, in the use of onium salt compounds of general formula (4) below by way of example, the compounds (2) can be synthesized by reacting the compounds (4) with the basic compounds of general formula (5) in the presence of an appropriate base.

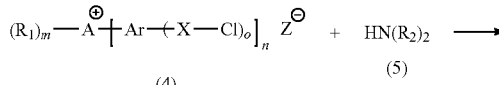

(4)       (5)

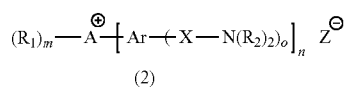

(2)

In this reaction, the molar ratio of basic compound (5) to compound (4) is preferably in the range of 1 to 100, more preferably 1 to 10 and most preferably 1 to 5.

As the base for use in the reaction, there can be mentioned, for example, any of triethylamine, pyridine, sodium hydrogen carbonate, sodium carbonate and potassium carbonate. Of these, triethylamine and potassium carbonate are preferred from the viewpoint of having an appropriate basicity.

This reaction is performed in, for example, an aprotic organic solvent, such as tetrahydrofuran, acetone, methyl ethyl ketone, acetonitrile, NMP, methylene chloride, and pyridine. The reaction is preferably performed in acetone, acetonitrile or tetrahydrofuran among these solvents. The ratio of organic solvent used per 100 parts by mass of the sum of organic solvent and water is preferably in the range of 2 to 100 parts by mass, more preferably 5 to 100 parts by mass and most preferably 10 to 95 parts by mass.

The temperature at which the reaction is performed is preferably in the range of −40 to 100° C., more preferably −20 to 80° C. and most preferably 0 to 80° C. The period of time in which the reaction is performed is preferably in the range of 0.1 to 96 hours, more preferably 0.5 to 24 hours.

A particular mode of the process for producing the compounds (2) will be considered using the onium salt compounds of general formula (6) below. In that instance, for example, the compounds (2) can be synthesized by reacting the compounds (6) with the compounds of general formula (7) in the presence of an appropriate base.

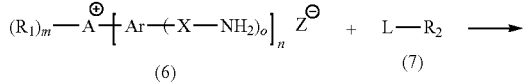

(6)       (7)

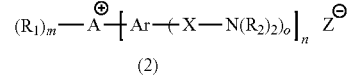

(2)

In the formulae, $R_4$ represents an alkyl group or a cycloaliphatic group.

In this reaction, the molar ratio of compound (7) to compound (6) is preferably in the range of 1 to 10, more preferably 1 to 5.

As the base for use in the reaction, there can be mentioned, for example, any of triethylamine, pyridine, sodium hydrogen carbonate, sodium carbonate, potassium carbonate and sodium hydride. Of these, triethylamine and potassium carbonate are preferred from the viewpoint of having an appropriate basicity.

This reaction is performed in, for example, an aprotic organic solvent, such as tetrahydrofuran, acetone, methyl ethyl ketone, acetonitrile, NMP, methylene chloride and pyridine. The reaction is preferably performed in acetone, acetonitrile or tetrahydrofuran among these solvents. The ratio of organic solvent used per 100 parts by mass of the sum of organic solvent and water is preferably in the range of 2 to 100 parts by mass, more preferably 5 to 100 parts by mass and most preferably 10 to 95 parts by mass.

The temperature at which the reaction is performed is preferably in the range of −40 to 100° C., more preferably −20 to 80° C. and most preferably 0 to 80° C. The period of time in which the reaction is performed is preferably in the range of 0.1 to 96 hours, more preferably 0.5 to 24 hours.

One of the compounds (B) may be used alone, or two or more thereof may be used in combination.

The content of component (B) based on the total solids of the composition is preferably in the range of 0.1 to 20.0 mass %, more preferably 0.5 to 15.0 mass % and further more preferably 1.0 to 10.0 mass %.

The composition of the present invention may further contain other components in addition to the above resins (A) and compounds (B). The other optional components will be described below.

(C) Acid Generator Other than Compounds (B)

It is preferred for the composition of the present invention to further contain an acid generator other than the compounds (B) (hereinafter also referred to as component (C)).

As the acid generator, use can be made of a member appropriately selected from a photoinitiator for photocationic polymerization, a photoinitiator for photoradical polymerization, a photo-achromatic agent and photo-discoloring agent for dyes, any of known compounds that generate an acid when exposed to actinic rays or radiation employed in microresists, etc., and mixtures thereof.

The acid generator includes, for example, a diazonium salt, a phosphonium salt, a sulfonium salt, an iodonium salt, an imide sulfonate, an oxime sulfonate, diazosulfone, disulfone and o-nitrobenzyl sulfonate.

Further, use can be made of compounds obtained by introducing any of the above groups or compounds that generate an acid when exposed to actinic rays or radiation in a polymer main chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

Preferred compounds of the acid generators include those represented by the following general formulae (ZI), (ZII) and (ZIII).

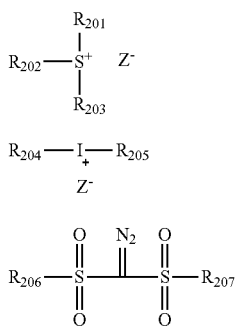

In the above general formula (ZI), $R_{201}$, $R_{202}$ and $R_{203}$ each independently represents an organic group.

The number of carbon atoms in the organic groups $R_{201}$, $R_{202}$ and $R_{203}$ is generally in the range of 1 to 30, preferably 1 to 20.

Two of $R_{201}$ to $R_{203}$ may be bonded to each other to thereby form a ring structure. The ring structure may contain an oxygen atom, a sulfur atom, an ester group, an amido group or a carbonyl group. The group formed by bonding of two of $R_{201}$ to $R_{203}$ includes, for example, an alkylene group, such as a butylene group or a pentylene group.

$Z^-$ represents a non-nucleophilic anion.

$Z^-$ can be, for example, any of those mentioned above in connection with $Y^-$ of general formula (1-1). $Z^-$ and $Y^-$ may be identical to each other, or may be different from each other. Employing $Z^-$ and $Y^-$ identical to each other is preferred from the viewpoint of suppressing any salt exchange reaction between compound (B) and compound (C).

The organic groups as $R_{201}$, $R_{202}$ and $R_{203}$ include, for example, the corresponding groups of compounds (ZI-1), (ZI-2), (ZI-3) or (ZI-4) to be described later. Compounds may be those having two or more of the structures represented by the general formula (ZI). For example, use may be made of a compound having a structure in which at least one of the $R_{201}$ to $R_{203}$ of one of the compounds of the general formula (ZI) is bonded to at least one of the $R_{201}$ to $R_{203}$ of another of the compounds of the general formula (ZI).

Preferred (ZI) components include the following compounds (ZI-1) to (ZI-4).

The compounds (ZI-1) are arylsulfonium compounds wherein at least one of $R_{201}$ to $R_{203}$ in the general formula (ZI) is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

The arylsulfonyl compound includes, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. The aryl group having a heterocyclic structure includes, for example, pyrrole, furan, thiophene, indole, benzofuran, and benzothiophene. When the arylsulfonium compound has two or more aryl groups, the two or more aryl groups may be identical to or different from each other.

The alkyl group or cycloalkyl group contained in the arylsulfonium compound as necessary is preferably a linear or branched alkyl group having 1 to 15 carbon atoms or a cycloalkyl group having 3 to 15 carbon atoms, and includes, for example, a methyl group, an ethyl group, a propyl group, an n-butyl group, a sec-butyl group, a t-butyl group, a cyclopropyl group, a cyclobutyl group, and a cyclohexyl group.

The aryl group, alkyl group or cycloalkyl group of $R_{201}$ to $R_{203}$ may have one or more substituent groups such as an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group, and a phenylthio group. Preferred substituent groups are a linear or branched alkyl group having 1 to 12 carbon atoms, a cycloalkyl group having 3 to 12 carbon atoms and a linear, branched or cyclic alkoxy group having 1 to 12 carbon atoms. More preferred substituent groups are an alkyl group having 1 to 6 carbon atoms and an alkoxy group having 1 to 6 carbon atoms. The substituent groups may be contained in any one of the three $R_{201}$ to $R_{203}$, or alternatively may be contained in all three of $R_{201}$ to $R_{203}$. When $R_{201}$ to $R_{203}$ are phenyl groups, the substituent group preferably lies at the p-position of the phenyl group.

Now, the compounds (ZI-2) will be described.

The compounds (ZI-2) are compounds that $R_{201}$ to $R_{203}$ in the formula (ZI) each independently represents an organic group having no aromatic ring. The aromatic rings include an aromatic ring having a heteroatom.

The organic group having no aromatic ring as $R_{201}$ to $R_{203}$ generally has 1 to 30 carbon atoms, preferably 1 to 20 carbon atoms.

$R_{201}$ to $R_{203}$ each independently is an alkyl group, a cycloalkyl group, an allyl group, and a vinyl group, more preferably a linear or branched 2-oxoalkyl group, 2-oxocycloalkyl group, and an alkoxycarbonylmethyl group, especially preferably a linear or branched 2-oxoalkyl group.

Preferred alkyl groups and cycloalkyl groups of $R_{201}$ to $R_{203}$ include a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group). More preferred alkyl groups include a 2-oxoalkyl group and an alkoxycarbonylmethyl group. More preferred cycloalkyl group includes a 2-oxocycloalkyl group.

The 2-oxoalkyl group may be linear or branched, and preferably includes a group having >C=O at the 2-position of the above-described alkyl group.

The 2-oxocycloalkyl group is preferably a group having >O=O at the 2-position of the above-described cycloalkyl group.

Preferred alkoxy groups of the alkoxycarbonylmethyl group include alkoxy groups having 1 to 5 carbon atoms such as a methoxy group, an ethoxy group, a propoxy group, a butoxy group and a pentoxy group.

$R_{201}$ to $R_{203}$ may be further substituted by a halogen atom, an alkoxy group (having, for example, 1 to 5 carbon atoms), a hydroxyl group, a cyano group or a nitro group.

The compound (C) is particularly preferably a compound (ZI-3), (ZI-4) or (ZI-5) as described later. When such a compound is used as the acid generator, roughness properties can be further improved, for example. However, such a compound has a structure relatively susceptible to nucleophilic reaction. Therefore, if a highly nucleophilic component and above compound are used together, this may result in somewhat reducing temporal stability of the pattern width.

In contrast, the composition of the present invention uses the compound (B) with low nucleophilicity. Therefore, in embodiments of the present invention, even when the above compound (C) is used together as the acid-generator, roughness properties can be further improved without deteriarating temporal stability of the pattern width.

The compounds (ZI-3) are those represented by the following general formula (ZI-3) which have a phenacylsulfonium salt structure.

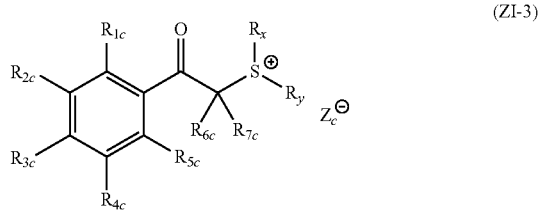

(ZI-3)

In the formula (ZI-3), $R_{1c}$ to $R_{5c}$ each independently represents a hydrogen atom, an alkyl group, a cycloalkyl group, an alkoxy group, a halogen atom, a cyano group, a nitro group or a phenylthio group.

$R_{6c}$ and $R_{7c}$ each independently represents a hydrogen atom, an alkyl group, a cycloalkyl group, halogen atom, a cyano group or an aryl group.

$R_x$ and $R_y$ each independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. The group formed by bonding of any two or more of $R_{1c}$ to $R_{5c}$, and $R_{6c}$ and $R_{7c}$, and $R_x$ and $R_y$ includes a butylene group, a pentylene group or the like.

$Zc^-$ represents a non-nucleophilic anion, and includes the same non-nucleophilic anions as mentioned with respect to the $Z^-$ of the general formula (ZI).

The alkyl group for $R_{1c}$ to $R_{7c}$ may be linear or branched, and includes, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). The cycloalkyl group includes, for example, a cycloalkyl group having 3 to 8 carbon atoms (for example, a cyclopentyl group or a cyclohexyl group).

The alkoxy group for $R_{1c}$ to $R_{5c}$ may be linear, or branched, or cyclic, and includes, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Such substituent groups serve to enhance solvent solubility and to inhibit particle generation during storage.

The aryl group for $R_{6c}$ and $R_{7c}$ preferably has 5 to 15 carbon atoms, and includes, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms, and includes, for example, an ethylene group, a propylene group, a butylene group, a pentylene group, a hexylene group or the like. Further, the ring formed by the bonding of $R_{6c}$ and $R_{7c}$ may have a heteroatom such as an oxygen atom in the ring.

The alkyl groups and cycloalkyl groups for $R_x$ and $R$ include the same alkyl groups and cycloalkyl groups as set forth above with respect to $R_{1c}$ to $R_{7c}$.

The 2-oxoalkyl group and 2-oxocycloalkyl group include such groups that the alkyl group and cycloalkyl group for $R_{1c}$ to $R_{7c}$ having >C=O at the 2-position thereof.

The alkoxy group of the alkoxycarbonylalkyl group includes the same alkoxy groups as mentioned above with respect to $R_{1c}$ to $R_{5c}$, and the alkyl group thereof includes, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a monocyclic or polycyclic cycloalkyl group.

The vinyl groups are not particularly limited. However, preferred use is made of an unsubstituted vinyl group or a vinyl group substituted with a monocyclic or polycyclic cycloalkyl group.

The ring structure that may be formed by the bonding of $R_x$ and $R_y$ includes a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

$R_x$ and $R_y$ are preferably alkyl group or cycloalkyl group having 4 or more carbon atoms, more preferably 6 or more carbon atoms, still more preferably 8 or more carbon atoms.

Specific examples of the cation moiety in the compound (ZI-3) will be described below.

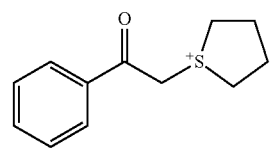

-continued
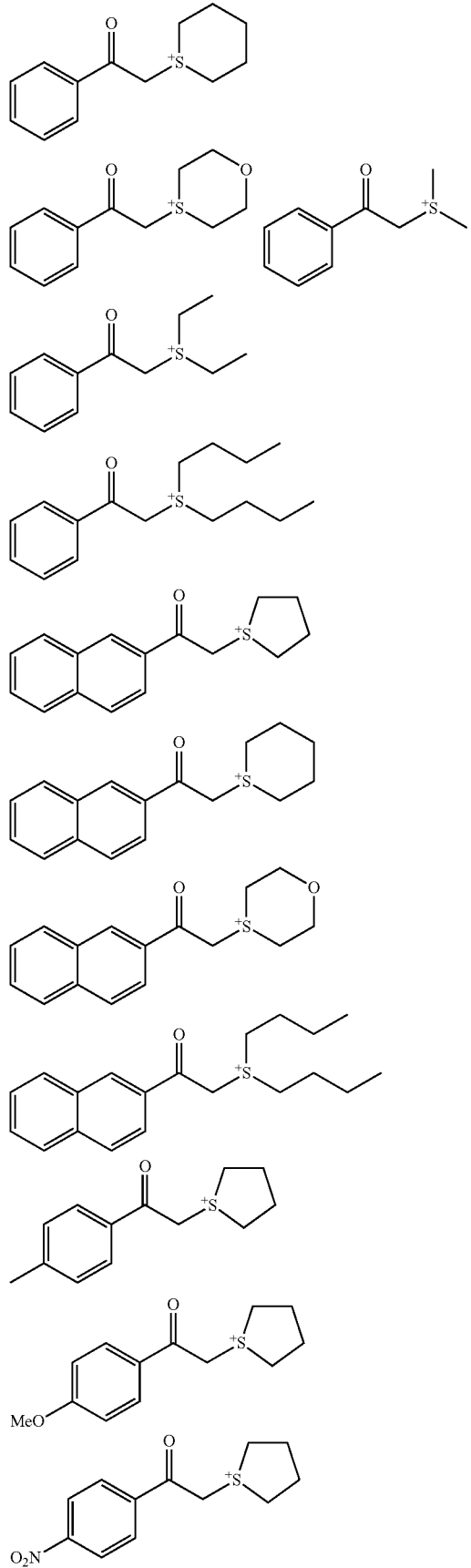
-continued
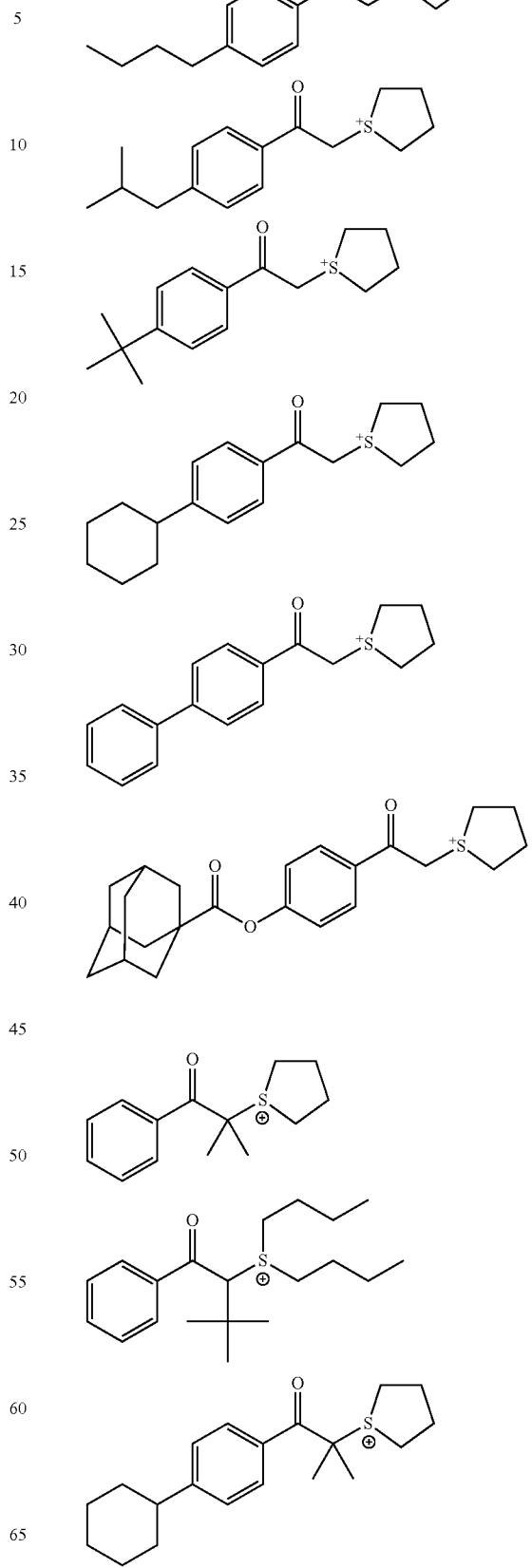

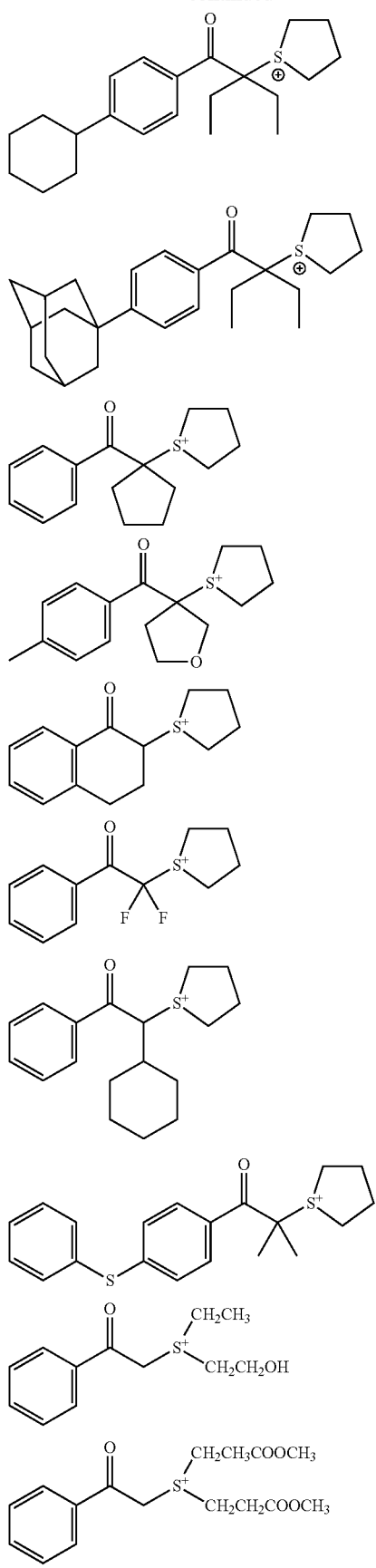
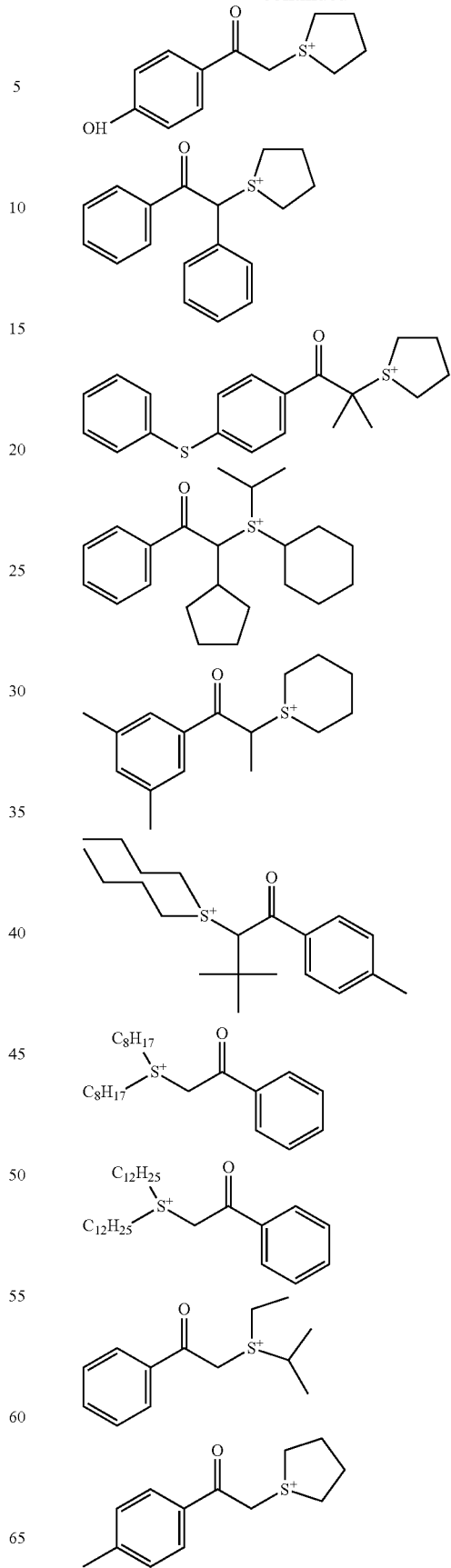

-continued

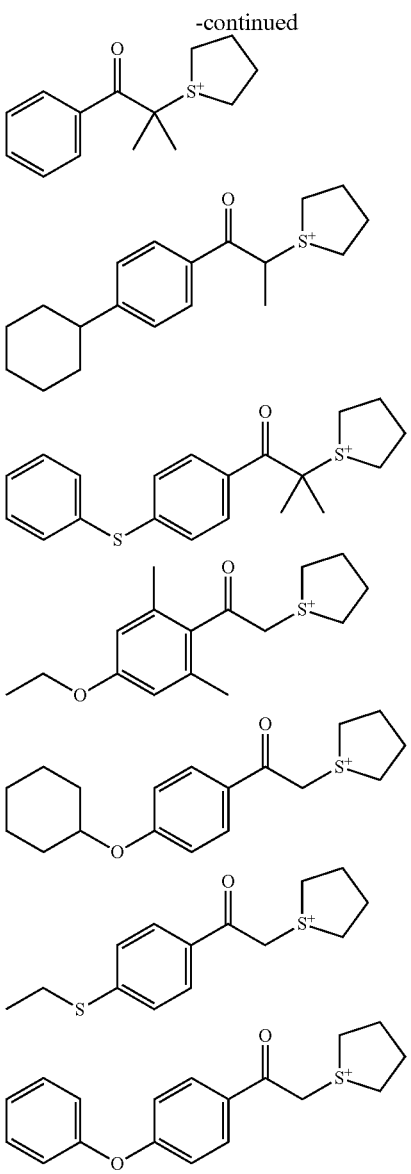

The compounds (ZI-4) are those represented by the general formula (ZI-4) below.

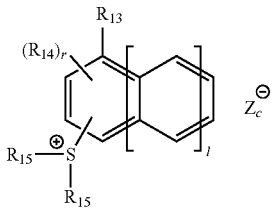

(ZI-4)

In general formula (ZI-4),

R$_{13}$ represents any of a hydrogen atom, a fluorine atom, a hydroxyl group, an alkyl group, a cycloalkyl group, an alkoxy group, an alkoxycarbonyl group and a group with a monocyclic or polycyclic cycloalkyl skeleton. These groups may have one or more substituent groups.

R$_{14}$, each independently in the case where r≥2, represents any of an alkyl group, a cycloalkyl group, an alkoxy group, an alkoxycarbonyl group, an alkylcarbonyl group, an alkylsulfonyl group, a cycloalkylsulfonyl group and a group with a monocyclic or polycyclic cycloalkyl skeleton.

R$_{15}$ each independently represents an alkyl group, a cycloalkyl group or a naphthyl group. Two R$_{15}$s may be bonded to each other to thereby form a ring.

l is an integer of 0 to 2.

r is an integer of 0 to 8.

Z$^-$ represents a non-nucleophilic anion, and includes any of the same non-nucleophilic anions as mentioned with respect to the Z$^-$ of the general formula (ZI).

In general formula (ZI-4), the alkyl groups for R$_{13}$, R$_{14}$ and R$_{15}$ may be linear or branched and preferably each have 1 to 10 carbon atoms, and include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

The cycloalkyl groups for R$_{13}$, R$_{14}$ and R$_{15}$ include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups for R$_{13}$ and R$_{14}$ may be linear or branched and preferably each have 1 to 10 carbon atoms, and include, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group for R$_{13}$ and R$_{14}$ may be linear or branched and preferably has 2 to 11 carbon atoms, and include, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

The groups with a monocyclic or polycyclic cycloalkyl skeleton for R$_{13}$ and R$_{14}$ include, for example, a monocyclic or polycyclic cycloalkyloxy group and an alkoxy group with a monocyclic or polycyclic cycloalkyl group. These groups may further have one or more substituent groups.

The monocyclic or polycyclic cycloalkyloxy groups for R$_{13}$ and R$_{14}$ preferably have the total carbon atoms of 7 or greater, more preferably in the range of 7 to 15. Further, the group having a monocyclic cycloalkyl skeleton is preferred. The monocyclic cycloalkyloxy group total carbon atoms of which is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent group selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, where the total carbon atoms thereof, including those of any optional substituent group introduced in the cycloalkyl group, is 7 or greater.

The polycyclic cycloalkyloxy group the total carbon atoms of which is 7 or greater includes a tricyclodecanyloxy group, a tetracyclodecanyloxy group, an adamantyloxy group or the like.

The alkyloxy groups having a monocyclic or polycyclic cycloalkyl skeleton for $R_{13}$ and $R_{14}$, the total carbon atoms thereof is preferably 7 or greater, more preferably in the range of 7 to 15. Further, the alkoxy group having a monocyclic cycloalkyl skeleton is preferred. The alkoxy group having a monocyclic cycloalkyl skeleton the total carbon atoms of which is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted monocyclic cycloalkyl group, where the total carbon atoms thereof, including those of the substituent groups, is 7 or greater. For example, there can be mentioned a cyclohexylmethoxy group, a cyclopentylethoxy group, a cyclohexylethoxy group or the like. A cyclohexylmethoxy group is preferred.

The alkoxy group having a polycyclic cycloalkyl skeleton the total carbon atoms of which is 7 or greater includes a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

The alkyl group of the alkylcarbonyl group for $R_{14}$ includes the same specific examples as mentioned above with respect to the alkyl groups for $R_{13}$ to $R_{15}$.

The alkylsulfonyl and cycloalkylsulfonyl groups for $R_{14}$ may be linear, branched or cyclic and preferably each have 1 to 10 carbon atoms, and include, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

The substituent groups which may be contained in the above groups include, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

The alkoxy group includes, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

The alkoxyalkyl group includes, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

The alkoxycarbonyl group includes, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

The alkoxycarbonyloxy group includes, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may be condensed with an aryl group or a cycloalkyl group.

The bivalent $R_{15}$s may have substituent groups. Such substituent groups include, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

The substituent groups which may be contained in $R_{13}$ and $R_{14}$ preferably include, for example, a hydroxyl group, an alkoxy group, an alkoxycarbonyl group, a halogen atom (especially, a fluorine atom) or the like.

l is preferably 0 or 1, more preferably 1.

r is preferably 0 to 2.

Specific examples of the cation moiety in the compound (ZI-4) will be shown below.

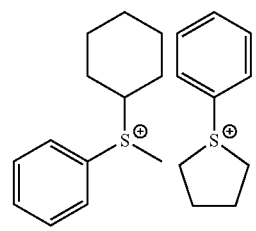

95 96
-continued -continued
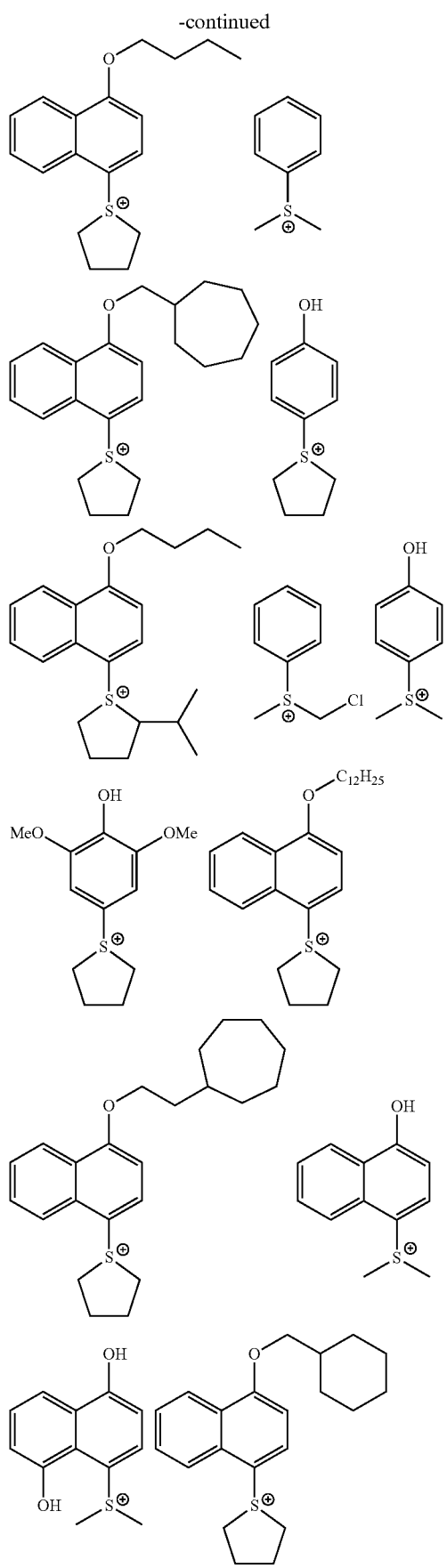
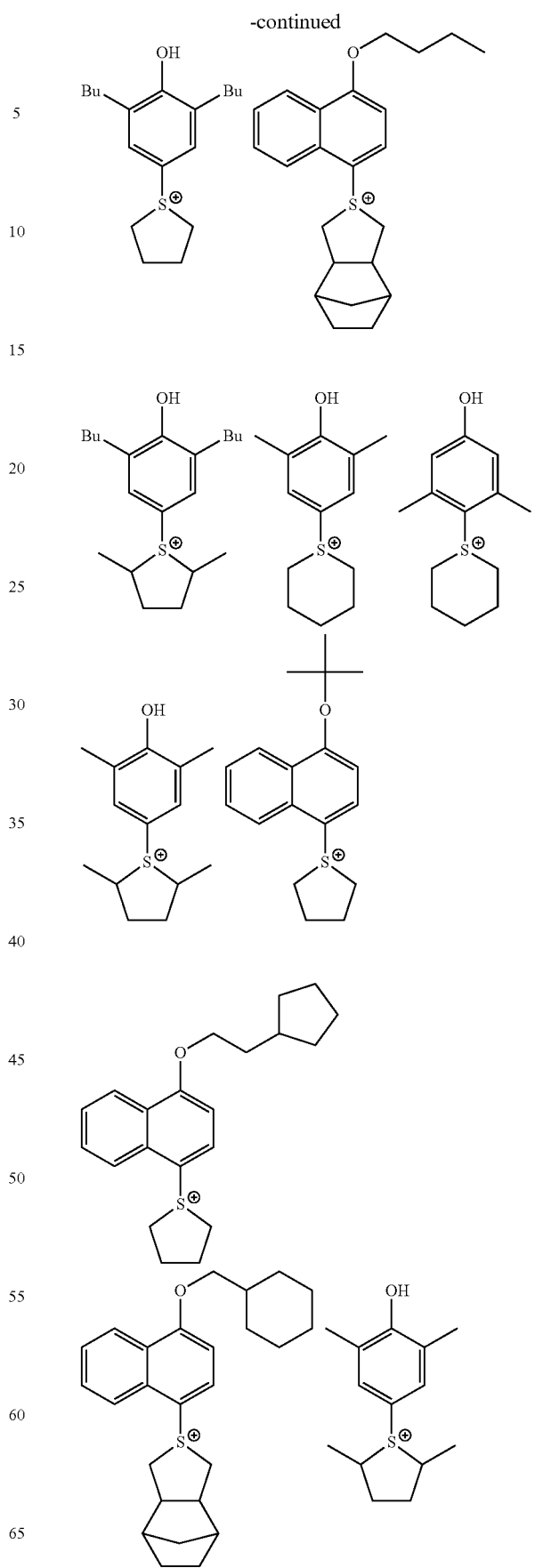

97
-continued
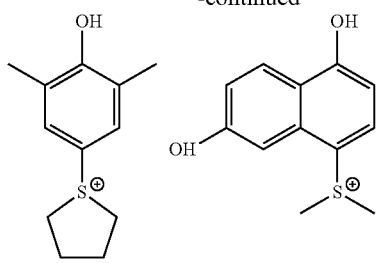
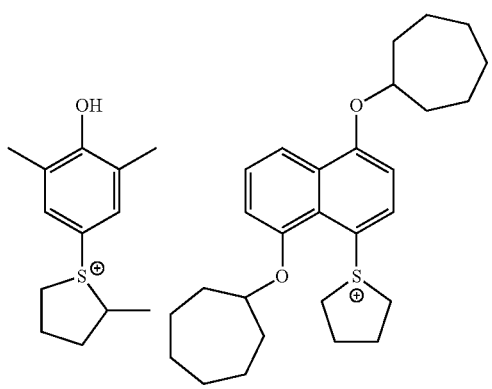
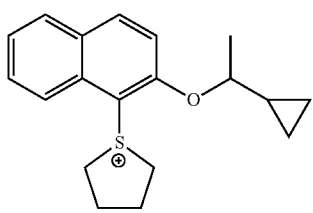
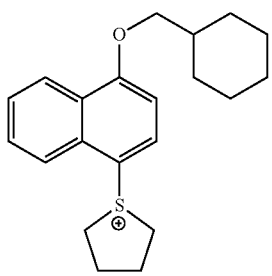
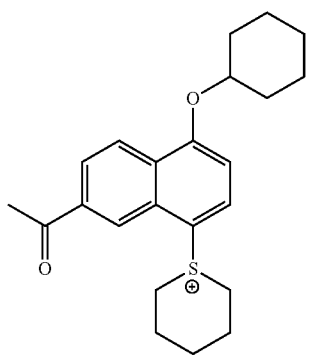
98
-continued
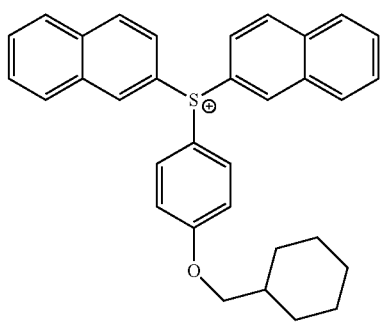
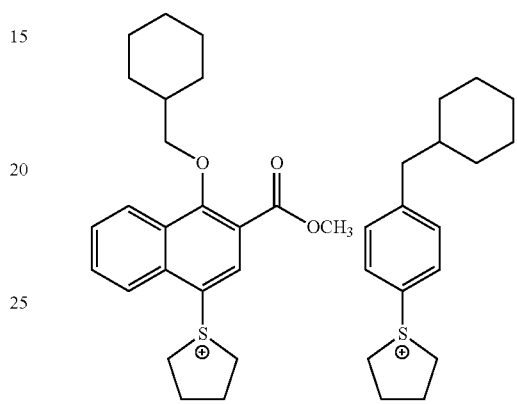
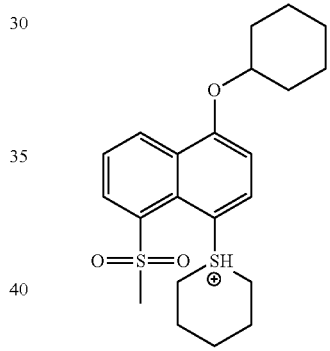
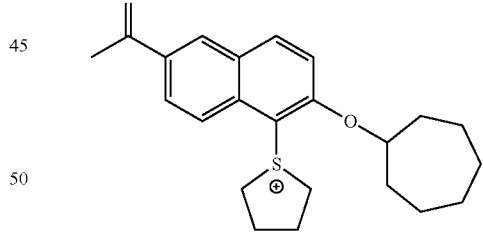
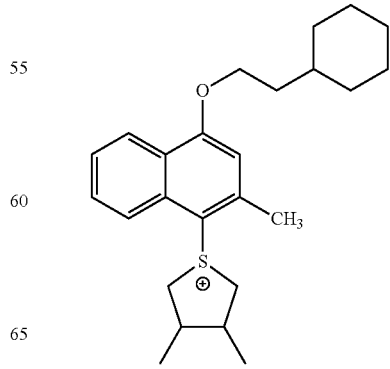

99
-continued
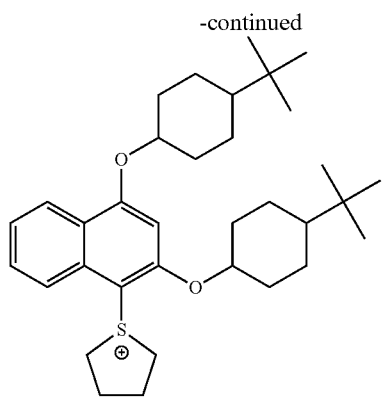
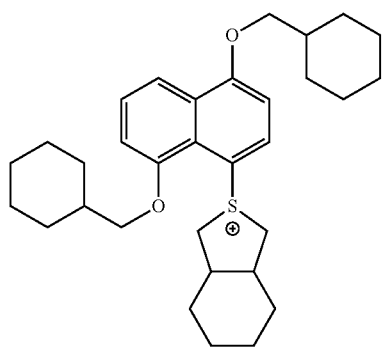
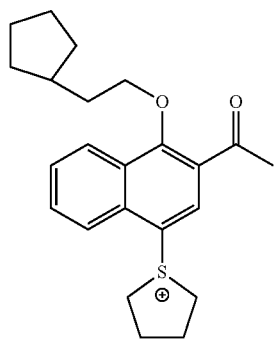
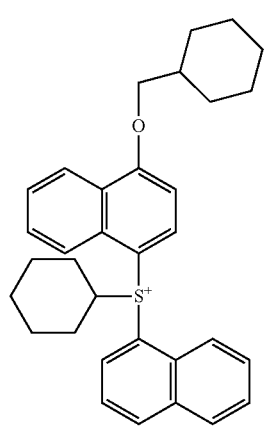
100
-continued
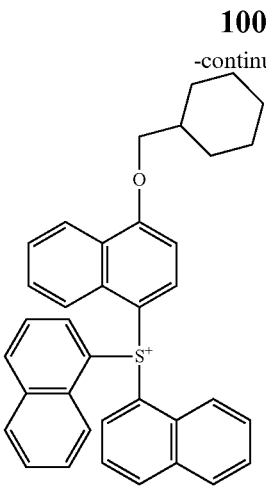
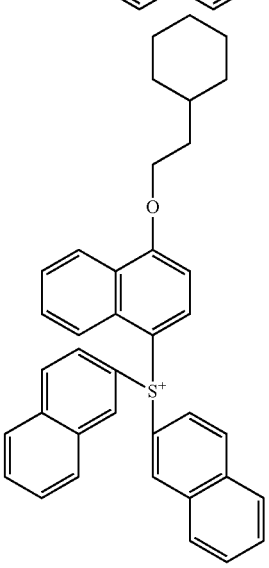
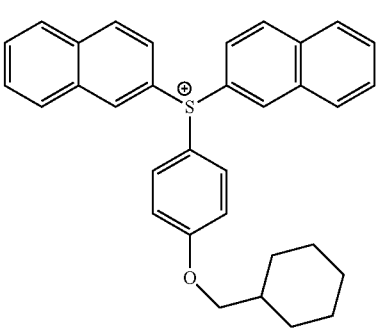
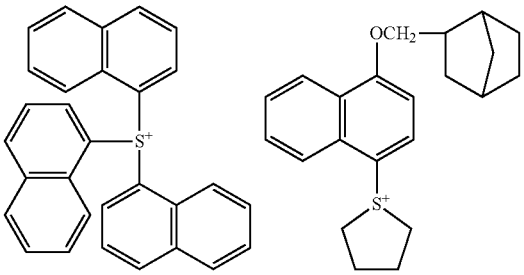
The compounds (ZI-5) are those represented by the general formula (ZI-5) below.

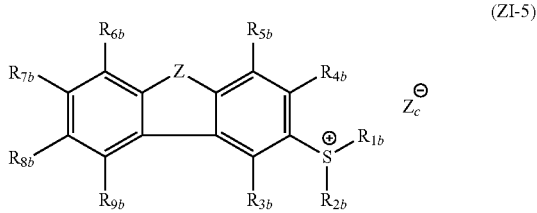

(ZI-5)

In the formula (ZI-5),

Z represents an oxygen atom, a sulfer atom, or —N($R_x$)—. $R_x$ represents a hydrogen atom, an alkyl group, a cycloalkyl group, an acyl group, an alkenyl group, an alkoxycarbonyl group, an aryl group, an arylcarbonyl group, or an aryloxycarbonyloxy group.

$R_{1b}$ and $R_{2b}$ each independently represents an alkyl group, a cycloalkyl group, or an aryl group.

$R_{3b}$ to $R_{9b}$ each independently represents a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group, or an aryloxycarbonyl oxy group.

$R_{1b}$ and $R_{2b}$ may be bonded with each other to thereby form a ring structure. Also, any two or more of $R_{6b}$ to $R_{9b}$, and $R_{3b}$ and $R_{9b}$, and $R_{4b}$ and $R_{5b}$, and $R_{5b}$ and $R_x$, and $R_{6b}$ and $R_x$ may be bonded with each other to thereby form a ring structure, respectively.

$Zc^-$ represents a non-nucleophilic anion, and includes the same non-nucleophilic anions as mentioned with respect to the $Z^-$ of the general formula (ZI).

In general formula (ZI-5), the alkyl groups for $R_{1b}$ to $R_{9b}$ and $R_x$ may be linear or branched and preferably each have 1 to 10 carbon atoms, and include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-propyl group, an i-propyl group, an n-butyl group, a t-butyl group and the like are preferred.

The cycloalkyl groups for $R_{1b}$ to $R_{9b}$ and $R_x$ include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups for $R_{3b}$ to $R_{9b}$ and $R_x$ may be linear or branched and preferably each have 1 to 10 carbon atoms, and include, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group for $R_{3b}$ to $R_{9b}$ and $R_x$ may be linear or branched and preferably has 2 to 11 carbon atoms, and include, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

The acyl group for $R_{3b}$ to $R_{9b}$ and $R_x$ may have a substituent group, and preferably has 1 to 10 carbon atoms. Specifically, the acyl group includes an acetyl group, a propionyl group, an isobutyryl group or the like.

The alkenyl group for $R_x$ is preferably one having 2 to 8 carbon atoms, and includes, for example, a vinyl group, an allyl group or a butenyl group.

The alkoxy groups for $R_{3b}$ to $R_{9b}$ may have a substituent group and is preferavly one having 1 to 20 carbon atoms. Specifically, the alkoxy group includes a methoxy group, an ethoxy group, an isopropyloxy group, and a cyclohexyloxy group.

The alkoxycarbonyl group for $R_{3b}$ to $R_{9b}$ and $R_x$ may have a substituent group and is preferably one having 2 to 20 carbon atoms. Specifically, the alkoxycarbonyl group includes a methoxycarbonyl group, an ethoxycarbonyl group, an isopropyloxycarbonyl group, and a cyclohexyloxycarbonyl group.

The alkylcarbonyloxy group for $R_{3b}$ to $R_{9b}$ may have a substituent group and is preferably one having 2 to 20 carbon atoms. Specifically, the alkylcarbonyloxy group includes a methylcarbonyloxy group, an ethylcarbonyloxy group, an isopropylcarbonyloxy group, and a cyclohexylcarbonyloxy group.

The aryl group for $R_{3b}$ to $R_{9b}$ and $R_x$ may have a substituent group, and is preferably one having 6 to 14 carbon atoms. The aryl group includes, for example, a phenyl group, and a naphtyl group.

The aryloxy group for $R_{3b}$ to $R_{9b}$ may have a substituent, group, and is preferably one having 6 to 14 carbon atoms. The aryloxy group includes, for example, a phenyloxy group, and a naphtyloxy group.

The aryloxycarbonyl group for $R_{3b}$ to $R_{9b}$ and $R_x$ may have a substituent group, and is preferably one having 7 to 15 carbon atoms. The aryloxycarbonyl group includes, for example, a phenyloxycarbonyl group, and a naphtyloxycarbonyl group.

The arylcarbonyloxy group for $R_{3b}$ to $R_{9b}$ may have a substituent group, and is preferably one having 7 to 15 carbon atoms. The arylcarbonyloxy group includes, for example, a phenylcarbonyloxy group, and a naphtylcarbonyloxy group.

The arylcarbonyl group for $R_x$ may have a substituent group, and is preferably one having 7 to 15 carbon atoms. The arylcarbonyl group includes, for example, a phenylcarbonyl group, and a naphtylcarbonyl group.

Each of the cycloalkyl group for $R_{3b}$ to $R_{9b}$ and $R_x$, the acyl for $R_{3b}$ to $R_{9b}$ and $R_x$, the alkoxy group for $R_{3b}$ to $R_{9b}$, the alkoxycabonyl group for $R_{3b}$ to $R_{9b}$, the alkylcabonyloxy group for $R_{3b}$ to $R_{9b}$, the aryl group for $R_{3b}$ to $R_{9b}$ and $R_x$, the aryloxy group for $R_{3b}$ to $R_{9b}$, the aryloxycarbonyl group for $R_{3b}$ to $R_{9b}$ and $R_x$, the arylcarbonyloxy group for $R_{3b}$ to $R_{9b}$, the arylcarbonyl group for $R_x$ may have a further substituent group. Such a substituent group includes an alkyl group (which may be linear or branched and preferbly has 1 to 12 carbon atoms), an aryl group (which preferbly has 6 to 14 carbon atoms), a nitro group, a halogen atom such as a fluorine atom, a carboxyl group, a hydroxyl group, an amino group, a cyano group, an alkoxyl group (which preferbly has 1 to 15 carbon atoms), a cycloalkyl group (which preferbly has 3 to 15 carbon atoms), and an acyl group (which preferbly has 2 to 12 carbon atoms).

The cyclic structure that may be formed by bonding of $R_{1b}$ and $R_{1b}$ to each other preferably includes a 5- or 6-membered ring, especially a 5-membered ring (namely, a tetrahydrothiophene ring) formed by bivalent $R_{1b}$ and $R_{1b}$ (for example, an ethylene group, an ethylene group, and a 1,2-cyclohexylene group) in cooperation with the sulfur atom of general formula (I). It should be noted that $R_{1b}$ and $R_{1b}$ are not bonded to each other so as not to form a ring from the viewpoint of decomposition efficiency for acid anion generation.

The cyclic structure that may be formed by bonding of any two or more of $R_{6b}$ to $R_{9b}$, and $R_{3b}$ and $R_{9b}$, and $R_{4b}$ and $R_{5b}$, and $R_{5b}$ and $R_x$, and $R_{6b}$ and $R_x$ preferably includes a 5- or 6-membered ring, more preferably a 6-membered ring.

It is particulary preferable that $R_{1b}$ and $R_{2b}$ be an alkyl group or an aryl group.

Particulary preferable examples of $R_{3b}$ to $R_{9b}$ include an alkyl group which may have a substituent group or a hydrogen atom. When use of made in the ArF resist application, they are particularly preferable a hydrogen atom from the viewpoint of absorption intencity for light with a wavelength of 193 nm.

It is particulary preferable that $R_x$ be an alkyl group or an acyl group.

Specific examples of the cation moiety in the compound (ZI-5) will be described below.

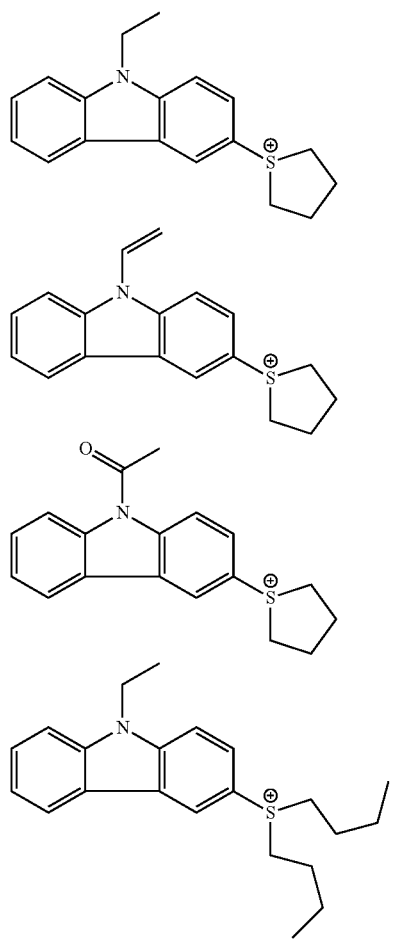

-continued

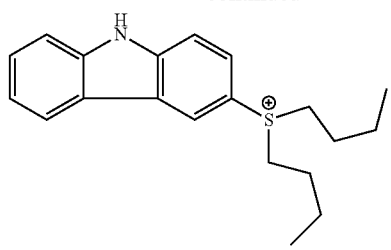

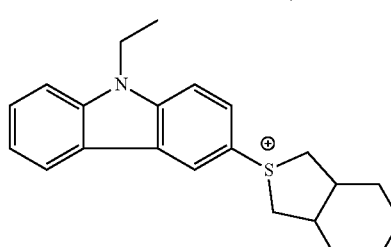

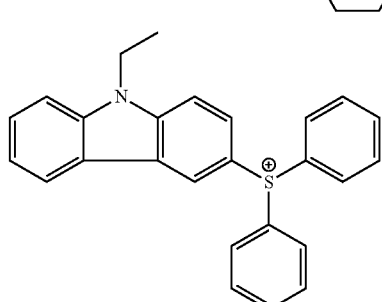

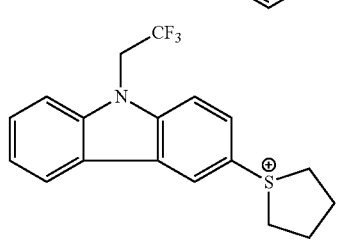

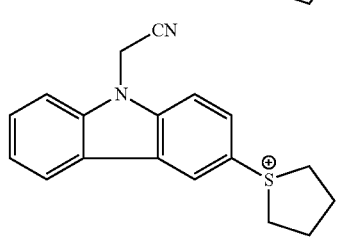

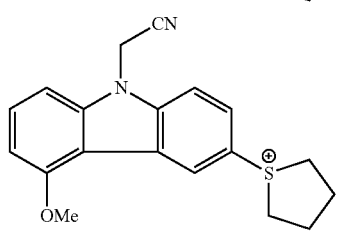

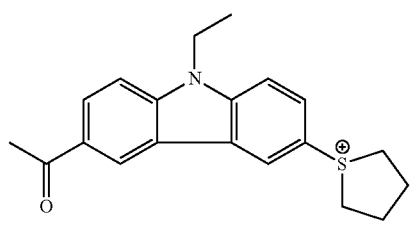

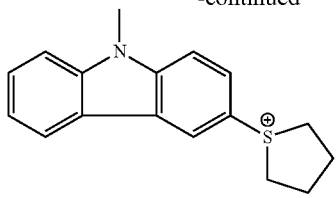
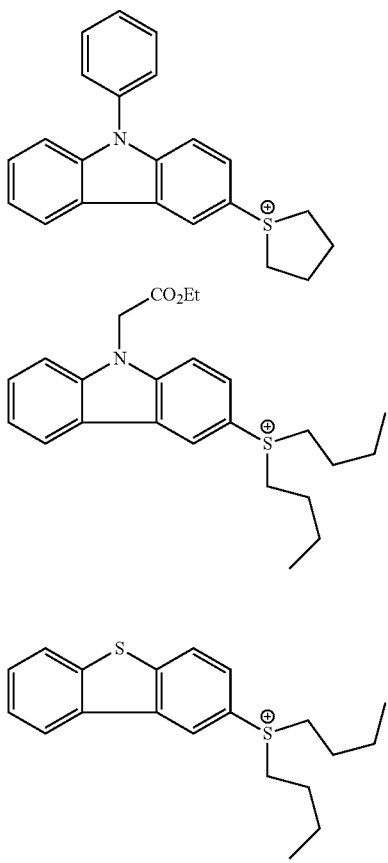
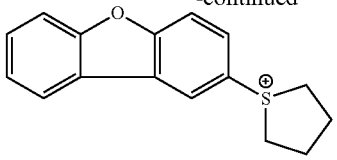

Now the general formulae (ZII) and (ZIII) will be described.

In general formulae (ZII) and (ZIII), $R_{204}$ to $R_{207}$ each independently represents an aryl group, an alkyl group or a cycloalkyl group.

The aryl group for $R_{204}$ to $R_{207}$ is preferably a phenyl group or a naphthyl group, more preferably a phenyl group. The aryl group for $R_{204}$ to $R_{207}$ may be one having a heterocyclic structure containing an oxygen atom, nitrogen atom, sulfur atom, etc. The heterocyclic structure includes, for example, pyrrole, furan, thiophene, indole, benzofuran, and benzothiophene.

The alkyl groups and cycloalkyl groups for $R_{204}$ to $R_{207}$ preferably include a linear or branched alkyl group having 1 to 10 carbon atoms (for example, a methyl group, an ethyl group, a propyl group, a butyl group and a pentyl group) and a cycloalkyl group having 3 to 10 carbon atoms (for example, a cyclopentyl group, a cyclohexyl group and a norbornyl group).

The aryl group, alkyl group and cycloalkyl group for $R_{204}$ to $R_{207}$ may have a substituent group. A possible substituent group, that the aryl group, alkyl group and cycloalkyl group for $R_{204}$ to $R_{207}$ may contain, includes an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxyl group, and a phenylthio group.

$Z^-$ represents a non-nucleophilic anion, and includes the same non-nucleophilic anions as mentioned with respect to the $Z^-$ in the general formula (ZI).

As the acid generators, the compounds represented by the following general formulae (ZIV), (ZV) and (ZVI) can further be exemplified.

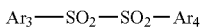

ZIV

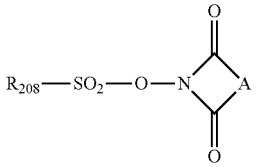

ZV

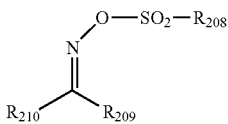

ZVI

In the general formulae (ZIV) to (ZVI), $Ar_3$ and $Ar_4$ each independently represents an aryl group.

$R_{208}$, $R_{209}$ and $R_{210}$ each independently represents an alkyl group, a cycloalkyl group or an aryl group.

A represents an alkylene group, an alkenylene group or an arylene group.

Among the acid generators, the compounds represented by the general formulae (ZI) to (ZIII) are more preferred.

The acid generator is preferably a compound capable of generating an acid containing one sulfonic acid group or imido group. More preferably, the acid generator is a compound capable of generating a monovalent perfluoroalkanesulfonic acid, or a compound capable of generating a monovalent aromatic sulfonic acid substituted with a fluorine atom or a group containing a fluorine atom, or a compound capable of generating a monovalent imidic acid substituted with a fluorine atom or a group containing a fluorine atom. Further more preferably, the acid generator is a sulfonium salt of fluorinated alkanesulfonic acid, fluorinated benzenesulfonic acid, fluorinated imidic acid or fluorinated methide acid. With respect to useful acid generators, it is especially preferred for the generated acid to be a fluorinated alkanesulfonic acid, fluorinated benzenesulfonic acid or fluorinated imidic acid which generates an acid with pKa of −1 or below. These acid generators can enhance the sensitivity.

Especially preferred examples of the acid generators will be shown below.

(z1) 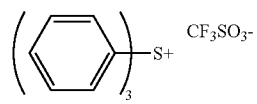

(z2) 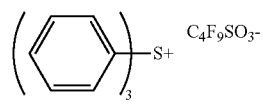

(z3) 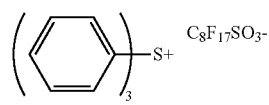

(z4) 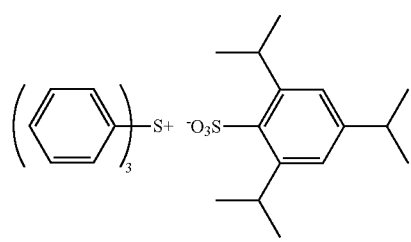

(z5) 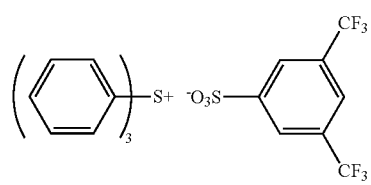

(Z6) 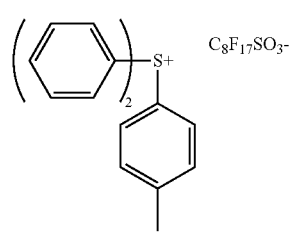

(z7) 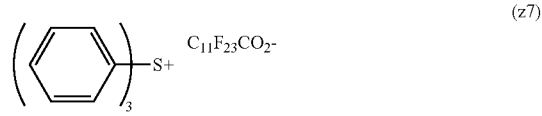

(z8) 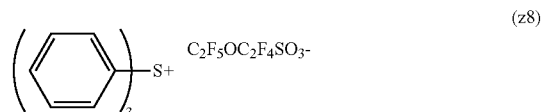

(z9) 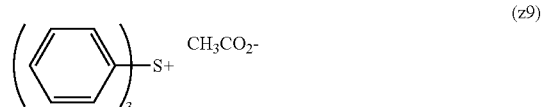

(z10) 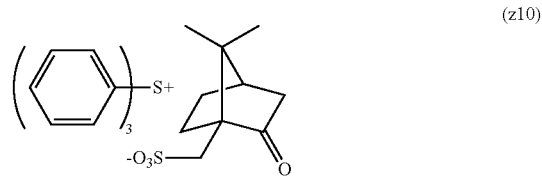

(z11) 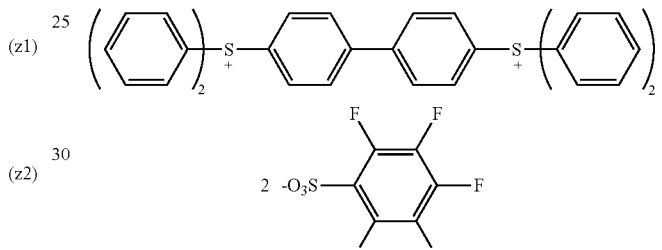

(z12) 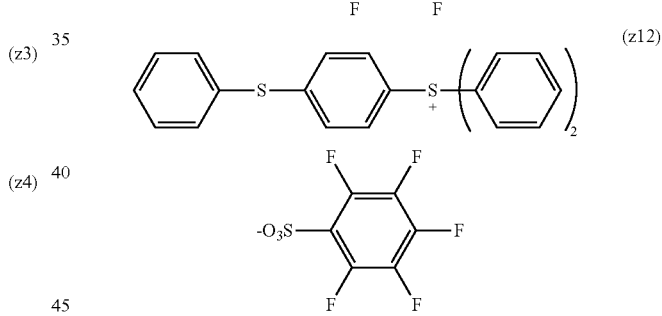

(z13) 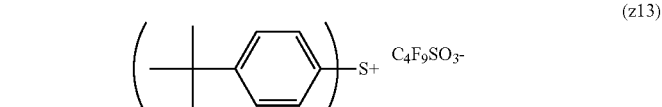

(z14) 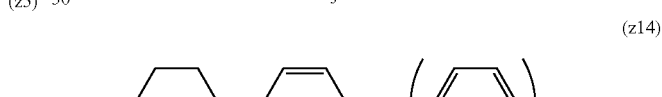

(z15) 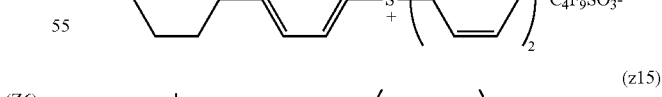

(z16) 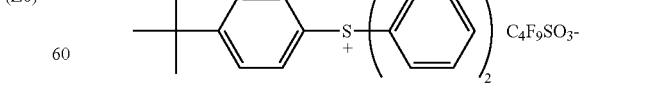

(z17) 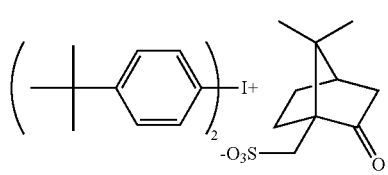
(z18) 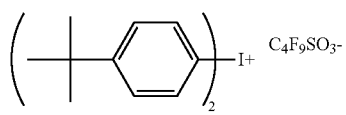
(z19) 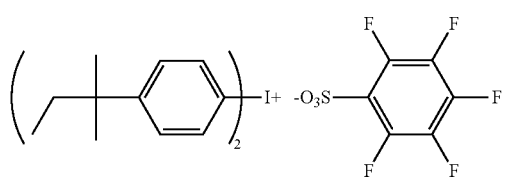
(z20) 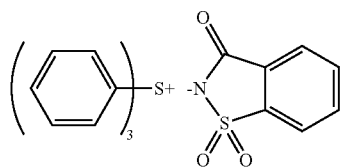
(z21) 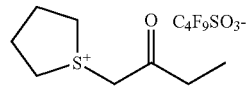
(z22) 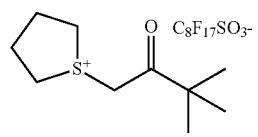
(z23) 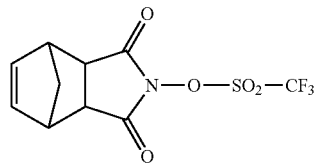
(z24) 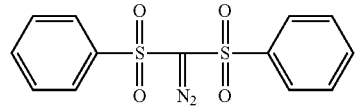
(z25) 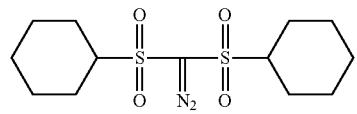
(z26) 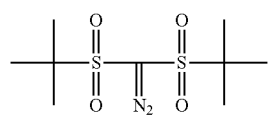
(z27) 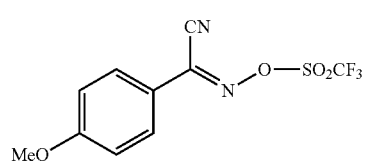
(z28) 
(z29) 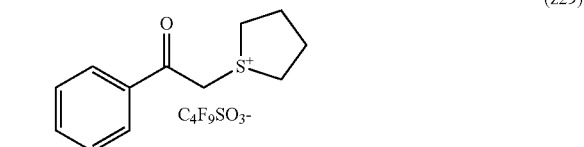
(z30) 
(z31) 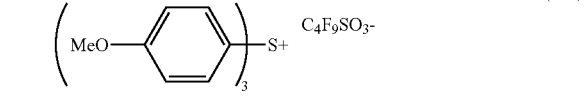
(z32) 
(z33) 
(z34) 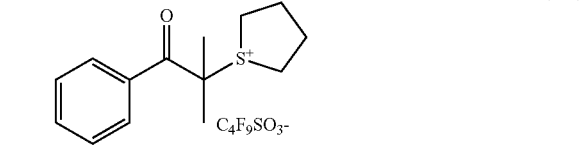
(z35) 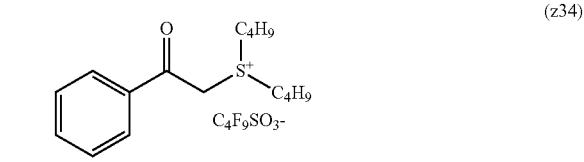
(z36) 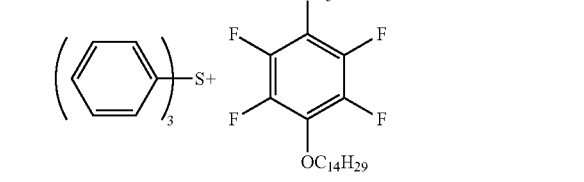

111
-continued
(z37) 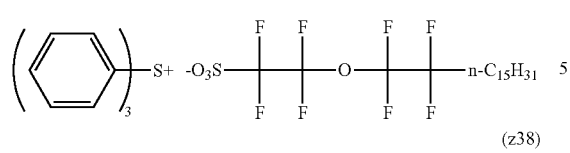
(z38) 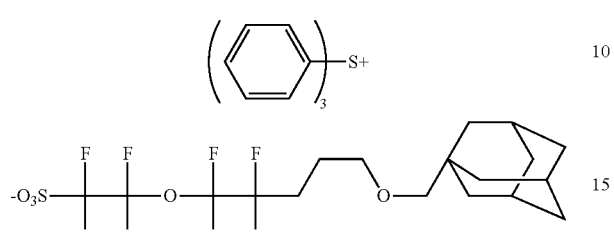
(z39) 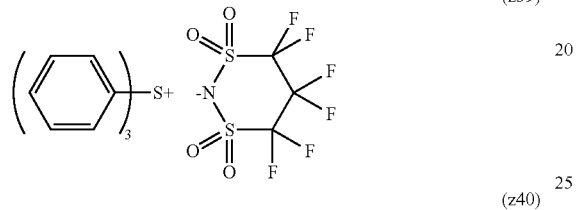
(z40) 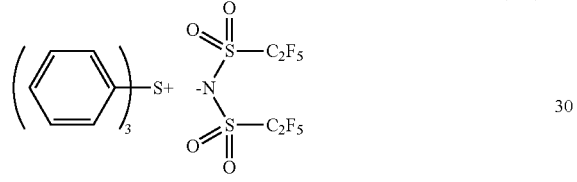
(z41) 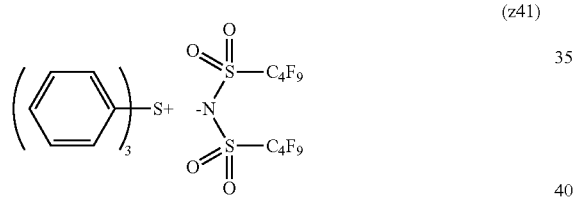
(z42) 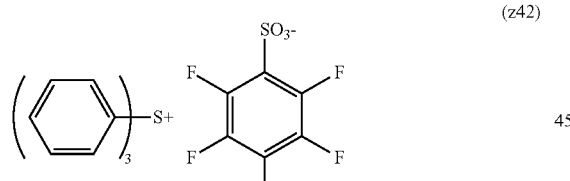
(z43) 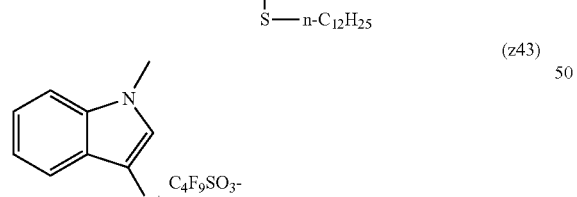
(z44) 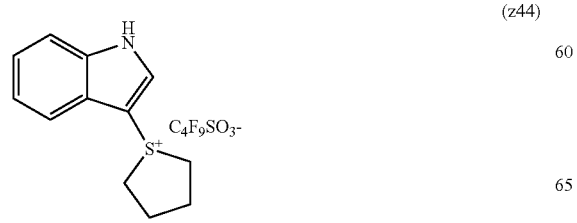
112
-continued
(z45) 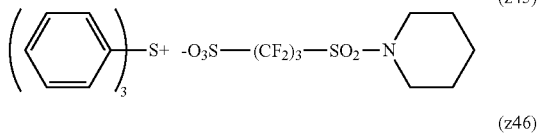
(z46) 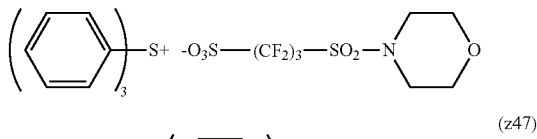
(z47) 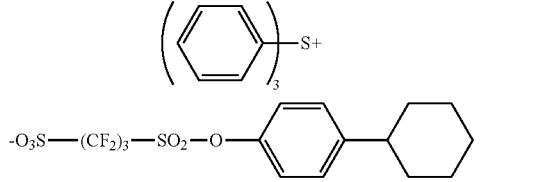
(z48) 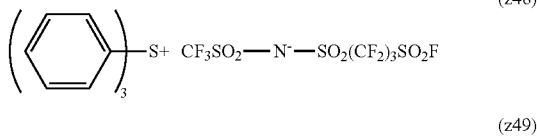
(z49) 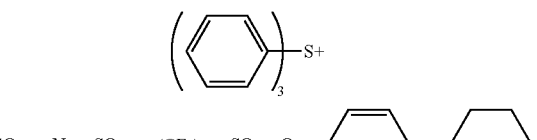
(z50) 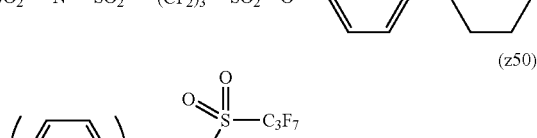
(z51) 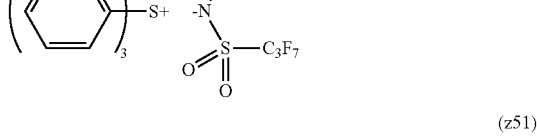
(z52) 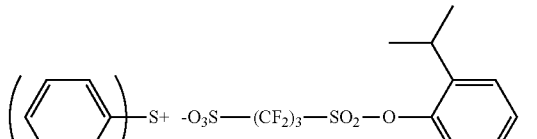
(z53) 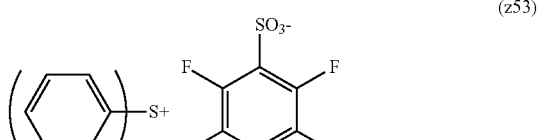

-continued (z54) $(\text{Ph})_3\text{S}^+ \ \text{C}^-(\text{SO}_2\text{C}_3\text{F}_7)_3$ (z55) $(\text{Ph})_3\text{S}^+ \ \text{C}^-(\text{SO}_2\text{C}_2\text{F}_5)_3$ (z56) $(\text{Ph})_3\text{S}^+ \ \text{C}^-(\text{SO}_2\text{CF}_3)_3$ (z57) $(\text{Ph})_3\text{S}^+$ with $^-\text{O}_3\text{S}-(\text{CF}_2)_3-\text{SO}_2-\text{O}-$(2,6-diisopropyl-4-formylphenyl)

(z58) $(\text{Ph})_3\text{S}^+ \ \text{C}_2\text{F}_5\text{SO}_3^-$ (z59) $(\text{Ph})_3\text{S}^+ \ \text{C}_3\text{F}_7\text{SO}_3^-$ (z60) $(\text{Ph})_3\text{S}^+ \ \text{C}_5\text{F}_{11}\text{SO}_3^-$ (z61) $(\text{Ph})_2(\text{tolyl})\text{S}^+$ with $^-\text{O}_3\text{S}-$(3,5-di-tert-butoxycarbonylphenyl)

(z62) $(\text{Ph})_2(\text{tolyl})\text{S}^+$ with $^-\text{O}_3\text{S}-$(3,5-bis(adamantyloxycarbonyl)phenyl)

(z63) (4-tert-butylphenyl)(phenyl)$_2\text{S}^+$ with 2,4,6-triisopropyl-3-nitrobenzenesulfonate (z64) $(\text{Ph})_3\text{S}^+$ with $^-\text{O}_3\text{S}-$(3,5-bis(2-cyclohexylethoxycarbonyl)phenyl)

(z65) $(\text{Ph})_3\text{S}^+$ with $^-\text{O}_3\text{S}-$(perfluorocyclohexyl)

(z66) $(\text{Ph})_3\text{S}^+$ with $^-\text{O}_3\text{S}-(\text{CF}_2)_3-\text{SO}_2-\text{O}-$(4-(5-phenyl-1,3-dioxan-2-yl)phenyl)

(z67) $(\text{Ph})_3\text{S}^+$ with $^-\text{O}_3\text{S}-(\text{CF}_2)_3-\text{SO}_2-\text{O}-$(4-(adamantyloxycarbonylmethylthio)phenyl)

(z68) fluoren-2-yl–C(CF$_3$)=N–O–SO$_2$C$_4$F$_9$

-continued (z69) (z70) (z71) (z72) (z73) (z74)

-continued (z75) (z76) (z77) (z78) (z79) (z80)

(z81) 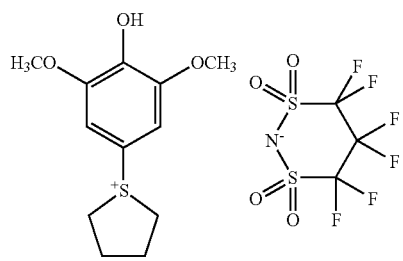
(z82) 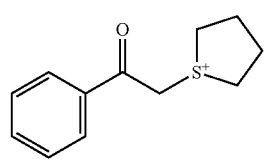
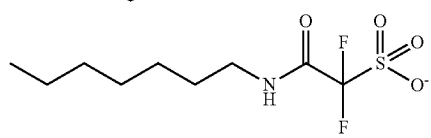
(z83) 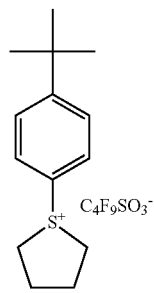
(z84) 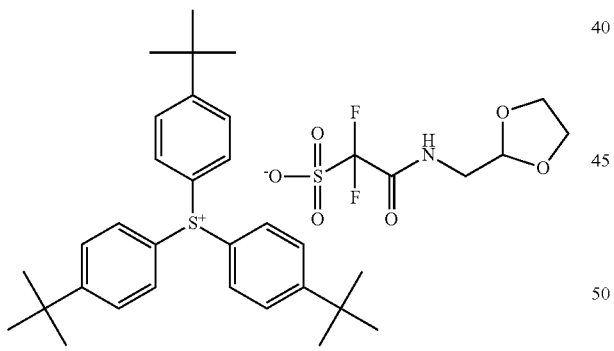
(z85) 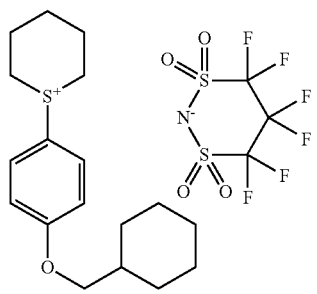
(z86) 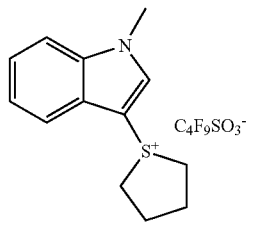
(z87) 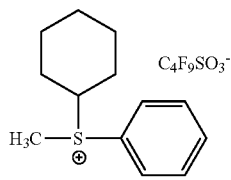
(z88) 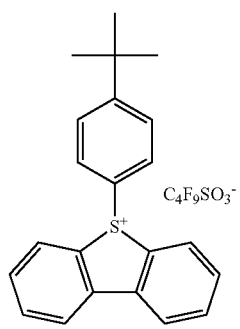
(z89) 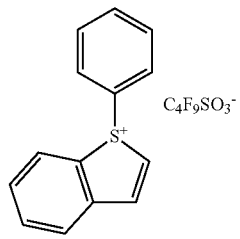
(z90) 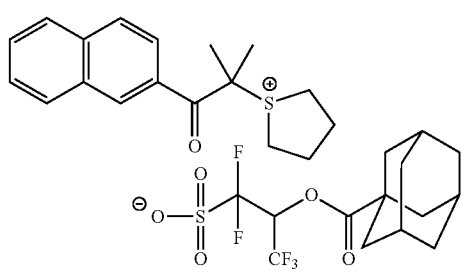
(z91) 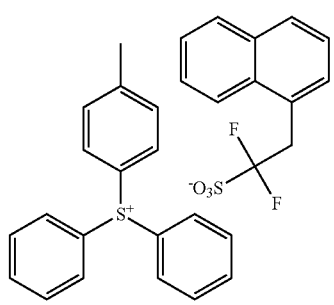

(z92)
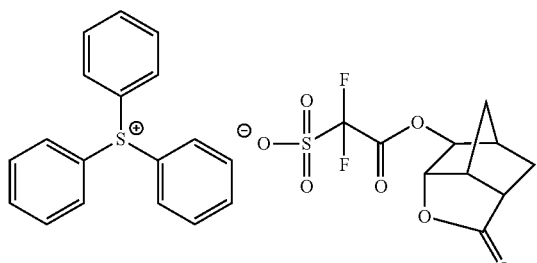
(z93)
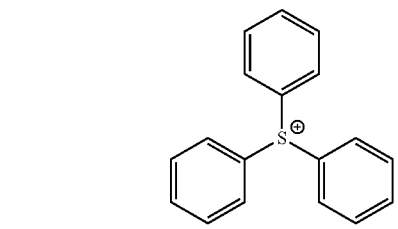
(z94)
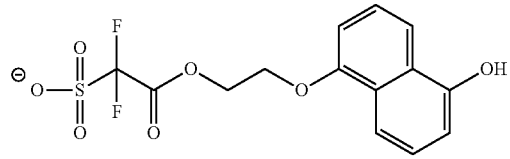
(z95)
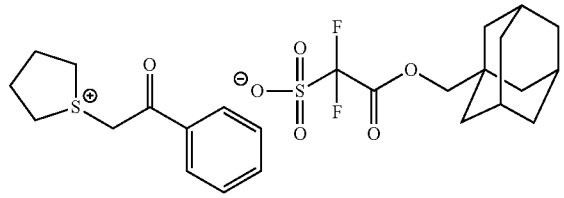
(z96)
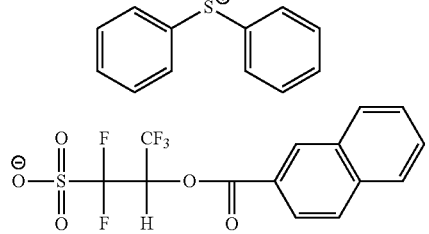
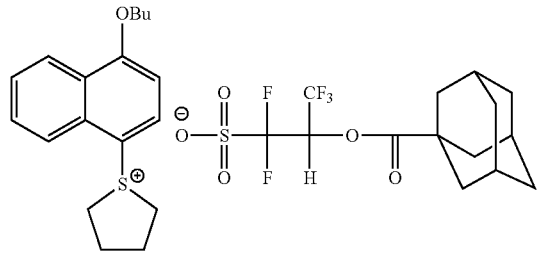
(z97)
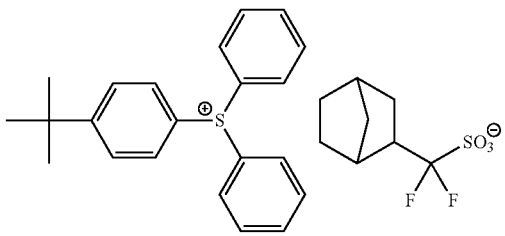
(z98)
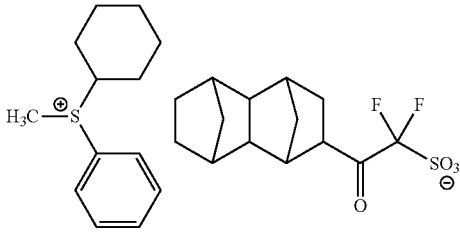
(z99)
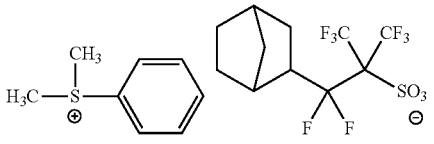
(z100)
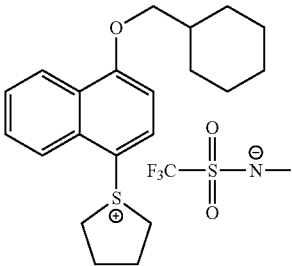
(z101)
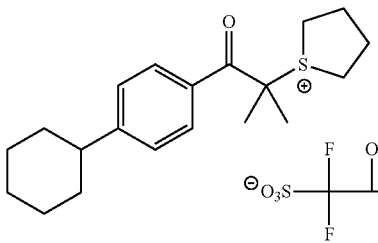
(z102)
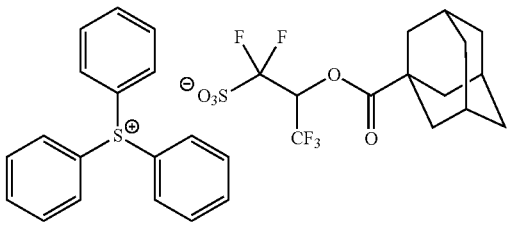

-continued

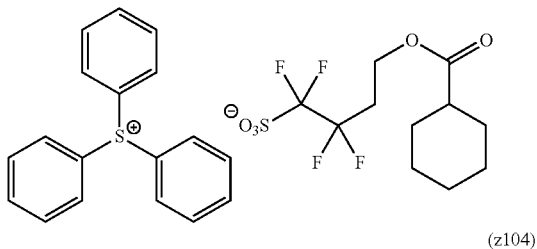
(z103)

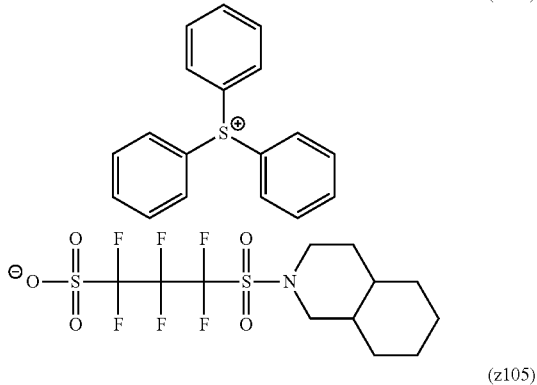
(z104)

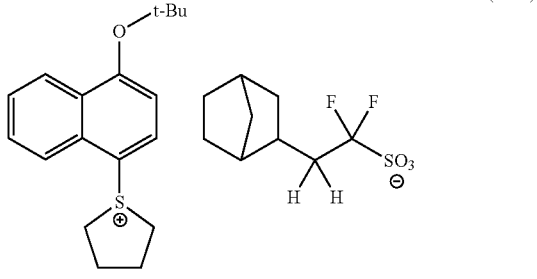
(z105)

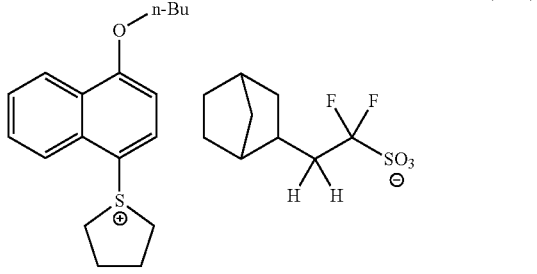
(z106)

The compound (C) may be used alone, or two or more thereof may be used in combination.

When the composition of the present invention contains the component (C), the content thereof based on the total solids of the composition is preferably in the range of 0.1 to 30 mass %, more preferably 0.5 to mass %, further more preferably 3 to 20 mass % and most preferably 5 to 20 mass %.

When the acid generator contain the compound (C), the percentage thereof based on the total solids of the composition is preferably in the range of 0.1 to mass %, more preferably 0.5 to 25 mass %, further more preferably 3 to 20 mass % and most preferably 5 to 20 mass %.

When the acid generator is represented by the above general formula (ZI-3), (ZI-4) or (ZI-5), the percentage thereof based on the total solids of the composition is preferably in the range of 0.5 to 30 mass %, more preferably 1 to 25 mass %, further more preferably 3 to 20 mass %, and most preferably 5 to 20 mass %.

The mass ratio of compound (C) to compound (B) [compound (C)/compound (B)] is preferably in the range of 0.5 to 5, more preferably 1.5 to 5.

(D) Hydrophobic Resin

The composition according to the present invention may further contain a hydrophobic resin (hereinafter also referred to as a "resin (D)"). The hydrophobic resin contains at least either a fluorine atom or a silicon atom.

The fluorine atom and/or silicon atom may be introduced in the main chain of the hydrophobic resin or a side chain thereof.

When the hydrophobic resin contains a fluorine atom, it is preferred for the resin to comprise, as a partial structure containing a fluorine atom, an alkyl group containing a fluorine atom, a cycloalkyl group containing a fluorine atom or an aryl group containing a fluorine atom.

The alkyl group having a fluorine atom is a linear or branched alkyl group whose at least one hydrogen atom is replaced by a fluorine atom. The alkyl group preferably has 1 to 10 carbon atoms, more preferably 1 to 4 carbon atoms. A further other substituent group may be introduced in the alkyl group.

The cycloalkyl group having a fluorine atom is a mono- or polycycloalkyl group whose at least one hydrogen atom is replaced by a fluorine atom. A further substituent group may be introduced in the cycloalkyl group.

As the aryl group containing a fluorine atom, there can be mentioned one having at least one hydrogen atom of an aryl group, such as a phenyl or naphthyl group, substituted with a fluorine atom. Further, other substituent groups may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

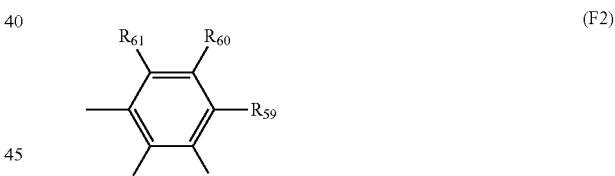
(F2)

(F3)

(F4)

In general formulae (F2) to (F4), each of $R_{57}$ to $R_{68}$ independently represents a hydrogen atom, a fluorine atom or an alkyl group (linear or branched), provided that at least one of each of $R_{57}$-$R_{61}$, at least one of each of $R_{62}$-$R_{64}$ and at least one of each of $R_{65}$-$R_{68}$ represent a fluorine atom or an alkyl group (preferably having 1 to 4 carbon atoms) having at least one hydrogen atom thereof substituted with a fluorine atom.

It is preferred that all of $R_{57}$-$R_{61}$ and $R_{65}$-$R_{67}$ represent fluorine atoms. Each of $R_{62}$, $R_{63}$ and $R_{68}$ preferably represents a fluoroalkyl group (especially having 1 to 4 carbon atoms), more preferably a perfluoroalkyl group having 1 to 4 carbon atoms. When each of $R_{62}$ and $R_{63}$ represents a perfluoroalkyl group, $R_{64}$ preferably represents a hydrogen atom. $R_{62}$ and $R_{63}$ may be bonded with each other to thereby form a ring.

Specific examples of the groups of general formula (F2) include a p-fluorophenyl group, a pentafluorophenyl group, a 3,5-di(trifluoromethyl)phenyl group and the like.

Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl) isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include —C(CF$_3$)$_2$OH, —C(C$_2$F$_5$)$_2$OH, —C(CF$_3$)(CF$_3$)OH, —CH(CF$_3$)OH and the like. —C(CF$_3$)$_2$OH is preferred.

The partial structure containing a fluorine atom may be directly bonded to the main chain, or may be bonded to the main chain through a group selected from the group consisting of an alkylene group, a phenylene group, an ether group, a thioether group, a carbonyl group, an ester group, an amido group, a urethane group and a ureylene group, or through a group composed of a combination of two or more of these groups.

As preferred repeating units having a fluorine atom, there can be mentioned the repeating units represented by the general formulae below.

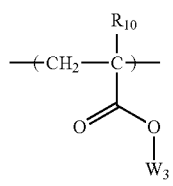
(C-Ia)

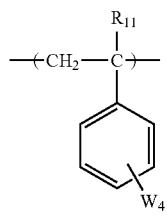
(C-Ib)

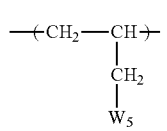
(C-Ic)

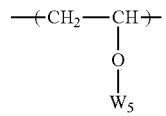
(C-Id)

In the formulae, each of $R_{10}$ and $R_{11}$ independently represents a hydrogen atom, a fluorine atom or an alkyl group. The alkyl group is preferably a linear or branched alkyl group having 1 to 4 carbon atoms. The alkyl group may have a substituent group. As a substituted alkyl group, there can be mentioned, in particular, a fluorinated alkyl group.

Each of $W_3$ to $W_6$ independently represents an organic group containing at least one fluorine atom. As such, for example, there can be mentioned the atomic groups of general formulae (F2) to (F4) above.

Further, besides these, the following units may be introduced as the repeating unit containing a fluorine atom.

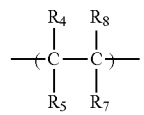
(C-II)

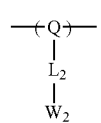
(C-III)

In the formulae, each of $R_4$ to $R_7$ independently represents a hydrogen atom, a fluorine atom or an alkyl group. The alkyl group is preferably a linear or branched alkyl group having 1 to 4 carbon atoms. The alkyl group may have a substituent group. As a substituted alkyl group, there can be mentioned, in particular, a fluorinated alkyl group.

At least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —SO$_2$—, —CO—, —N(R)— (in the formula, R is a hydrogen atom or an alkyl group), —NHSO$_2$— or a bivalent connecting group consisting of a combination of two or more of these.

Q represents an alicyclic structure. A substituent group may be introduced in the alicyclic structure. The alicyclic structure may be monocyclic or polycyclic. The alicyclic structure when being polycyclic may be a bridged one. The alicyclic structure when being monocyclic is preferably a cycloalkyl group having 3 to 8 carbon atoms. As such, there can be mentioned, for example, a cyclopentyl group, a cyclohexyl group, a cyclobutyl group, a cyclooctyl group or the like. As the polycyclic one, there can be mentioned a group with, for example, a bicyclo, tricyclo or tetracyclo structure having 5 or more carbon atoms. A cycloalkyl group having 6 to 20 carbon atoms is preferred. As such, there can be mentioned, for example, an adamantyl group, a norbornyl group, a dicyclopentyl group, a tricyclodecanyl group, a tetracyclododecyl group or the like. The carbon atoms of the cycloalkyl group may be partially replaced with a heteroatom, such as an oxygen atom. It is especially preferred for Q to represent a norbornyl group, a tricyclodecanyl group, a tetracyclododecyl group or the like.

The hydrophobic resin may contain a silicon atom.

It is preferred for the hydrophobic resin to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

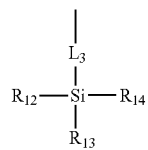
(CS-1)

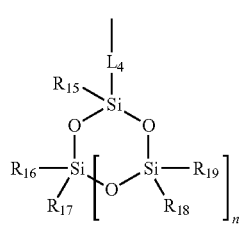
(CS-2)

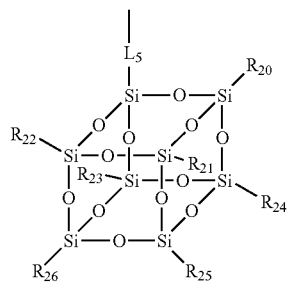
(CS-3)

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether bond, a thioether bond, a carbonyl group, an ester bond, an amido bond, a urethane bond and a ureylene bond.

In the formulae, n is an integer of 1 to 5. n is preferably an integer of 2 to 4.

It is preferred for the repeating unit containing at least either a fluorine atom or a silicon atom to be a (meth)acrylate repeating unit.

Particular examples of the repeating units each containing at least either a fluorine atom or a silicon atom are shown below, which in no way limit the scope of the present invention. In the particular examples, $X_1$ represents a hydrogen atom, —$CH_3$, —F or —$CF_3$, and $X_2$ represents —F or —$CF_3$.

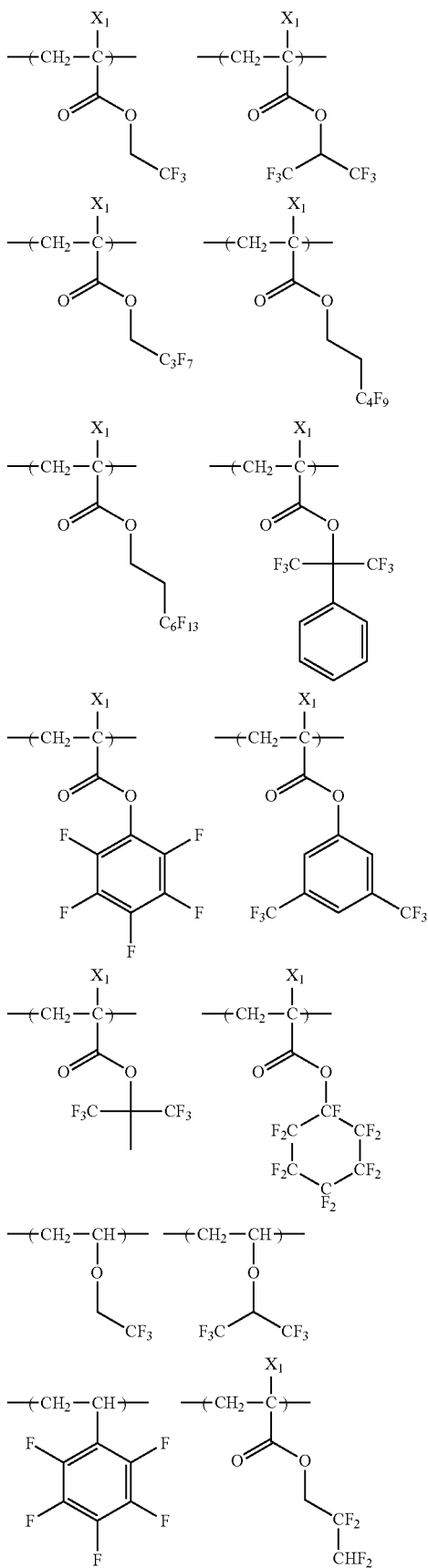

127
-continued
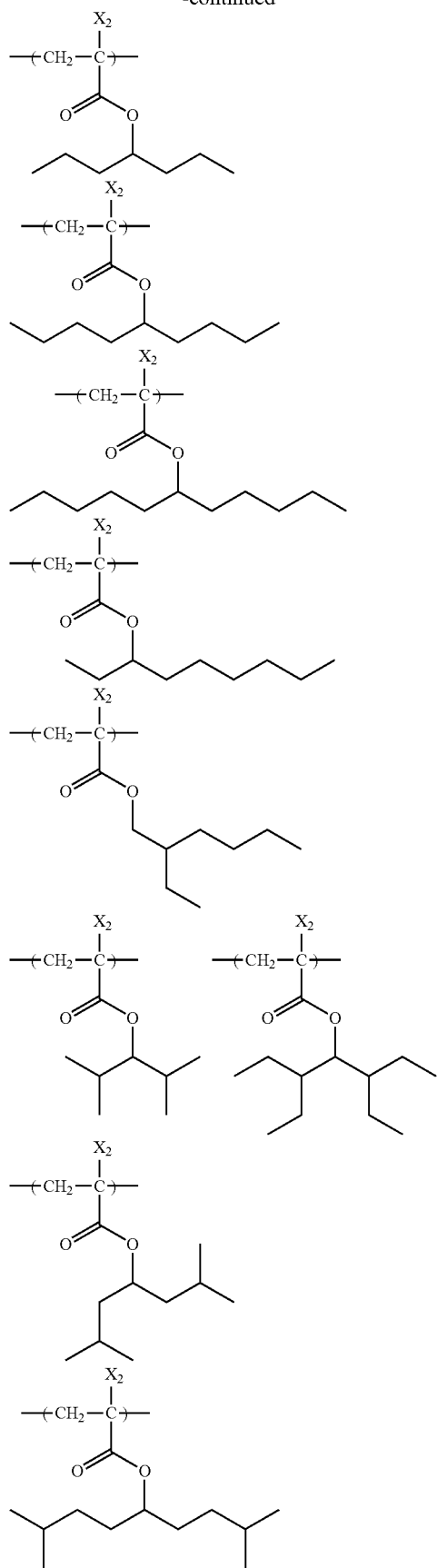
128
-continued
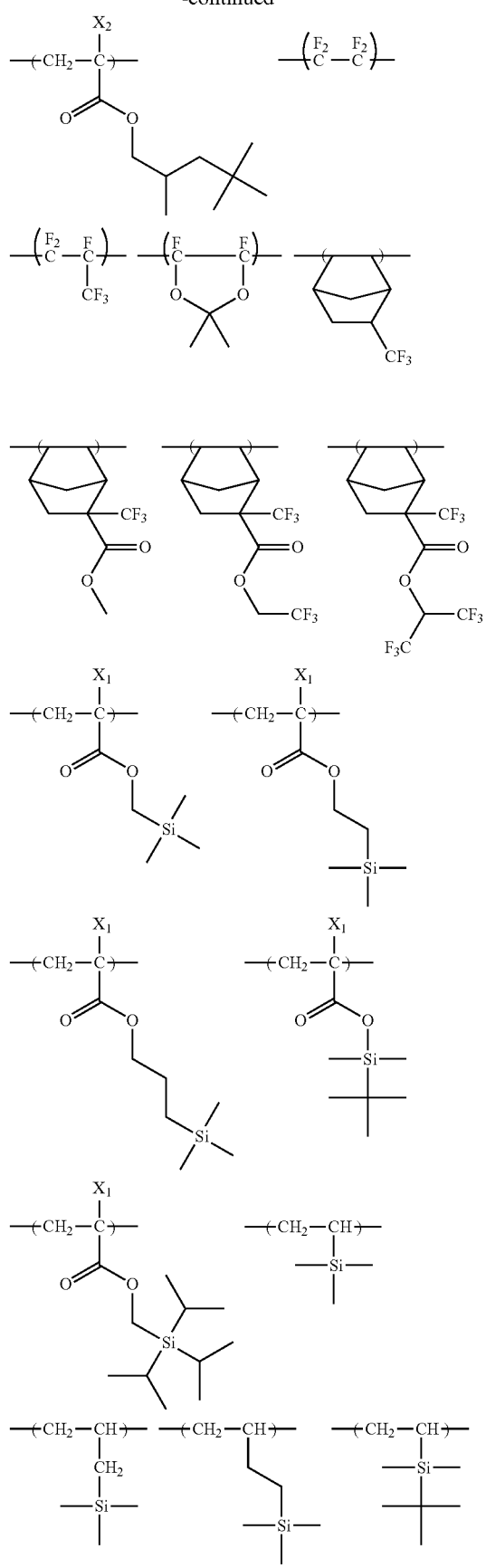

-continued

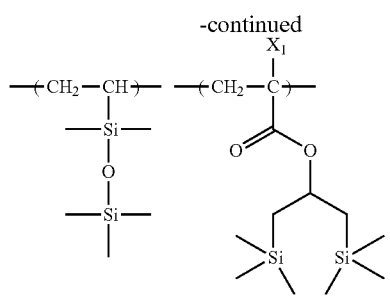

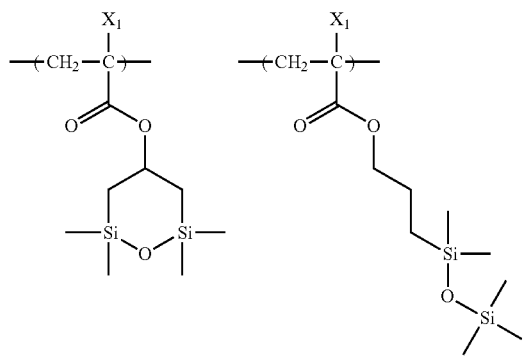

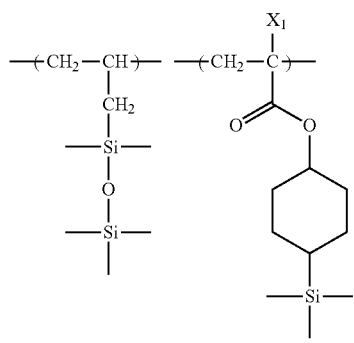

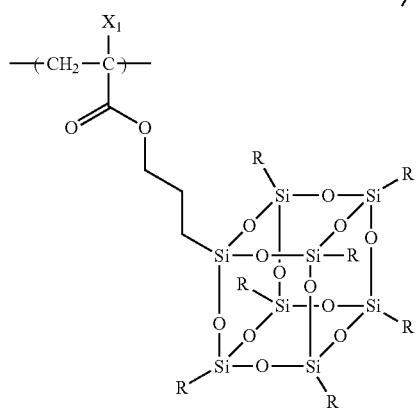

-continued

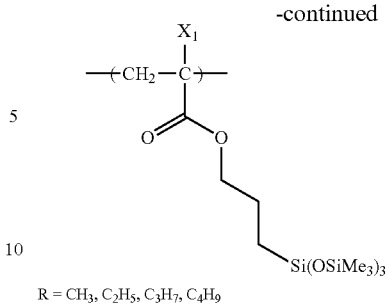

R = CH$_3$, C$_2$H$_5$, C$_3$H$_7$, C$_4$H$_9$

It is preferred for the hydrophobic resin to contain a repeating unit (b) containing at least one group selected from the group consisting of the following groups (x) to (z).
Namely,
(x) an alkali-soluble group,
(y) a group that when acted on by an alkali developer, is decomposed to thereby increase its solubility in the alkali developer (polarity conversion group), and
(z) a group that when acted on by an acid, is decomposed to thereby increase its solubility in an alkali developer.

The following varieties of repeating units (b) can be mentioned.
Namely, the repeating unit (b) may be: a repeating unit (b') containing at least either a fluorine atom or a silicon atom and at least one group selected from the group consisting of the above groups (x) to (z) simultaneously introduced in one side chain thereof,
a repeating unit (b*) containing at least one group selected from the group consisting of the above groups (x) to (z) but containing neither a fluorine atom nor a silicon atom, or
a repeating unit (b'') in which at least one group selected from the group consisting of the above groups (x) to (z) is introduced in its one side chain while at least either a fluorine atom or a silicon atom is introduced in a side chain other than the above side chain within the same repeating unit.

It is preferred for the hydrophobic resin to contain the repeating unit (b') as the repeating unit (b). Namely, it is preferred for the repeating unit (b) containing at least one group selected from the group consisting of the above groups (x) to (z) to further contain at least either a fluorine atom or a silicon atom.

When the hydrophobic resin contains the repeating unit (b*), it is preferred for the hydrophobic resin to be a copolymer with a repeating unit (repeating unit other than the above-mentioned repeating units (b') and (b'')) containing at least either a fluorine atom or a silicon atom. In the repeating unit (b''), it is preferred for the side chain containing at least one group selected from the group consisting of the above groups (x) to (z) and the side chain containing at least either a fluorine atom or a silicon atom to be bonded to the same carbon atom of the main chain, namely to be in a positional relationship shown in the formula (K1) below.

In the formula, B1 represents a partial structure containing at least one group selected from the group consisting of the above groups (x) to (z), and B2 represents a partial structure containing at least either a fluorine atom or a silicon atom.

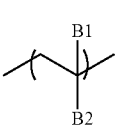

(K1)

The group selected from the group consisting of the above groups (x) to (z) is preferably (x) an alkali-soluble group or (y) a polarity conversion group, more preferably (y) a polarity conversion group.

As the alkali-soluble group (x), there can be mentioned a phenolic hydroxyl group, a carboxylate group, a fluoroalcohol group, a sulfonate group, a sulfonamido group, a sulfonimido group, an (alkylsulfonyl)(alkylcarbonyl)methylene group, an (alkylsulfonyl)(alkylcarbonyl)imido group, a bis (alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris (alkylsulfonyl)methylene group or the like.

As preferred alkali-soluble groups, there can be mentioned a fluoroalcohol group (preferably hexafluoroisopropanol group), a sulfonimido group and a bis(alkylcarbonyl)methylene group.

As the repeating unit (bx) having an alkali soluble group (x), preferred use is made of any of a repeating unit resulting from direct bonding of an alkali soluble group to the main chain of a resin like a repeating unit of acrylic acid or methacrylic acid, a repeating unit resulting from bonding, via a connecting group, of an alkali soluble group to the main chain of a resin and a repeating unit resulting from polymerization with the use of a chain transfer agent or polymerization initiator having an alkali soluble group to thereby introduce the same in a polymer chain terminal.

When the repeating unit (bx) is a repeating unit containing at least either a fluorine atom or a silicon atom (namely, when corresponding to the above-mentioned repeating unit (b') or repeating unit (b")), the partial structure containing a fluorine atom contained in the repeating unit (bx) can be the same as set forth above in connection with the repeating unit containing at least either a fluorine atom or a silicon atom. As such, preferably, there can be mentioned any of the groups of general formulae (F2) to (F4) above. Also in that instance, the partial structure containing a silicon atom contained in the repeating unit (bx) can be the same as set forth above in connection with the repeating unit containing at least either a fluorine atom or a silicon atom. As such, preferably, there can be mentioned any of the groups of general formulae (CS-1) to (CS-3) above.

The content ratio of repeating units (bx) having an alkali soluble group (x) is preferably in the range of 1 to 50 mol %, more preferably 3 to 35 mol % and still more preferably 5 to 20 mol % based on all the repeating units of the hydrophobic resin.

Specific examples of the repeating units (bx) having an alkali-soluble group (x) will be shown below. In the formulae, $R_x$ represents a hydrogen atom, $-CH_3$, $-CF_3$ or $-CH_2OH$, and $X_1$ represents a hydrogen atom, $-CH_3$, $-F$ or $-CF_3$.

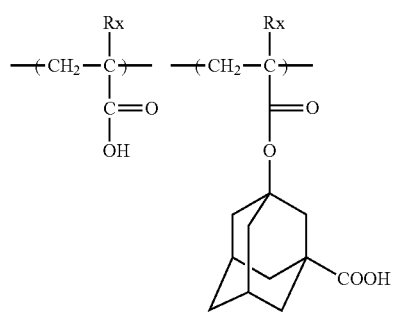

-continued

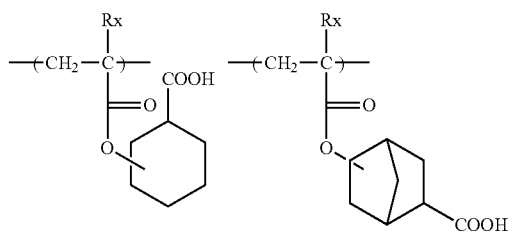

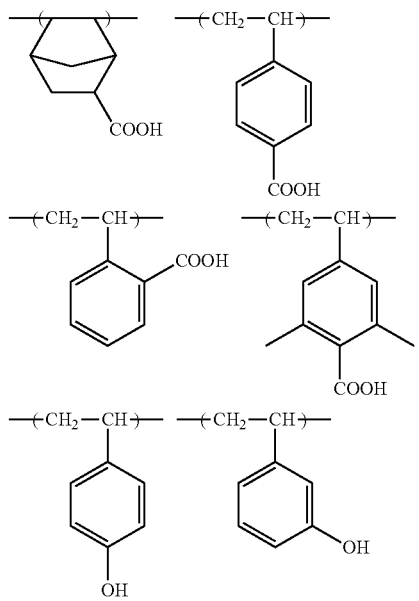

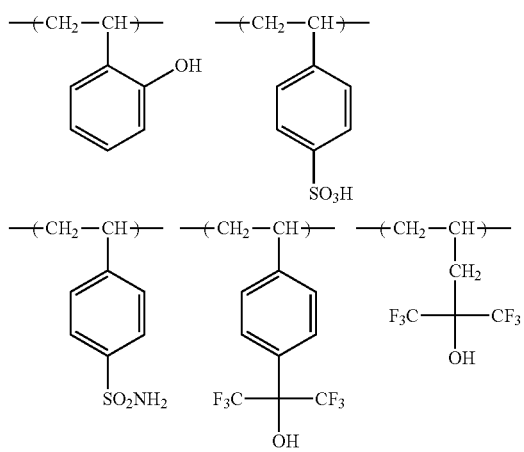

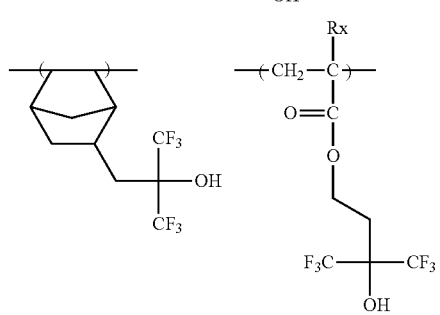

-continued

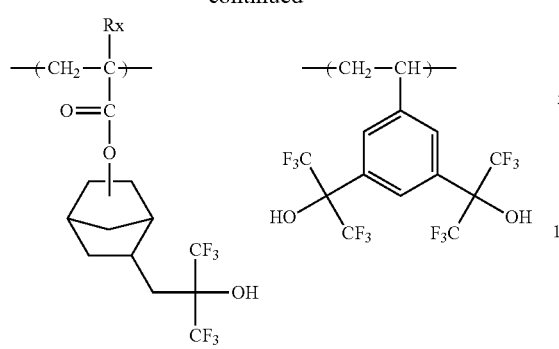

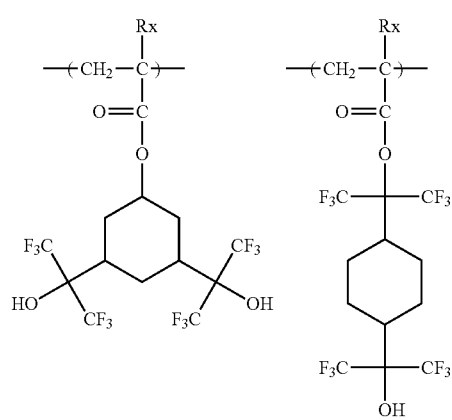

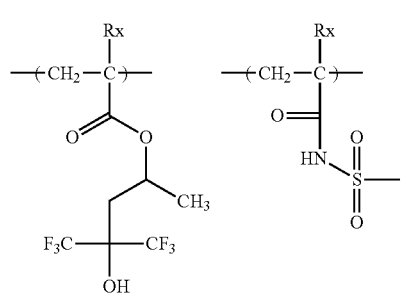

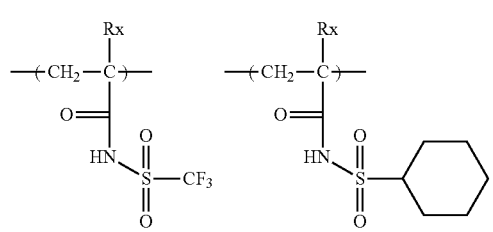

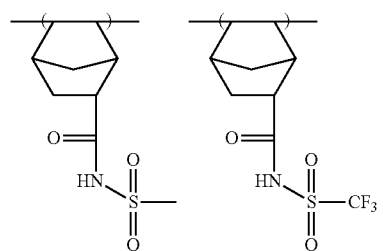

-continued

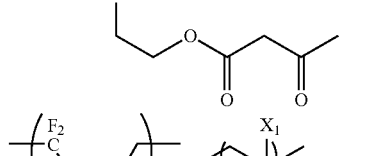

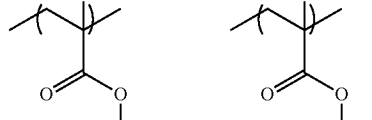

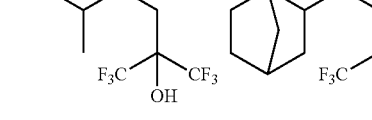

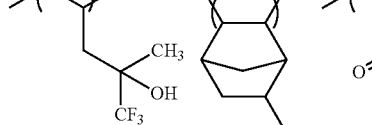

As the polarity conversion group (y), there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO₂O—), a sulfonic ester group (—SO₂O—) or the like. A lactone group is particularly preferred.

The polarity conversion group (y) is contained in, for example, two modes which are both preferred. In one mode, the polarity conversion group (y) is contained in a repeating unit of an acrylic ester or methacrylic ester and introduced in a side chain of a resin. In the other mode, the polarity conversion group is introduced in a terminal of a polymer chain by using a polymerization initiator or chain transfer agent containing the polarity conversion group (y) in the stage of polymerization.

As particular examples of the repeating units (by) each containing a polarity conversion group (y), there can be mentioned the repeating units with a lactone structure of formulae (KA-1-1) to (KA-1-17) to be shown hereinafter.

Further, it is preferred for the repeating unit (by) containing a polarity conversion group (y) to be a repeating unit containing at least either a fluorine atom or a silicon atom (namely, corresponding to the above-mentioned repeating unit (b') or repeating unit (b")). The resin comprising this repeating unit (by) is hydrophobic, and is especially preferred from the viewpoint of the reduction of development defects.

As the repeating unit (by), there can be mentioned, for example, any of the repeating units of formula (K0) below.

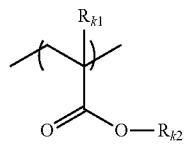
(K0)

In the formula, $R_{k1}$ represents a hydrogen atom, a halogen atom, a hydroxyl group, an alkyl group, a cycloalkyl group, an aryl group or a group containing a polarity conversion group.

$R_{k2}$ represents an alkyl group, a cycloalkyl group, an aryl group or a group containing a polarity conversion group.

Here, at least one of $R_{k1}$ and $R_{k2}$ is a group containing a polarity conversion group.

The polarity conversion group, as mentioned above, refers to a group that is decomposed by the action of an alkali developer to thereby increase its solubility in the alkali developer. It is preferred for the polarity conversion group to be a group represented by X in the partial structures of general formulae (KA-1) and (KB-1) below.

(KA-1)

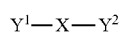
(KB-1)

In general formulae (KA-1) and (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (-OSO$_2$O—) or a sulfonic ester group (—SO$_2$O—).

$Y^1$ and $Y^2$ may be identical to or different from each other, and each thereof represents an electron withdrawing group.

The repeating unit (by) contains a preferred group whose solubility in an alkali developer is increased by containing a group with the partial structure of general formula (KA-1) or (KB-1). When the partial structure has no bonding site as in the case of the partial structure of general formula (KA-1) or the partial structure of general formula (KB-1) in which $Y^1$ and $Y^2$ are monovalent, the above group with the partial structure refers to a group containing a monovalent or higher-valent group resulting from the elimination of at least one arbitrary hydrogen atom from the partial structure.

The partial structure of general formula (KA-1) or (KB-1) is linked at its arbitrary position to the main chain of the hydrophobic resin via a substituent group.

The partial structure of general formula (KA-1) is a structure in which a ring structure is formed in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent group may be introduced in the ring structure of general formula (KA-1). For example, when $Z_{ka1}$ is a substituent group, nka substituent groups may be introduced.

$Z_{ka1}$, or each of a plurality of $Z_{ka1}$s independently, represents a halogen atom, an alkyl group, a cycloalkyl group, an ether group, a hydroxyl group, an amido group, an aryl group, a lactone ring group or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

The electron withdrawing groups represented by $Z_{ka1}$ are the same as those represented by $Y^1$ and $Y^2$ to be described hereinafter. These electron withdrawing groups may be substituted with other electron withdrawing groups.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like. The electron withdrawing group is as mentioned above.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent group, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl (t-decanoyl) group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent group and may be monocyclic or polycyclic. When polycyclic, the cycloalkyl group may be a bridged one. Namely, in that case, the cycloalkyl group may have a bridged structure. The monocycloalkyl group is preferably a cycloalkyl group having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably a cycloalkyl group having 6 to 20 carbon atoms. As such, there can be mentioned, for example, an adamantyl group, a norbornyl group, an isobornyl group, a camphonyl group, a bicyclopentyl group, an α-pinanyl group, a tricyclodecanyl group, a tetracyclododecyl group, an androstanyl group or the like. As the cycloalkyl groups, there can also be mentioned any of the following structures. The carbon atoms of each of the cycloalkyl groups may be partially replaced with a heteroatom, such as an oxygen atom.

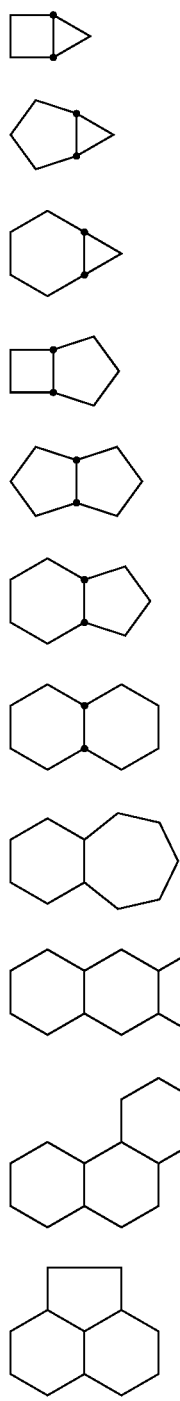

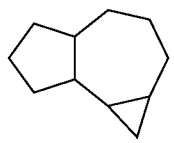

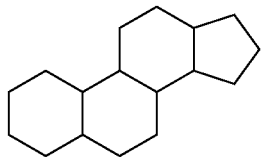

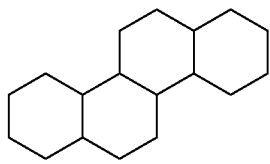

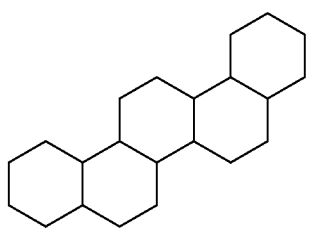

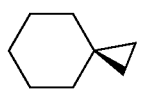

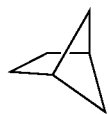

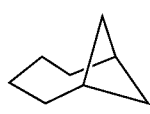

(24)
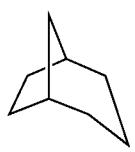
(25)
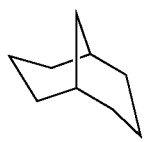
(26)
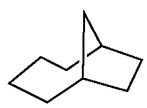
(27)
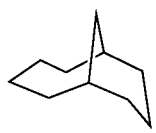
(28)
(29)
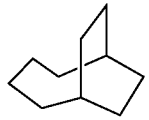
(30)
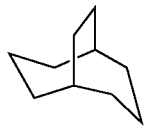
(31)
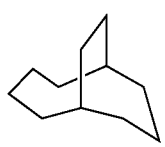
(32)
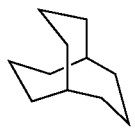
(33)
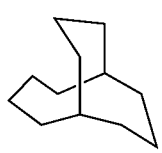
(34)
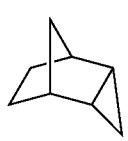
(35)
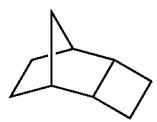
(36)
(37)
(38)
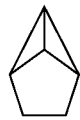
(39)
(40)
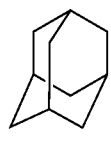
(41)
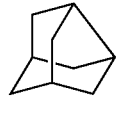
(42)
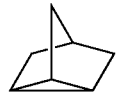
(43)
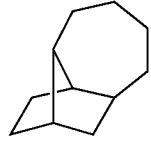
(44)
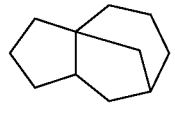
(45)
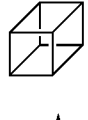
(46)
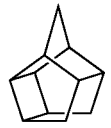

-continued

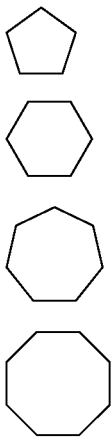

(47)

(48)

(49)

(50)

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent group that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent group that may be introduced in these alkyl and alkoxy groups, there can be mentioned a hydroxyl group, a halogen atom, an alkoxy group (preferably having 1 to 4 carbon atoms) or the like.

Further substituent groups may be introduced in these groups. As further substituent groups, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cinnamoyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structure of general formula (KA-1) is a lactone ring. A 5- to 7-membered lactone ring is preferred.

Further, as shown in the formulae (KA-1-1) to (KA-1-17) below, the 5- to 7-membered lactone ring as the partial structure of general formula (KA-1) is preferably condensed with another ring structure in such a fashion that a bicyclo structure or a Spiro structure is formed.

The peripheral ring structures to which the ring structure of general formula (KA-1) may be bonded can be, for example, those shown in the formulae (KA-1-1) to (KA-1-17) below, or those similar to the same.

It is preferred for the structure containing the lactone ring structure of general formula (KA-1) to be the structure of any of formulae (KA-1-1) to (KA-1-17) below. The lactone structure may be directly bonded to the main chain. As preferred structures, there can be mentioned those of formulae (KA-1-1), (KA-1-4), (KA-1-5), (KA-1-6), (KA-1-13), (KA-1-14) and (KA-1-17).

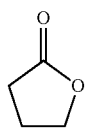

KA-1-1

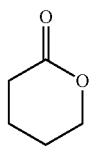

KA-1-2

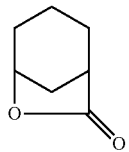

KA-1-3

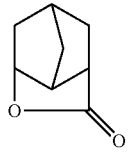

KA-1-4

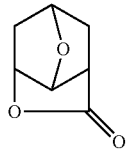

KA-1-5

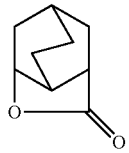

KA-1-6

KA-1-7 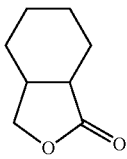

KA-1-8 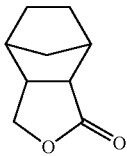

KA-1-9 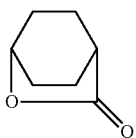

KA-1-10 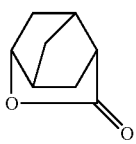

KA-1-11 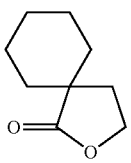

KA-1-12 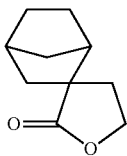

KA-1-13 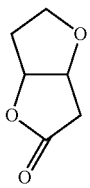

KA-1-14 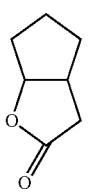

KA-1-15 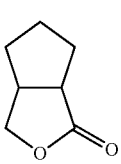

KA-1-16 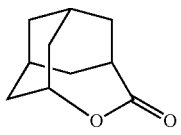

KA-1-17 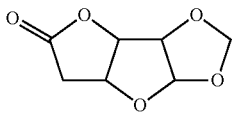

A substituent group may or may not be introduced in the above structures containing the lactone ring structure. As preferred substituent groups, there can be mentioned the same as the substituent groups $Z_{ka1}$ that may be introduced in the ring structure of general formula (KA-1) above.

In general formula (KB-1), X is preferably a carboxylic ester group (—COO—).

In general formula (KB-1), each of $Y^1$ and $Y^2$ independently represents an electron withdrawing group. The electron withdrawing group has the partial structure of formula (EW) below. In the formula (EW), * represents either a bonding site directly bonded to the structure of general formula (KA-1) or a bonding site directly bonded to X of general formula (KB-1).

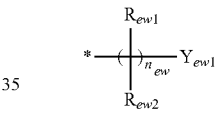
(EW)

In the formula (EW), $n_{ew}$ is the number of repetitions of each of the connecting groups of the formula —$C(R_{ew1})(R_{ew2})$—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —$C(R_{f1})(R_{f2})$—$R_{f3}$ to be described hereinafter, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. The "haloaryl group" refers to an at least partially halogenated aryl group. In the following structural formulae, each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the main chain of the resin. Preferably, each of $R_{ew3}$ and $R_{ew4}$ is an alkyl group, a cycloalkyl group or a fluoroalkyl group.

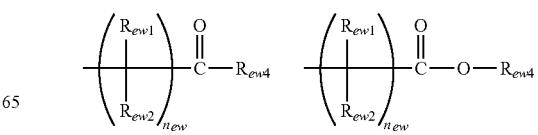

-continued

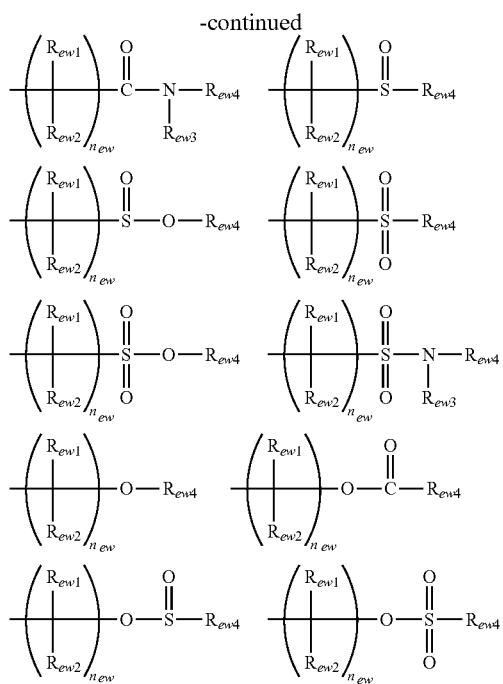

When $Y_{ew1}$ is a bivalent or higher-valent group, the remaining bonding site or sites form a bond with an arbitrary atom or substituent group. At least any of the groups represented by $Y_{ew1}$, $R_{ew1}$ and $R_{ew2}$ may be linked via a further substituent group to the main chain of the hydrophobic resin.

$Y_{ew1}$ is preferably a halogen atom or any of the halo(cyclo)alkyl groups or haloaryl groups of the formula —C($R_{f1}$)($R_{f2}$)—$R_{f3}$.

Each of $R_{ew1}$ and $R_{ew2}$ independently represents an arbitrary substituent group, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as $R_{f1}$ or to be linked to $R_{f3}$ to thereby form a ring.

$R_{f1}$ to $R_{f3}$ may be linked to each other to thereby form a ring. As the formed ring, there can be mentioned a (halo)cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups mentioned above as being represented by $Z_{ka1}$, preferably fluorocycloalkyl groups of the formula —$C_{(n)}F_{(2n-2)}H$ and perfluoroaryl groups of the formula —$C_{(n)}F_{(n-1)}$. The number of carbon atoms, n, is not particularly limited. Preferably, however, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (by) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester group, the carboxylic ester group can function as the electron withdrawing group represented by $Y^1$ or $Y^2$ of general formula (KB-1).

When the repeating unit (by) corresponds to the above-mentioned repeating unit (b*) or repeating unit (b") and contains any of the partial structures of general formula (KA-1), it is preferred for the partial structures of general formula (KA-1) to be a partial structure in which the polarity conversion group is expressed by —COO— appearing in the structures of general formula (KA-1).

The repeating unit (by) can be a repeating unit with the partial structure of general formula (KY-0) below.

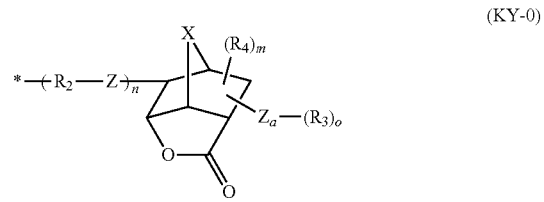

(KY-0)

In general formula (KY-0), $R_2$ each independently represents an alkylene group or a cycloalkylene group.

$R_3$ each independently represents a hydrocarbon group whose hydrogen atoms on constituent carbons are partially or entirely replaced with fluorine atoms.

$R_4$, when m≥2 each independently, represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(=O)— or R—C(=O)O— in which R is an alkyl group or a cycloalkyl group. When m≥2, two or more $R_4$s may be bonded to each other to thereby form a ring.

X represents an alkylene group, a cycloalkylene group, an oxygen atom or a sulfur atom.

Each of Z and Za independently represents a single bond, an ether bond, an ester bond, an amido bond, a urethane bond or a urea bond. When n≥2 a plurality of Zs may be identical to or different from each other.

In the formula, * represents a bonding site to the main chain or a side chain of the resin (D); o is an integer of 1 to 7; m is an integer of 0 to 7; and n is an integer of 0 to 5.

The structure —$R_2$—Z— is preferably the structure of formula —$(CH_2)_l$—COO— in which l is an integer of 1 to 5.

With respect to the alkylene group and cycloalkylene group represented by $R_2$, the preferred number of carbon atoms and particular examples are as mentioned above in connection with the alkylene group and cycloalkylene group represented by $Z_2$ of general formula (bb).

The number of carbon atoms of the linear, branched or cyclic hydrocarbon group represented by $R_3$ is preferably in the range of 1 to 30, more preferably 1 to 20 when the hydrocarbon group is linear; is preferably in the range of 3 to 30, more preferably 3 to 20 when the hydrocarbon group is branched; and is in the range of 6 to 20 when the hydrocarbon group is cyclic. As particular examples of the $R_3$ groups, there can be mentioned the above particular examples of the alkyl and cycloalkyl groups represented by $Z_{ka1}$.

With respect to the alkyl groups and cycloalkyl groups represented by $R_4$ or R, the preferred number of carbon atoms and particular examples are as mentioned above in connection with the alkyl groups and cycloalkyl groups represented by $Z_{ka1}$.

The acyl group represented by $R_4$ preferably has 1 to 6 carbon atoms. As such, there can be mentioned, for example, a formyl group, an acetyl group, a propionyl group, a butyryl group, an isobutyryl group, a valeryl group, a pivaloyl group or the like.

As the alkyl moiety of the alkoxy group and alkoxycarbonyl group represented by $R_4$, there can be mentioned a linear, branched or cyclic alkyl moiety. With respect to the alkyl moiety, the preferred number of carbon atoms and particular examples are as mentioned above in connection with the alkyl groups and cycloalkyl groups represented by $Z_{ka1}$.

With respect to the alkylene group and cycloalkylene group represented by X, the preferred number of carbon atoms and particular examples are as mentioned above in connection with the alkylene group and cycloalkylene group represented by $R_2$.

Moreover, as particular structures of the repeating units (by), there can be mentioned the repeating units with the following partial structures.

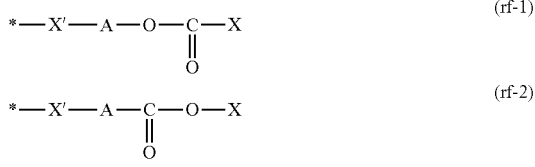

In general formulae (rf-1) and (rf-2),

X' represents an electron withdrawing substituent group, preferably a carbonyloxy group, an oxycarbonyl group, an alkylene group substituted with a fluorine atom or a cycloalkylene group substituted with a fluorine atom.

A represents a single bond or a bivalent connecting group of the formula —C($R_x$)($R_y$)—. In the formula, each of $R_x$ and $R_y$ independently represents a hydrogen atom, a fluorine atom, an alkyl group (preferably having 1 to 6 carbon atoms, optionally substituted with a fluorine atom) or a cycloalkyl group (preferably having 5 to 12 carbon atoms, optionally substituted with a fluorine atom). Each of $R_x$ and $R_y$ is preferably a hydrogen atom, an alkyl group or an alkyl group substituted with a fluorine atom.

X represents an electron withdrawing group. As particular examples thereof, there can be mentioned the electron withdrawing groups set forth above as being represented by $Y^1$ and $Y^2$. X is preferably a fluoroalkyl group, a fluorocycloalkyl group, an aryl group substituted with fluorine or a fluoroalkyl group, an aralkyl group substituted with fluorine or a fluoroalkyl group, a cyano group or a nitro group.

* represents a bonding site to the main chain or a side chain of the resin, namely, a bonding site bonded to the main chain of the resin through a single bond or a connecting group.

When X' is a carbonyloxy group or an oxycarbonyl group, A is not a single bond.

The receding contact angle with water of the resin composition film after alkali development can be decreased by the polarity conversion effected by the decomposition of the polarity conversion group by the action of an alkali developer. The decrease of the receding contact angle between water and the film after alkali development is preferred from the viewpoint of the inhibition of development defects.

The receding contact angle with water of the resin composition film after alkali development is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

The above receding contact angle of the film after alkali development refers to the contact angle obtained by measuring the following film by the dilation/contraction method to be described in examples. Namely, an organic antireflection film ARC29A (produced by Nissan Chemical Industries, Ltd.) was applied onto a silicon wafer (8-inch diameter) and baked at 205° C. for 60 seconds, thereby forming a 98 nm-thick antireflection film. Each of the compositions of the present invention was applied thereonto and baked at 120° C. for 60 seconds, thereby forming a 120 nm-thick film. The film was developed with an aqueous solution of tetramethylammonium hydroxide (2.38 mass %) for 30 seconds, rinsed with pure water and spin dried. The contact angle of the thus obtained film was measured in accordance with the dilation/contraction method.

The rate of hydrolysis of the hydrophobic resin in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the hydrophobic resin in an alkali developer refers to the rate of decrease of the thickness of a resin film formed from only the hydrophobic resin in 23° C. TMAH (aqueous solution of tetramethylammonium hydroxide) (2.38 mass %).

It is preferred for the repeating unit (by) to be a repeating unit containing at least two polarity conversion groups.

When the repeating unit (by) contains at least two polarity conversion groups, it is preferred for the repeating unit to contain a group with any of the partial structures having two polarity conversion groups of general formula (KY-1) below. When the structure of general formula (KY-1) has no bonding site, a group with a mono- or higher-valent group resulting from the elimination of at least any arbitrary one of the hydrogen atoms contained in the structure is referred to.

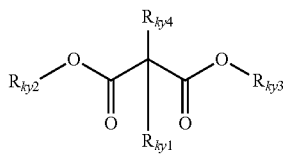

(KY-1)

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —C($R_{f1}$)($R_{f2}$)—$R_{f3}$ above. Preferably, $R_{ky3}$ is a halogen atom, or any of the halo(cyclo)alkyl groups or haloaryl groups of the formula —C($R_{f1}$)($R_{f2}$)—$R_{f3}$ above, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those mentioned above as being represented by $Y^1$ and $Y^2$ of general formula (KB-1) above.

It is more preferred for the structure of general formula (KY-1) to be the structure of general formula (KY-2) below. The structure of general formula (KY-2) refers to a group with a mono- or higher-valent group resulting from the removal of at least any arbitrary one of the hydrogen atoms contained in the structure.

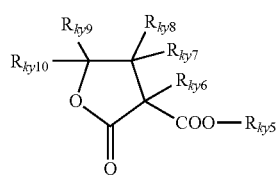

(KY-2)

In the formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic structure.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —C($R_{f1}$)($R_{f2}$)—$R_{f3}$ above.

As $R_{ky5}$ to $R_{ky10}$, there can be mentioned, for example, the same groups as set forth above with respect to $Z_{ka1}$ of formula (KA-1).

It is more preferred for the structure of formula (KY-2) to be the partial structure of general formula (KY-3) below.

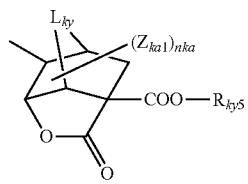

(KY-3)

In the formula (KY-3), $Z_{ka1}$ and nka are as defined above in connection with general formula (KA-1). $R_{ky5}$ is as defined above in connection with formula (KY-2).

$L_{ky}$ represents an alkylene group, a cycloalkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (b) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent group at the α- and/or β-position), styrene repeating units (including the family having a substituent group at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

When the repeating unit (by) is a repeating unit containing at least either a fluorine atom or a silicon atom (namely, corresponding to the above repeating unit (b') or (b")), as the partial structure containing a fluorine atom within the repeating unit (by), there can be mentioned any of those set forth in connection with the aforementioned repeating unit containing at least either a fluorine atom or a silicon atom, preferably the groups of general formulae (F2) to (F4) above. As the partial structure containing a silicon atom within the repeating unit (by), there can be mentioned any of those set forth in connection with the aforementioned repeating unit containing at least either a fluorine atom or a silicon atom, preferably the groups of general formulae (CS-1) to (CS-3) above.

Monomers corresponding to the repeating units (by) each containing a group whose solubility is increased in an alkali developer can be synthesized in accordance with any of the processes described in, for example, US 2010/0152400 A, WO 2010/067905 A and WO 2010/067898 A.

The content of repeating unit (by) in the hydrophobic resin, based on all the repeating units of the hydrophobic resin, is preferably in the range of 10 to 100 mol %, more preferably 20 to 99 mol %, further more preferably 30 to 97 mol % and most preferably 40 to 95 mol %.

Particular examples of the repeating units (by) containing a group whose solubility in an alkali developer is increased are shown below, which however in no way limit the scope of the repeating units. Ra represents a hydrogen atom, a fluorine atom, a methyl group or a trifluoromethyl group.

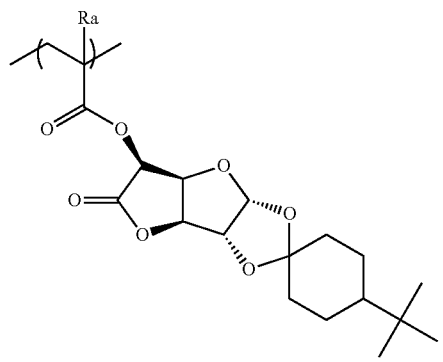
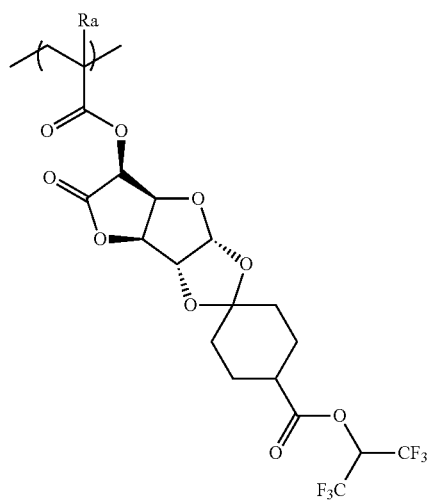
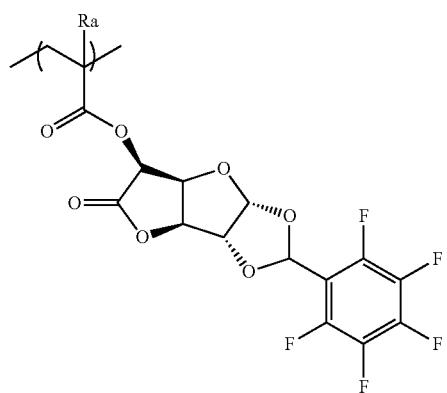

-continued

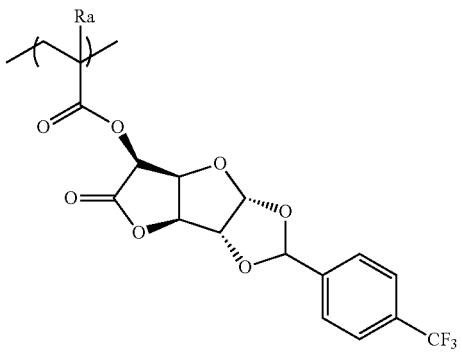
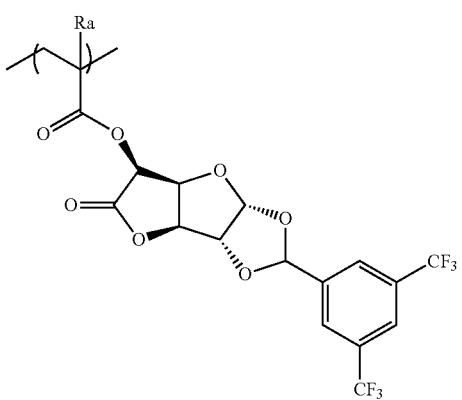
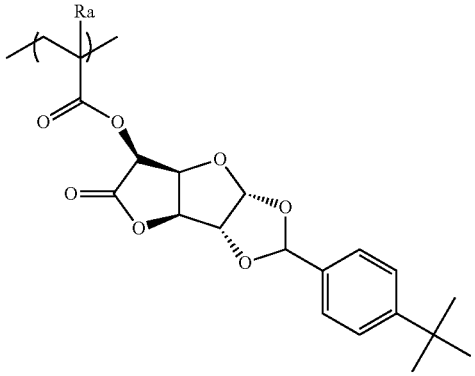
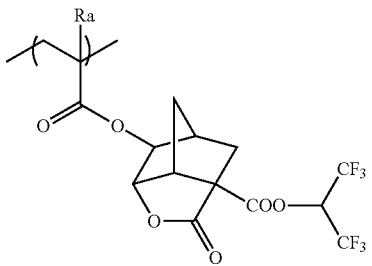
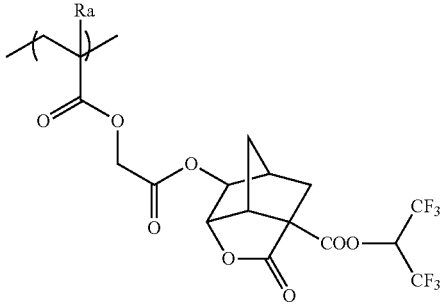

153
-continued
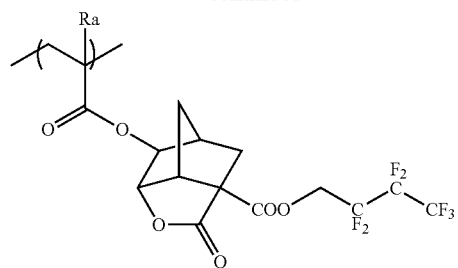
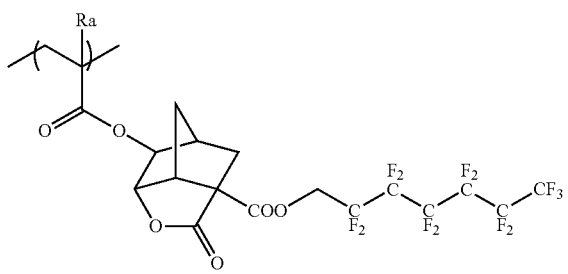
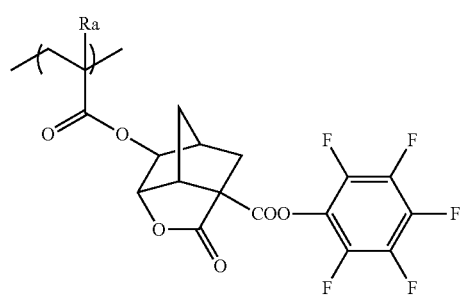
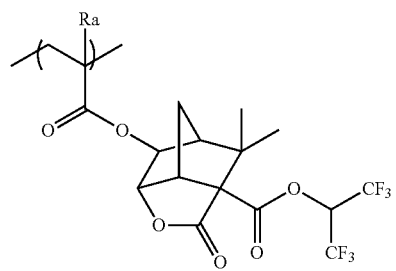
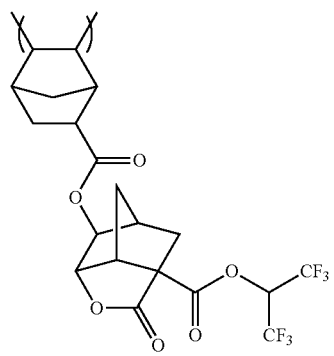
154
-continued
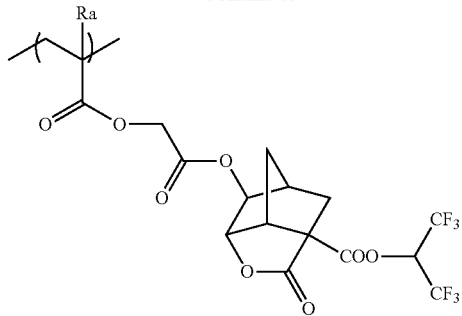
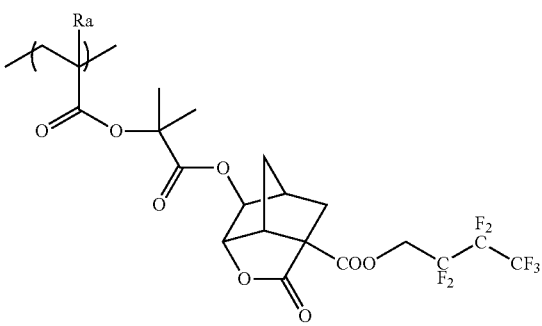
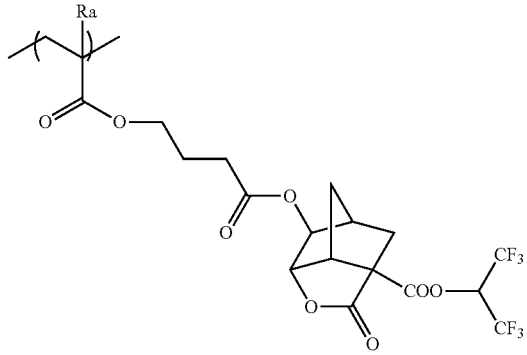
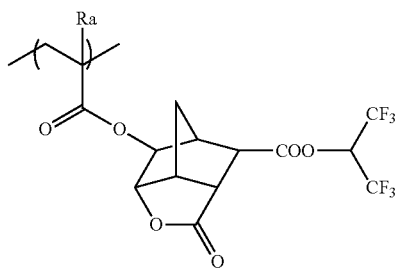
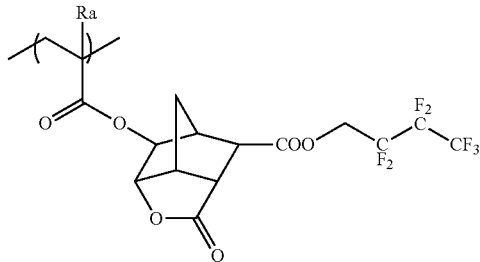

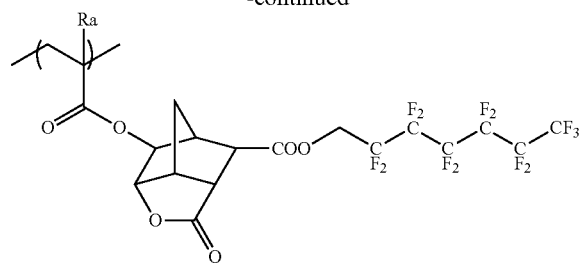
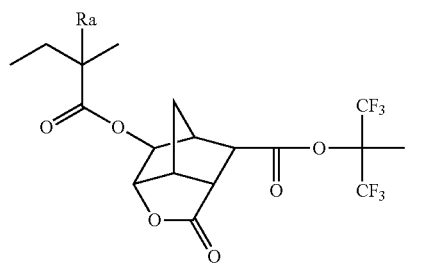
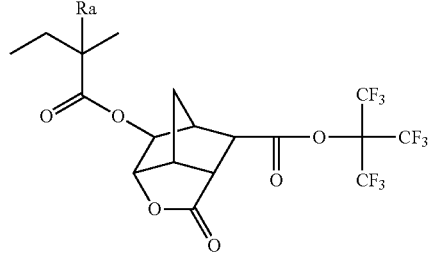
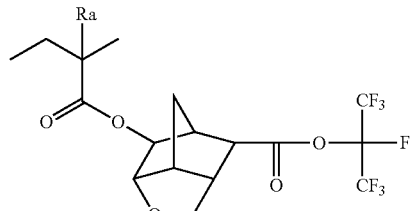
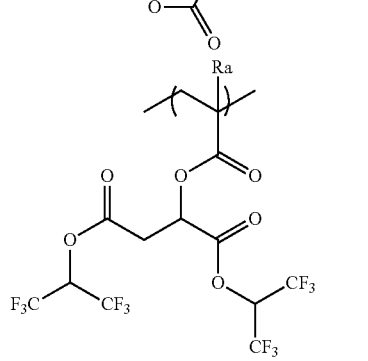
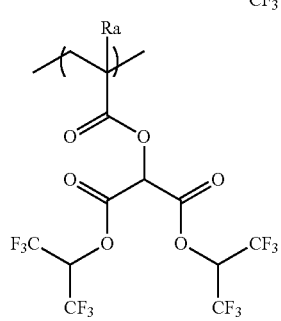

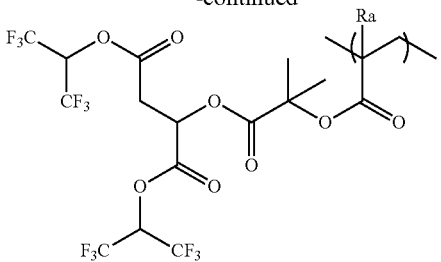
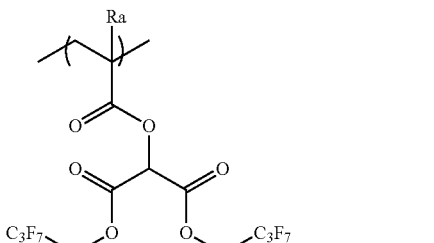
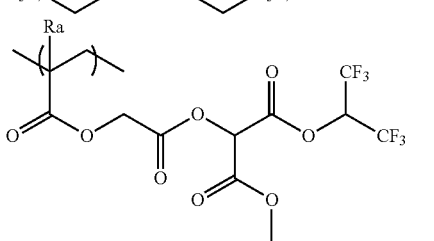
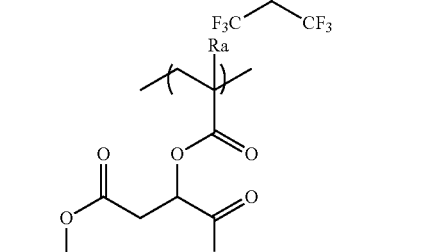
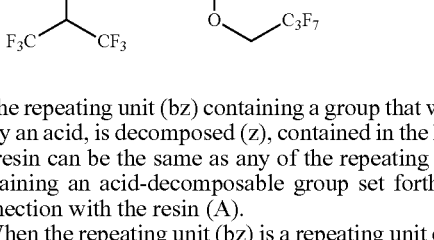

The repeating unit (bz) containing a group that when acted on by an acid, is decomposed (z), contained in the hydrophobic resin can be the same as any of the repeating units each containing an acid-decomposable group set forth above in connection with the resin (A).

When the repeating unit (bz) is a repeating unit containing at least either a fluorine atom or a silicon atom (namely, when corresponding to the above-mentioned repeating unit (b') or repeating unit (b")), the partial structure containing a fluorine atom contained in the repeating unit (bz) can be the same as set forth above in connection with the repeating unit containing at least either a fluorine atom or a silicon atom. As such, preferably, there can be mentioned any of the groups of general formulae (F2) to (F4) above. Also in that instance, the partial structure containing a silicon atom contained in the repeating unit (bz) can be the same as set forth above in connection with the repeating unit containing at least either a fluorine atom or a silicon atom. As such, preferably, there can be mentioned any of the groups of general formulae (CS-1) to (CS-3) above.

The content of repeating unit (bz) containing a group that when acted on by an acid, is decomposed (z) in the hydrophobic resin is preferably in the range of 1 to 80 mol %, more preferably 10 to 80 mol % and further more preferably 20 to 60 mol %, based on all the repeating units of the hydrophobic resin.

The repeating unit (b) containing at least one group selected from the group consisting of the above groups (x) to (z) has been described. The content of repeating unit (b) in the hydrophobic resin is preferably in the range of 1 to 98 mol %, more preferably 3 to 98 mol %, further more preferably 5 to 97 mol % and most preferably 10 to 95 mol %, based on all the repeating units of the hydrophobic resin.

The content of repeating unit (b') in the hydrophobic resin is preferably in the range of 1 to 100 mol %, more preferably 3 to 99 mol %, further more preferably 5 to 97 mol % and most preferably 10 to 95 mol %, based on all the repeating units of the hydrophobic resin.

The content of repeating unit (b*) in the hydrophobic resin is preferably in the range of 1 to 90 mol %, more preferably 3 to 80 mol %, further more preferably 5 to 70 mol % and most preferably 10 to 60 mol %, based on all the repeating units of the hydrophobic resin. The content of repeating unit containing at least either a fluorine atom or a silicon atom used in combination with the repeating unit (b*) is preferably in the range of 10 to 99 mol %, more preferably 20 to 97 mol %, further more preferably 30 to 95 mol % and most preferably 40 to 90 mol %, based on all the repeating units of the hydrophobic resin.

The content of repeating unit (b″) in the hydrophobic resin is preferably in the range of 1 to 100 mol %, more preferably 3 to 99 mol %, further more preferably 5 to 97 mol % and most preferably 10 to 95 mol %, based on all the repeating units of the hydrophobic resin.

The hydrophobic resin may further contain any of the repeating units represented by general formula (III) below.

(III)

In the formula (III), $R_{c31}$ represents a hydrogen atom, an alkyl group, an alkyl group optionally substituted with one or more fluorine atoms, a cyano group or a group of the formula —$CH_2$—O—$R_{ac2}$ in which $R_{ac2}$ represents a hydrogen atom, an alkyl group or an acyl group. $R_{c31}$ is preferably a hydrogen atom, a methyl group, a hydroxymethyl group, or a trifluoromethyl group, more preferably a hydrogen atom or a methyl group.

$R_{c32}$ represents a group containing an alkyl group, a cycloalkyl group, an alkenyl group, a cycloalkenyl group, or an aryl group. These groups may be substituted with fluorine atom and/or silicon atom.

$L_{c3}$ represents a single bond or a bivalent connecting group.

The alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms such as a phenyl group or a naphthyl group.

These groups may have one or more substituent groups.

Preferably, $R_{c32}$ represents an unsubstituted alkyl group or an alkyl group substituted with one or more fluorine atoms.

$L_{c3}$ represents a single bond or a bivalent connecting group. As the bivalent connecting group represented by $L_{c3}$, an alkylene group (preferably having 1 to 5 carbon atoms), an oxy group, a phenylene group, or an ester bond (a group represented by —COO—).

The hydrophobic resin may further contain any of the repeating units represented by general formula (BII-AB) below.

(BII-AB)

In the formula (BII-AB), each of $R_{c11'}$ and $R_{c12'}$ independently represents a hydrogen atom, a cyano group, a halogen atom or an alkyl group.

$Zc'$ represents an atomic group required for forming an alicyclic structure in cooperation with two carbon atoms (C—C) to which $R_{c11'}$ and $R_{c12'}$ are respectively bonded.

When any of the groups contained in the repeating unit represented by general formulae (III) or (BII-AB) is substituted with a group containing a fluorine atom or a silicone atom, the repeating unit is also corresponding to the aforementioned repeating unit containing at least either a fluorine atom or a silicon atom.

Specific examples of the repeating unit represented by general formulae (III) or (BII-AB) will be shown below, which however in no way limit the scope of the present invention. In the formulae, Ra represents H, $CH_3$, $CH_2OH$, $CF_3$ or CN. Note that the repeating unit in which Ra represents $CF_3$ also corresponds to the repeating unit containing at least either a fluorine atom or a silicon atom.

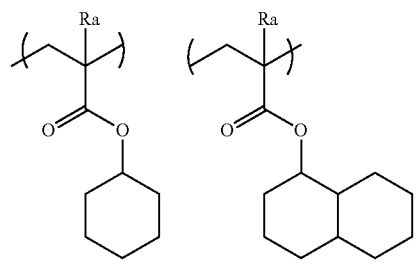

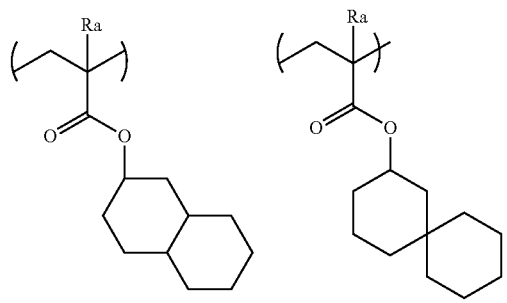

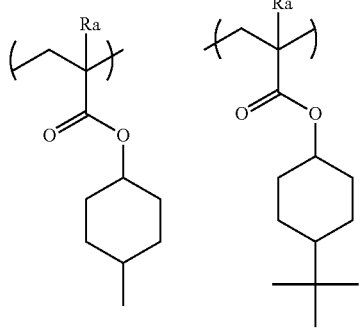
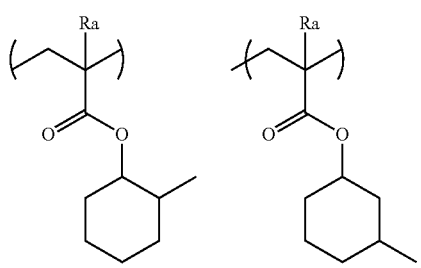
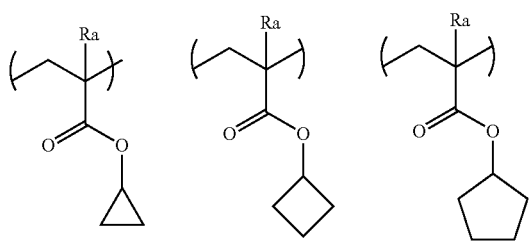
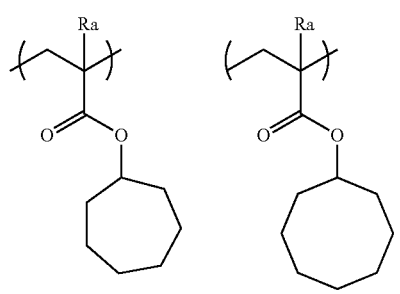
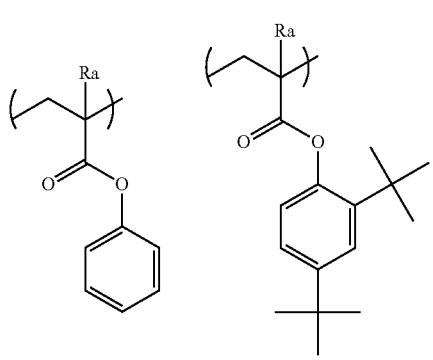
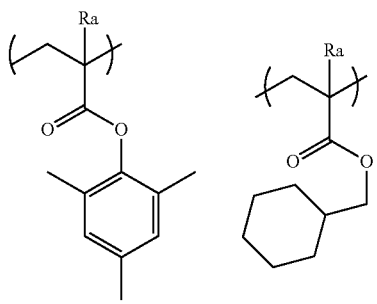
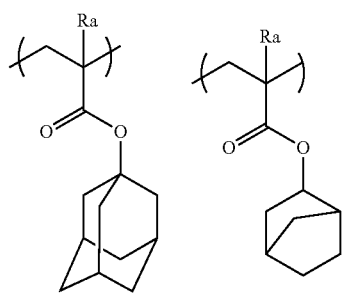
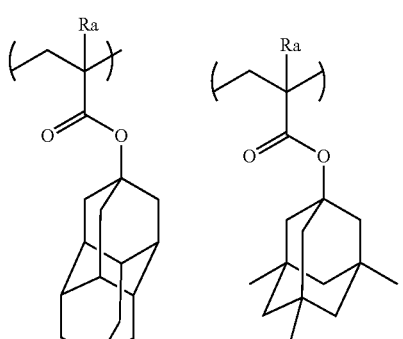
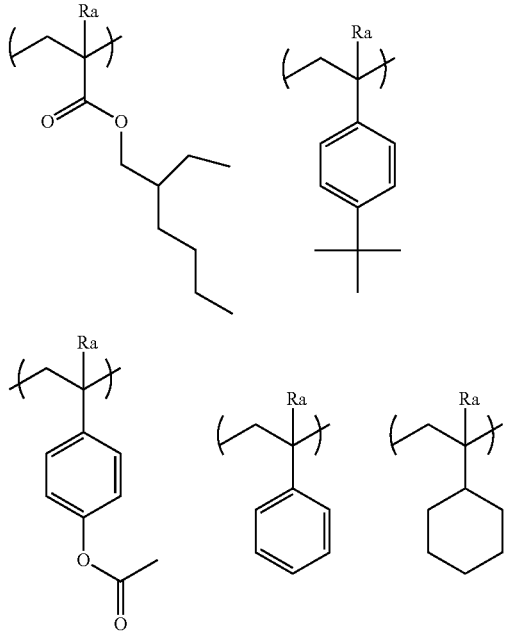

-continued

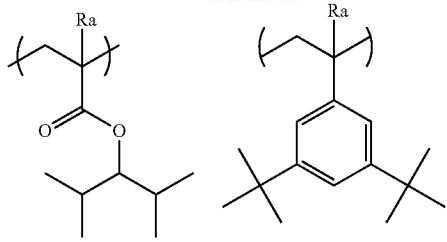

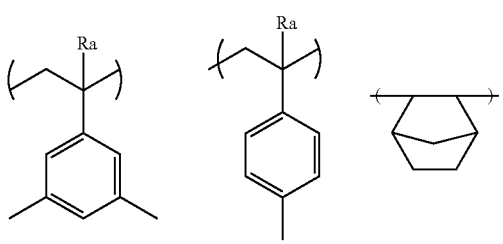

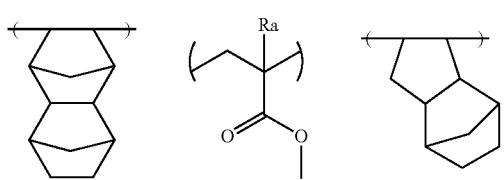

Impurities such as metals in the hydrophobic resin should naturally be of low quantity as in the resin (A). The content of residual monomers and oligomer components is preferably in the range of 0 to 10 mass %, more preferably 0 to 5 mass %, and still more preferably 0 to 1 mass %. Accordingly, there can be obtained a composition being free from in-liquid foreign matters and a change in sensitivity, etc. over time. From the viewpoint of resolving power, pattern profile, side wall of pattern, roughness, etc., the molecular weight distribution (Mw/Mn, also referred to as the degree of dispersion) thereof is preferably in the range of 1 to 3, more preferably 1 to 2, still more preferably 1 to 1.8, and most preferably 1 to 1.5.

A variety of commercially available products can be used as the hydrophobic resin, and also the resin can be synthesized in accordance with conventional methods (for example, by radical polymerization). As general synthesizing methods, a batch polymerization method in which a monomer species and an initiator are dissolved in a solvent and heated to carry out polymerization and a dropping polymerization method in which a solution of monomer species and initiator is dropped into a hot solvent over a period of 1 to 10 hours. Of these, the dropping polymerization method is preferred.

The reaction solvent, polymerization initiator, reaction conditions (temperature, concentration, etc.) and purification method after reaction are the same as described above in connection with the resin (A).

Specific examples of the hydrophobic resins will be shown below. The following Table 1 shows the molar ratio of individual repeating units (corresponding to individual repeating units in order from the left), weight average molecular weight, and degree of dispersion with respect to each of the resins.

(B-1)
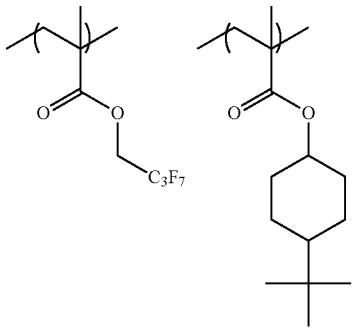

(B-2)
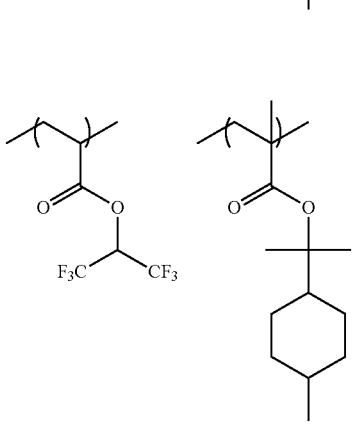

(B-3)
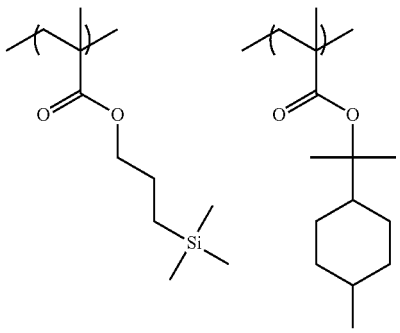

(B-4)
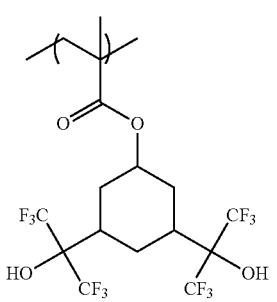

(B-5)
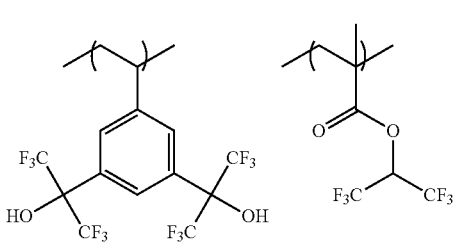

(B-6)
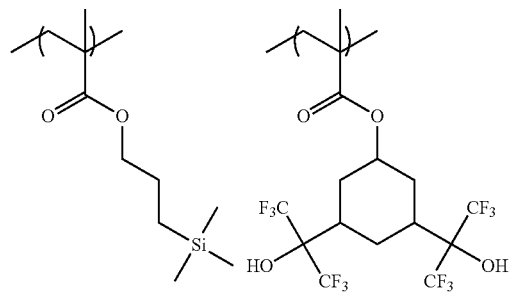
(B-7)
(B-8)
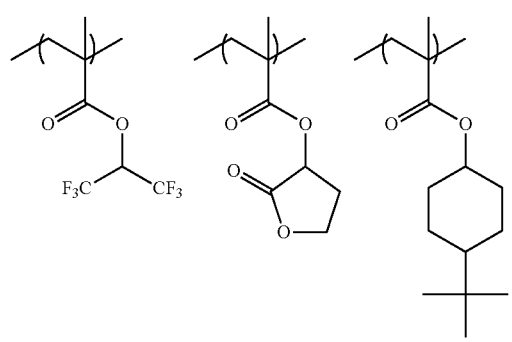
(B-9)
(B-10)
(B-11)
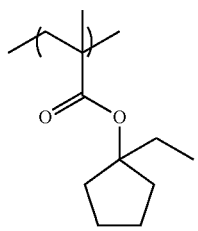
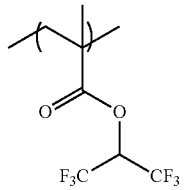
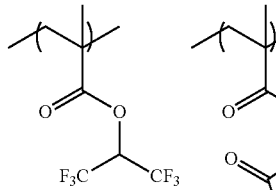
(B-12)
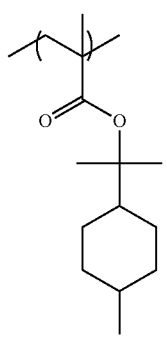
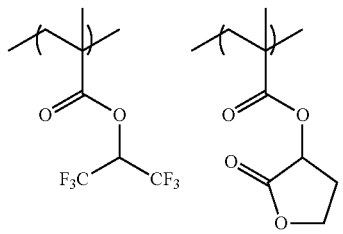
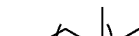
(B-13)
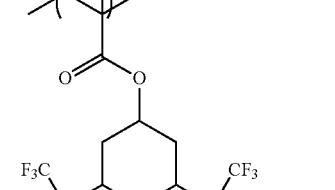
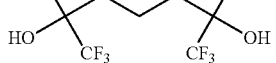

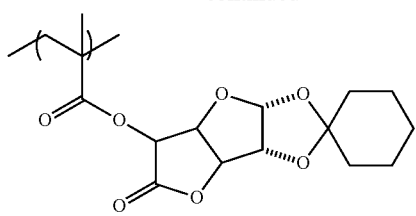
(B-14)
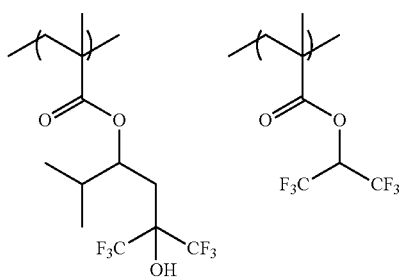
(B-15)
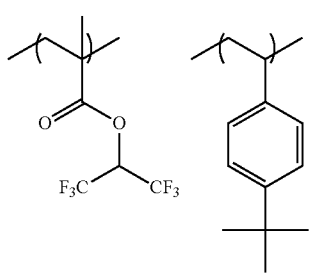
(B-16)
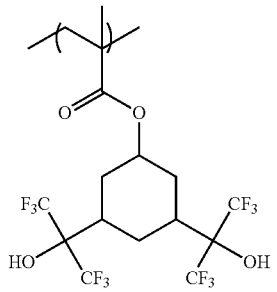
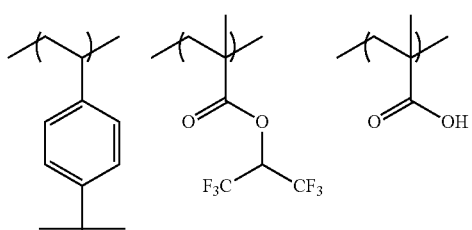
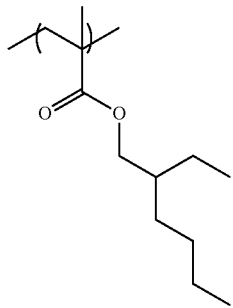
(B-17)
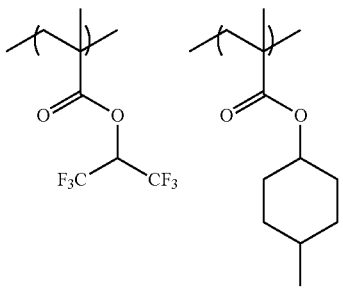
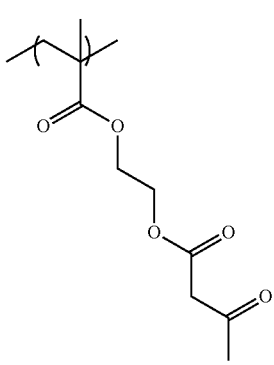
(B-18)
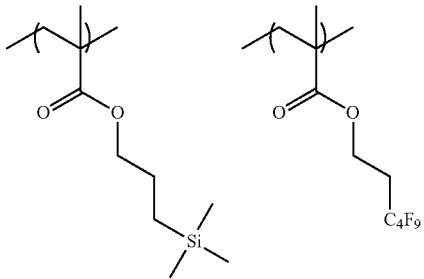
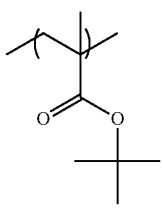
(B-19)
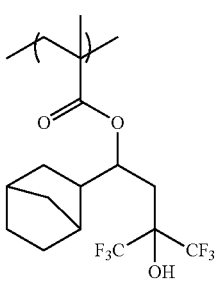

(B-20) 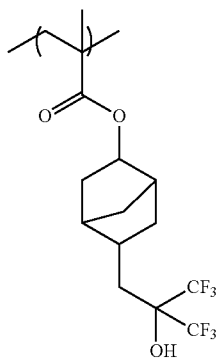
(B-24) 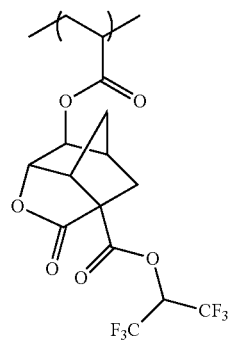
(B-21) 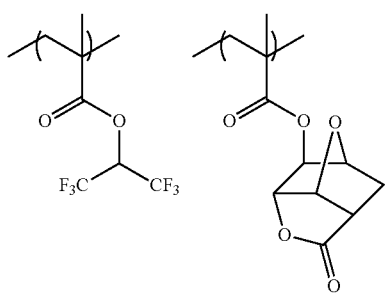
(B-25) 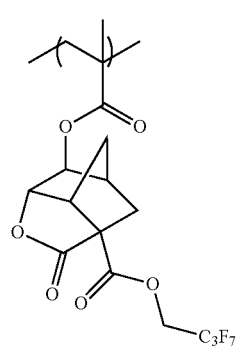
(B-22) 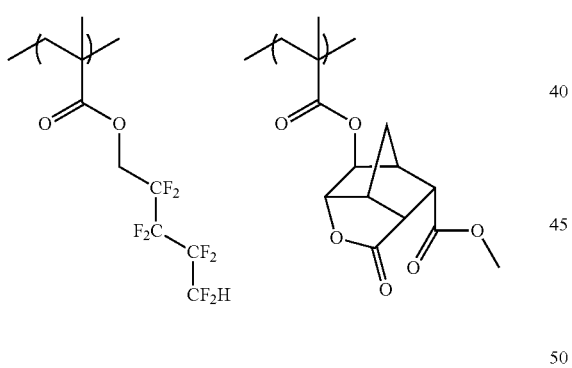
(B-26) 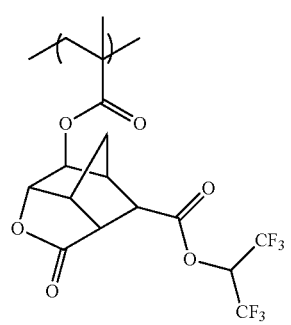
(B-23) 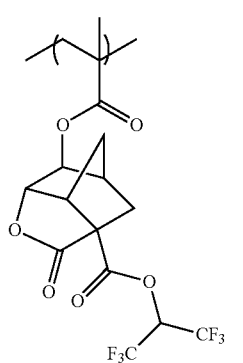
(B-27) 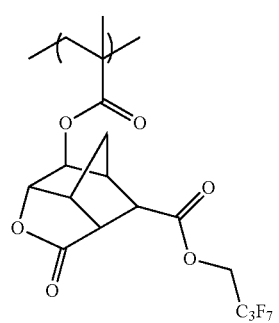

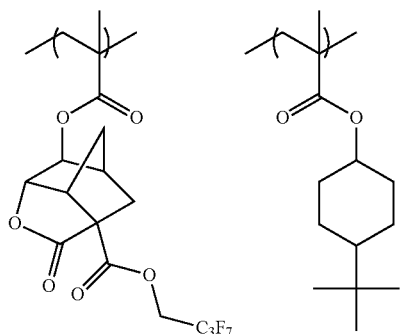
(B-28)
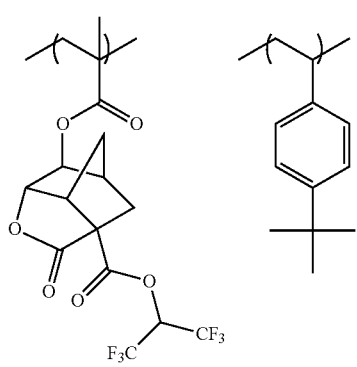
(B-29)
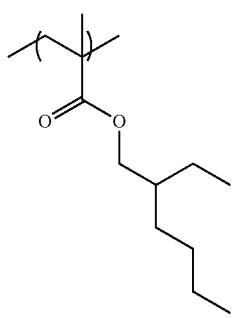
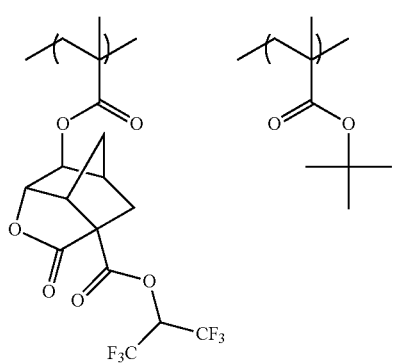
(B-30)
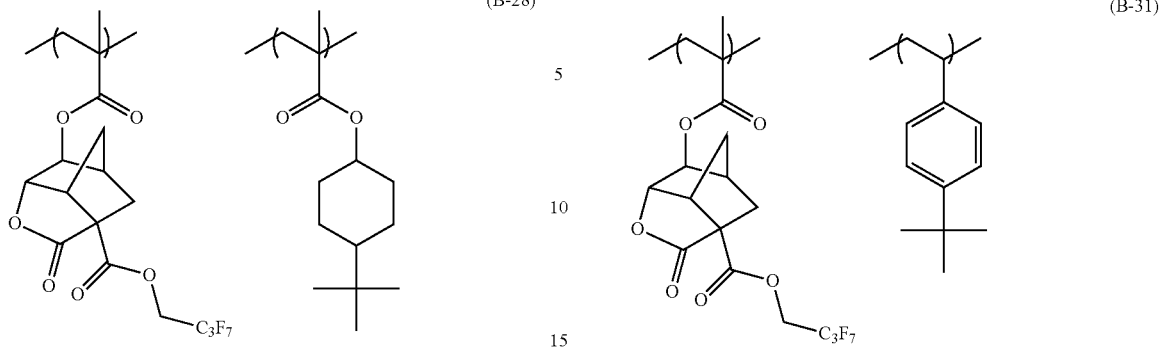
(B-31)
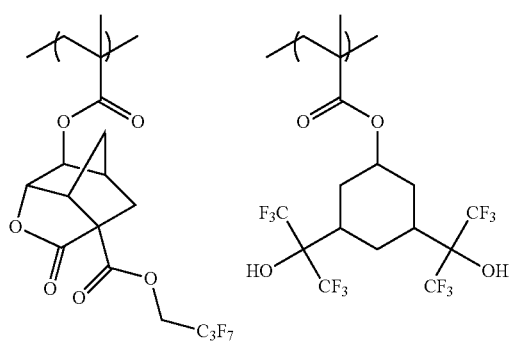
(B-32)
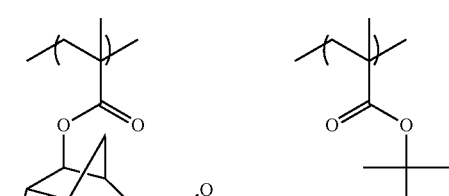
(B-33)
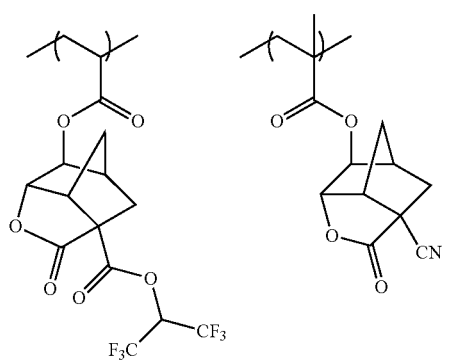
(B-34)

(B-35) 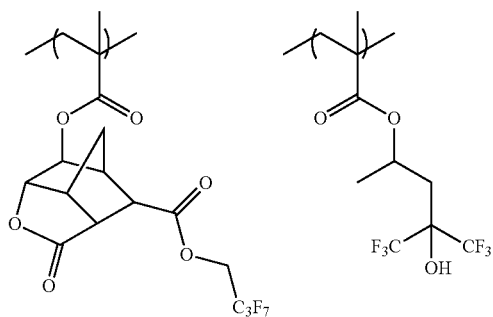
(B-36) 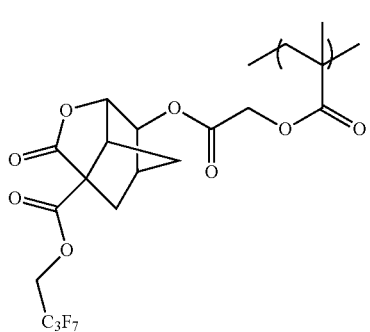
(B-37) 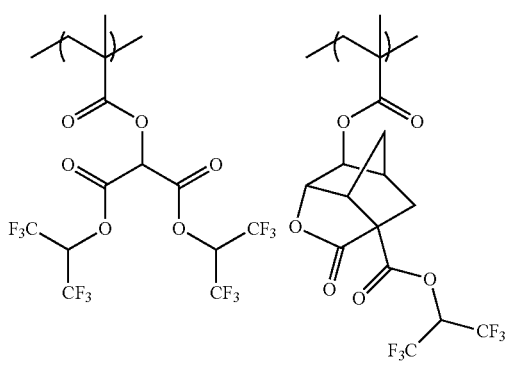
(B-38) 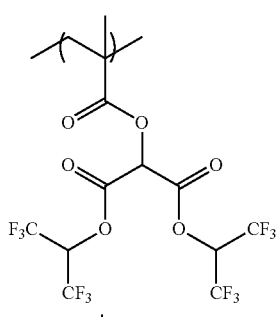
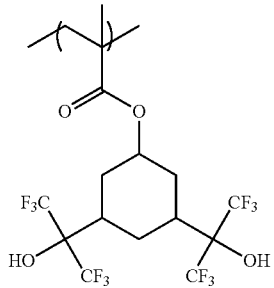
(B-39) 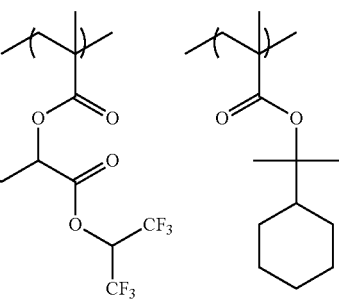
(B-40) 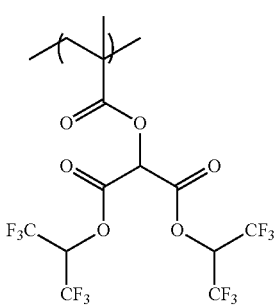
(B-41) 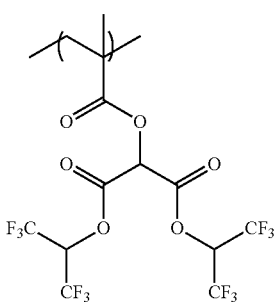
(B-42) 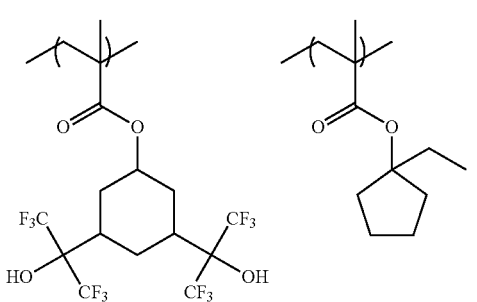

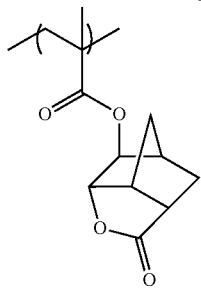
(B-43)
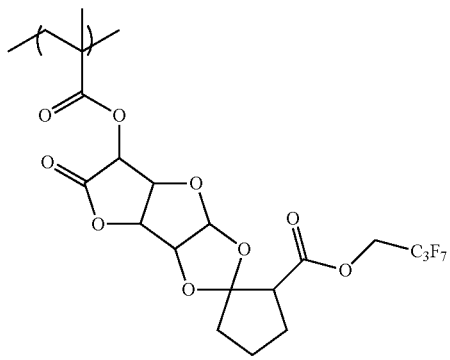
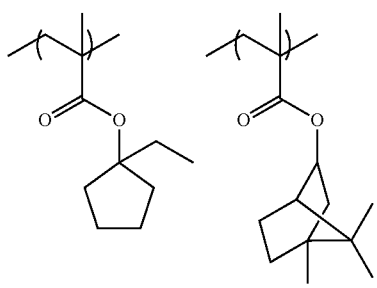
(B-44)
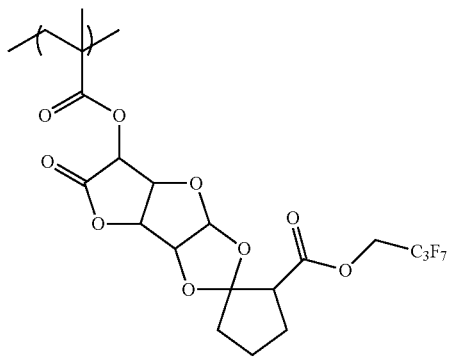
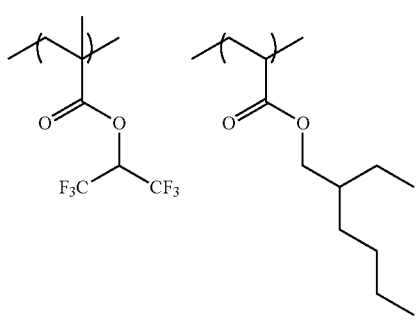
(B-45)
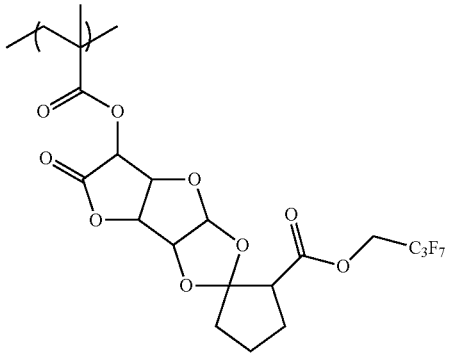
(B-46)
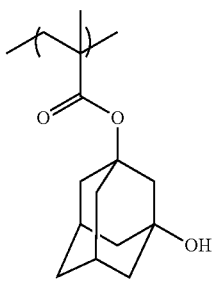
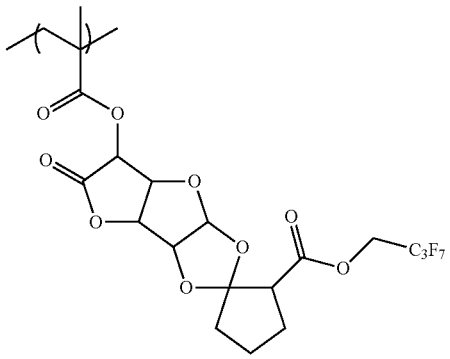
(B-47)
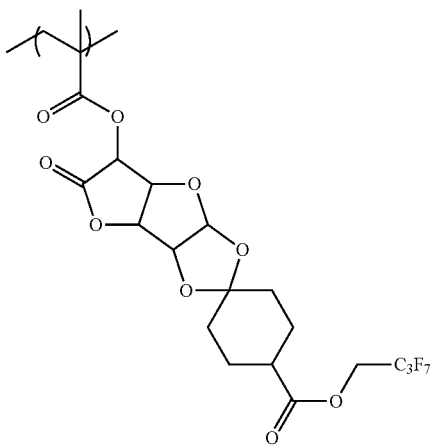
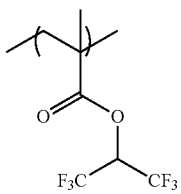

(B-48)
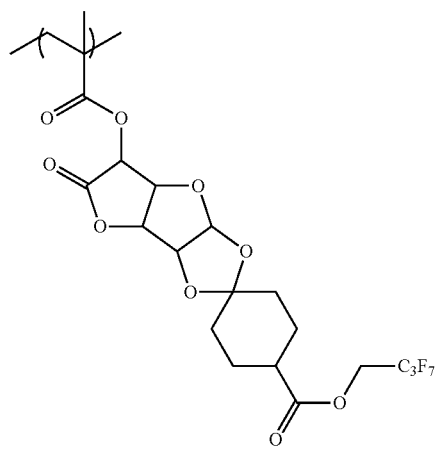
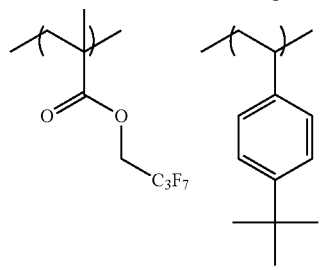
(B-49)
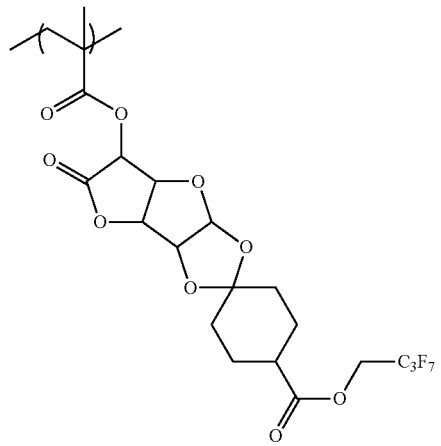
(B-50)
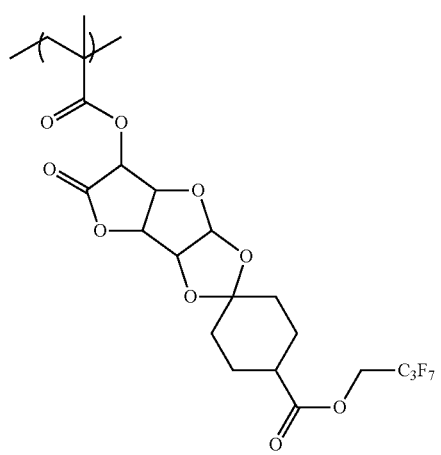
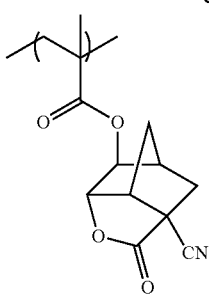
(B-51)
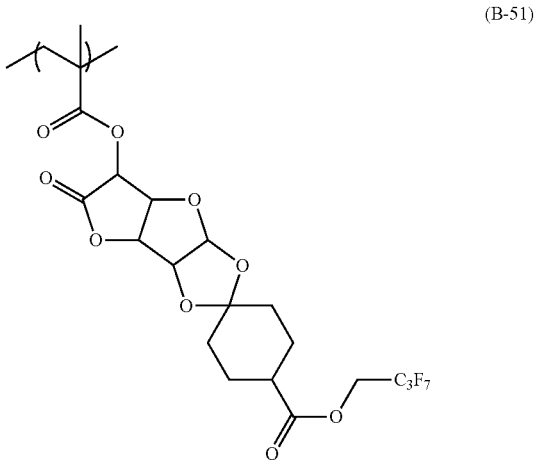
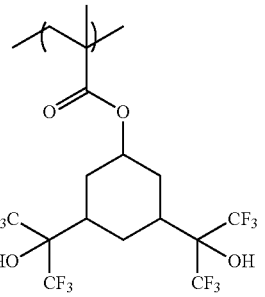
(B-52)
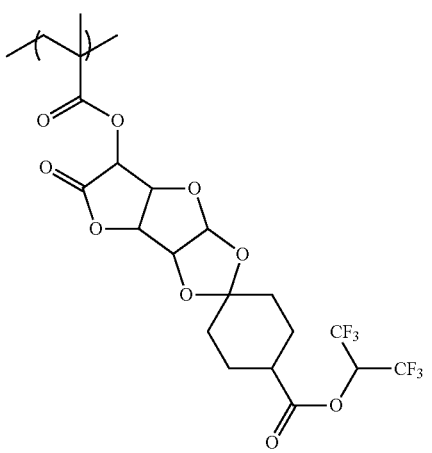

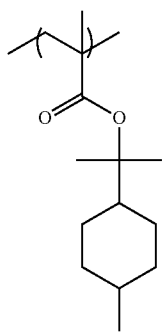
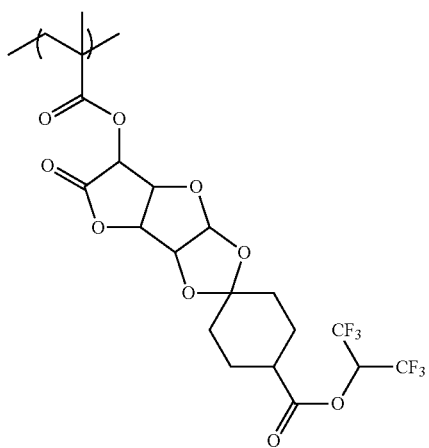
(B-53)
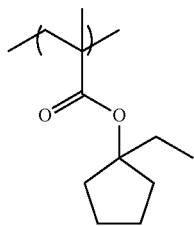
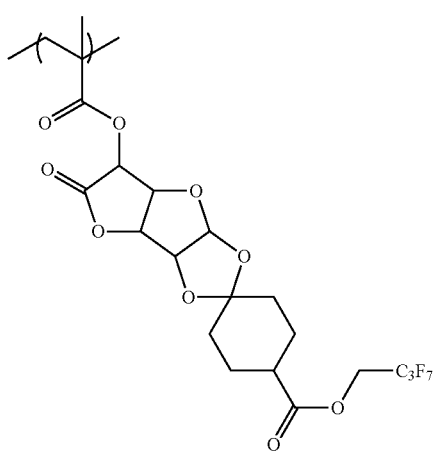
(B-54)
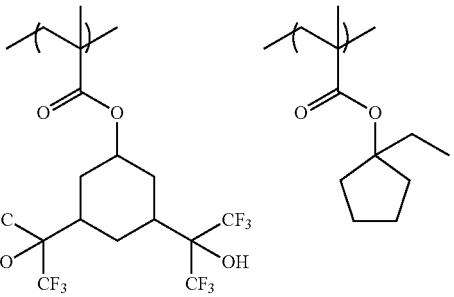
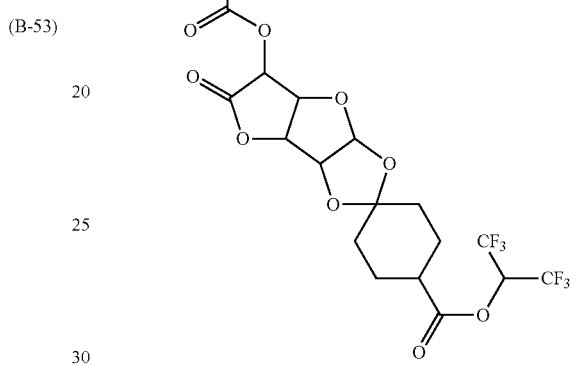
(B-55)
TABLE 1
| Polymer | Composition ratio (mol %) | Mw | Mw/Mn |
|---|---|---|---|
| B-1 | 50/50 | 6000 | 1.5 |
| B-2 | 30/70 | 6500 | 1.4 |
| B-3 | 45/55 | 8000 | 1.4 |
| B-4 | 100 | 15000 | 1.7 |
| B-5 | 60/40 | 6000 | 1.4 |
| B-6 | 40/60 | 8000 | 1.4 |
| B-7 | 30/40/30 | 8000 | 1.4 |
| B-8 | 60/40 | 8000 | 1.3 |
| B-9 | 50/50 | 6000 | 1.4 |
| B-10 | 40/40/20 | 7000 | 1.4 |
| B-11 | 40/30/30 | 9000 | 1.6 |
| B-12 | 30/30/40 | 6000 | 1.4 |
| B-13 | 60/40 | 9500 | 1.4 |
| B-14 | 60/40 | 8000 | 1.4 |
| B-15 | 35/35/30 | 7000 | 1.4 |
| B-16 | 50/40/5/5 | 6800 | 1.3 |
| B-17 | 20/30/50 | 8000 | 1.4 |
| B-18 | 25/25/50 | 6000 | 1.4 |
| B-19 | 100 | 9500 | 1.5 |
| B-20 | 100 | 7000 | 1.5 |
| B-21 | 50/50 | 6000 | 1.6 |
| B-22 | 40/60 | 9600 | 1.3 |
| B-23 | 100 | 20000 | 1.7 |
| B-24 | 100 | 25000 | 1.4 |
| B-25 | 100 | 15000 | 1.7 |
| B-26 | 100 | 12000 | 1.8 |
| B-27 | 100 | 18000 | 1.3 |
| B-28 | 70/30 | 15000 | 2.0 |
| B-29 | 80/15/5 | 18000 | 1.8 |
| B-30 | 60/40 | 25000 | 1.8 |
| B-31 | 90/10 | 19000 | 1.6 |
| B-32 | 60/40 | 20000 | 1.8 |
| B-33 | 50/30/20 | 11000 | 1.6 |
| B-34 | 60/40 | 12000 | 1.8 |
| B-35 | 60/40 | 15000 | 1.6 |
| B-36 | 100 | 22000 | 1.8 |
| B-37 | 20/80 | 35000 | 1.6 |

TABLE 1-continued

| Polymer | Composition ratio (mol %) | Mw | Mw/Mn |
|---|---|---|---|
| B-38 | 30/70 | 12000 | 1.7 |
| B-39 | 30/70 | 9000 | 1.5 |
| B-40 | 100 | 9000 | 1.5 |
| B-41 | 40/15/45 | 12000 | 1.9 |
| B-42 | 30/30/40 | 13000 | 2.0 |
| B-43 | 40/40/20 | 23000 | 2.1 |
| B-44 | 65/30/5 | 25000 | 1.6 |
| B-45 | 100 | 15000 | 1.7 |
| B-46 | 20/80 | 9000 | 1.7 |
| B-47 | 70/30 | 18000 | 1.5 |
| B-48 | 60/20/20 | 18000 | 1.8 |
| B-49 | 100 | 12000 | 1.4 |
| B-50 | 60/40 | 20000 | 1.6 |
| B-51 | 70/30 | 33000 | 2.0 |
| B-52 | 60/40 | 19000 | 1.8 |
| B-53 | 50/50 | 15000 | 1.5 |
| B-54 | 40/20/40 | 35000 | 1.9 |
| B-55 | 100 | 16000 | 1.4 |

The above-mentioned hydrophobic resin may be used in the case where liquid immersion exposure is performed using the composition according to the present invention, for example. When the hydrophobic resin containing at least either a fluorine atom or a silicon atom is contained, the hydrophobic resin is unevenly distributed in a surface layer portion of the film formed from the composition. When the immersion medium is water, the receding contact angle of the film surface with respect to water is increased so that the immersion-water tracking properties can be enhanced.

The receding contact angle of the film of the composition of the present invention after the bake of the coating but prior to the exposure thereof is preferably in the range of 60° to 90°, more preferably 65° or greater, further more preferably 70° or greater and most preferably 75° or greater at the exposure temperature, generally room temperature 23±3° C. in a humidity of 45±5%.

The above hydrophobic resin often has an unstable structure against a nucleophilic reaction. Thus, when the resist solution contains a nucleophilic component, degradation of receding contact angle may be observed during long-term storage. However, the composition according to the present invention contains the compound (B) with low nucleophilicity as described above. Therefore, the composition according to the present invention is used, it makes possible to suppress temporal change of receding contact angle. Namely, use of the composition according to the present invention also permits to improve temporal stability of receding contact angle.

Although the hydrophobic resin is unevenly localized on any interface, as different from the surfactant, the resin does not necessarily have to have a hydrophilic group in its molecule and does not need to contribute toward uniform mixing of polar/nonpolar substances.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the resist film in dynamic condition is important, and it is required for the resist composition to be capable of tracking the high-speed scanning of the exposure head without leaving droplets.

The hydrophobic resin, due to its hydrophobicity, is likely to cause the blob defect and development residue (scum) after alkali development to deteriorate. When use is made of a hydrophobic resin having three or more polymer chains via at least one branch portion, as compared with a linear-chain resin, the alkali dissolution rate is increased to thereby improve the development residue (scum) and blob defect performance.

When the hydrophobic resin contains fluorine atoms, the content of the fluorine atoms based on the molecular weight of the hydrophobic resin is preferably in the range of 5 to 80 mass %, and more preferably 10 to 80 mass %. The repeating unit containing fluorine atoms preferably exists in the hydrophobic resin in an amount of 10 to 100 mass %, more preferably 30 to 100 mass %.

When the hydrophobic resin contains silicon atoms, the content of the silicon atoms based on the molecular weight of the hydrophobic resin is preferably in the range of 2 to 50 mass %, more preferably 2 to 30 mass %. The repeating unit containing silicon atoms preferably exists in the hydrophobic resin in an amount of 10 to 90 mass %, more preferably 20 to 80 mass %. The weight average molecular weight of the hydrophobic resin is preferably in the range of 1000 to 100,000, more preferably 2000 to 50,000 and further more preferably 3000 to 30,000. Herein, the weight average molecular weight of the resin refers to the polystyrene-equivalent molecular weight measured by GPC (carrier: tetrahydrofuran (THF)).

One type of hydrophobic resin may be used alone, or two or more types thereof may be used in combination.

The content of hydrophobic resin in the resist composition can be regulated so that the receding contact angle of the actinic-ray- or radiation-sensitive resin film falls within the above-mentioned range. The content of hydrophobic resin based on the total solids of the resist composition is preferably in the range of 0.01 to 20 mass %, more preferably 0.1 to 15 mass %, further more preferably 0.1 to 10 mass % and most preferably 0.5 to 8 mass %.

(E) Solvent

The composition of the present invention may further contain a solvent. As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate.

As alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

As alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether.

As alkyl lactates, methyl lactate, ethyl lactate, propyl lactate and butyl lactate.

As alkyl alkoxypropionates, ethyl 3-ethoxypropionate, methyl 3-methoxypropionate, methyl 3-ethoxypropionate, and ethyl 3-methoxypropionate.

As cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

As optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

As alkylene carbonates, propylene carbonate, vinylene carbonate, ethylene carbonate, and butylene carbonate.

As alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester.

As alkyl pyruvates, methyl pyruvate, ethyl pyruvate and propyl pyruvate.

As a preferably usable solvent, there can be mentioned a solvent having a boiling point of 130° C. or higher measured under ordinary pressure. In particular, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy) ethyl acetate or propylene carbonate.

In the present invention, each of these solvents may be used alone, or two or more thereof may be used in combination.

In the present invention, a mixed solvent consisting of a mixture of a solvent having a hydroxyl group in its structure and a solvent having no hydroxyl group may be used as an organic solvent.

The solvent having a hydroxyl group and solvent having no hydroxyl group can appropriately be selected from among the compounds set forth above as examples.

The solvent having a hydroxyl group is preferably an alkylene group monoalkyl ether, an alkyl lactate or the like, more preferably propylene glycol monomethyl ether or ethyl lactate. The solvent having no hydroxyl group is preferably an alkylene glycol monoalkyl ether acetate, an alkyl alkoxypropionate, an optionally cyclized monoketone compound, a cyclolactone, an alkyl acetate or the like. Of these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

When employing a mixed solvent consisting of a mixture of a solvent having a hydroxyl group in its structure and a solvent having no hydroxyl group, the mass ratio between them is preferably in the range of 1/99 to 99/1, more preferably 10/90 to 90/10, and further more preferably 20/80 to 60/40. The mixed solvent containing 50 mass % or more of a solvent having no hydroxyl group is especially preferred from the viewpoint of uniform applicability.

It is preferred for the solvent to be a mixed solvent consisting of two or more solvents and to contain propylene glycol monomethyl ether acetate.

(F) Basic Compound Other than Compounds (B)

The composition of the present invention may contain a basic compound (hereinafter also referred to as a "component (F)") other than compounds (B) so as to decrease any performance alteration over time from exposure to heating.

As preferred basic compounds, there can be mentioned the compounds having the structures of the following formulae (A) to (E).

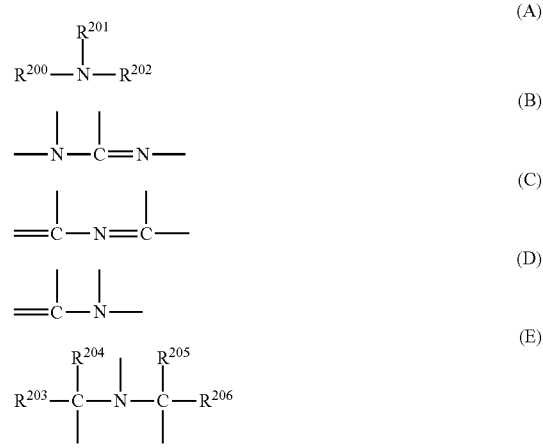

In the general formulae (A) and (E), $R_{200}$, $R_{201}$ and $R_{202}$ may be identical to or different from each other and each represents a hydrogen atom, an alkyl group (preferably having 1 to 20 carbon atoms), a cycloalkyl group (preferably having 3 to 20 carbon atoms) or an aryl group (having 6 to 20 carbon atoms). $R_{201}$ and $R_{202}$ may be bonded with each other to thereby form a ring. $R_{203}$, $R_{204}$, $R_{205}$ and $R_{206}$ may be identical to or different from each other and each represents an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

Each of the above amine compound having a phenoxy group, ammonium salt compound having a phenoxy group, amine compound having a sulfonic ester group and ammonium salt compound having a sulfonic ester group preferably has at least one alkyl group bonded to the nitrogen atom thereof. Further preferably, the alkyl group in its chain contains an oxygen atom, thereby forming an oxyalkylene group. The number of oxyalkylene groups in each molecule is one or more, preferably 3 to 9 and more preferably 4 to 6. Oxyalkylene groups having the structure of —$CH_2CH_2O$—, —$CH(CH_3)CH_2O$— or —$CH_2CH_2CH_2O$— are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to ($C_3$-3) shown as examples in Section [0066] of US 2007/0224539 A, which are however nonlimiting.

These basic compounds may be used either individually or in combination.

When the composition of the present invention contains the component (F), the content thereof is typically in the range of 0.001 to 10 mass %, preferably 0.01 to 5 mass % based on the total solids of the composition.

With respect to the ratio of the acid generator to the component (F) used in the composition, preferably, the acid generator/the component (F) (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/the component (F) (molar ratio) is more preferably in the range of 3.5 to 200, still more preferably 3.5 to 150.

(G) Low-molecular weight compound containing a group eliminated by the action of an acid that upon the elimination, exhibits an increased basicity It is preferred for the composition of the present invention to contain a low-molecular weight compound containing a group eliminated by the action of an acid that upon the elimination, exhibits an increased basicity (hereinafter also referred to as a "low-molecular weight compound (G).")

The group that is eliminated when acted on by an acid is not particularly limited. However, an acetal group, a carbonate group, a carbamate group, a tertiary ester group, a tertiary hydroxyl group and a hemiaminal ether group are preferably used. A carbamate group and a hemiaminal ether group are especially preferred.

The molecular weight of the compound (G) containing a group eliminated by the action of an acid is preferably in the range of 100 to 1000, more preferably 100 to 700 and most preferably 100 to 500.

As the compound (G), an amine derivative containing a group that is eliminated when acted on by an acid being connected to a nitrogen atom.

The compound (G) may contain a carbamate group with a protective group, the carbamate group being connected to a nitrogen atom. The protective group contained in the carbamate group can be represented, for example, by the following formula (d-1).

(d-1)

In the formula (d-1),

Each of R's independently represents a hydrogen atom, a linear or branched alkyl group, a cycloalkyl group, an aryl group, an aralkyl group, or an alkoxyalkyl group. At least two of R's may be connected to each other to form a ring.

Preferably, R' represents a linear or branched alkyl group, a cycloalkyl group, or an aryl group. More preferably, R' represents a linear or branched alkyl group, or a cycloalkyl group.

The low-molecular weight compound (G) may have a structure in which any of the above-mentioned basic compounds are combined with the structure represented by general formula (d-1).

The low-molecular weight compound (G) is especially preferred to be the one represented by general formula (A) below.

Note that, the low-molecular weight compound (G) may be any of the basic compounds described above as long as it is a low-molecular weight compound containing a group that is eliminated when acted on by an acid.

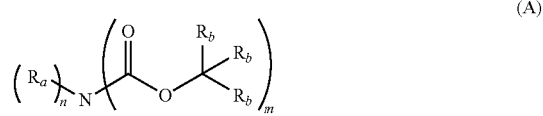

(A)

In the general formula (A), Ra represents a hydrogen atom, an alkyl group, a cycloalkyl group, an aryl group, or an aralkyl group. When n=2, two Ra's may be the same or different from each other, and may be connected to each other to form a bivalent heterocyclic hydrocarbon group (preferably having 20 or less carbon atoms) or its derivatives.

Each of Rb's independently represents a hydrogen atom, an alkyl group, a cycloalkyl group, an aryl group, an aralkyl group, or an alkoxyalkyl group, with the proviso that when at least one of Rb's are hydrogen atoms, at least one of the remainder represents a cyclopropyl group, 1-alkoxyalkyl group, or an aryl group.

At least two of Rb's may be connected to each other to form an alicyclic hydrocarbon group, an aromatic hydrocarbon group, a heterocyclic hydrocarbon group, or their derivatives.

In the formula (A), n represents an integer of 0 to 2, m represents an integer of 1 to 3, and n+m=3.

In the formula (A), the alkyl group, the cycloalkyl group, the aryl group, and the aralkyl group represented by Ra and Rb may be substituted with a functional group such as a hydroxyl group, a cyano group, an amino group, a pyrrolidino group, a piperidino group, a morpholino group, and an oxo group; an alkoxy group; or a halogen atom. The same applies to the alkoxyalkyl group represented by Rb.

As the alkyl group, the cycloalkyl group, the aryl group, and the aralkyl group (these groups may be substituted with the above functional group, an alkoxy group, or a halogen atom) represented by Ra and/or Rb, there can be mentioned the following groups:

a group derived from a linear or branched alkane such as methane, ethane, propane, butane, pentane, hexane, heptane, octane, nonane, decane, undecane, or dodecane; and a group derived from the alkane and substituted with one or more cycloalkyl groups such as a cyclobutyl group, a cyclopentyl group, or a cyclohexyl group;

a group derived from cycloalkane such as cyclobutane, cyclopentane, cyclohexane, cycloheptane, cyclooctane, norbornane, adamantane, or noradamantane; and a group derived from the cycloalkane and substituted with one or more linear or branched alkyl group such as a methyl group, an ethyl group, a n-propyl group, an i-propyl group, a n-butyl group, a 2-methylpropyl group, a 1-methylpropyl group, or a t-butyl group;

a group derived from aromatic compound such as benzene, naphthalene, or anthracene; and a group derived from the aromatic compound and substituted with one or more linear or branched alkyl group such as a methyl group, an ethyl group, a n-propyl group, an i-propyl group, a n-butyl group, a 2-methylpropyl group, a 1-methylpropyl group, or a t-butyl group;

a group derived from heterocyclic compound such as pyrrolidine, piperidine, morpholine, tetrahydrofuran, tetrahydropyrane, indole, indoline, quinoline, perhydroquinoline, indazole, or benzimidazole; a group derived from heterocyclic compound and substituted with one or more linear or branched alkyl group or a group derived from the aromatic compound;

a group derived from linear or branched alkane and substituted with a group derived from aromatic compound such as a phenyl group, a naphthyl group, or an anthracenyl group;

a group derived from cycloalkane and substituted with a group derived from aromatic compound such as a phenyl group, a naphthyl group, or an anthracenyl group; or each of these groups substituted with a functional group such as a hydroroxyl group, a cyano group, an amino group, a pyrrolidino group, a piperidino group, a morpholino group, or an oxo group.

Further, as the bivalent heterocyclic hydrocarbon group (preferably having 1 to 20 carbon atoms) or its derivative, formed by mutual binding of Ra's, there can be mentioned, for example, the followings:

a group derived from heterocyclic compound such as pyrrolidine, piperidine, morpholine, 1,4,5,6-tetrahydropyrimidine, 1,2,3,4-tetrahydroquinoline, 1,2,3,6-tetrahydroquinoline, homopiperadine, 4-azabenzimidazole, benztriazole, 5-azabenztriazole, 1H-1,2,3-triazole, 1,4,7-triazacyclononane, tetrazole, 7-azaindole, indazole, benzimidazole, imidazo[1,2-a]pyridine, (1S,4S)-(+)2,5-azabicyclo[2.2.1]heptane, 1,5,7-triazabicyclo[4.4.0]dec-5-en, indole, indoline, 1,2,3,4-tetrahydroquinoxaline, perhydroquinoline, or 1,5,9-triazacyclododecane; or a group derived from heterocyclic compound and substituted with at least one of a group derived from linear or branched alkane, a group derived from cycloalkane, a group derived from aromatic compound, a group derived from heterocyclic compound, or a functional group such as a hydroxyl group, a cyano group, an amino group, a pyrrolidino group, a piperidino group, a morpholino group, or an oxo group.

Particularly preferred examples of the low-molecular weight compound (G) will be shown below, which however in no way limit the scope of the present invention.

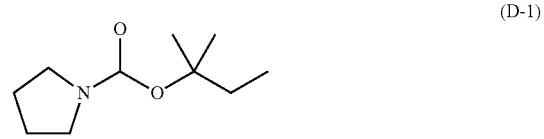

(D-1)

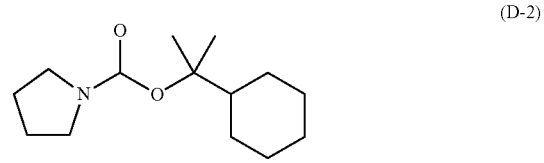

(D-2)

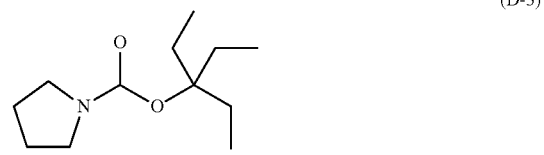

(D-3)

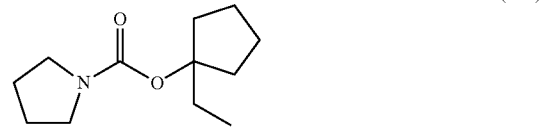

(D-4)

(D-5)

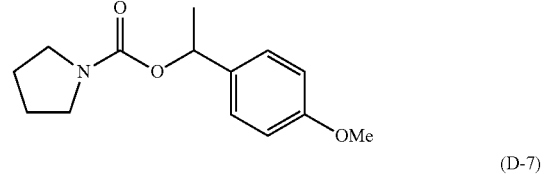

(D-6)

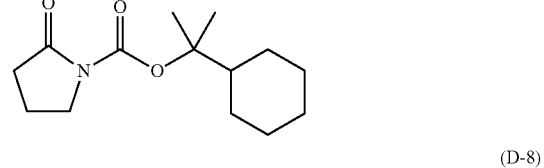

(D-7)

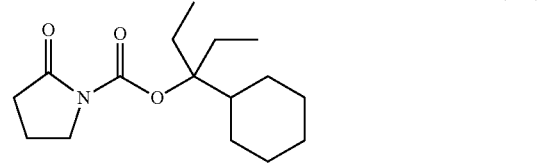

(D-8)

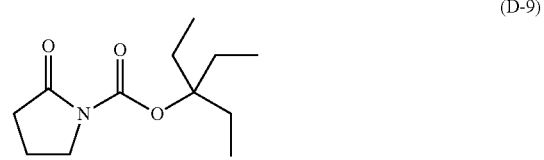

(D-9)

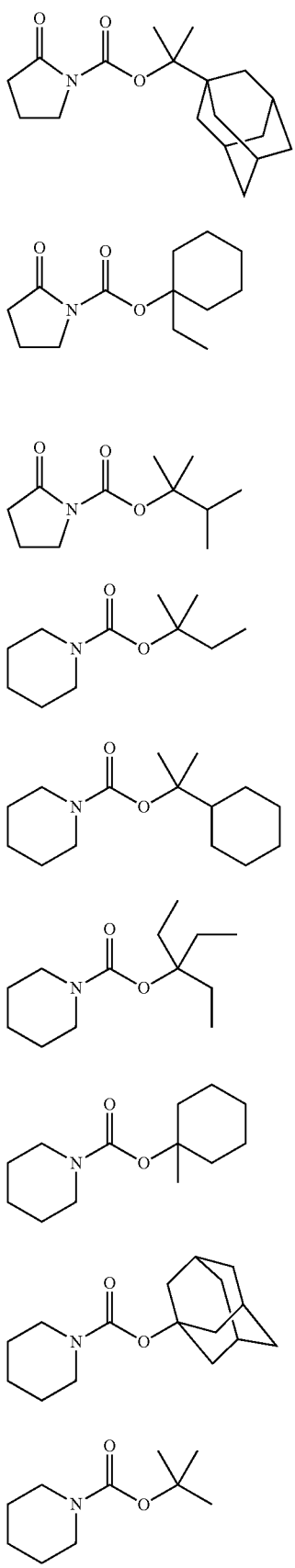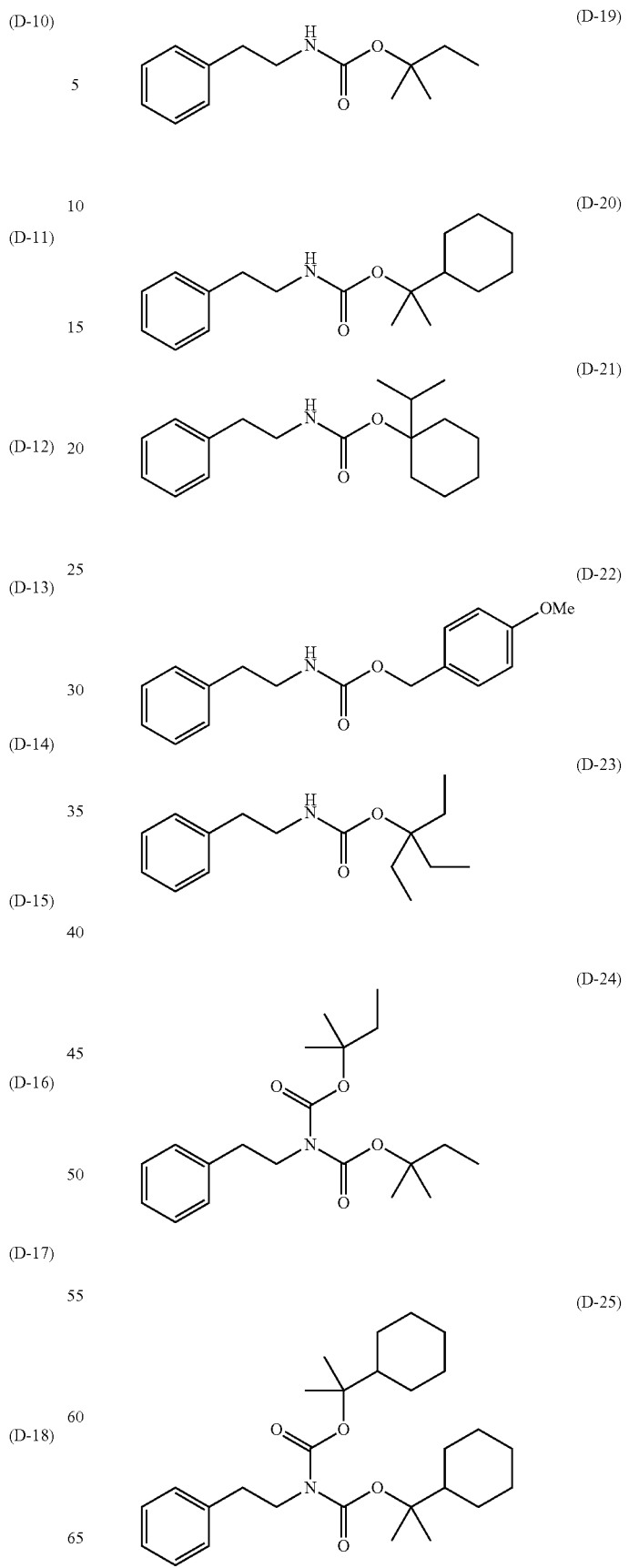

(D-26) 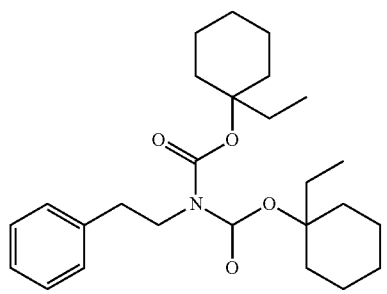
(D-31) 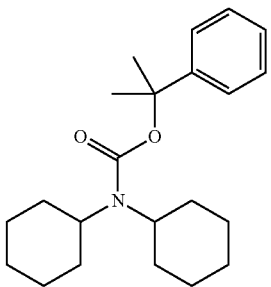
(D-27) 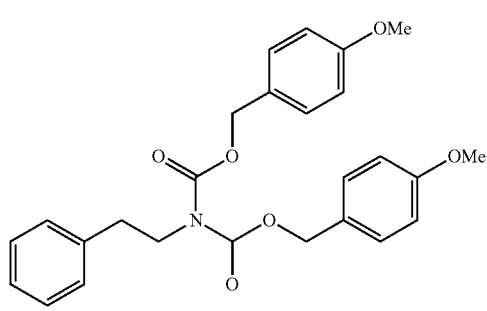
(D-32) 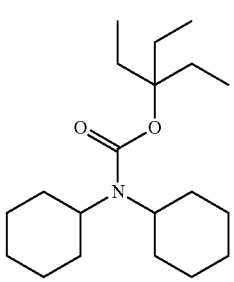
(D-28) 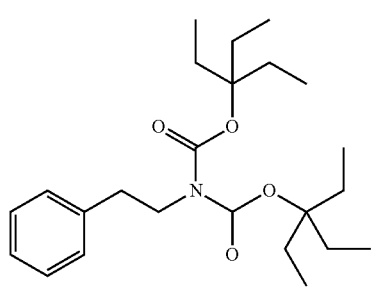
(D-33) 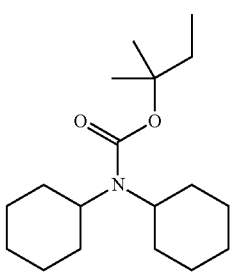
(D-29) 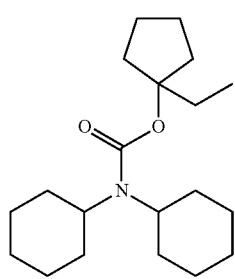
(D-34) 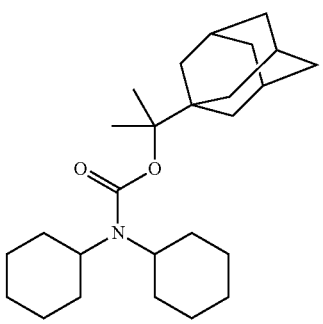
(D-30) 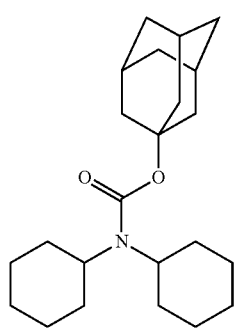
(D-35) 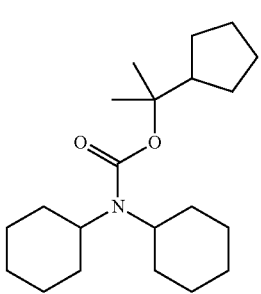

-continued
(D-36)
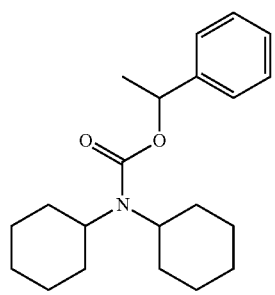
(D-37)
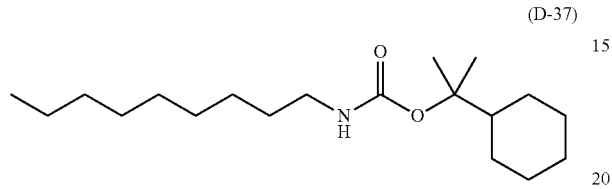
(D-38)
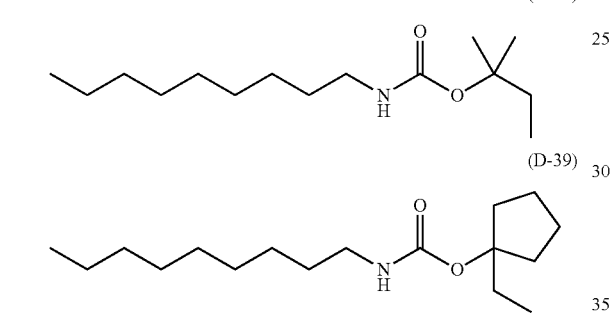
(D-39)
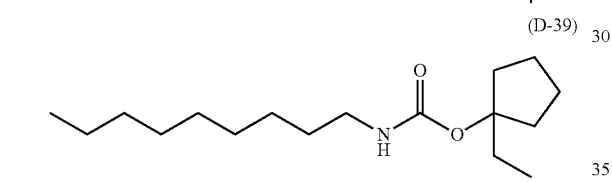
(D-40)
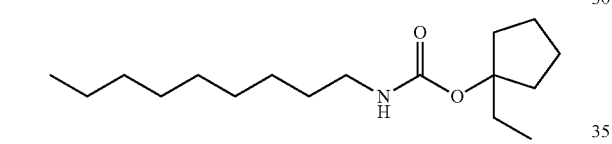
(D-41)
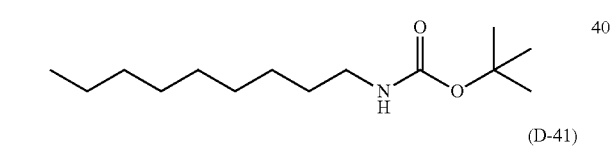
(D-42)
-continued
(D-43)
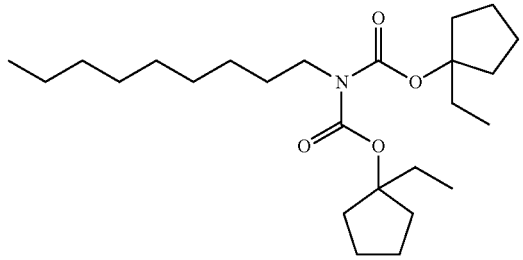
(D-44)
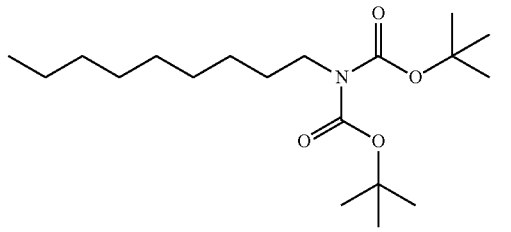
(D-45)
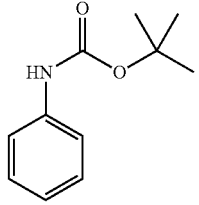
(D-46)
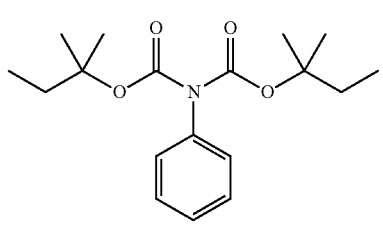
(D-47)
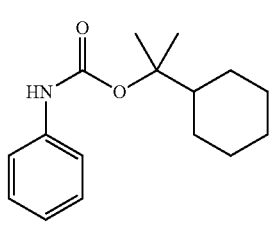
(D-48)
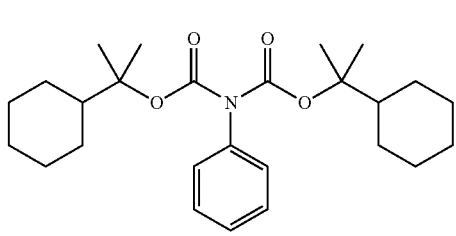

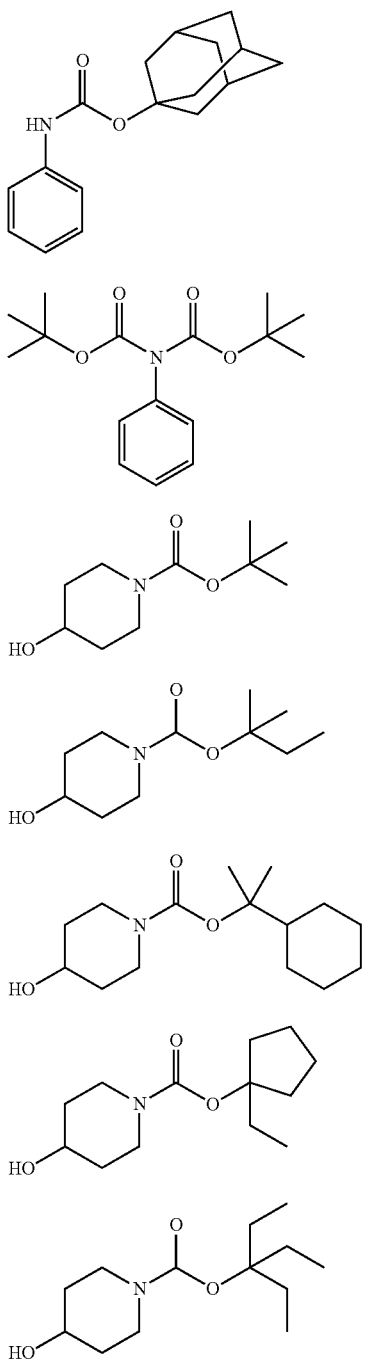

The compounds represented by the general formula (A) can be synthesized by, for example, the method described in JP-A-2009-199021.

In the present invention, one type of low-molecular weight compound (G) may be used alone, or two or more types thereof may be used in a mixture.

In the present invention, the content of low-molecular weight compound (G), based on the total solids of the composition mixed with the component (F), is generally in the range of 0.001 to 20 mass %, preferably 0.001 to 10 mass % and more preferably 0.01 to 5 mass %.

With respect to the ratio between acid generator and low-molecular weight compound (G) used in the composition, it is preferred for the molar ratio of acid generator/[low-molecular weight compound (G)+compound (F)] to be in the range of 2.5 to 300. Namely, the molar ratio is preferred to be 2.5 or higher from the viewpoint of sensitivity and resolution, and the molar ratio is preferred to be 300 or below from the viewpoint of inhibiting the lowering of resolution by thickening of resist pattern over time from exposure to baking treatment. The molar ratio of acid generator/[low-molecular weight compound (G)+component (F)] is more preferably in the range of 3.5 to 200, further more preferably 3.5 to 150.

(H) Surfactant

The composition of the present invention may further contain a surfactant. When the composition contains a surfactant, the composition preferably contains any one, or two or more members, of fluorinated and/or siliconized surfactants (fluorinated surfactant, siliconized surfactant and surfactant containing both fluorine and silicon atoms).

The composition of the present invention when containing the above surfactant would, in the use of an exposure light source of 250 nm or below, especially 220 nm or below, realize favorable sensitivity and resolving power and produce a resist pattern with less adhesion and development defects.

As fluorinated and/or siliconized surfactants, there can be mentioned, for example, those described in section [0276] of US 2008/0248425 A1. As useful commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and $R_{08}$ (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

The polymer containing a fluorinated aliphatic group is preferably a copolymer from a monomer containing a fluorinated aliphatic group and a poly(oxyalkylene) acrylate and/or poly(oxyalkylene) methacrylate, which copolymer may have an irregular distribution or may result from block copolymerization. As the poly(oxyalkylene) group, there can be mentioned a poly(oxyethylene) group, a poly(oxypropylene) group, a poly(oxybutylene) group or the like. Further, use can be made of a unit comprising alkylenes of different chain lengths in a single chain, such as poly(oxyethylene-oxypropylene-oxyethylene block concatenation) or poly(oxyethylene-oxypropylene block concatenation). Moreover, the copolymer from a monomer containing a fluorinated aliphatic group and a poly(oxyalkylene) acrylate (or methacrylate) is not limited to binary copolymers and may be ternary or higher copolymers obtained by simultaneous copolymerization of two or more different monomers having a fluorinated aliphatic group, two or more different poly(oxyalkylene) acrylates (or methacrylates), etc.

For example, as a commercially available surfactant, there can be mentioned, for example, Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_3F_7$ group, poly (oxyethylene) acrylate (or methacrylate) and poly(oxypropylene) acrylate (or methacrylate), or the like.

In the present invention, surfactants other than the fluorinated and/or siliconized surfactants can also be employed. In particular, there can be mentioned, for example, those described in section [0280] of US 2008/0248425 A1.

These surfactants may be used either individually or in combination.

When the composition of the present invention contains the surfactant, the content thereorf based on the total solids of the composition is preferably in the range of 0.1 to 2 mass %, more preferably 0.1 to 1.5 mass %, and most preferably 0.1 to 1 mass %.

(I) Carboxylic Acid Onium Salt

The composition according to the present invention may further contain a carboxylic acid onium salt. Preferred carboxylic acid onium salt is a sulfonium salt and an iodonium salt. A preferred anion moiety thereof is a linear, branched, monocyclic or polycyclic alkylcarboxylate anion having 1 to 30 carbon atoms. A more preferred anion moiety is an anion of carboxylic acid wherein the alkyl group is partially or wholly fluorinated. The alkyl chain may contain an oxygen atom. If so, the transparency to light of wavelength 220 nm or shorter can be ensured, the sensitivity and resolving power can be enhanced, and the iso/dense bias and exposure margin can also be enhanced.

As the fluorinated carboxylic acid anion, any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

The content of the carboxylic acid onium salt based on the total solids of the composition is preferably in the range of 0.1 to 20 mass %, more preferably 0.5 to 10 mass %, and most preferably 1 to 7 mass %.

(J) Dissolution Inhibiting Compound

The composition according to the present invention may further contain a dissolution inhibiting compound. Here the "dissolution inhibiting compound" means compound having 3000 or less molecular weight that is decomposed by the action of an acid to increase the solubility in an alkali developer. From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure can be the same as described earlier.

When the composition according to the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

The content of the dissolution inhibiting compound based on the total solids of the composition is preferably in the range of 3 to 50 massa, and more preferably 5 to 40 mass %.

Specific examples of the dissolution inhibiting compound will be shown below, which however in no way limit the scope of the present invention.

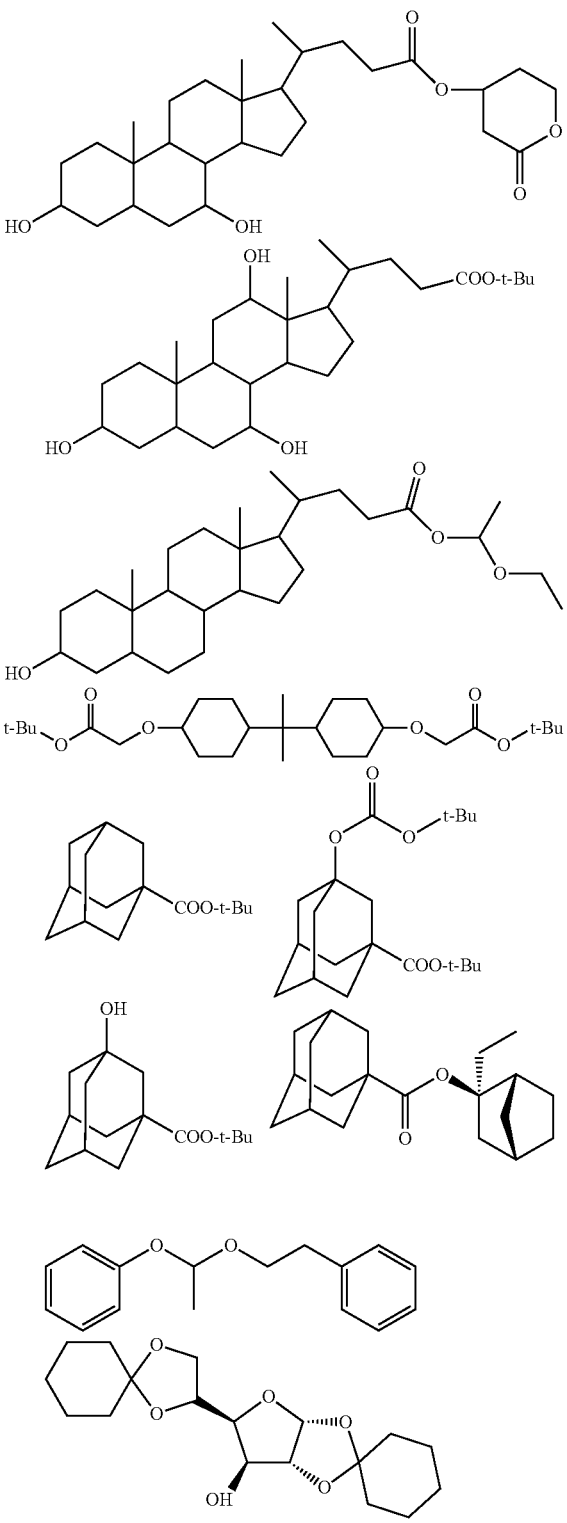

(K) Other Additives

The composition according to the present invention may further contain a dye, a plasticizer, a photosensitizer, a light absorber, and/or a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art while consulting the processes described in, for example, JP-As 4-122938 and 2-28531, U.S. Pat. No. 4,916,210, and EP 219294.

As the nonlimiting examples of the carboxylated alicyclic or aliphatic compound, a carboxylic acid derivative of steroid structure such as cholic acid, deoxycholic acid or lithocholic acid, an adamantanecarboxylic acid derivative, adamantanedicarboxylic acid, cyclohexanecarboxylic acid, and cyclohexanedicarboxylic acid.

<Method of Forming Pattern>

From the viewpoint of enhancing the resolving power, it is preferred for the composition of the present invention to be used with a film thickness of 30 to 250 nm. More preferably, the composition is used with a film thickness of 30 to 200 nm. This film thickness can be attained by setting the solid content of the actinic-ray- or radiation-sensitive resin composition within an appropriate range so as to cause the composition to have an appropriate viscosity, thereby improving the applicability and film forming property.

The total solid content of the composition of the present invention is generally in the range of 1 to 10 mass %, preferably 1 to 8.0 mass % and more preferably 1.0 to 7.0 mass %.

The composition of the present invention is used in such a manner that the above components are dissolved in a given organic solvent, preferably the above mixed solvent, and filtered and applied onto a given support in the following manner. Preferably, the filter medium for the filtration is made of a polytetrafluoroethylene, polyethylene or nylon having a pore size of 0.1 μm or less, especially 0.05 μm or less and further especially 0.03 μm or less. In the filtration, use may be made of two or more types of filters connected in series or in parallel. Further, the composition may be filtered two or more times. Still further, before or after the filtration, the composition may be subjected to deaeration, etc.

For example, the actinic-ray- or radiation-sensitive resin composition is applied onto a substrate, such as one for use in the production of precision integrated circuit elements (e.g., silicon/silicon dioxide coating), by appropriate application means, such as a spinner or coater, and dried to thereby form a film.

The obtained film is exposed through a given mask to actinic rays or radiation, preferably baked (heated), developed and rinsed. Thus, a desirable pattern can be obtained.

As the actinic rays or radiation, infrared rays, visible light, ultraviolet rays, far ultraviolet rays, extreme ultraviolet rays (EUV), X-rays, and electron beams. Among them, preferred use is made of far ultraviolet rays with wavelength of preferably 250 nm or less, more preferably 220 nm or less, and still more preferably 1 to 200 nm, such as a KrF excimer laser (248 nm), an ArF excimer laser (193 nm) and an $F_2$ excimer laser (157 nm), EUV (13 nm) and electron beams.

The application of the composition to the substrate can be preceded by the application of an antireflection film.

As the anti-reflection film, use can be made of not only an inorganic film of titanium, titanium oxide, titanium nitride, chromium oxide, carbon, amorphous silicon or the like but also an organic film composed of a light absorber and a polymer material. Also, as the organic anti-reflection film, use can be made of commercially available organic anti-reflection films, such as the DUV30 Series and DUV40 Series produced by Brewer Science Inc. and AR-2, AR-3 and AR-5 produced by Shipley Co., Ltd.

Generally, an aqueous solution of any of quaternary ammonium salts, a typical example thereof being tetramethylammonium hydroxide, is employed as the alkali developer for use in the development operation. However, other aqueous alkali solutions of an inorganic alkali, a primary amine, a secondary amine, a tertiary amine, an alcoholamine, a cycloamine, etc. can also be employed.

An appropriate amount of alcohol and/or surfactant may be added to the alkali developer.

The alkali concentration of the alkali developer is generally in the range of 0.1 to 20 massa.

The pH value of the alkali developer is generally in the range of 10.0 to 15.0.

Pure water is used as the rinse liquid. An appropriate amount of surfactant may be added to the rinse liquid before use.

The development operation or rinse operation may be followed by the operation for removing any portion of developer or rinse liquid adhering onto the pattern by use of a supercritical fluid.

Liquid immersion exposure may be carried out for the film produced from the composition of the present invention. Namely, the film may be exposed to actinic rays or radiation under the conditions that the space between the film and a lens is filled with a liquid whose refractive index is higher than that of air. If so, an enhanced resolution can be attained.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

For the attainment of further wavelength shortening, use can be made of a medium whose refractive index is 1.5 or higher. This medium may be an aqueous solution or an organic solvent.

In the use of water as the liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase surface activating power.

The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of concentration, the change of refractive index of the liquid as a whole can be minimized. On the other hand, when a substance being opaque in 193 nm rays or an impurity whose refractive index is greatly different from that of water is mixed therein, the mixing would result in distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MΩcm or higher, and the TOC (organic matter concentration) thereof is 20 ppb or below. Prior *deaeration* of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

EXAMPLES

Embodiments of the present invention will be described in greater detail below by way of examples thereof. However, the scope of the present invention is in no way limited to these examples.

<Acid Generator (1)>

The following compounds (B-1) to (B-34) were synthesized as compounds (B). Further, the following compounds (B-35) and (B-36) were provided for reference.

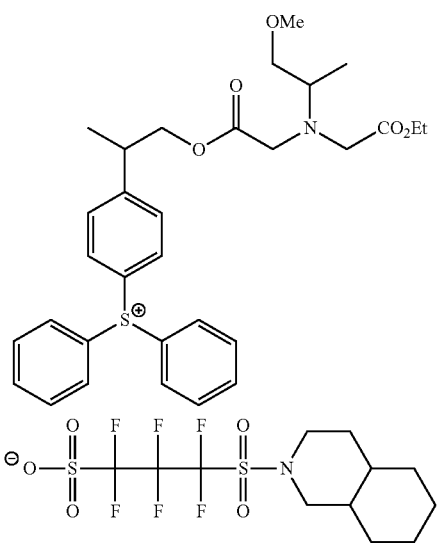
(B-3)

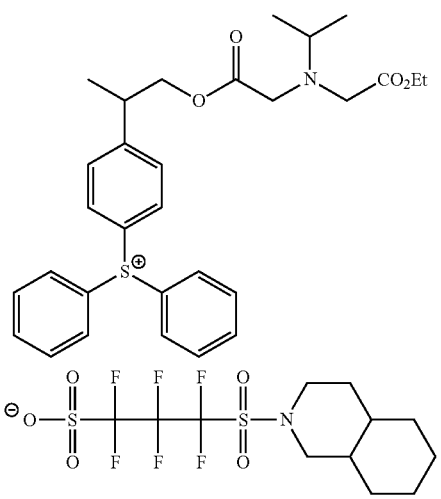
(B-4)

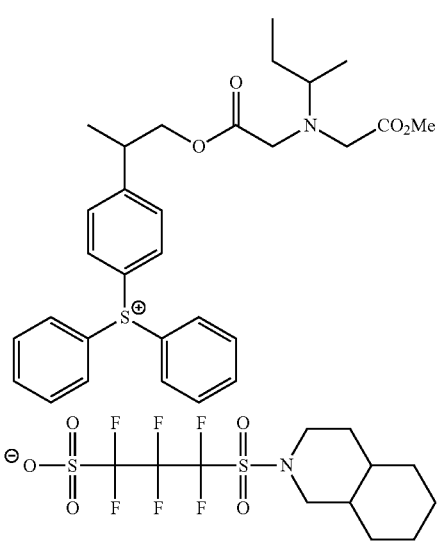
(B-5)

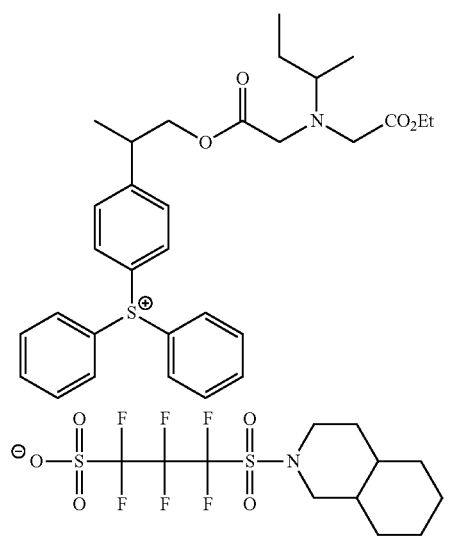
(B-1)

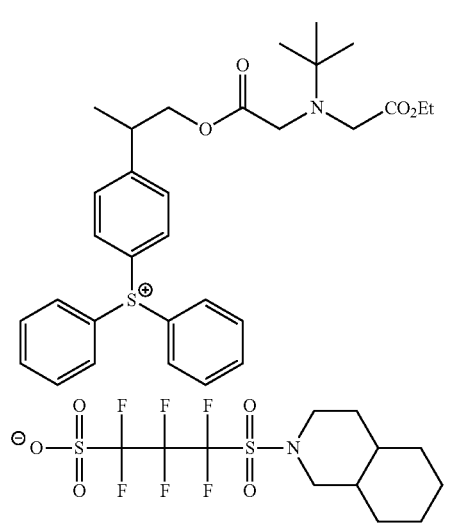
(B-2)

-continued
(B-6)
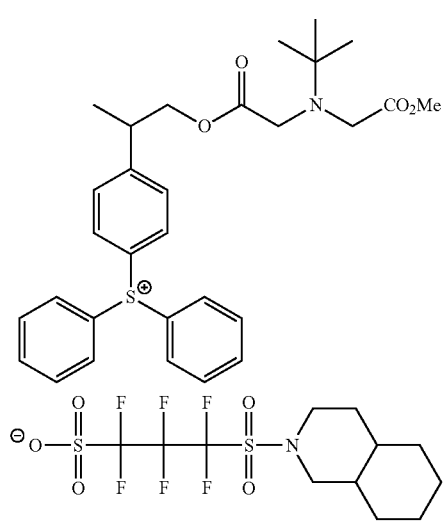
(B-7)
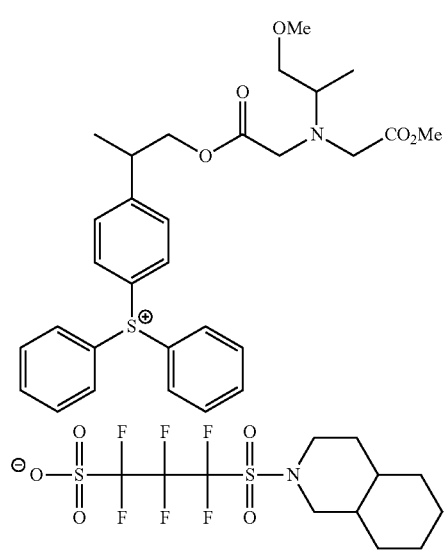
(B-8)
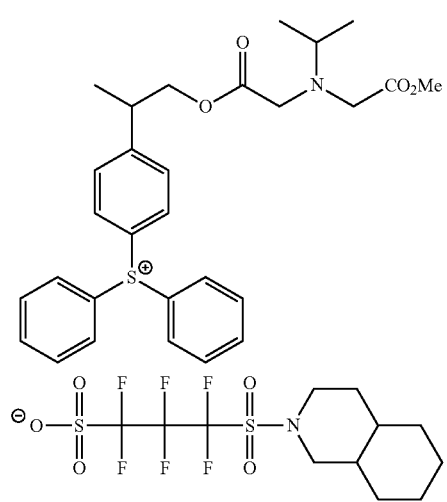
-continued
(B-9)
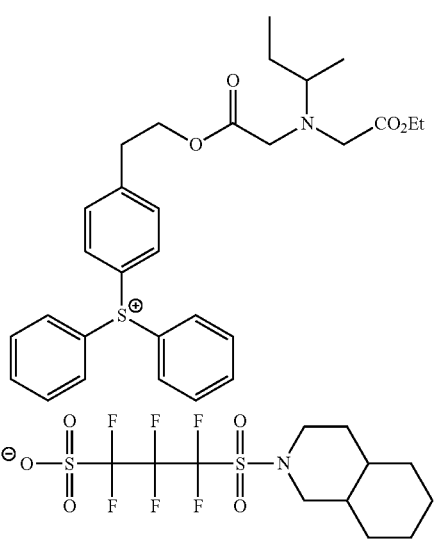
(B-19)
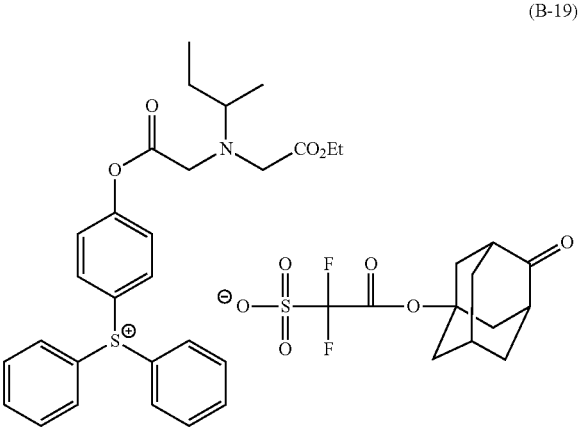
(B-20)
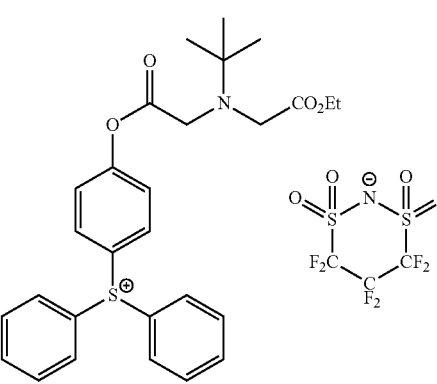

(B-21)
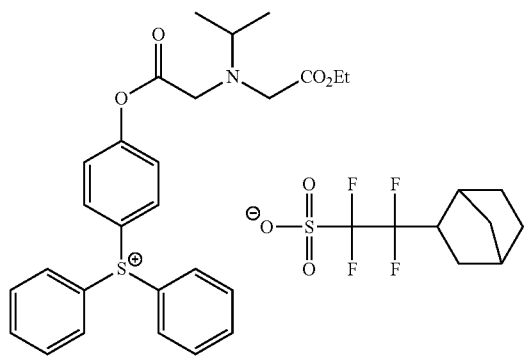
(B-22)
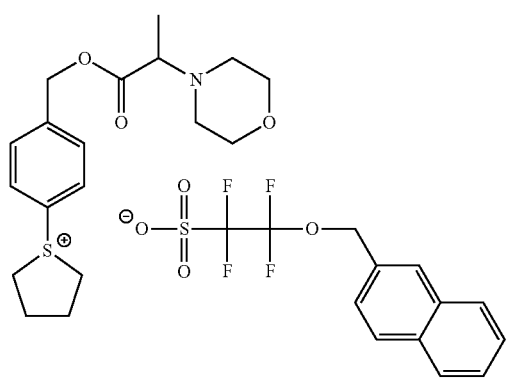
(B-23)
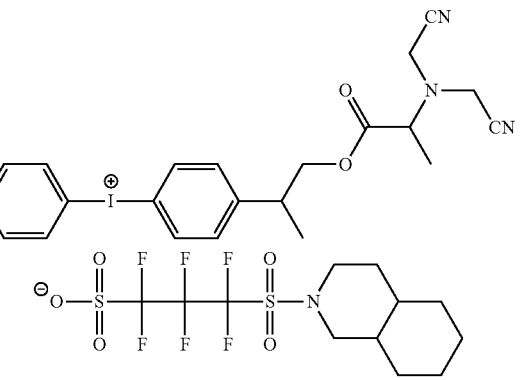
(B-24)
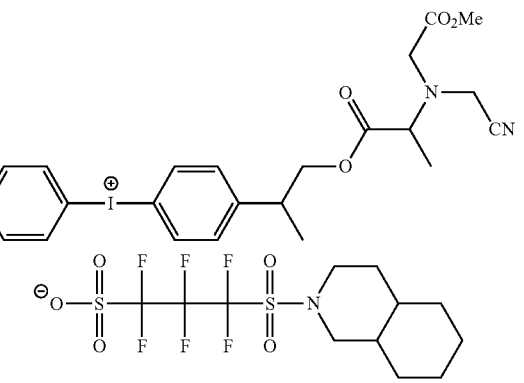
(B-25)
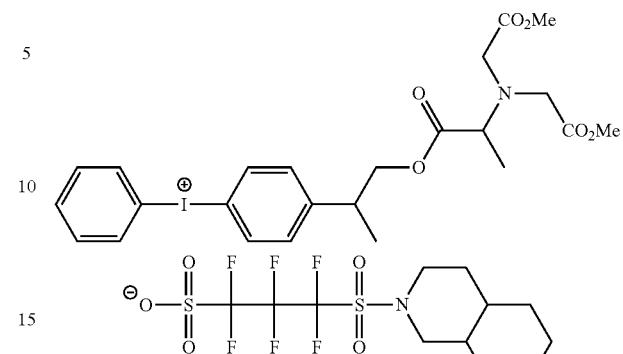
(B-26)
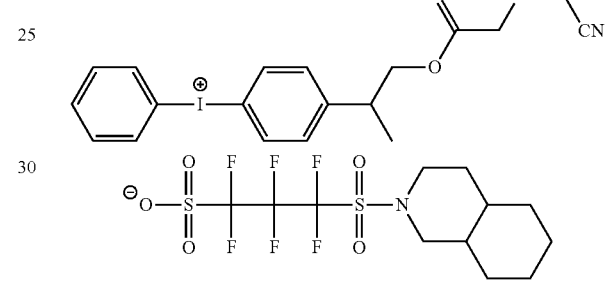
(B-27)
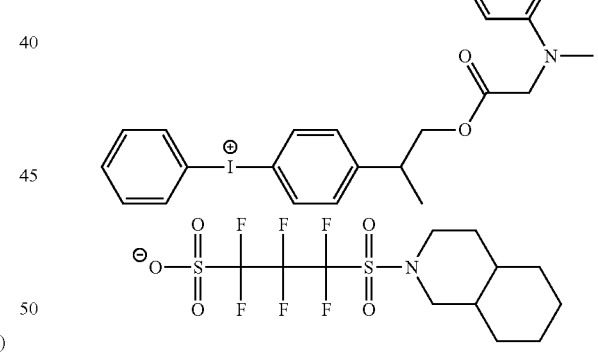
(B-28)
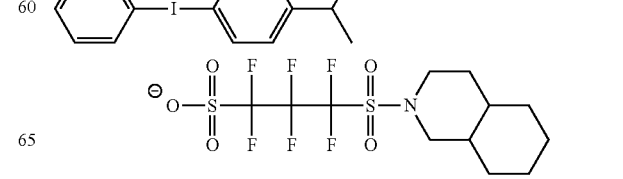

(B-29)
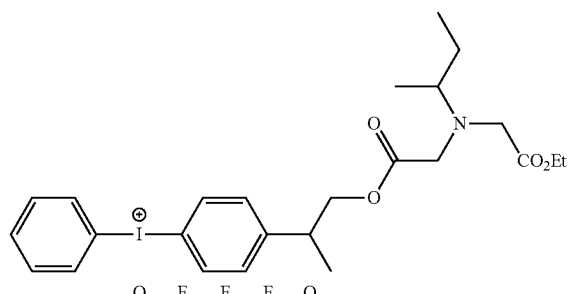

(B-30)
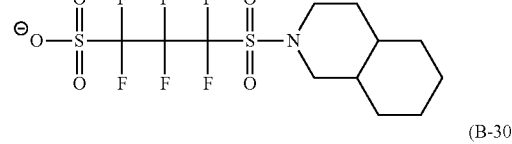

(B-31)
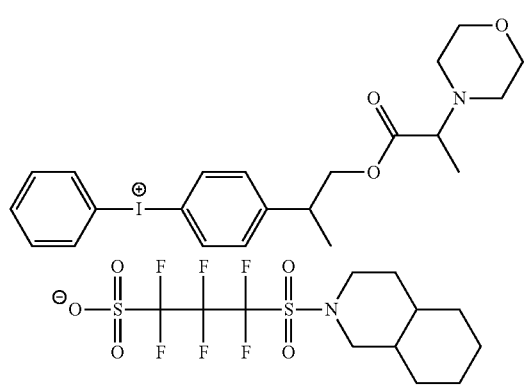

(B-32)
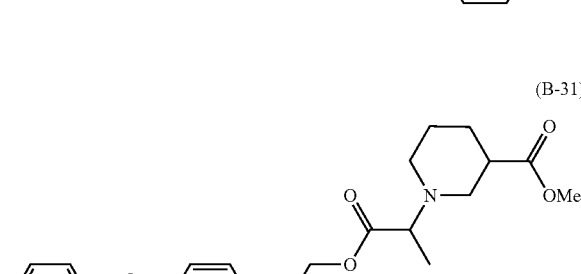

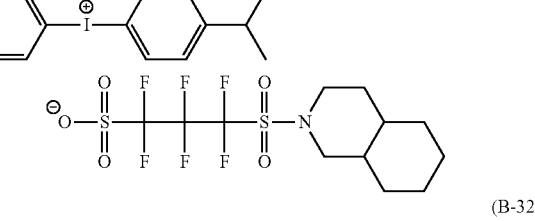

(B-33)
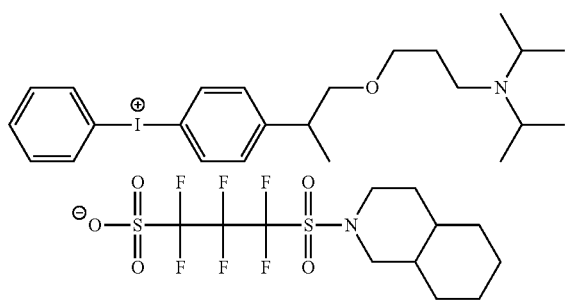

(B-34)
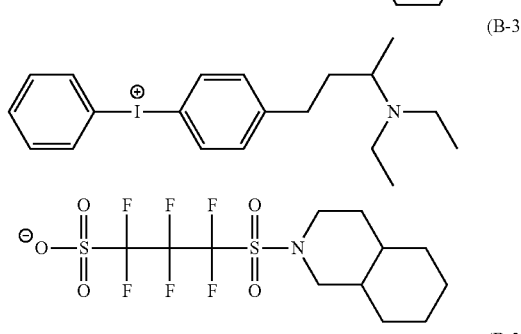

(B-35)
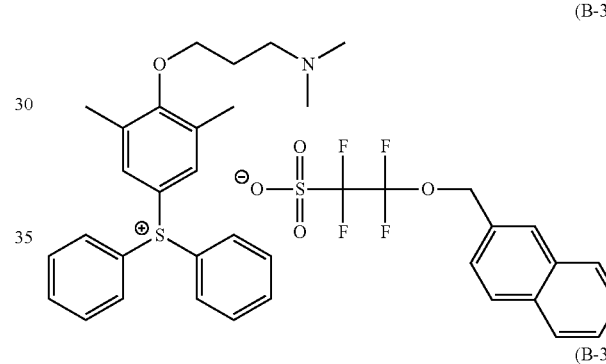

(B-36)
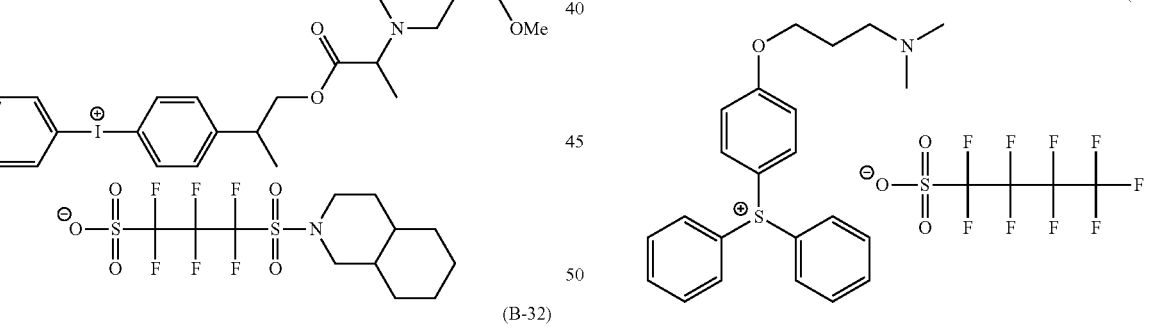

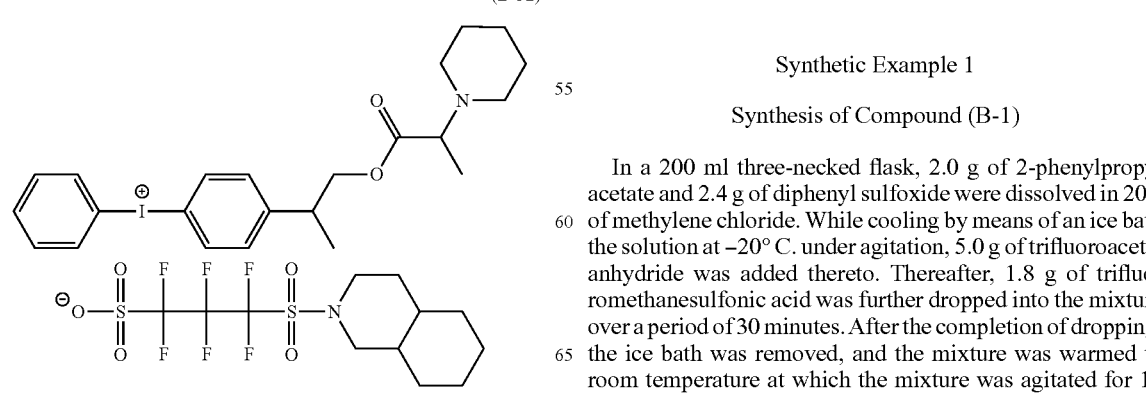

Synthetic Example 1

Synthesis of Compound (B-1)

In a 200 ml three-necked flask, 2.0 g of 2-phenylpropyl acetate and 2.4 g of diphenyl sulfoxide were dissolved in 20 g of methylene chloride. While cooling by means of an ice bath the solution at −20° C. under agitation, 5.0 g of trifluoroacetic anhydride was added thereto. Thereafter, 1.8 g of trifluoromethanesulfonic acid was further dropped into the mixture over a period of 30 minutes. After the completion of dropping, the ice bath was removed, and the mixture was warmed to room temperature at which the mixture was agitated for 12 hours. The resultant reaction liquid was dropped into a 1/1 mixture of cyclopentyl methyl ether and hexane, thereby obtaining a brown liquid compound (B-1-1) as a precipitate. The precipitate was added to 80 g of solvent comprised of a 1/1 mixture of methanol and H₂O and agitated while cooling the same by means of an ice bath. Further, 3.0 g of aqueous sodium hydroxide solution was added thereto. Thereafter, the ice bath was removed, and the mixture was warmed to room temperature at which the mixture was agitated for 2 hours. The resultant mixture was neutralized with hydrochloric acid, and 100 g of chloroform was added thereto. The thus obtained organic phase was sequentially washed with a saturated aqueous sodium bicarbonate solution and water. The solvent was removed, thereby obtaining 3.7 g of brown liquid compound (B-1-1) shown below.

In a 200 ml three-necked flask, 3.7 g of obtained compound (B-1-1) was dissolved in a mixed solvent comprised of 1.5 g of pyridine and 25 g of THF. While cooling the solution by means of an ice bath under agitation, 3.8 g of bromoacetyl bromide was dropped thereinto over a period of 30 minutes. After the completion of dropping, the ice bath was removed, and the mixture was warmed to room temperature at which the mixture was agitated for an hour. Thereafter, 100 g of chloroform was added to the mixture, and the resultant organic phase was sequentially washed with water, a saturated aqueous sodium bicarbonate solution and water. The solvent was removed, thereby obtaining a brown liquid compound (B-1-2) shown below.

In a 200 ml three-necked flask, the compound (B-1-2), 3.3 g of amine (B-1-4) shown below and 3.2 g of potassium carbonate were dissolved in 25 g of acetonitrile. The solution was agitated at room temperature for 5 hours. Thereafter, 100 g of chloroform was added to the solution, and the resultant organic phase was sequentially washed with water, a saturated aqueous sodium bicarbonate solution and water. The solvent was removed, thereby obtaining a brown liquid compound (B-1-3) shown below.

Compound (B-1-3) was dissolved in 50 g of water, and 3.6 g of compound (B-1-5) shown below was added to the aqueous solution. The mixture was agitated for 30 minutes, and 100 g of chloroform was added to the mixture. The resultant organic phase was washed with water. Thus, 3.5 g of brown liquid compound (B-1) shown below was obtained.

¹H-NMR (300 MHz, CDCl₃): 7.80-7.62 (m, 12H), 7.57 (d, 2H), 4.20 (m, 2H), 4.13 (q, 2H), 3.95 (d, 1H), 3.76 (d, 1H), 3.41 (d, 4H), 3.23 (m, 1H), 3.03 (t, 1H), 2.68 (m, 2H), 1.78-1.40 (m, 7H), 1.39-1.14 (m, 12H), 1.14-0.80 (m, 10H)

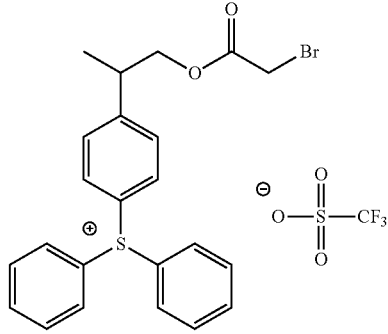
(B-1-2)

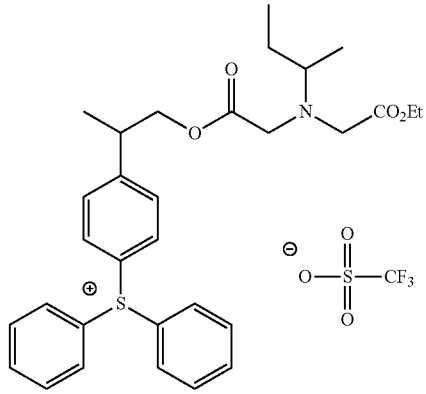
(B-1-3)

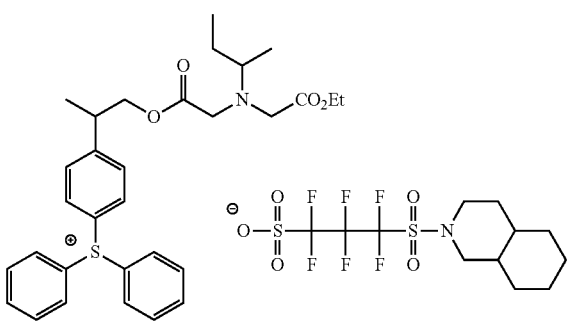
(B-1)

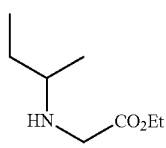
(B-1-4)

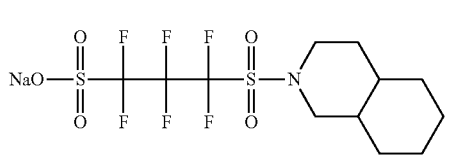
(B-1-5)

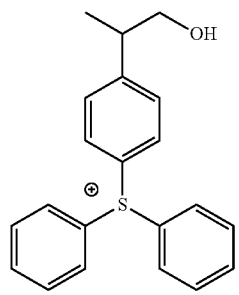
(B-1-1)

Synthetic Example 2

Synthesis of Compound (B-17)

In a 200 ml three-necked flask, 2.4 g of 3-phenyl-1-methylpropylamine and 2.4 g of diphenyl sulfoxide were dissolved in 25 g of methylene chloride. While cooling by means of an ice bath the solution at −20° C. under agitation, 3.6 g of trifluoromethanesulfonic acid was added thereto. Thereafter, 5.0 g of trifluoroacetic anhydride was further dropped into the mixture over a period of 30 minutes. After the completion of dropping, the ice bath was removed, and the mixture was warmed to room temperature at which the mixture was agitated for 12 hours. The resultant reaction liquid was dropped into a 1/1 mixture of cyclopentyl methyl ether and hexane, thereby obtaining a brown liquid compound (B-17-1) as a precipitate. The precipitate was added to 80 g of solvent comprised of a 1/1 mixture of methanol and $H_2O$ and agitated while cooling the same by means of an ice bath. Further, 4.5 g of aqueous sodium hydroxide solution was added thereto. Thereafter, the ice bath was removed, and the mixture was warmed to room temperature at which the mixture was agitated for 2 hours. The resultant mixture was neutralized with hydrochloric acid, and 100 g of chloroform was added thereto. The thus obtained organic phase was sequentially washed with a saturated aqueous sodium bicarbonate solution and water. The solvent was removed, thereby obtaining 4.2 g of brown liquid compound (B-17-1) shown below.

In a 200 ml three-necked flask, 4.2 g of obtained compound (B-17-1) was dissolved in 40 g of acetonitrile. Subsequently, 3.6 g of potassium carbonate was added to the solution. While cooling the mixture by means of an ice bath, 3.2 g of ethyl bromoacetate was dropped thereinto over a period of 30 minutes, and further agitated for 30 minutes. The ice bath was removed, and the mixture was warmed to room temperature at which the mixture was agitated for 5 hours. Thereafter, 100 g of chloroform was added to the mixture, and the resultant organic phase was washed with water. The solvent was removed, thereby obtaining a brown liquid compound (B-17-2) shown below.

Obtained compound (B-17-2) was dissolved in 50 g of water, and 3.9 g of compound (B-1-5) mentioned above was added to the aqueous solution. The mixture was agitated for 30 minutes, and 100 g of chloroform was added to the mixture. The resultant organic phase was washed with water. Thus, 3.0 g of brown liquid compound (B-17) shown below was obtained.

$^1$H-NMR (300 MHz, $CDCl_3$): 7.78-7.67 (m, 10H), 7.61 (d, 2H), 7.54 (d, 2H), 4.15 (q, 4H), 3.95 (d, 1H), 3.76 (d, 1H), 3.47 (s, 4H), 3.08-2.73 (m, 4H), 2.65 (t, 1H), 1.78-1.50 (m, 8H), 1.42-1.18 (m, 10H), 1.15-0.82 (m, 5H)

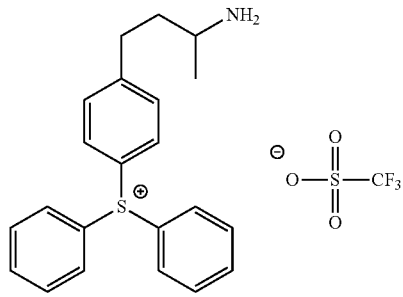
(B-17-1)

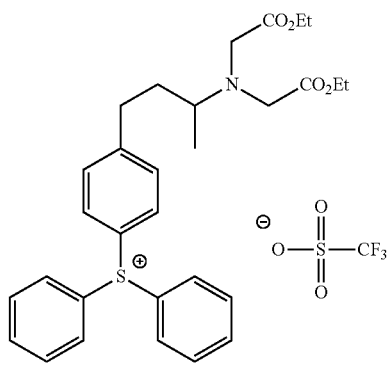
(B-17-2)

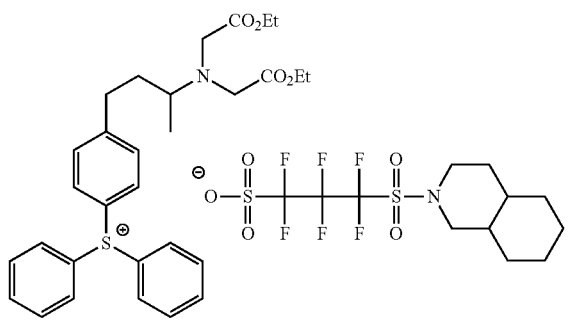
(B-17-3)

Other compounds (B) were synthesized in the same manner as described above for the compounds (B-1) and (B-17).

<Acid Generator (2)>

The following compounds (C-1) to (C-10) were provided as compounds (C).

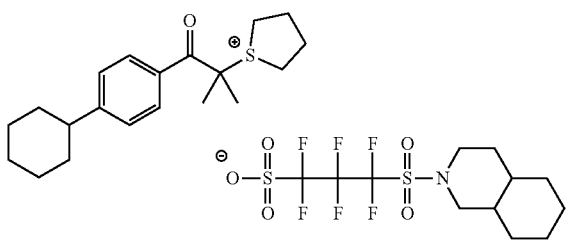
(C-1)

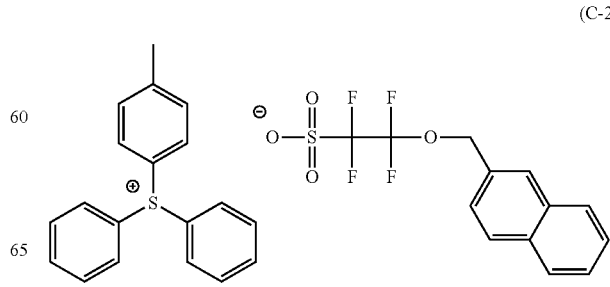
(C-2)

(C-3)
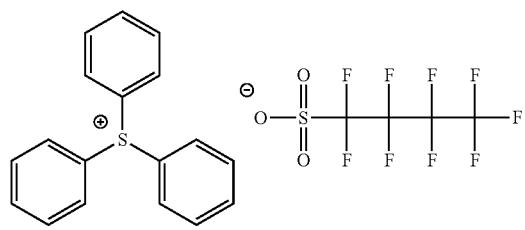
(C-4)
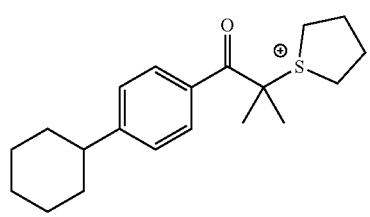
(C-5)
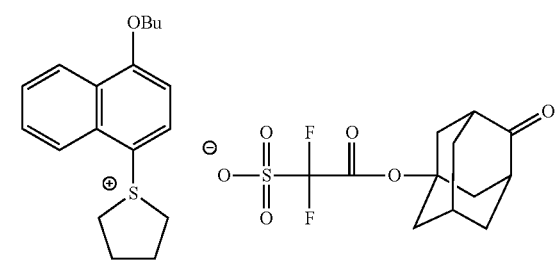
(C-6)
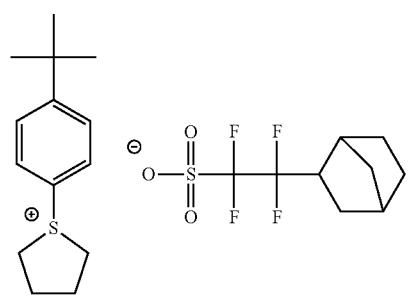
(C-7)
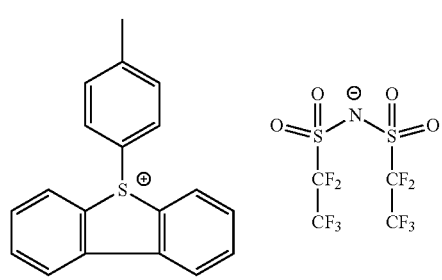
(C-8)
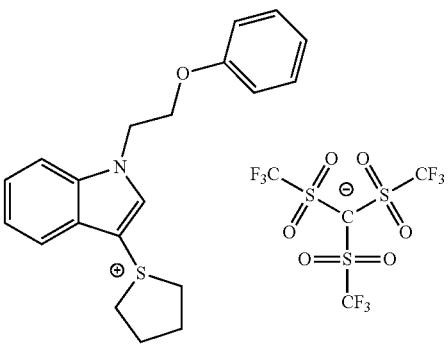
(C-9)
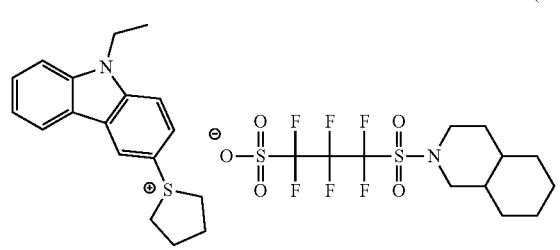
(C-10)
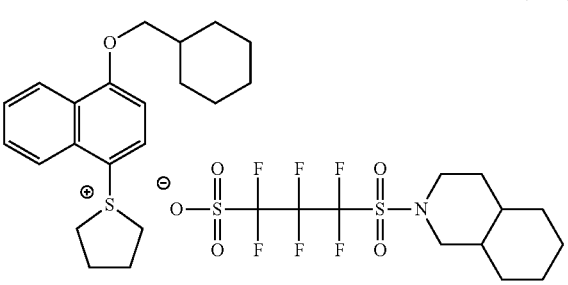
<Resin (A)>
The following resins (A-1) to (A-11) were provided as resins (A).
(A-1)
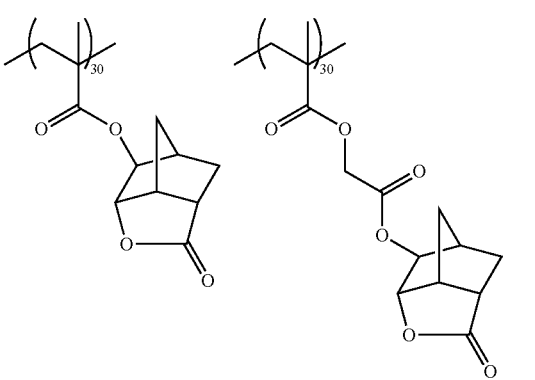

-continued
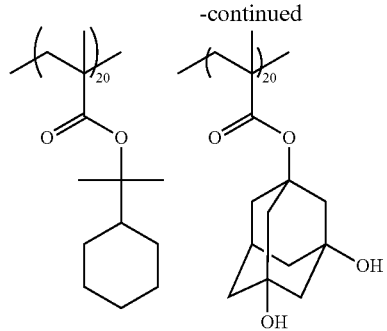
Mw = 12000
Mw/Mn = 1.81
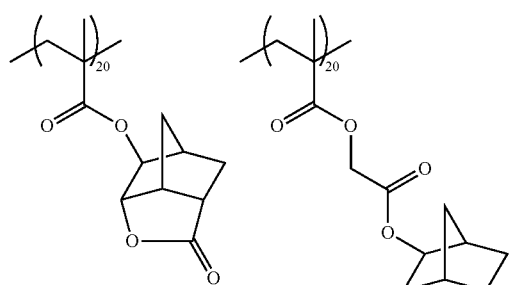
(A-2)
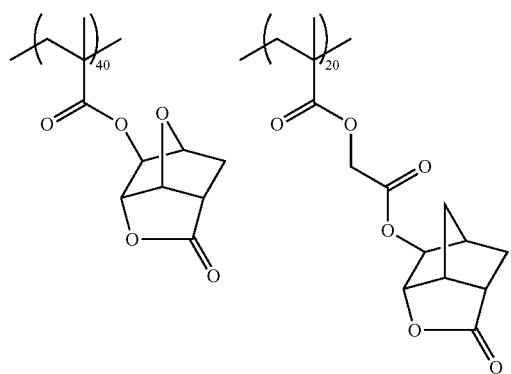
Mw = 7400
Mw/Mn = 1.99
(A-3)
-continued
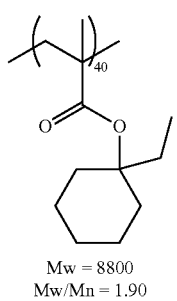
Mw = 8800
Mw/Mn = 1.90
(A-4)
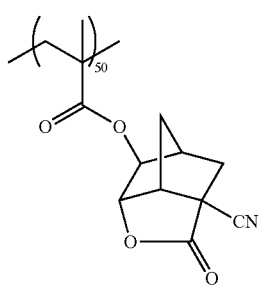
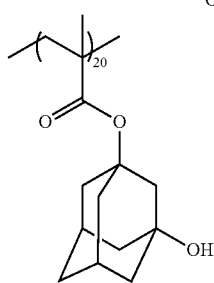
Mw = 8200
Mw/Mn = 1.93
(A-5)
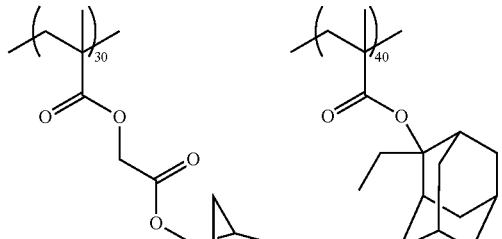
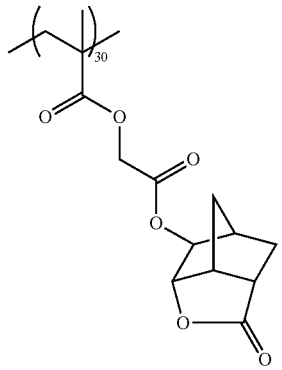
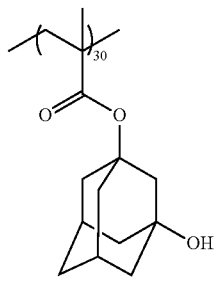
Mw = 7300
Mw/Mn = 1.60

(A-6)
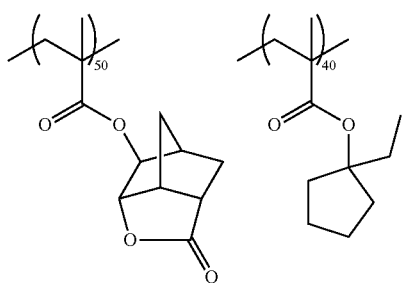
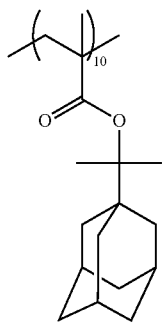
Mw = 8900
Mw/Mn = 1.66
(A-7)
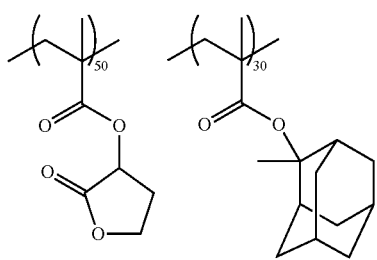
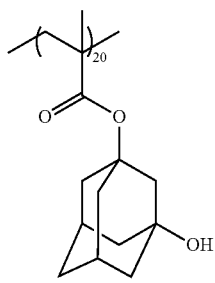
Mw = 9700
Mw/Mn = 2.02
(A-8)
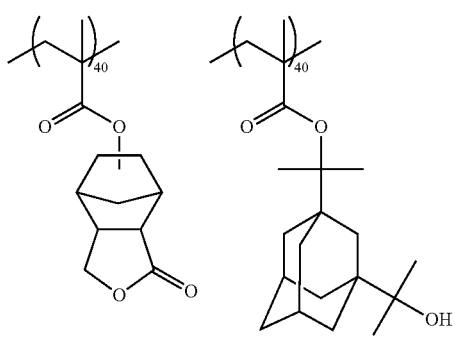
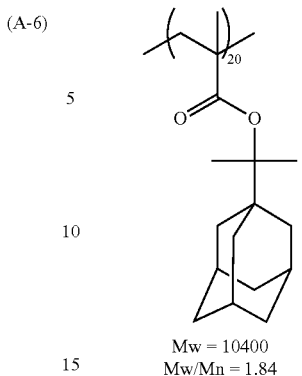
Mw = 10400
Mw/Mn = 1.84
(A-9)
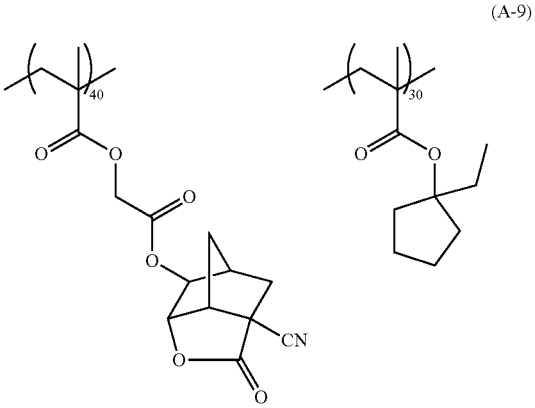
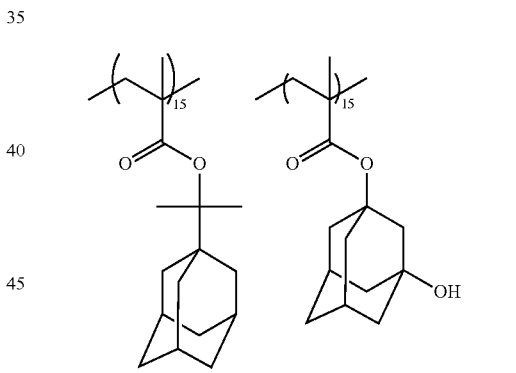
Mw = 9500
Mw/Mn = 1.70
(A-10)
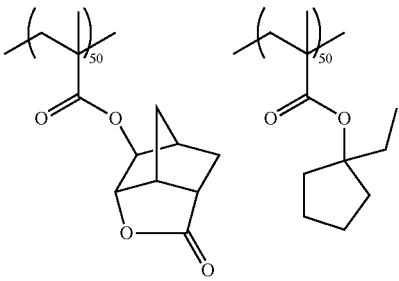
Mw = 8400
Mw/Mn = 1.52

(A-11)
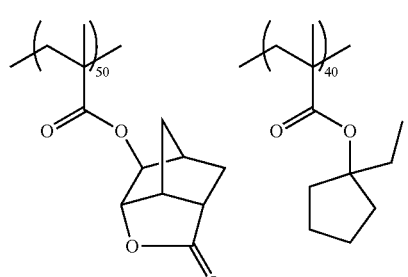
Mw = 8100
Mw/Mn = 1.62
<Hydrophobic Resin>
The following resins (D-1) to (D-8) were provided as hydrophobic resins (D).
(D-1)
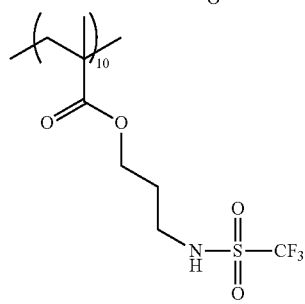
Mw = 8200
Mw/Mn = 1.31
(D-2)
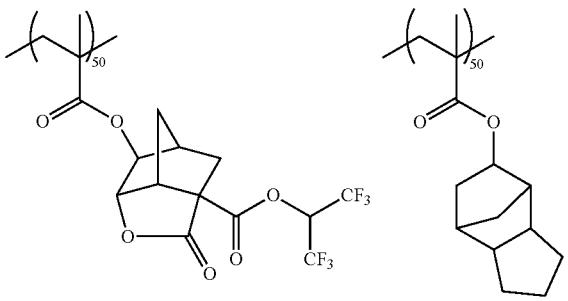
Mw = 9000
Mw/Mn = 1.72
(D-3)
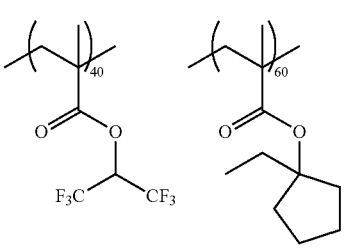
Mw = 7900
Mw/Mn = 1.80
(D-4)
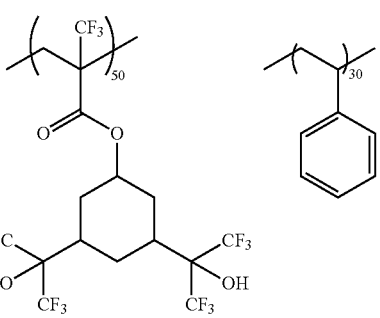
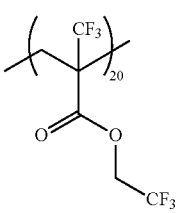
Mw = 10500
Mw/Mn = 1.73
(D-5)
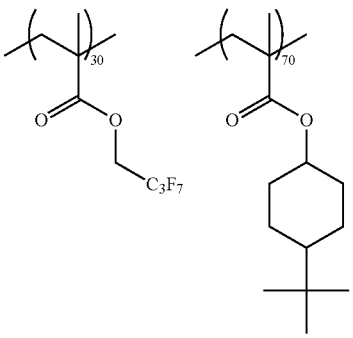
Mw = 8900
Mw/Mn = 1.61
(D-6)
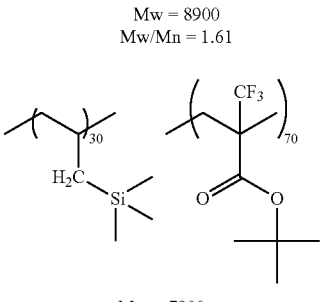
Mw = 7900
Mw/Mn = 1.62

-continued

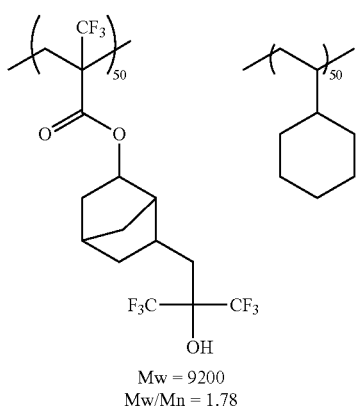

Mw = 9200
Mw/Mn = 1.78

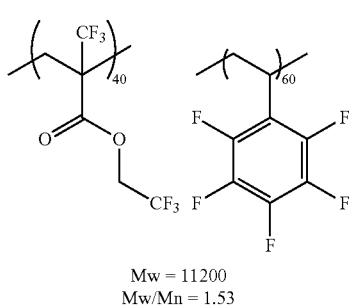

Mw = 11200
Mw/Mn = 1.53

<Basic Compound (F) or Low-Molecular Weight Compound (G)>

The following compounds (F-1) to (F-6) were provided as basic compounds (F) or low-molecular weight compounds (G).

(F-1)

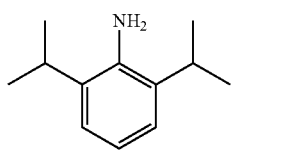

(F-2)

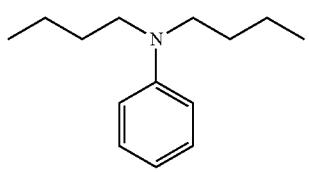

(F-3)

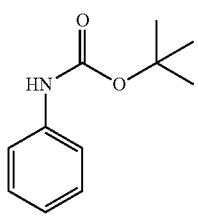

(F-4)

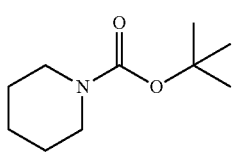

(F-5)

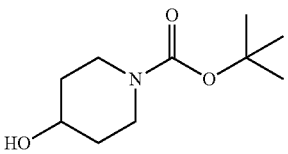

(F-6)

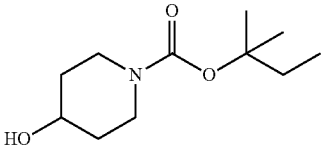

<Solvent>

The following solvents S-1 to S-3 were provided. S-1: propylene glycol monomethyl ether acetate, S-2: propylene glycol monomethyl ether, and S-3: γ-butyrolactone.

<Surfactant>

The following surfactants W-1 to W-5 were provided.

W-1: Megafac F176 (produced by Dainippon Ink & Chemicals, Inc.),

W-2: Megafac $R_{08}$ (produced by Dainippon Ink & Chemicals, Inc.),

W-3: polysiloxane polymer KP-341 (produced by Shin-Etsu Chemical Co., Ltd.),

W-4: Troy Sol S-366 (produced by Troy Chemical Co., Ltd.), and

W-5: PF6320 (produced by OMNOVA SOLUTIONS, INC.).

<Preparation of Resist Composition>

Components of Table 2 below were dissolved in mixed solvents of the same table, thereby obtaining solutions with a solid content of 4.4 mass %. The solutions were each passed through a polyethylene filter of 0.03 μm pore size, thereby obtaining positive resist solutions.

<Exposure Condition (1): ArF Liquid-Immersion Evaluation>

An organic anti-reflection film ARC29SR (produced by Nissan Chemical Industries, Ltd.) was applied onto a silicon wafer and baked at 205° C. for 60 seconds, thereby forming a 78 nm-thick anti-reflection film. Each of the prepared actinic-ray- or radiation-sensitive resin compositions was applied thereonto and baked at 130° C. for 60 seconds, thereby forming a 110 nm-thick resist film. The resultant wafer was exposed through a 6% half-tone mask of 1:1 line and space pattern of 45 nm line width to light by means of an ArF excimer laser liquid-immersion scanner (manufactured by ASML, XT1700i, NA 1.35). Pure water was used as an immersion liquid.

Thereafter, the exposed wafer was baked at 90° C. for 60 seconds, developed with an aqueous solution of tetramethylammonium hydroxide (2.38 mass %) for 30 seconds, rinsed with pure water and spin dried, thereby obtaining a resist pattern.

<Exposure condition (2): ArF dry evaluation>

An organic antireflection film ARC29A (produced by Nissan Chemical Industries, Ltd.) was applied onto a silicon wafer and baked at 205° C. for 60 seconds, thereby forming a 78 nm-thick antireflection film. Each of the prepared actinic-ray- or radiation-sensitive resin compositions was applied thereonto and baked at 130° C. for 60 seconds, thereby forming a 120 nm-thick resist film. The resultant wafer was exposed through a 6% half-tone mask of 1:1 line and space pattern of 75 nm line width to light by means of an ArF excimer laser scanner (manufactured by ASML, PAS5500/1100, NA 0.75).

Thereafter, the exposed wafer was baked at 90° C. for 60 seconds, developed with an aqueous solution of tetramethylammonium hydroxide (2.38 mass %) for 30 seconds, rinsed with pure water and spin dried, thereby obtaining a pattern.

<Evaluation of Resist>

[LWR: Exposure Condition (1)]

Each line pattern finished into a line width of 45 nm was observed by means of a scanning electron microscope (model S9260 manufactured by Hitachi, Ltd.). In a 2 μm-long edge region along the longitudinal direction of the line pattern, the distances of actual edge from a reference line on which edge were to be present were measured at 50 points. The standard deviation of measurements was determined, and 3σ was calculated therefrom. The smaller the value thereof, the more favorable the performance exhibited.

[LWR: exposure condition (2)]

Each line pattern finished into a line width of 75 nm was observed by means of a scanning electron microscope (model S9260 manufactured by Hitachi, Ltd.). In a 2 μm-long edge region along the longitudinal direction of the line pattern, the distances of actual edge from a reference line on which edge were to be present were measured at 50 points. The standard deviation of measurements was determined, and 3σ was calculated therefrom. The smaller the value thereof, the more favorable the performance exhibited.

[Temporal Stability of Line Width: Exposure Condition (1)]

The line widths from the resists respectively aged at 40° C., 50° C. and 60° C. for 30 days were compared with that from the resist (reference resist) aged at 0° C. for 30 days, and the stability was evaluated by any line width differences therebetween.

Specifically, first, with respect to the resist aged at 0° C. for 30 days, the exposure amount ($E_1$) that reproduced a mask pattern of 45 nm line width (line/space:1/1) was determined. Subsequently, $E_1$ exposure was performed on each of three types of resist films aged at raised temperatures for 30 days. The line widths of thus obtained patterns were measured by means of a scanning electron microscope (model S-9260 manufactured by Hitachi, Ltd.), and pattern width variations from the line width (45 nm) obtained from the reference resist were calculated.

On the basis of thus obtained 3-point data, plotting was performed on a semilogarithmic graph wherein the X-axis indicated the reciprocal of aging temperature (Celsius converted to Kelvin) while the Y-axis indicated the reciprocal of line width variation per day (namely, quotient of the determined line width variation divided by 30), and a collinear approximation was applied. On the thus obtained line, the Y-coordinate value at the X-coordinate corresponding to the aging temperature 25° C. was read. The thus read Y-coordinate value was denoted as the 1 nm-line-width guaranteed days in room temperature condition (25° C.) [Temporal Stability of Contact Angle: Exposure Condition (1)]

The 1°-contact-angle guaranteed days (reciprocal of dynamic receding contact angle variation per day) in room temperature condition (25° C.) was determined by evaluating and plotting the contact angle variation over time in the same manner as described above with respect to [Temporal stability of line width: exposure condition (1)]. In the measurement of contact angle, the dynamic receding contact angle before exposure with respect to pure water was measured by means of a fully automated contact angle meter (DropMaster 700 manufactured by Kyowa Interface Science Co., Ltd.).

[Temporal Stability of Line Width: Exposure Condition (2)]

The line widths from the resists respectively aged at 40° C., 50° C. and 60° C. for 30 days were compared with that from the resist (reference resist) aged at 0° C. for 30 days, and the stability was evaluated by any line width differences therebetween.

Specifically, first, with respect to the resist aged at 0° C. for 30 days, the exposure amount ($E_1$) that reproduced a mask pattern of 75 nm line width (line/space: 1/1) was determined. Subsequently, $E_1$ exposure was performed on each of three types of resist films aged at raised temperatures for 30 days. The line widths of thus obtained patterns were measured by means of a scanning electron microscope (model S-9260 manufactured by Hitachi, Ltd.), and pattern width variations from the line width (75 nm) obtained from the reference resist were calculated.

On the basis of thus obtained 3-point data, plotting was performed on a semilogarithmic graph wherein the X-axis indicated the reciprocal of aging temperature (Celsius converted to Kelvin) while the Y-axis indicated the reciprocal of line width variation per day (namely, quotient of the determined line width variation divided by 30), and a collinear approximation was applied. On the thus obtained line, the Y-coordinate value at the X-coordinate corresponding to the aging temperature 25° C. was read. The thus read Y-coordinate value was denoted as the 1 nm-line-width guaranteed days in room temperature condition (25° C.)

The thus obtained evaluation results are given in Table 2 below. In Table 2, the column "conjugate acid pKa" lists the pKa values of conjugate acids of compounds represented by the general formula (1-1P).

TABLE 2-1

|  | Resin (10 g) | Acid-generator (B component) | (g) | Conjugate acid pKa | Acid-generator (C component) | (g) | Hydrophobic resin (D component) | (g) |
| --- | --- | --- | --- | --- | --- | --- | --- | --- |
| Examples |  |  |  |  |  |  |  |  |
| 1 | A-2 | B-1 | 0.3 | 4.8 | C-1 | 0.9 | D-2 | 1.5 |
| 2 | A-2 | B-1 | 0.3 | 4.8 | C-10 | 0.9 | D-2 | 1.5 |
| 3 | A-10 | B-1/B-9 | 0.15/0.15 | 4.8/4.9 | C-1 | 0.9 | D-1/D-4 | 1.0/0.5 |
| 4 | A-11 | B-2 | 0.3 | 5.0 | C-1/C-3 | 0.6/0.15 | D-1 | 1.5 |
| 5 | A-3 | B-3 | 0.25 | 4.0 | C-1 | 0.9 | D-2 | 1.5 |
| 6 | A-9 | B-4 | 0.25 | 4.9 | C-4 | 0.9 | D-3 | 1.5 |
| 7 | A-5 | B-5 | 0.3 | 4.8 | C-5 | 0.9 | D-4 | 1.5 |
| 8 | A-6 | B-6 | 0.3 | 4.9 | C-5 | 0.9 | D-5 | 1.5 |
| 9 | A-7 | B-7 | 0.3 | 3.9 | C-7/C-1 | 0.3/0.4 | D-6 | 1.5 |
| 10 | A-8 | B-8 | 0.3 | 4.8 | C-8 | 0.9 | D-7 | 1.5 |
| 11 | A-9 | B-9 | 0.25 | 4.9 | C-9/C-3 | 0.4/0.2 | D-8 | 1.5 |

TABLE 2-1-continued

| | | | | | | | | | |
|---|---|---|---|---|---|---|---|---|---|
| 12 | A-10 | B-10 | 0.3 | 5.0 | C-10 | 0.9 | D-1 | 1.5 | |
| 13 | A-11 | B-11 | 0.3 | 4.0 | C-1 | 0.9 | D-1 | 1.5 | |
| 14 | A-1 | B-12 | 0.25 | 4.8 | C-1 | 0.9 | D-2 | 1.5 | |
| 15 | A-10/A-11 (5/5) | B-13 | 0.3 | 4.8 | C-3 | 0.9 | D-3 | 1.5 | |
| 16 | A-9 | B-14 | 0.3 | 4.8 | C-4 | 0.9 | D-4 | 1.5 | |
| 17 | A-4 | B-15 | 0.25 | 3.8 | C-5 | 0.9 | D-5 | 1.5 | |
| 18 | A-5 | B-16 | 0.25 | 4.8 | C-8 | 0.9 | D-6 | 1.5 | |
| 19 | A-6 | B-17 | 0.3 | 4.9 | C-6 | 0.9 | D-7 | 1.5 | |
| 20 | A-9/A-10 (5/5) | B-18 | 0.3 | 4.6 | C-8 | 0.9 | D-8 | 1.5 | |
| 21 | A-10 | B-19 | 0.3 | 4.5 | C-4 | 0.9 | D-2 | 1.5 | |
| 22 | A-11 | B-20 | 0.25 | 4.5 | C-4 | 0.9 | D-3 | 1.5 | |
| 23 | A-1 | B-21 | 0.25 | 4.5 | C-4 | 0.9 | D-4 | 1.5 | |
| 24 | A-4 | B-22 | 0.3 | 5.6 | C-5 | 1.0 | D-2 | 1.5 | |
| 25 | A-1 | B-23 | 0.3 | −1.8 | C-1 | 0.9 | D-1 | 1.5 | |
| 26 | A-1 | B-24 | 0.3 | 0.2 | C-1 | 0.9 | D-1 | 1.5 | |
| 27 | A-1 | B-25 | 0.3 | 2.2 | C-1 | 0.9 | D-2 | 1.5 | |
| 28 | A-1 | B-26 | 0.3 | 2.7 | C-1 | 0.9 | D-3 | 1.5 | |
| 29 | A-1 | B-27 | 0.3 | 3.1 | C-1 | 0.9 | D-1 | 1.5 | |
| 30 | A-1 | B-28 | 0.3 | 4.0 | C-1 | 0.9 | D-1 | 1.5 | |
| 31 | A-1 | B-29 | 0.3 | 4.8 | C-1 | 0.9 | D-2 | 1.5 | |
| 32 | A-1 | B-30 | 0.3 | 5.6 | C-1 | 0.9 | D-3 | 1.5 | |
| 33 | A-1 | B-31 | 0.3 | 6.2 | C-1 | 0.9 | D-2 | 1.5 | |
| 34 | A-1 | B-32 | 0.3 | 7.4 | C-1 | 0.9 | D-3 | 1.5 | |
| 35 | A-1 | B-33 | 0.3 | 9.6 | C-1 | 0.9 | D-2 | 1.5 | |
| 36 | A-1 | B-34 | 0.3 | 10.5 | C-1 | 0.9 | D-3 | 1.5 | |
| 37 | A-4 | B-34 | 0.3 | 10.5 | C-2 | 0.5 | D-6 | 1.5 | |
| 38 | A-4 | B-34 | 0.3 | 10.5 | C-3 | 0.5 | D-6 | 1.5 | |
| Comparative Examples | | | | | | | | | |
| 1 | A-2 | B-35 | 0.3 | 9.4 | C-1 | 0.9 | D-6 | 1.5 | |
| 2 | A-2 | B-36 | 0.3 | 9.4 | C-10 | 0.9 | D-6 | 1.5 | |
| 3 | A-4 | B-35 | 0.3 | 9.4 | C-2 | 0.5 | D-6 | 1.5 | |
| 4 | A-4 | B-36 | 0.3 | 9.4 | C-3 | 0.5 | D-6 | 1.5 | |

| Examples | Basic compound or compound (G) | (g) | Surfactant (0.03 g) | Solvent | (Mass ratio) | Exposure conditions | Days under temporal stability of line width (days) | Days under temporal stability of contact angle (days) | LWR (nm) |
|---|---|---|---|---|---|---|---|---|---|
| 1 | — | | W-1 | S-1/S-2 | (70/30) | (1) | 770 | 980 | 3.1 |
| 2 | — | | W-1 | S-1/S-2 | (70/30) | (1) | 755 | 950 | 3.1 |
| 3 | — | | W-1 | S-1/S-2/S-5 | (70/25/5) | (1) | 740 | 900 | 3.2 |
| 4 | — | | W-2 | S-2/S-3 | (60/40) | (1) | 620 | 920 | 3.5 |
| 5 | F-5 | 0.01 | W-3 | S-2/S-3 | (70/30) | (1) | 590 | 920 | 3.8 |
| 6 | F-4 | 0.01 | W-4 | S-1/S-4 | (95/5) | (1) | 610 | 920 | 3.6 |
| 7 | — | | W-5 | S-1/S-5 | (95/5) | (1) | 630 | 910 | 3.5 |
| 8 | F-3 | 0.005 | W-1 | S-1/S-2/S-4 | (60/35/5) | (1) | 660 | 920 | 3.6 |
| 9 | — | | W-2 | S-1/S-3 | (55/45) | (1) | 610 | 940 | 3.5 |
| 10 | — | | W-3 | S-1/S-3 | (60/40) | (1) | 620 | 890 | 3.7 |
| 11 | F-1 | 0.02 | W-4 | S-1/S-3 | (80/20) | (1) | 590 | 930 | 3.4 |
| 12 | — | | W-5 | S-1/S-2 | (70/30) | (1) | 610 | 920 | 3.2 |
| 13 | — | | W-1 | S-2/S-3 | (70/30) | (1) | 630 | 950 | 3.6 |
| 14 | F-4/F-6 | 0.01/0.005 | W-2 | S-2/S-3 | (60/40) | (1) | 660 | 920 | 3.6 |
| 15 | — | | W-3 | S-1/S-2/S-5 | (60/35/5) | (1) | 610 | 930 | 3.4 |
| 16 | — | | W-4 | S-1/S-2 | (60/40) | (1) | 650 | 910 | 3.2 |
| 17 | F-5 | 0.02 | W-5 | S-1/S-2 | (55/45) | (1) | 700 | 920 | 3.6 |
| 18 | F-4 | 0.01 | W-1 | S-1/S-3 | (60/40) | (1) | 690 | 920 | 3.5 |
| 19 | — | | W-2 | S-1/S-4 | (95/5) | (1) | 675 | 930 | 3.6 |
| 20 | F-6/F-5 | 0.01/0.01 | W-3 | S-1/S-5 | (95/5) | (1) | 650 | 940 | 3.6 |
| 21 | — | | W-1 | S-1/S-3 | (55/45) | (1) | 700 | 920 | 3.6 |
| 22 | F-5 | 0.02 | W-2 | S-1/S-3 | (75/25) | (1) | 690 | 960 | 3.5 |
| 23 | F-4 | 0.01 | W-3 | S-1/S-2 | (75/25) | (1) | 675 | 920 | 3.7 |
| 24 | — | | W-5 | S-1/S-3 | (70/30) | (1) | 500 | 890 | 4.0 |
| 25 | — | | W-1 | S-1/S-2 | (70/30) | (1) | 590 | 940 | 6.0 |
| 26 | — | | W-2 | S-1/S-3 | (70/30) | (1) | 570 | 940 | 5.2 |
| 27 | — | | W-1 | S-1/S-2 | (70/30) | (1) | 520 | 900 | 4.7 |
| 28 | — | | W-1 | S-1/S-2 | (70/30) | (1) | 530 | 970 | 4.2 |
| 29 | — | | W-1 | S-1/S-2 | (70/30) | (1) | 540 | 880 | 4.0 |
| 30 | — | | W-1 | S-1/S-2 | (70/30) | (1) | 550 | 950 | 4.2 |
| 31 | — | | W-1 | S-1/S-2 | (70/30) | (1) | 520 | 900 | 4.3 |
| 32 | — | | W-1 | S-1/S-2 | (70/30) | (1) | 520 | 920 | 4.1 |
| 33 | — | | W-1 | S-1/S-2 | (70/30) | (1) | 500 | 950 | 4.1 |
| 34 | — | | W-1 | S-1/S-2 | (70/30) | (1) | 480 | 820 | 4.2 |
| 35 | — | | W-1 | S-1/S-2 | (70/30) | (1) | 390 | 710 | 4.1 |
| 36 | — | | W-1 | S-1/S-2 | (70/30) | (1) | 340 | 520 | 4.3 |
| 37 | — | | W-2 | S-1/S-3 | (60/40) | (1) | 530 | 320 | 5.1 |
| 38 | — | | W-2 | S-1/S-3 | (60/40) | (1) | 530 | 300 | 5.0 |

TABLE 2-1-continued

| Comparative Examples | Basic compound or compound (G) | (g) | Surfactant (0.03 g) | Solvent | (Mass ratio) | Exposure conditions | Days during which line width is stable with time (day) | Days during which contact angle is stable with time (day) | LWR (nm) |
|---|---|---|---|---|---|---|---|---|---|
| 1 | — | | W-2 | S-2/S-3 | (60/40) | (1) | 15 | 30 | 5.5 |
| 2 | — | | W-3 | S-2/S-3 | (60/40) | (1) | 15 | 30 | 5.5 |
| 3 | — | | W-4 | S-2/S-4 | (60/40) | (1) | 200 | 25 | 6.4 |
| 4 | — | | W-3 | S-2/S-3 | (60/40) | (1) | 230 | 30 | 6.5 |

TABLE 2-2

| | Resin (10 g) | Acid-generator (B component) | (g) | Conjugate acid pKa | Acid-generator (C component) | (g) | Basic compound or compound (G) | (g) |
|---|---|---|---|---|---|---|---|---|
| Examples | | | | | | | | |
| 1 | A-2 | B-1 | 0.3 | 4.8 | C-1 | 0.9 | — | |
| 2 | A-3 | B-1 | 0.3 | 4.8 | C-10 | 0.5 | — | |
| 3 | A-10 | B-2 | 0.3 | 4.9 | C-7 | 0.9 | F-6/F-5 | 0.01/0.01 |
| 4 | A-9/A-10 (5/5) | B-3 | 0.3 | 4.5 | C-10 | 0.9 | — | |
| 5 | A-4 | B-4 | 0.3 | 5.6 | C-10/C-3 | 0.6/0.1 | F-5 | 0.01 |
| 6 | A-9 | B-5 | 0.3 | 4.8 | C-1 | 0.9 | — | |
| 7 | A-5 | B-6/B-7 | 0.15/0.15 | 4.9/3.9 | C-9/C-3 | 0.4/0.2 | — | |
| 8 | A-1 | B-23 | 0.3 | −1.8 | C-1 | 0.9 | — | |
| 9 | A-1 | B-24 | 0.3 | 0.2 | C-1 | 0.9 | — | |
| 10 | A-1 | B-25 | 0.3 | 2.2 | C-1 | 0.9 | — | |
| 11 | A-1 | B-26 | 0.3 | 2.7 | C-1 | 0.9 | — | |
| 12 | A-1 | B-27 | 0.3 | 3.1 | C-1 | 0.9 | — | |
| 13 | A-1 | B-28 | 0.3 | 4.0 | C-1 | 0.9 | — | |
| 14 | A-1 | B-29 | 0.3 | 4.8 | C-1 | 0.9 | — | |
| 15 | A-1 | B-30 | 0.3 | 5.6 | C-1 | 0.9 | — | |
| 16 | A-1 | B-31 | 0.3 | 6.2 | C-1 | 0.9 | — | |
| 17 | A-1 | B-32 | 0.3 | 7.4 | C-1 | 0.9 | — | |
| 18 | A-1 | B-33 | 0.3 | 9.6 | C-1 | 0.9 | — | |
| 19 | A-1 | B-34 | 0.3 | 10.5 | C-1 | 0.9 | — | |
| 20 | A-4 | B-34 | 0.3 | 9.4 | C-2 | 0.5 | — | |
| 21 | A-5 | B-34 | 0.3 | 9.4 | C-3 | 0.5 | — | |
| Comparative Examples | | | | | | | | |
| 1 | A-2 | B-35 | 0.3 | 9.4 | C-1 | 0.9 | — | |
| 2 | A-3 | B-36 | 0.3 | 9.4 | C-10 | 0.9 | — | |
| 3 | A-4 | B-35 | 0.3 | 9.4 | C-2 | 0.5 | — | |
| 4 | A-5 | B-36 | 0.3 | 9.4 | C-3 | 0.5 | — | |

| Examples | Surfactant (0.03 g) | Solvent | (Mass ratio) | Exposure conditions | Days under temporal stability of line width (days) | LWR (nm) |
|---|---|---|---|---|---|---|
| 1 | W-1 | S-1/S-2 | (70/30) | (2) | 670 | 5.3 |
| 2 | W-2 | S-1/S-3 | (70/30) | (2) | 660 | 5.4 |
| 3 | W-2 | S-1/S-2 | (70/30) | (2) | 640 | 5.6 |
| 4 | W-3 | S-2/S-3 | (70/30) | (2) | 610 | 5.6 |
| 5 | W-4 | S-2/S-3 | (60/40) | (2) | 620 | 5.7 |
| 6 | W-3 | S-1/S-2/S-5 | (60/35/5) | (2) | 620 | 5.5 |
| 7 | W-4 | S-1/S-5 | (95/5) | (2) | 610 | 5.6 |
| 8 | W-5 | S-1/S-2 | (70/30) | (2) | 610 | 7.9 |
| 9 | W-1 | S-2/S-3 | (70/30) | (2) | 590 | 7.2 |
| 10 | W-2 | S-2/S-3 | (60/40) | (2) | 530 | 6.7 |
| 11 | W-3 | S-1/S-2 | (60/40) | (2) | 550 | 6.2 |
| 12 | W-4 | S-1/S-2 | (60/40) | (2) | 520 | 6.3 |
| 13 | W-5 | S-1/S-2 | (55/45) | (2) | 530 | 6.1 |
| 14 | W-1 | S-1/S-3 | (60/40) | (2) | 510 | 6.5 |
| 15 | W-2 | S-1/S-3 | (80/20) | (2) | 550 | 6.1 |
| 16 | W-3 | S-1/S-2 | (70/30) | (2) | 530 | 6.1 |
| 17 | W-1 | S-1/S-3 | (55/45) | (2) | 480 | 5.9 |
| 18 | W-2 | S-1/S-3 | (75/25) | (2) | 400 | 6.0 |
| 19 | W-3 | S-1/S-2 | (75/25) | (2) | 330 | 6.0 |
| 20 | W-4 | S-2/S-4 | (60/40) | (2) | 450 | 6.7 |
| 21 | W-3 | S-2/S-3 | (60/40) | (2) | 440 | 6.8 |

TABLE 2-2-continued

| Comparative Examples | Surfactant (0.03 g) | Solvent | (Mass ratio) | Exposure conditions | Days during which line width is stable with time (day) | LWR (nm) |
| --- | --- | --- | --- | --- | --- | --- |
| 1 | W-2 | S-2/S-3 | (60/40) | (2) | 15 | 7.4 |
| 2 | W-3 | S-2/S-3 | (60/40) | (2) | 15 | 7.2 |
| 3 | W-4 | S-2/S-4 | (60/40) | (2) | 200 | 8.4 |
| 4 | W-3 | S-2/S-3 | (60/40) | (2) | 230 | 8.2 |

As apparent from Table 2, the compositions of Examples excelled the compositions of Comparative Examples in the roughness characteristics and temporal stabilities of line width and contact angle.

As apparent from the foregoing, a favorable resist pattern can be formed by using the patterning method of the present invention. Therefore, an electronic device exhibiting favorable performance can be manufactured by using this method.

What is claimed is:

1. An actinic-ray- or radiation-sensitive resin composition comprising:
    (A) a resin to be decomposed to increase its solubility in an alkali developer when acted on by an acid, and
    (B) a monovalent ionic compound represented by the general formula (1-1) below,

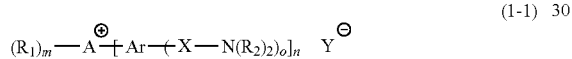

where
A represents a sulfur atom or an iodine atom,
$R_1$ each independently represents an alkyl group, an alkenyl group, a cycloaliphatic group, an aromatic hydrocarbon group or a heterocyclic hydrocarbon group; when m is 2, two R1s are both alkyl groups or both aryl groups, and two $R_1$s may be bonded to each other to form a ring,
Ar each independently represents an aromatic ring group,
X each independently represents a bivalent connecting group,
$R_2$ each independently represents a hydrogen atom, an alkyl group, an alkenyl group, a cycloaliphatic group, an aromatic hydrocarbon group or a heterocyclic hydrocarbon group,
at least two groups selected from X and two $R_2$s may be bonded to each other to form a ring, and
provided that to the nitrogen atom (N) in the general formula (1-1), at least one group is directly bonded, the group being selected from a cycloaliphatic group, an aromatic hydrocarbon group, a heterocyclic hydrocarbon group and a chain aliphatic group whose moiety adjacent to the nitrogen atom is a tertiary or quaternary carbon atom, and an electron withdrawing group selected from a carbonyl group, a sulfonyl group, a cyano group and a halogen atom is not directly bonded,
when A is a sulfur atom, n is an integer of 1 to 3, and m is an integer satisfying the relationship m+n=3,
when A is an iodine atom, n is an integer of 1 or 2, and m is an integer satisfying the relationship m+n=2,
o is an integer of 1 to 10, and
$Y^-$ represents a non-nucleophilic anion.

2. The composition according to claim 1, further comprising (C) a compound to be decomposed to generate an acid when exposed to actinic rays or radiation, the compound being other than the compounds (B).

3. The composition according to claim 2, wherein the compound (C) is represented by the general formulae (ZI-3), (ZI-4) or (ZI-5) below,

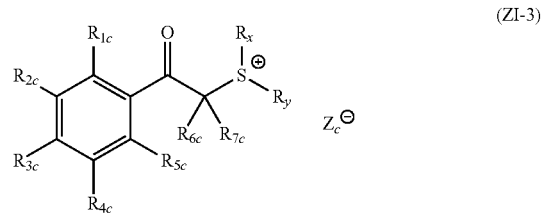

in the general formula (ZI-3),
$R_{1c}$ to $R_{5c}$ each independently represents a hydrogen atom, an alkyl group, a cycloalkyl group, an alkoxy group, an alkoxycarbonyl group, a halogen atom, a cyano group, a nitro group or a phenylthio group,
$R_{6c}$ and $R_{7c}$ each independently represents a hydrogen atom, an alkyl group, a cycloalkyl group, a halogen atom, a cyano group or an aryl group,
$R_x$ and $R_y$ each independently represents an alkyl group, a cycloalkyl group, a 2-oxoalkyl group, a 2-oxocycloalkyl group, an alkoxycarbonylalkyl group, an allyl group or a vinyl group,
provided that any two or more of $R_{1c}$ to $R_{5c}$, and $R_{6c}$ and $R_{7c}$, and $R_x$ and $R_y$ may be bonded to each other to form a ring structure, and that the ring structure may contain an oxygen atom, a sulfur atom, an ester bond or an amido bond, and
$Zc^-$ represents a non-nucleophilic anion,

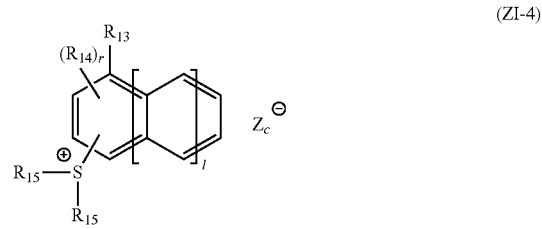

in the general formula (ZI-4),
$R_{13}$ represents a hydrogen atom, a fluorine atom, a hydroxyl group, an alkyl group, a cycloalkyl group, an alkoxy group, an alkoxycarbonyl group or a group with a mono- or polycycloalkyl skeleton,
$R_{14}$, when r≥2, each independently represents an alkyl group, a cycloalkyl group, an alkoxy group, an alkoxycarbonyl group, an alkylcarbonyl group, an alkylsulfonyl group, a cycloalkylsulfonyl group or a group with a mono- or polycycloalkyl skeleton, $R_{15}$ each independently represents an alkyl group, a cycloalkyl group or a naphthyl group, provided that two $R_{15}$s may be bonded to each other to form a ring, l represents an integer of 0 to 2, r represents an integer of 0 to 8, and $Zc^-$ represents a non-nucleophilic anion, and

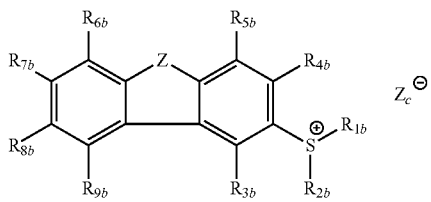

(ZI-5)

in the general formula (ZI-5),

Z represents an oxygen atom, a sulfur atom or —N($R_x$)— where $R_x$ represents a hydrogen atom, an alkyl group, a cycloalkyl group, an acyl group, an alkenyl group, an alkoxycarbonyl group, an aryl group, an arylcarbonyl group or an aryloxycarbonyl group, $R_{1b}$ and $R_{2b}$ each independently represents an alkyl group, a cycloalkyl group or an aryl group, $R_{3b}$ to $R_{9b}$ each independently represents a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group or an arylcarbonyloxy group, provided that $R_{1b}$ and $R_{2b}$ may be bonded to each other to form a ring, and that any two or more of $R_{6b}$ to $R_{9b}$, $R_{3b}$ and $R_{9b}$, $R_{4b}$ and $R_{5b}$, $R_{5b}$ and $R_x$, and $R_{6b}$ and $R_x$ may be bonded to each other to form a ring, and $Zc^-$ represents a non-nucleophilic anion.

4. The composition according to claim 1, wherein either at least one group selected from X and two $R_2$s or the ring formed by bonding at least two groups selected from X and two $R_2$s comprises an electron withdrawing group as a substituent group.

5. The composition according to claim 1, wherein Ar, X and $R_2$ in the general formula (1-1) are configured such that a conjugate acid of a compound represented by the general formula (1-1P) below exhibits a pKa value of 0 or higher H—Ar—X—N($R_2$)$_2$. (1-1P)

6. The composition according to claim 1, wherein A represents a sulfur atom.

7. The composition according to claim 1, wherein $R_1$ each independently represents an aromatic hydrocarbon group.

8. The composition according to claim 1, wherein $Y^-$ represents an organic acid anion.

9. The composition according to claim 1, wherein $Y^-$ represents a sulfonate anion, an imidate anion or a methide anion.

10. An actinic-ray- or radiation-sensitive film formed from the composition according to claim 1.

11. A method of forming a pattern, comprising:
forming the composition according to claim 1 into a film,
exposing the film to light, and
developing the exposed film.

12. The method according to claim 11, wherein the exposure is performed through an immersion liquid.

13. The composition according to claim 1, wherein $Y^-$ is an anion represented by the general formula (LD1) or (LD2) below,

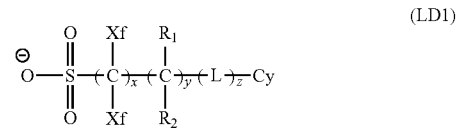

(LD1)

in the general formula (LD1),

Xf each independently represents a fluorine atom or an alkyl group substituted with at least one fluorine atom, $R_1$ and $R_2$ each independently represents a group selected from the group consisting of a hydrogen atom, a fluorine atom, an alkyl group and an alkyl group substituted with at least one fluorine atom, L each independently represents a single bond or a bivalent connecting group, Cy represents a group with a cyclic structure, x is an integer of 1 to 20, y is an integer of 0 to 10, and z is an integer of 0 to 10,

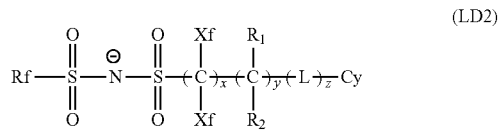

(LD2)

in the general formula (LD2),

Xf, $R_1$, $R_2$, L, Cy, x, y and z are as defined above in connection with the general formula (LD1), Rf is a group containing a fluorine atom.

14. The composition according to claim 2, wherein the composition has a mass ratio of compound (C) to compound (B) [compound (C)/compound (B)] in a range of 1.5 to 5.

15. The composition according to claim 1, wherein, in the general formula (1-1), when m is 2, two R1s are both alkyl groups, and two R1s are bonded to each other to form a ring.

16. The composition according to claim 1, wherein, in the general formula (1-1), when m is 2, two R1s are both aryl groups.

* * * * *